(12) United States Patent
Kunita et al.

(10) Patent No.: US 7,618,762 B2
(45) Date of Patent: Nov. 17, 2009

(54) POLYMER HAVING POLYMERIZABLE GROUP, POLYMERIZABLE COMPOSITION, PLANOGRAPHIC PRINTING PLATE PRECURSOR, AND PLANOGRAPHIC PRINTING METHOD USING THE SAME

(75) Inventors: Kazuto Kunita, Shizuoka-ken (JP); Sumiaki Yamasaki, Shizuoka-ken (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 12/073,769

(22) Filed: Mar. 10, 2008

(65) Prior Publication Data
US 2008/0182205 A1   Jul. 31, 2008

Related U.S. Application Data

(62) Division of application No. 11/182,830, filed on Jul. 18, 2005.

(30) Foreign Application Priority Data

Sep. 10, 2004 (JP) ............... 2004-264486
Sep. 14, 2004 (JP) ............... 2004-266489
Jun. 13, 2005 (JP) ............... 2005-172871

(51) Int. Cl.
G03F 7/11 (2006.01)
G03F 7/30 (2006.01)
B41N 1/14 (2006.01)

(52) U.S. Cl. ............... 430/138; 430/276.1; 430/271.1; 430/287.1; 430/302; 430/944; 430/285.1; 101/456; 101/472

(58) Field of Classification Search ............... None
See application file for complete search history.

(56) References Cited

U.S. PATENT DOCUMENTS

| | | | | |
|---|---|---|---|---|
| 4,030,417 A * | 6/1977 | Lipovac | ............... | 101/451 |
| 4,677,050 A | 6/1987 | Yokoyama et al. | | |
| 4,764,213 A * | 8/1988 | Gventer et al. | ............... | 106/2 |
| 5,171,655 A * | 12/1992 | Aoshima | ............... | 430/138 |
| 5,654,350 A | 8/1997 | Nunez et al. | | |
| 6,106,984 A | 8/2000 | Kato et al. | | |
| 6,124,425 A * | 9/2000 | Nguyen | ............... | 528/422 |
| 6,387,595 B1 * | 5/2002 | Teng | ............... | 430/302 |
| 6,537,725 B2 | 3/2003 | Kunita et al. | | |
| 6,593,059 B2 | 7/2003 | Kawamura et al. | | |
| 2002/0177074 A1 | 11/2002 | Hoshi et al. | | |
| 2002/0182537 A1 | 12/2002 | Furukawa | | |
| 2003/0064318 A1 * | 4/2003 | Huang et al. | ............... | 430/270.1 |
| 2003/0084806 A1 | 5/2003 | Kunita et al. | | |
| 2003/0190548 A1 | 10/2003 | Furukawa et al. | | |
| 2003/0215745 A1 | 11/2003 | Fujimaki | | |
| 2004/0009426 A1 * | 1/2004 | Goto et al. | ............... | 430/270.1 |
| 2005/0039620 A1 | 2/2005 | Kakino et al. | | |
| 2005/0074692 A1 | 4/2005 | Makino et al. | | |
| 2005/0263021 A1 * | 12/2005 | Mitsumoto et al. | ....... | 101/463.1 |
| 2005/0279234 A1 * | 12/2005 | Inno et al. | ............... | 101/453 |
| 2006/0005725 A1 * | 1/2006 | Aoshima et al. | ............... | 101/453 |
| 2006/0194149 A1 | 8/2006 | Yamasaki et al. | | |

FOREIGN PATENT DOCUMENTS

| | | |
|---|---|---|
| EP | 0 298 522 A2 | 1/1989 |
| EP | 0 468 584 A2 | 1/1992 |
| EP | 0 902 322 A1 | 3/1999 |
| EP | 1 116 580 A2 | 7/2001 |
| EP | 1 132 200 A2 | 12/2001 |
| EP | 1 391 296 A1 | 2/2004 |
| EP | 1 502 735 A2 | 2/2005 |
| EP | 1 518 673 A2 | 3/2005 |
| EP | 1520694 | 4/2005 |
| EP | 1 564 591 A2 | 8/2005 |
| EP | 1 602 982 A2 | 12/2005 |
| EP | 1 614 537 A1 | 1/2006 |
| EP | 1 621 337 A1 | 2/2006 |
| JP | 2938397 B2 | 6/1999 |
| JP | 2000-187322 A | 7/2000 |
| JP | 2001-277740 A | 10/2001 |
| JP | 2001-277742 A | 10/2001 |
| JP | 2001-290271 A | 10/2001 |
| JP | 2002-287334 A | 10/2002 |

* cited by examiner

*Primary Examiner*—Cynthia Hamilton
(74) *Attorney, Agent, or Firm*—Birch, Stewart, Kolasch & Birch LLP

(57) ABSTRACT

A polymer having a polymerizable group and an alkyleneoxy groups on side chains thereof, and a polymerizable composition containing the polymer. The polymerizable composition preferably contains a polymerizable compound and a polymerization initiator. Also provided is a planographic printing plate precursor having a polymerizable layer on a hydrophilic support, the polymerizable layer containing a polymer having a polymerizable on a side chain thereof. The planographic printing plate precursor can form an image without being subjected to an alkali development. An undercoat layer containing a specific copolymer may be provided between the support and the photopolymerizable layer.

5 Claims, No Drawings

POLYMER HAVING POLYMERIZABLE GROUP, POLYMERIZABLE COMPOSITION, PLANOGRAPHIC PRINTING PLATE PRECURSOR, AND PLANOGRAPHIC PRINTING METHOD USING THE SAME

CROSS-REFERENCE TO RELATED APPLICATION

This application is a Divisional of co-pending application Ser. No. 11/182,830, filed on Jul. 18, 2005, the entire contents of which are hereby incorporated by reference and for which priority is claimed under 35 U.S.C. § 120.

This application claims priority under 35 USC 119 from Japanese patent Application Nos. 2004-264486, 2004-266489, and 2005-172871, the disclosure of which is incorporated by reference herein.

BACKGROUND OF THE INVENTION

1. Field of the Invention

The invention is concerned with a polymerizable composition which can be polymerized and cured by light or heat, a planographic printing plate precursor using the same, and a planographic printing method using the same. Specifically, the invention relates to a stable polymerizable composition capable of polymerizing with high sensitivity which is useful for use in a recording layer of a planographic printing plate precursor which can be used for printing without being alkali-developed after exposure to laser light. The invention also relates to a planographic printing plate precursor and a planographic printing method using the printing plate precursor, the method comprising on-press development but not comprising usual development operation.

2. Description of the Related Art

Generally, a planographic printing plate comprises lipophilic image portions receiving ink at printing and hydrophilic non-image portions receiving moistening water. The planographic printing comprises: forming ink-receiving portions which are lipophilic image portions and moistening water receiving portions (ink-repelling portions) which are hydrophilic non-image portions on a planographic printing plate so as to make irregularity of ink adhesiveness on the surface of the planographic printing plate; allowing ink to adhere only to the image portions utilizing the repulsion between water and oil-based ink; and transferring the ink to a member (such as paper) on which the image is to be printed to conduct printing.

Planographic printing plate precursors (PS plates) have been widely used for making planographic printing plates, which printing plate precursors have a hydrophilic support and a lipophilic photosensitive resin layer (image-recording layer) on the support. Usually, the planographic printing plate precursor is exposed to light which has passed an element having an image such as a lith film, and then the image-recording layer in non-image portions is removed by being dissolved in an alkaline developer or an organic solvent while allowing the image-recording layer in image portions to remain so that the surface of the hydrophilic support is partially exposed in accordance with the image to form a planographic printing plate.

Conventionally, recording materials each having a resin layer which can be polymerized and cured by light or heat have been widely used as recording materials for planographic printing plate precursors.

Digitalization techniques have been spreading widely which process, store, and output image information electronically by using computers. In accordance with the development of digitalization techniques, new image out-put methods have been put into practice which are adapted to such digitalization techniques. As a result, there is a demand for computer-to-plate (CTP) techniques which comprise scanning a printing plate precursor with a light with high directivity such as a laser light according to digitalized image information, thereby directly producing a printing plate without using a lith film. Accordingly, it has been an important issue to develop an image-recording material adapted for such techniques.

An image-recording material proposed as a scan-exposable recording material has a constitution in which a hydrophilic support has thereon a lipophilic photosensitive resin layer (hereinafter occasionally referred to as "photosensitive layer") including a photosensitive compound capable of generating active species such as radicals and Bronsted acids upon exposure to laser light. This image-recording material is commercially available as a planographic printing plate precursor. A negative planographic printing plate can be obtained by: scanning the planographic printing plate precursor with a laser light according to digital information to generate active species which causes chemical or physical changes of the photosensitive layer, thereby insolubilizing the photosensitive layer; and then developing the planographic printing plate precursor.

Specifically, a planographic printing plate with high resolution and high ink-affinity can be obtained efficiently by a simple developing treatment when the planographic printing plate precursor has a hydrophilic support and a photopolymerizable photosensitive layer (recording layer) containing a photopolymerization initiator excellent in response speed, an addition-polymerizable ethylenic unsaturated compound, and a binder polymer which is soluble in an alkaline developer, and an optional oxygen-blocking protective layer on the support. A planographic printing plate having the desired characteristics can be produced from such a planographic printing plate precursor.

A highly-sensitive radical-polymerizable recording material suitable for use as a recording layer of a planographic printing plate usually comprises a combination of an alkali-soluble polymer binder and a polymerizable crosslinking agent (monomer or oligomer). In order to improve sensitivity of a polymerizable composition containing the combination, techniques have been proposed; a technique disclosed in Japanese Patent Application Laid-Open (JP-A) No. 2000-187322 provides a radical polymerizable group to the binder, and a technique disclosed in JP-A No. 2001-290271 introduces a phenyl group substituted by a vinyl group to a side chain of the binder. When the binder polymer has a radical polymerizable group, the binder, which is a high-molecular-weight compound, can directly participate in cross-linking, thus enhancing the cross-linking effects by molecular-weight effects and improving the sensitivity. However, the introduction of the polymerizable group makes thermally instable the polymer and the polymerizable composition containing the polymer. The image quality is deteriorated when such techniques are applied; particularly, the polymerizable composition may deteriorate because of the high gelling efficiency of the cross-linking binder when stored in a condition of high temperature and high humidity, and decrease in developability of a non-image portion may cause poor reproducibility of thin lines if the non-image portion is a space between the thin lines. Therefore, there has been a need for a composition which cures with high sensitivity to form a tough film only in exposed portions while maintaining high removability of non-exposed portions.

In conventional techniques, a process for making a planographic printing plate has to have a process for removing non-image portions after exposure; the non-image portions are removed by being dissolved in a developer suitable for the image-recording layer. It has been an issue to eliminate the need for the additional wet process described above or simplify the wet process. Particularly, the industry has paid attention to the disposal of the waste liquid occurring in the wet process, in consideration of the global environment; accordingly, there is a stronger request for solving the above problems.

As a simple method for making a printing plate which can solve the problems, an on-press development method has been proposed in which the recording layer is such a recording layer that non-image portions of the planographic printing plate precursor can be removed in a usual printing procedure, and in which the non-image portions is removed on the printing machine to form a planographic printing plate.

Specifically, the on-press development may be carried out in the following manners: a method using a planographic printing plate precursor having such an image-recording layer as to be dissolved or dispersed in an emulsion containing the moistening water and the solvent of the ink or in an emulsion containing the moistening water and the ink; a method comprising physically removing the image-recording layer by the contact between the image-recording layer and the rollers or blanket cylinder; and a method comprising weakening the cohesive force of the image-recording layer or the adhesion force working between the image-recording layer and the support by penetration of the moistening water and the ink solvent into the image-recording layer, and physically removing the image-recording layer by the contact between the image-recording layer and the rollers or blanket cylinder.

In the invention, the term "developing treatment" refers to a treatment in which: a planographic printing plate precursor which was exposed to infrared laser light or the like is brought into contact with a liquid (usually an alkaline developer) using an apparatus (usually, an automatic processor) which is not a printing machine such that non-exposed portions are removed to expose the surface of the hydrophilic support. In the invention, the term "on-press development" refers to a method or treatment in which a planographic printing plate precursor is brought into contact with a liquid (usually a non-alkaline aqueous solution such as printing ink and moistening water) using a printing machine such that non-exposed portions of the planographic printing plate precursor is removed to expose the surface of the hydrophilic support.

A planographic printing plate precursor disclosed in Japanese Patent 2938397 etc. is an image-recording material capable of on-press development which has, on a hydrophilic support, an image-recording layer containing hydrophobic thermoplastic polymer particles dispersed in a hydrophilic binder. The planographic printing plate precursor can be developed on-press with moistening water and/or ink and exhibits excellent on-press developability; the planographic printing plate precursor is exposed to a laser light to fuse the thermoplastic polymer particles to form an image and then attached to the cylinder of a printing machine, and then developed on-press. However, when the image is formed by mere thermal fusion of the particles, the strength of the obtained image is poor and printing durability is insufficient; particularly, the adhesion between the support and the ink-receiving layer is very weak.

A planographic printing plate precursor having, on a hydrophilic support, microcapsules containing a polymerizable compound has been proposed for example in JP-A Nos. 2001-277740 and 2001-277742.

Further, a planographic printing plate precursor having, on a support, a photosensitive layer containing an infrared absorber, a radical polymerization initiator, and a polymerizable compound has been proposed for example in JP-A No. 2002-287334.

Another planographic printing plate precursor capable of on-press development has been disclosed for example in JP—No. 2002-287334. This planographic printing plate precursor has, on a support, a photosensitive layer containing an infrared absorber, a radical polymerization initiator such as an onium salt or an organic borate compound, and a polymerizable compound having an ethylenic unsaturated double bond such as acrylic ester.

The image portion formed by the polymerization has a higher denseness of chemical bonds in the image portion than the image portion formed by the thermal fusion of polymer particles. Therefore, the image portion formed by the polymerization has a better image strength; however, even such a planographic printing plate precursor fails to achieve sufficient on-press developability, printing durability, and polymerization efficiency (sensitivity) from the practical viewpoint, whereby the planographic printing plate precursor has not been put into practice.

Therefore, there is a need for a polymerizable composition which has high sensitivity and curability and which enables easy removal of non-cured portions with a non-alkaline water or the like without requiring removing treatment with an excessive amount of developer.

SUMMARY OF THE INVENTION

After intensive research, the inventors have found that the above problems can be solved by using a radical-crosslinkable alkali-soluble polymer having a polymerizable group on a side chain and having a partial structure with a high water-dispersability.

A first aspect of the invention is to provide a radical-crosslinkable polymer having a polymerizable group and an alkyleneoxy group on a side chain or side chains thereof. The polymerizable group may be a styrene group.

A second aspect of the invention is to provide a polymerizable composition. The polymerizable composition includes a radical-crosslinkable polymer (hereinafter occasionally referred to as "specific polymer (A)") having a styrene group and an alkyleneoxy group on a side chain or side chains thereof.

The polymerizable composition may further comprise a polymerizable compound and a polymerization initiator. From the viewpoint of sensitivity, the polymerizable composition may further comprise a sensitizing colorant.

The mechanism of the present invention is supposed to be as follows: the polymer binder of the invention has, on a side chain, a styrene group, which is hydrophobic and which improves the strength of the cured film; the polymer binder of the invention further has an alkyleneoxy group, which is hydrophilic and capable of crosslinking by a chain reaction; the combination of the two groups provides synergetic effects, thereby imparting superior characteristics to the polymerizable composition.

When the polymerizable composition is used, a cured film with excellent water resistance is formed in exposed portions by crosslinking between hydrophobic styrene groups; further, alkyleneoxy groups can cause chain reactions involving radicals when the hydrogen adjacent to the oxygen is pulled out, thereby improving the cross-linking denseness and sensitivity. The obtained film is strong and cannot be removed by moistening water or water containing a surfactant used in printing.

In unexposed portions, uncured film is easily removed at printing by contact with ink, moistening water, a water containing a surfactant, or the like since the alkyleneoxy group has a high hydrophilicity and high dispersibility in water. Therefore, a planographic printing plate precursor having a recording layer including the polymerizable composition can form an image with clear distinction between unexposed portions and exposed portions on a printing machine without being subjected to an alkali-developing treatment. The planographic printing plate precursor can form an image with high quality without being subjected to an alkali-developing treatment, supposedly because of the mechanism described above.

The polymerizable composition of the invention may be used suitably as a recording layer of a planographic printing plate precursor which is capable of direct plate-making and which is adapted for an infrared LD laser having a wavelength of 800 nm or longer or an ultraviolet LD laser having a wavelength in the range of 300 nm to 450 nm. Exposure with an infrared LD laser uses a mechanism for image formation in which light is converted to heat which then generate radicals to proceed polymerization. Although exposure with an infrared LD laser enables exposure with high illumination, the curing caused by a radical reaction is insufficient in the neighborhood of the support because of heat diffusion. However, such a problem can be solved by using the polymerizable composition of the invention because: in exposed portions (image portions), the hydrophobic styrene groups form a strong cured film to which moistening water or the like is difficult to penetrate at the time of printing, and the film formation occurs with high sensitivity owing to the characteristics of the alkyleneoxy groups, and the alkyleneoxy groups further increase crosslinking denseness of the film. On the other hand, the illumination intensity of an ultraviolet LD laser used for recording is low. The polymerizable composition of the invention is also suitable for exposure by an ultraviolet LD laser since the polymerizable composition of the invention has high sensitivity and curability and form a dense film.

A third aspect of the invention is to provide a planographic printing plate precursor comprising a support and a laser-sensitive recording layer disposed on the support, wherein the planographic printing plate precursor can be used for printing after exposure without being developed with an alkaline developer, and the recording layer includes a polymer having a polymerizable group on a side chain thereof. The support may be a hydrophilic support. The polymerizable group may be a styrene group or a group having an ethylenic unsaturated bond.

A fourth aspect of the invention is to provide a planographic printing plate precursor comprising a support and a recording layer including a polymerizable composition disposed on the support, wherein the planographic printing plate precursor is capable of recording image by laser exposure, the planographic printing plate can be used for printing after exposure without being developed with an alkaline developer, and the polymerizable composition includes a radical-crosslinkable polymer (specific polymer (A)) having a styrene group and an alkyleneoxy group on a side chain or side chains thereof.

A fifth aspect of the invention is to provide a planographic printing method comprising: attaching a planographic printing plate precursor to a printing machine; imagewise exposing the planographic printing plate precursor to laser light; and supplying printing ink and moistening water to the planographic printing plate precursor so as to remove a laser-sensitive recording layer in unexposed regions and so as to conduct printing, wherein the planographic printing plate precursor comprises a support and the laser-sensitive recording layer disposed on the support, and the laser-sensitive recording layer includes a polymer having a polymerizable group on a side chain thereof.

A sixth aspect of the invention is to provide a planographic printing plate precursor. The planographic printing plate precursor can form an image without being subjected to an alkali-developing treatment. The planographic printing plate precursor has a laser-sensitive photopolymerizable layer on a hydrophilic support, and the photopolymerizable layer includes a polymer compound having at least one ethylenic unsaturated bond on side chains.

The polymer compound having at least one ethylenic unsaturated bond on side chains may be a polymer compound having at least one group selected from groups represented by the following formulae (1) to (3).

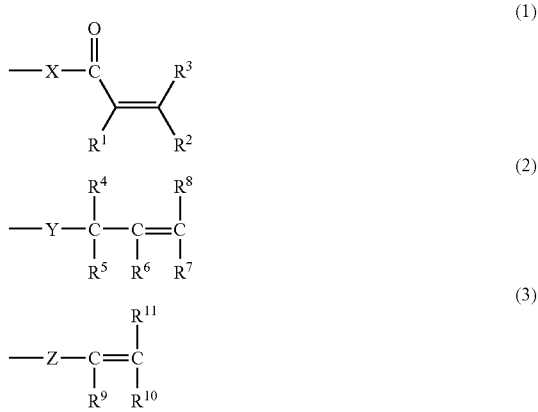

In the formulae, X and Y each independently represent an oxygen atom, a sulfur atom, or $-N-R^{12}$; Z represents an oxygen atom, a sulfur atom, $-N-R^{12}$, or a phenylene group; and $R^1$ to $R^{12}$ each independently represent a monovalent substitutent.

The photopolymerizable layer may include a microcapsule. In an embodiment, the photopolymerizable layer or another layer includes a copolymer comprising a repeating unit (a1) including an ethylenic unsaturated group and a repeating unit (a2) including a functional group capable of interacting with the surface of the support.

A seventh aspect of the invention is to provide a planographic printing method comprising:

imagewise exposing a planographic printing plate precursor comprising a hydrophilic support and a laser-sensitive photopolymerizable layer disposed on the support to a laser light;

attaching the planographic printing plate precursor to a printing machine;

providing the planographic printing plate precursor with moistening water and printing ink;

removing unexposed portions of the photopolymerizable layer; and using the obtained planographic printing plate for printing, wherein the planographic printing plate precursor is capable of forming image after exposure without being developed with an alkali developer, and the photopolymerizable layer includes a polymer having at least one ethylenic unsaturated bond on a side chain or side chains thereof. The imagewise exposure may be conducted before the attachment to the printing machine, or the attachment to the printing machine may be conducted before the imagewise exposure.

DETAILED DESCRIPTION OF THE INVENTION

The radical-crosslinkable polymer of the invention has a polymerizable group and an alkyleneoxy group on a side chain or side chains thereof. In the following, the radical-crosslinkable polymer is described using an exemplary embodiment in which the polymerizable group is a styrene group.

First Embodiment

In the following, a first embodiment of the invention is described in detail.

Polymerizable Composition and Radical-Crosslinkable Polymer

The polymerizable composition of the first embodiment includes a radical-crosslinkable alkali-soluble polymer (A) having a styrene group and an alkyleneoxy group on a side chain or side chains.

Preferably, the polymerizable composition further includes a polymerizable compound and a polymerization initiator. It is preferable to incorporate a sensitizing colorant to the polymerizable composition from the viewpoint of sensitivity. In the following, the radical crosslinkable alkali-soluble polymer (A) (occasionally referred to as simply "specific polymer (A)" hereinafter) having a styrene group and an alkyleneoxy group on a side chain or side chains is described in detail.

Specific Polymer (A)

The specific polymer (A) of the first embodiment is not particularly limited as long as a single molecule of the polymer has a styrene group and an alkyleneoxy group on a side chain or side chains. The structural unit of the specific polymer (A) may be any known structural unit or a combination of known structural units.

The glass transition point (Tg) of the specific polymer (A) is preferably 60° C. or lower from the viewpoints of curability (printing durability) of exposed portions and removability of unexposed portions. The glass transition point is more preferably 50° C. or lower, still more preferably 30° C. or lower. The lower limit of the glass transition point is preferably −50° C.

The existence form of the styrene group and alkyleneoxy group in the molecule is not particularly limited. For example, the specific polymer (A) may be obtained by copolymerization of a structural unit having a styrene group on a side chain thereof, a structural unit having an alkyleneoxy group on a side chain thereof, and other optional structural units. In another example, the specific polymer (A) may be obtained by polymerization of a structural unit having a styrene group and an alkyleneoxy group or copolymerization of structural units including a structural unit having a styrene group and an alkyleneoxy group. As an alternative, such structures may be introduced to the main chain of a polymer as side chains.

As described above, the glass transition point of the specific polymer (A) is preferably 60° C. or lower. In order to adjust the glass transition point to the range, a structural unit having a low glass transition point may be introduced into the molecule.

The specific polymer (A) is preferably an organic high-molecular-weight polymer which is soluble or swellable in water or weakly alkaline water, whereby development with water or weakly alkaline water is possible.

In the specific polymer (A), a styrene group is connected to the main chain of the polymer directly or via a connecting group. The connecting group is not particularly limited, and may be an arbitrary connecting group, an atom such as N or O, or a combination thereof. The phenyl group and vinyl group in the styrene group each may have a substituent. The substituent may be, for example, a halogen atom, a carboxyl group, a sulfo group, a nitro group, a cyano group, an amide group, an amino group, an alkyl group, an aryl group, an alkoxy group, or an aryloxy group.

The specific polymer (A) may include a structural unit having a side chain structure represented by the following formula (S) as the side chain having a styrene group.

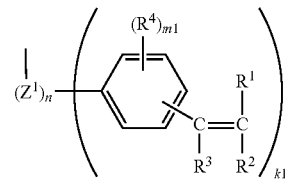

Formula (S)

In formula (S), $Z^1$ represents a connecting group; $R^1$, $R^2$, and $R^3$ each independently represent a hydrogen atom, a halogen atom, a carboxyl group, a sulfo group, a nitro group, a cyano group, an amide group, an amino group, an alkyl group, an aryl group, an alkoxy group, or an aryloxy group, each of which may have a substituent such as an alkyl group, an amino group, an aryl group, an alkenyl group, an carboxyl group, a sulfo group, or a hydroxyl group; $R^4$ represents a group or an atom each of which is capable of being bonded to the benzene ring, such as an alkyl group, an aryl group or a halogen atom which may be a substituted oxy group, a substituted thio group, a substituted amino group, or a substituted carbonyl group, and $R^4$ may have a substituent selected from the examples of substituents on $R^1$, $R^2$, and $R^3$; n represents 0 or 1; m1 represents an integer of 0 to 4; and k1 represents an integer of 1 to 4.

The connecting group represented by $Z^1$ is preferably —O—, —S—, an alkylene group, an alkenylene group, an arylene group, —N($R^5$)—, —C=(O)—O—, —C($R^6$)=N—, —C=(O)—, a sulfonyl group, a heterocyclic group, the group described below, or a connecting group formed by combination of two or more connecting groups which may be selected from the above connecting groups. $R^5$ and $R^6$ each independently represent a hydrogen atom, an alkyl group, or an aryl group.

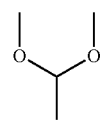

The above connecting groups each may have a substituent such as an alkyl group, an aryl group, or a halogen atom.

The connecting group which connects a styrene structure to the main chain is preferably has a structure containing a heterocyclic group. The heterocyclic group may be a nitrogen-containing heterocyclic group, a furan group, or a thiophene group. Examples of the nitrogen-containing heterocyclic group include a pyrrol ring, a pyrazol ring, an imidazole ring, a triazole ring, a tetrazole ring, an isooxazole ring, an oxazole ring, an oxadiazole ring, an isothiazole ring, a thiazole ring, a thiadiazole ring, a thiatriazole ring, an indole ring, an indazole ring, a benzimidazole ring, benzotriazole ring, a benzoxazole ring, a benzthiazole ring, a benzoselenazole ring, a benzothiadiazole ring, a pyridine ring, a pyridazine ring, a pyrimidine ring, a pyrazine ring, a triazine ring, a quinoline ring, and a quinoxaline ring. Such heterocyclic groups each may have a substituent and the substituent may be selected from halogen atoms, carboxyl groups, sulfo groups, nitro groups, cyano groups, amide groups, amino groups, alkyl groups, aryl groups, alkoxy groups, and aryloxy groups.

Examples of a structural unit having the side-chain structure which includes a styrene group and which is represented by the above formula are shown below (K-1 to K-20). However, the invention is not limited to those examples.

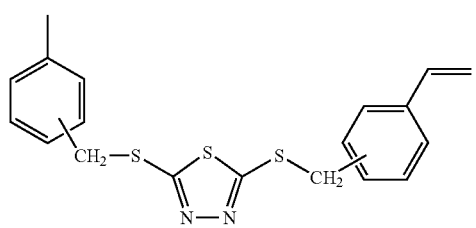 (K-1)

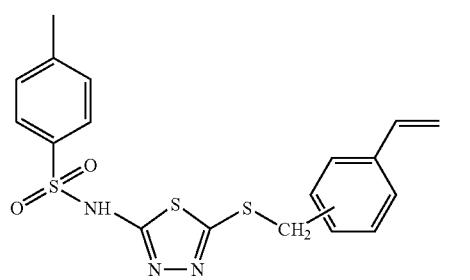 (K-2)

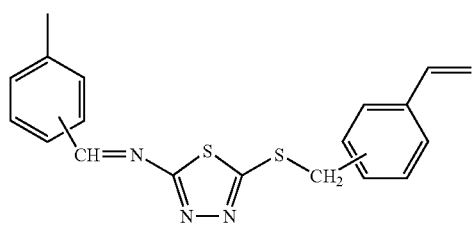 (K-3)

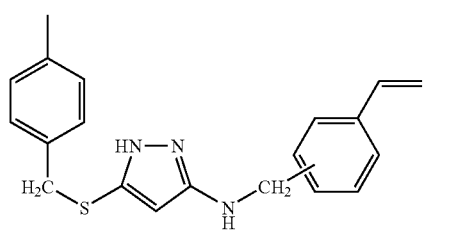 (K-4)

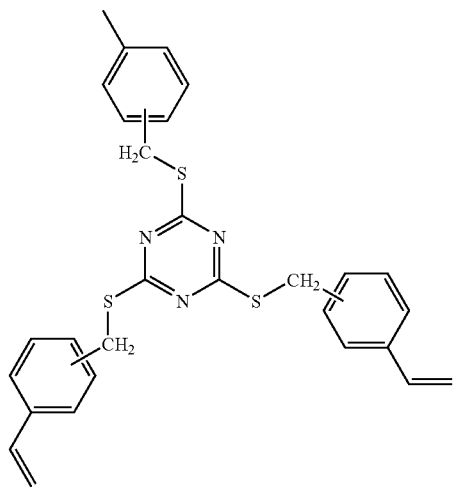 (K-5)

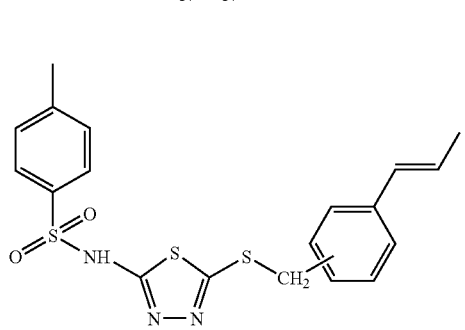

(K-6)

(K-7)

(K-8)

(K-9)

(K-10)

(K-11)

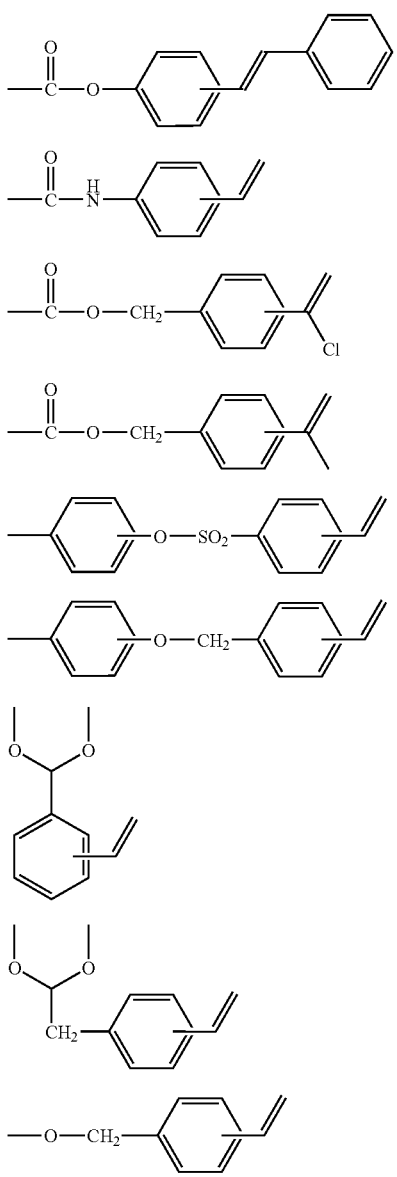

The structural unit represented by formula (S) is preferably a structural unit in which $R^1$ and $R^2$ are hydrogen atoms and $R^3$ is a hydrogen atom or an alkyl group having 4 or less carbon atoms such as a methyl group or an ethyl group. The connecting group is preferably a connecting group including a heterocycle, and k1 is preferably 1 or 2.

Only a single type of structural unit represented by formula (S) may be included in the specific polymer (A) or two or more types of structural units represented by formula (S) may be included in the specific polymer (A).

The proportion of the structural unit having a side-chain structure represented by formula (S) to the total structural units constituting the specific polymer (A) is preferably 1% by mol to 50% by mol, more preferably 1% by mol to 40% by mol. The content of the structural unit having a side-chain structure represented by formula (S) per 1 g of the specific polymer (A) is preferably 0.01 mmol to 7.0 mmol, more preferably 0.01 mmol to 5.0 mmol, still more preferably 0.01 mmol to 4.0 mmol.

The specific polymer (A) may include a side-chain structural unit represented by the following formula (AO) as the side chain having an alkyleneoxy group.

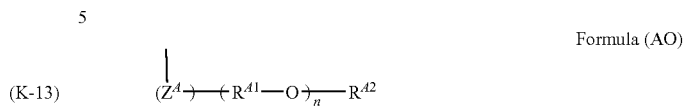

Formula (AO)

In formula (AO), $Z^A$ represents a connecting group; $R^{A1}$ represents an alkylene group; $R^{A2}$ represents a hydrogen atom, an alkyl group, or an aryl group; and n represents an integer of 1 to 20.

The connecting group represented by $Z^A$ may be selected from the connecting groups cited in the description of the connecting group Z in formula (S).

The alkylene group represented by $R^{A1}$ may be alkylene group obtained by removing an arbitrary hydrogen atom form an alkyl group having 1 to 20 carbon atoms. The alkylene group is preferably a linear alkylene group having 1 to 12 carbon atoms, a branched alkylene group having 3 to 12 carbon atoms, or a cyclic alkylene group having 5 to 10 carbon atoms.

$R^{A2}$ is preferably an alkyl group having 1 to 18 carbon atoms, an aryl group having 6 to 18 carbon atoms, or a hydrogen atom, more preferably an alkyl group having 1 to 3 carbon atoms.

n is preferably an integer of 1 to 12, more preferably an integer of 3 to 10.

Only a single type of structural unit represented by formula (AO) may be included in the specific polymer (A), or two or more types of structural units represented by formula (AO) may be included in the specific polymer (A).

In the specific polymer (A), the proportion of the structural unit represented by formula (AO) to the total structural units constituting the specific polymer (A) is preferably 5% by mol to 90% by mol, more preferably 20% by mol to 70% by mol.

The glass transition point (Tg) of the specific polymer (A) is preferably 60° C. or lower. The glass transition point of the specific polymer (A) may be adjusted to the range by incorporating a structural unit with a low Tg into the specific polymer (A).

Preferable examples of the structural unit with a low Tg include acrylate monomers and methacrylate monomers. The structural unit with a low Tg is preferably a methacrylic ester of a long-chain alkyl. The long-chain alkyl is preferably connected to methacrylic acid via an ester group or an ether group.

The introduction of such a structural unit with a low Tg is advantageous also from the viewpoints of curability (printing durability) and removability of unexposed portions. Structural units represented by the following formulae (I) to (IV) are preferable as structural units having low Tgs.

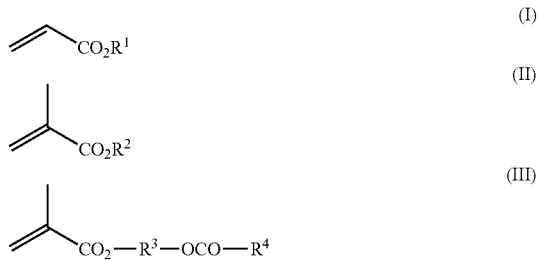

-continued

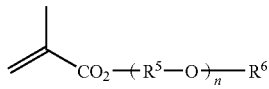
(IV)

In formulae (I) to (IV), $R^1$ represents an alkyl group, preferably an alkyl group having 1 to 12 carbon atoms, more preferably an alkyl group having 4 to 8 carbon atoms.

$R^2$ represents an alkyl group having 4 to 12 carbon atoms, preferably a linear alkyl group having 4 to 6 carbon atoms.

$R^3$ represents an alkylene group, preferably an alkylene group having 2 to 6 carbon atoms. $R^4$ represents an alkyl group whose preferable examples are the same as in the case of the alkyl group represented by $R^1$.

$R^5$ represents an alkylene group whose preferable examples are the same as in the case of the alkylene group represented by $R^3$. $R^6$ represents a hydrogen atom or an alkyl group. When $R^6$ represents an alkyl group, preferable examples thereof are the same as in the case of the alkyl group represented by $R^1$.

Among formulae (I) to (IV), formula (IV) is included in the scope of formula (AO). Accordingly, when the specific polymer (A) includes an adequate amount of a structural unit represented by formula (IV), the specific polymer (A) has a high sensitivity and hydrophilicity owing to the alkyleneoxy group and also has high printing durability and developability owing to the low Tg.

Only a single type of structural unit with a low Tg may be used, or two or more types of structural units with low Tgs may be used.

A structural unit represented by any of formulae (I) to (IV) may be incorporated into the specific polymer (A) by adding the structural unit to the copolymerization components of the specific polymer (A) and conduct copolymerization by a usual radical polymerization method.

The content of such a structural unit with a low Tg in the specific polymer (A) is preferably 0% by mol to 60% by mol, more preferably 10% by mol to 40% by mol.

In addition to the above-described side-chain structural unit, the specific polymer (A) may further include a structural unit having an alkali-soluble group on a side chain thereof. The alkali-soluble group is preferably incorporated into the specific polymer (A) by adding a structural unit having an alkali-soluble group on a side chain thereof to copolymerization components. In the structural unit having an alkali-soluble group as a copolymerization component, the alkali-soluble group is preferably selected from the following groups (1) to (6) from the viewpoint of solubility of the specific polymer (A) in an alkaline developer. The structural unit may include two or more such alkali-soluble groups.

(1) Phenolic hydroxyl groups (—Ar—OH)
(2) Sulfonamide groups (—$SO_2NH$—R)
(3) Substituted sulfonamide groups (occasionally referred to as "active imide groups" hereinafter) (—$SO_2NHCOR$, —$SO_2NHSO_2R$, —$CONHSO_2R$)
(4) Carboxylic acid groups (—$CO_2H$)
(5) Sulfonic acid groups (—$SO_3H$)
(6) Phosphoric acid groups (—$OPO_3H_2$)

In the above groups (1) to (6), Ar represents a divalent aryl connecting group which may have a substituent, and R represents a hydrogen atom or a hydrocarbon group which may have a substituent.

The specific polymer (A) may further include other structural units as copolymerization components for the purpose of improving film properties, in addition to essential structural units such as the structural unit having a side-chain structure having a styrene group and a structural unit having an alkyleneoxy group and the optional structural unit having an alkali-soluble group.

Examples of such other structural units in the specific polymer (A) include structural units derived from known monomers such as arylic esters, methacrylic esters, acrylamides, methacrylamides, vinylesters, styrenes, arylic acids, methacrylic acids, acrylonitrile, maleic anhydride, and maleic imide.

Examples of the acrylic esters include methyl acrylate, ethyl acrylate, (n- or i-)propyl acrylate, (n-, i-, sec- or t-)butyl acrylate, amyl acrylate, 2-ethylhexyl acrylate, dodecyl acrylate, chloroethyl acrylate, 2-hydroxyethyl acrylate, 2-hydroxypropyl acrylate, 5-hydroxypentyl acrylate, cyclohexyl acrylate, allyl acrylate, trimethylolpropane monoacrylate, pentaerythritol monoacrylate, glycidyl acrylate, benzyl acrylate, methoxybenzyl acrylate, chlorobenzyl acrylate, 2-(p-hydroxyphenyl)ethyl acrylate, furfuryl acrylate, tetrahydrofurfuryl acrylate, phenyl acrylate, chlorophenyl acrylate, and sulfamoylphenyl acrylate.

Examples of the methacrylic esters include methyl methacrylate, ethyl methacrylate, (m, or i-)propyl methacrylate, (n, i-, sec- or t-)butyl methacrylate, amyl methacrylate, 2-ethylhexyl methacrylate, dodecyl methacrylate, chloroethyl methacrylate, 2-hydroxyethyl methacrylate, 2-hydroxypropyl methacrylate, 5-hydroxypentyl methacrylate, cyclohexyl methacrylate, allyl methacrylate, trimethylolpropane monomethacrylate, pentaerythritol monomethacrylate, glycidyl methacrylate, methoxybenzyl methacrylate, chlorobenzyl methacrylate, 2-(p-hydroxyphenyl)ethyl methacrylate, furfuryl methacrylate, tetrahydrofurfuryl methacrylate, phenyl methacrylate, chlorophenyl methacrylate, and sulfamoylphenyl methacrylate.

Examples of the acrylamides include acrylamide, N-methylacrylamide, N-ethylacrylamide, N-propylacrylamide, N-butylacrylamide, N-benzylacrylamide, N-hydroxyethylacrylamide, N-phenylacrylamide, N-tolylacrylamide, N-(p-hydroxyphenyl)acrylamide, N-(sulfamoylphenyl)acrylamide, N-(phenylsulfonyl)acrylamide, N-(tolylsulfonyl) acrylamide, N,N-dimethylacrylamide, N-methyl-N-phenylacrylamide, and N-hydroxyethyl-N-methylacrylamide.

Examples of the methacrylamides include methacrylamide, N-methylmethacrylamide, N-ethylmethacrylamide, N-propylmethacrylamide, N-butylmethacrylamide, N-benzylmethacrylamide, N-hydroxyethylmethacrylamide, N-phenylmethacrylamide, N-tolylmethacrylamide, N-(p-hydroxyphenyl)methacrylamide, N-(sulfamoylphenyl)methacrylamide, N-(phenylsulfonyl)methacrylamide, N-(tolylsulfonyl)methacrylamide, N,N-dimethylmethacrylamide, N-methyl-N-phenylmethacrylamide, and N-hydroxyethyl-N-methylmethacrylamide.

Examples of the vinylesters include vinyl acetate, vinyl butyrate and vinyl benzoate.

Examples of the styrenes include styrene, methylstyrene, dimethylstyrene, trimethylstyrene, ethylstyrene, propylstyrene, cyclohexylstyrene, chloromethylstyrene, trifluoromethylstyrene, ethoxymethylstyrene, acetoxymethylstyrene, methoxystyrene, dimethoxystyrene, chlorostyrene, dichlorostyrene, bromostyrene, iodostyrene, fluorostyrene, and carboxystyrene.

Among these monomers, acrylic esters, methacrylic esters, acrylamides, methacrylamides, vinylesters, styrenes, acrylic acids, methacrylic acids and acrylonitriles each having 20 or less carbon atoms are preferable.

In the following, specific examples (Q-1 to Q-15) of the specific polymer (A) of the first embodiment are shown below. However, the invention is not limited thereto. In the examples, Mw represents the weight-average molecular weight of each polymer, and Tg represents the glass transition point of each polymer. Further, the ratio (% by weight) of each structural unit in each polymer is also shown in the examples.

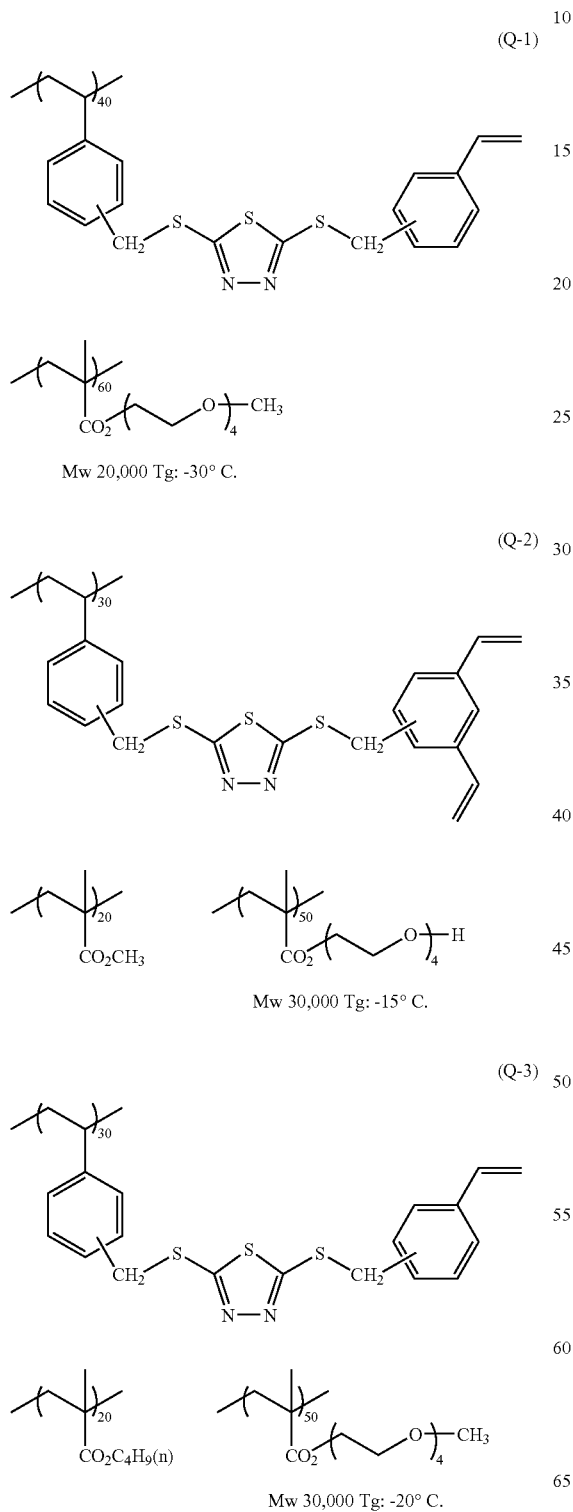

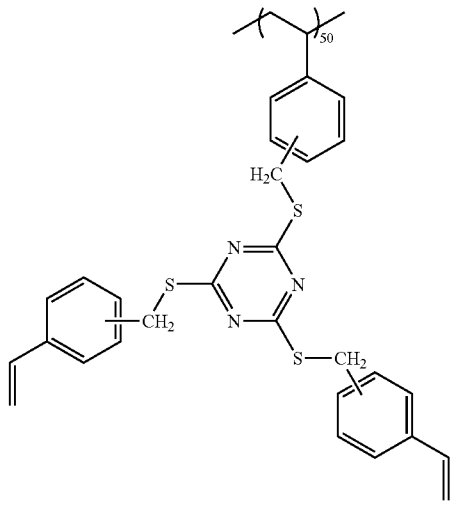

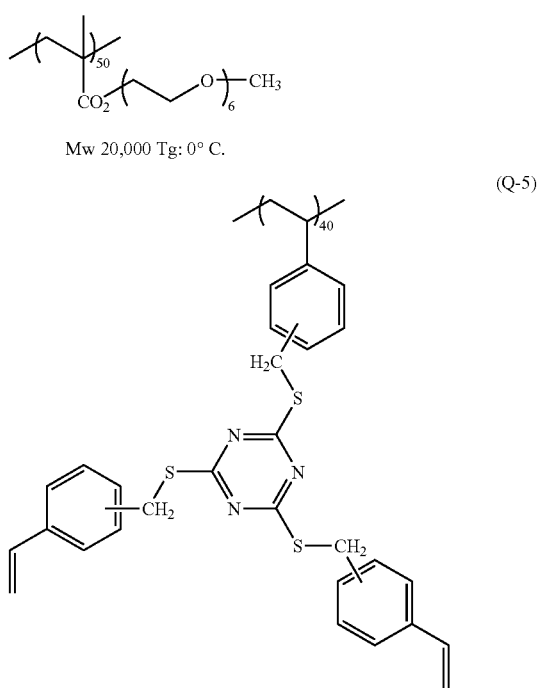

-continued
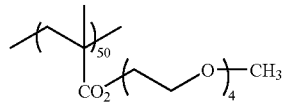
Mw 20,000 Tg: -20° C.
(Q-7)
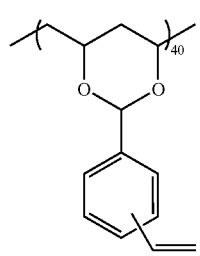
Mw 20,000 Tg: -25° C.
(Q-8)
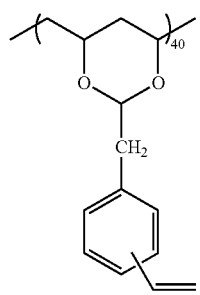
Mw 50,000 Tg: -20° C.
(Q-9)
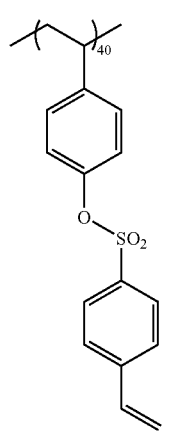
Mw 40,000 Tg: -15° C.
(Q-10)
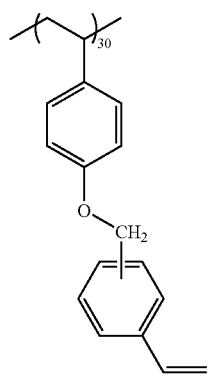 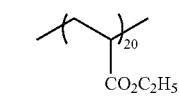
-continued
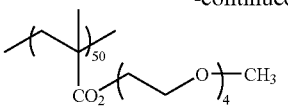
Mw 20,000 Tg: -30° C.
(Q-11)
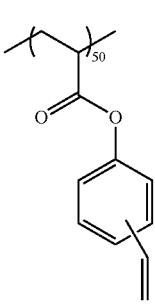 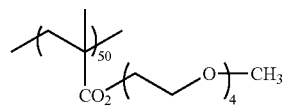
Mw 100,000 Tg: -20° C.
(Q-12)
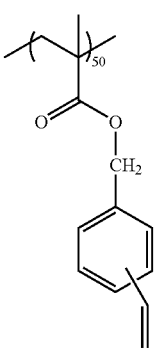 
Mw 100,000 Tg: -15° C.
(Q-13)
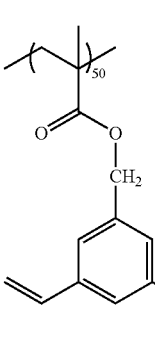 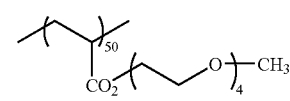
Mw 100,000 Tg: -30° C.
(Q-14)
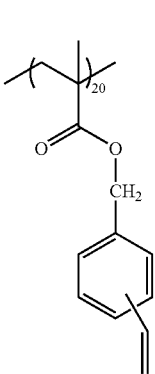 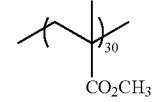

-continued

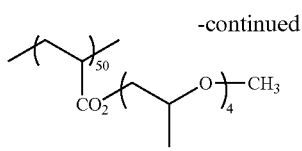

Mw 30,000 Tg: -5° C.

(Q-15)

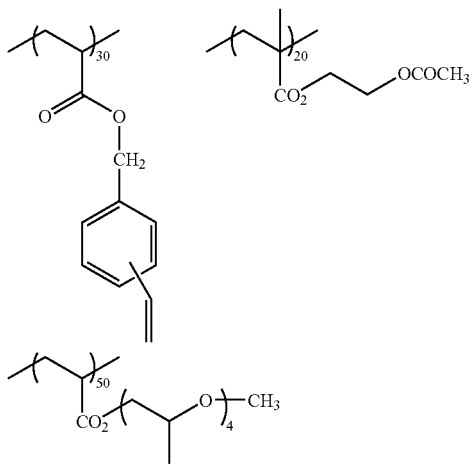

Mw 40,000 Tg: -20° C.

The weight-average molecular weight of the specific polymer (A) is selected in accordance with the intended use of the polymerizable composition. Usually, the film property improves as the molecular weight increases; however, image-forming property upon polymerization and curing deteriorates as the molecular weight increases. In contrast, when the molecular weight is low, the image-forming property is improved, but film property (printing durability) is deteriorated. The weight-average molecular weight of the specific polymer (A) in the first embodiment is preferably 2000 to 1000000 from the viewpoints of sensitivity and film property, more preferably 5000 to 500000, still more preferably 10000 to 300000.

Only a single type of specific polymer (A) may be used, or two or more types of specific polymers (A) may be used. The amount of the specific polymer may be 20% by weight to 80% by weight based on the total solids of the polymerizable composition, preferably 30% by weight to 70% by weight based on the total solids of the polymerizable composition.

As long as the effects of the invention are obtained, binder polymers other than the specific polymer (A) may be used in combination with the specific polymer (A). The amount of the other polymers may be 1% by weight to 60% by weight based on the total weight of the binder polymers, preferably 1% by weight to 40% by weight based on the total weight of the binder polymers, more preferably 1% by weight to 20% by weight based on the total weight of the binder polymers. The other binder polymers may be selected from known binder polymers without particular restrictions, and examples thereof include binders each having an acrylic main chain and urethane binders which are commonly used as film-forming polymers of polymerizable compositions.

The total sum of the weight of the specific polymer and the weights of other optional polymers in the polymerizable composition may be suitably selected, and is usually 10% by weight to 90% by weight based on the total weight of involatile components, preferably 20% by weight to 80% by weight based on the total weight of involatile components, more preferably 30% by weight to 70% by weight based on the total weight of involatile components. These ranges are also applicable in the recording layer of a planographic printing plate precursor described later.

The planographic printing plate precursor of the invention comprises a support and a laser-sensitive recording layer disposed on the support, wherein the planographic printing plate precursor can be used for printing without being subjected to an alkali development, and the recording layer includes a polymer having a polymerizable group on a side chain thereof. The support may be a hydrophilic support.

Second Embodiment

In the following, the second embodiment of the invention is described in detail.

The planographic printing plate precursor of the second embodiment has a laser-sensitive photopolymerizable layer on a hydrophilic support. The components in the photopolymerizable layer are described in the following.

Photopolymerizable Layer

Polymer Having Ethylenic Unsaturated Bond on Side Chain

In the second embodiment, a polymer compound having at least one ethylenic unsaturated bond on a side chain or side chains is used as a binder resin from the viewpoints of film property of the photopolymerizable layer and on-press developability. The polymer compound having at least one ethylenic unsaturated bond on a side chain or side chains is preferably a polymer compound having at least one group selected from the groups represented by formulae (1) to (3) below on a side chain or side chains thereof. This polymer compound having at least one group selected from the groups each represented by formula (1), (2), or (3) on a side chain or side chains is occasionally referred to as "specific polymer (B)" hereinafter.

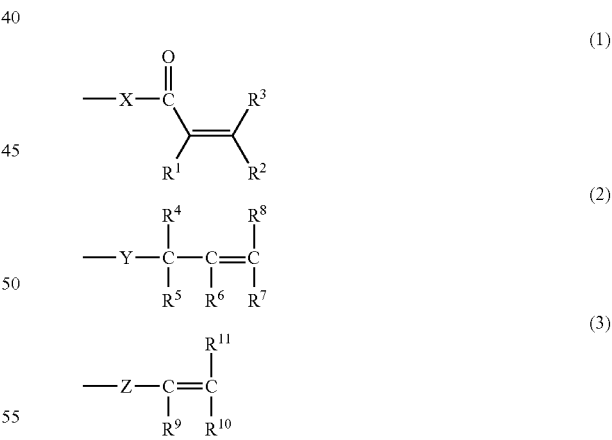

In the formulae, X and Y each independently represent an oxygen atom, a sulfur atom, or $-N-R^{12}$. Z represents an oxygen atom, a sulfur atom, $-N-R^{12}$, or a phenylene group. $R^1$ to $R^{12}$ each independently represent a monovalent substituent.

In formula (1), $R^1$ to $R^3$ each independently represent a monovalent substituent. For example, $R^1$ may be a hydrogen atom or a monovalent organic group such as an alkyl group which may be substituted. $R^1$ is preferably a hydrogen atom, a methyl group, a methylalkoxy group, or a methyl ester group. $R^2$ and $R^3$ may each independently represent a hydrogen atom, a halogen atom, an amino group, a dialkylamino group, a carboxyl group, an alkoxycarbonyl group, a sulfo group, a nitro group, a cyano group, an alkyl group which may be substituted, an aryl group which may be substituted, an alkoxy group which may be substituted, an aryloxy group which may be substituted, an alkylamino group which may be substituted, an arylamino group which may be substituted, an alkylsulfonyl group which may be substituted, or an arylsulfonyl group which may be substituted. $R^2$ and $R^3$ are each preferably a hydrogen atom, a carboxyl group, an alkoxycarbonyl group, an alkyl group which may be substituted, or an aryl group which may be substituted. The substituent to be introduced may be a methoxycarbonyl group, an ethoxycarbonyl group, an isopropoxycarbonyl group, a methyl group, an ethyl group or a phenyl group. X represents an oxygen atom, a sulfur atom, or $-N-R^{12}$, and $R^{12}$ may be an alkyl group which may be substituted.

In formula (2), $R^4$ to $R^8$ each independently represent a monovalent substituent, and examples thereof include a hydrogen atom, a halogen atom, an amino group, a dialkylamino group, a carboxyl group, an alkoxy carbonyl group, a sulfo group, a nitro group, a cyano group, an alkyl group which may be substituted, an aryl group which may be substituted, an alkoxy group which may be substituted, an aryloxy group which may be substituted, an alkylamino group which may be substituted, an arylamino group which may be substituted, an alkylsulfonyl group which may be substituted, or an arylsulfonyl group which may be substituted. $R^4$ and $R^8$ are each preferably a hydrogen atom, a carboxyl group, an alkoxycarbonyl group, an alkyl group which may be substituted, or an aryl group which may be substituted. The substituent to be introduced may be a methoxycarbonyl group, an ethoxycarbonyl group, an isopropoxycarbonyl group, a methyl group, an ethyl group or a phenyl group. Y represents an oxygen atom, a sulfur atom, or $-N-R^{12}$, and $R^{12}$ may be an alkyl group which may be substituted.

In formula (3), $R^9$ to $R^{11}$ each independently represent a monovalent substituent, and examples thereof include a hydrogen atom, a halogen atom, an amino group, a dialkylamino group, a carboxyl group, an alkoxy carbonyl group, a sulfo group, a nitro group, a cyano group, an alkyl group which may be substituted, an aryl group which may be substituted, an alkoxy group which may be substituted, an aryloxy group which may be substituted, an alkylamino group which may be substituted, an arylamino group which may be substituted, an alkylsulfonyl group which may be substituted, or an arylsulfonyl group which may be substituted. $R^9$ and $R^{11}$ are each preferably a hydrogen atom, a carboxyl group, an alkoxycarbonyl group, an alkyl group which may be substituted, or an aryl group which may be substituted. The substituent to be introduced may be a methoxycarbonyl group, an ethoxycarbonyl group, an isopropoxycarbonyl group, a methyl group, an ethyl group or a phenyl group. Z represents an oxygen atom, a sulfur atom, $-N-R^{12}$, or a phenylene group, and $R^{12}$ may be an alkyl group which may be substituted.

Among the specific polymers (B), compounds having groups represented by (1) on side chains can be synthesized by at least one of the following methods (1) and (2).

Synthesis Method (1)

This method comprises: synthesizing a polymer compound by polymerization of a at least one of radical-polymerizable compounds each represented by the following formula (4) or (5); and treating the polymer compound with a base to cause an elimination reaction such that $X^1$ and $Z^1$ in the formula are eliminated, thereby obtaining the desired polymer compound.

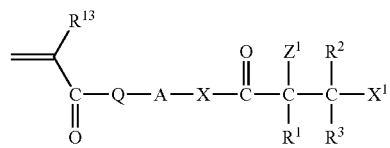

(4)

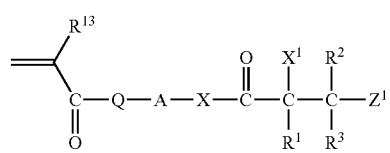

(5)

In the formulae, $X^1$ and $Z^1$ each independently represent a dissociative group which is to be removed by the elimination reaction. In the elimination reaction, $Z^1$ is pulled out by action of the base, and $X^1$ is eliminated. Preferably, $X^1$ is a group which can dissociate as an anion and $Z^1$ is a group which can dissociate as a cation.

Examples of the group represented by $X^1$ include halogen atoms, sulfonic acid groups, sulfinic acid groups, carboxyl groups, cyano groups, ammonium groups, azide groups, sulfonium groups, nitro groups, hydroxyl groups, alkoxy groups, phenoxy groups, thioalkoxy groups, and oxonium groups. $X^1$ is preferably a halogen atom, a sulfonic acid group, an ammonium group or a sulfonium group. $X^1$ is more preferably a chlorine atom, a bromine atom, an iodine atom, an alkylsulfonic acid group, or an arylsulfonic acid group. Examples of the alkylsulfonic acid groups include a methane sulfonic acid group, an ethane sulfonic acid group, a 1-propane sulfonic acid group, an isopropyl sulfonic acid group, a 1-butane sulfonic acid group, a 1-octyl sulfonic acid group, a 1-hexadecane sulfonic acid group, a trifluoromethane sulfonic acid group, a trichloromethan sulfonic acid group, a 2-chloro-1-ethane sulfonic acid group, a 2,2,2,-trifluoroethane sulfonic acid group, a 3-chloropropane sulfonic acid group, a perfluoro-1-butane sulfonic acid group, a perfuluoro-1-octane sulfonic acid group, a 10-camphor sulfonic acid group, and a benzyl sulfonic acid group. Examples of the arylsulfonic acid group include benzene sulfonic acid group, a trans-β-styrene sulfonic acid group, a 2-nitrobenzene sulfonic acid group, a 2-acetylbenzene sulfonic acid group, a 3-(trifluoromethyl)benzene sulfonic acid group, a 3-nitrobenzene sulfonic acid group, a 4-nitrobenzene sulfonic acid group, a p-toluene sulfonic acid group, a 4-tert-butylbenzene sulfonic acid group, a 4-fluorobenzene sulfonic acid group, a 4-chlorobenzene sulfonic acid group, a 4-bromobenzene sulfonic acid group, a 4-iodobenzene sulfonic acid group, a 4-methoxybenzene sulfonic acid group, a 4-(trifluoromethoxy)benzene sulfonic acid group, a 2,5-dichlorobenzene sulfonic acid group, a 2-nitro-4-(trifluoromethyl)-benzene sulfonic acid group, a 4-chloro-3-nitrobenzene sulfonic acid group, a 2,4-dinitrobenzene sulfonic acid group, a 2-mesitylene sulfonic acid group, a 2,4,6-triisopropylbenzene sulfonic acid group, a pentafluorobenzene sulfonic acid group, a 1-naphthalene sulfonic acid group, and a 2-naphthalene sulfonic acid group.

$Z^1$ may be, for example, a hydrogen atom, a halogen atom, an ammonium group, a sulfonium group, a phosphonium group, or an oxonium group, preferably a hydrogen atom.

When $Z^1$ is a hydrogen atom, the base pulls out the proton, thus causing the elimination of $X^1$.

In the second embodiment, a combination of $X^1$ and $Z^1$ is preferably such a combination that $X^1$ is a halogen atom and $Z^1$ is a hydrogen atom. In this case, $X^1$ leaves as an anion and $Z^1$ leaves as a cation.

In formulae (4) and (5), $R^{13}$ may be, for example, a hydrogen atom or an alkyl group which may be substituted, preferably a hydrogen atom, a methyl group, a methylalkoxy group or a methylester group. Q represents an oxygen atom, —NH—, or $NR^{14}$— and $R^{14}$ represents an alkyl group which may be substituted. A represents a divalent organic connecting group.

In formulae (4) and (5), the divalent organic connecting group represented by A is preferably comprised of a combination of 1 to 60 carbon atom(s), 0 to 10 nitrogen atom(s), 0 to 50 oxygen atom(s), 1 to 100 hydrogen atom(s), and 0 to 20 sulfur atom(s). Specific examples of the connecting group include connecting groups each comprised of a combination of the following structural units.

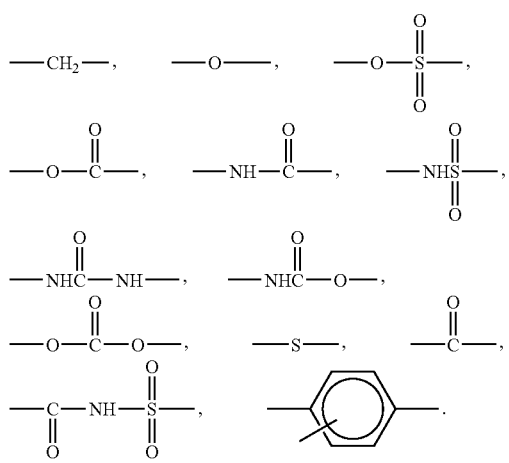

(Base Used for Elimination Reaction)

In the method for synthesizing a polymer compound having at least one group represented by formula (1) on a side chain or side chains, a treatment with a base causes an elimination reaction of a specific functional group to remove $X^1$ and $Z^1$ in formula (1), thereby obtaining a radical-reactive group. The base used in the elimination reaction is preferably an alkali metal hydride, an alkali metal hydroxide, an alkali metal carbonate, an organic amine compound, or a metal alkoxide compound.

Examples of the hydride, hydroxide, and carbonate of an alkali metal include sodium hydride, calcium hydride, potassium hydride, sodium hydroxide, potassium hydroxide, calcium hydroxide, potassium carbonate, sodium carbonate, potassium hydrogen carbonate, and sodium hydrogen carbonate.

Examples of the organic amine compound include trimethylamine, triethylamine, diethylmethylamine, tributylamine, triisobutylamine, trihexylamine, trioctylamine, N,N-dimethylcyclohexylamine, N,N-diethylcyclohexylamine, N-methyldicyclohexylamine, N-ethyldicyclohexylamine, pyrrolidine, 1-methylpyrrolidine, 2,5-dimethylpyrrolidine, piperidine, 1-methylpiperidine, 2,2,6,6-tetramethylpiperidine, piperazine, 1,4-dimethylpiperazine, quinuclidine, 1,4-diazabicyclo[2,2,2]-octane, hexamethylenetetramine, morpholine, 4-methylmorpholine, pyridine, picoline, 4-dimethylaminopyridine, lutidine, 1,8-diazabicyclo[5,4,0]-7-undecene (DBU), N,N'-dicyclohexylcarbodiimide (DCC), diisopropylethylamine, and a Schiff base.

Examples of the metal alkoxide compound include sodium methoxide, sodium ethoxide, and potassium t-butoxide. Only a single base compound may be used, or a mixture of two or more base compounds may be used.

In the elimination reaction, the solvent for adding the base may be, for example, ethylene dichloride, cyclohexanone, methyl ethyl ketone, acetone, methanol, ethanol, propanol, butanol, ethyleneglycol monomethyl ether, ethyleneglycol monoethyl ether, 2-methoxyethyl acetate, 1-methoxy-2-propanol, 1-methoxy-2-propyl acetate, N,N-dimethylformamide, N,N-dimethylacetamide, dimethylsulfoxide, toluene, ethyl acetate, methyl lactate, ethyl lactate, or water. Only a single type of solvent may be used, or two or more types of solvents may be used in combination.

The amount of the base to be used may be not larger than an amount equivalent to the amount of the specific functional groups in the compound, or may be not smaller than the amount equivalent to the amount of the specific functional groups in the compound.

When an excessive amount of a base is used, it is preferable to add an acid or the like after the elimination reaction so as to remove the excessive base. The acid may be an inorganic acid such as hydrochloric acid, sulfuric acid, nitric acid, hydrobromic acid, and perchloric acid, or an organic acid such as acetic acid, fluoroacetic acid, trifluoroacetic acid, methanesulfonic acid, p-toluenesulfonic acid, and trifluoromethanesulfonic acid.

The temperature at the elimination reaction may be room temperature, a lowered temperature, or an elevated temperature. The temperature is preferably −20° C. to 100° C.

Examples of radical-polymerizable compounds each represented by formula (4) or (5) are shown below, but the examples should not be construed as limiting the invention.

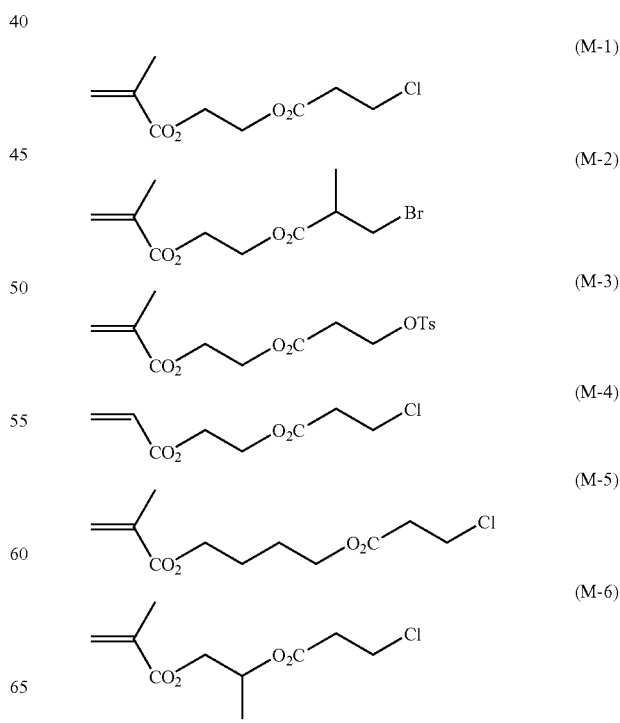

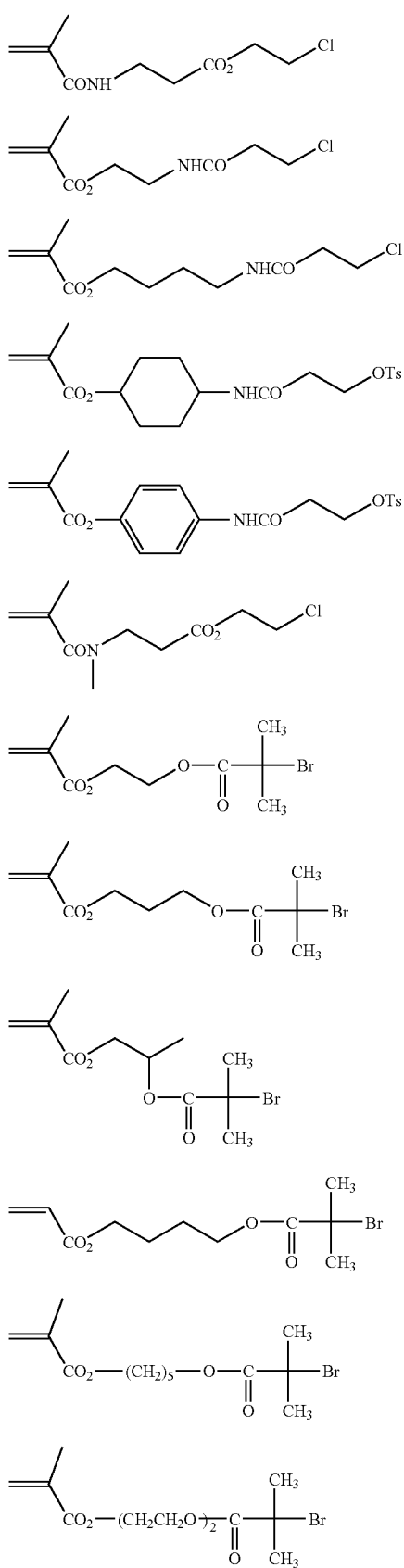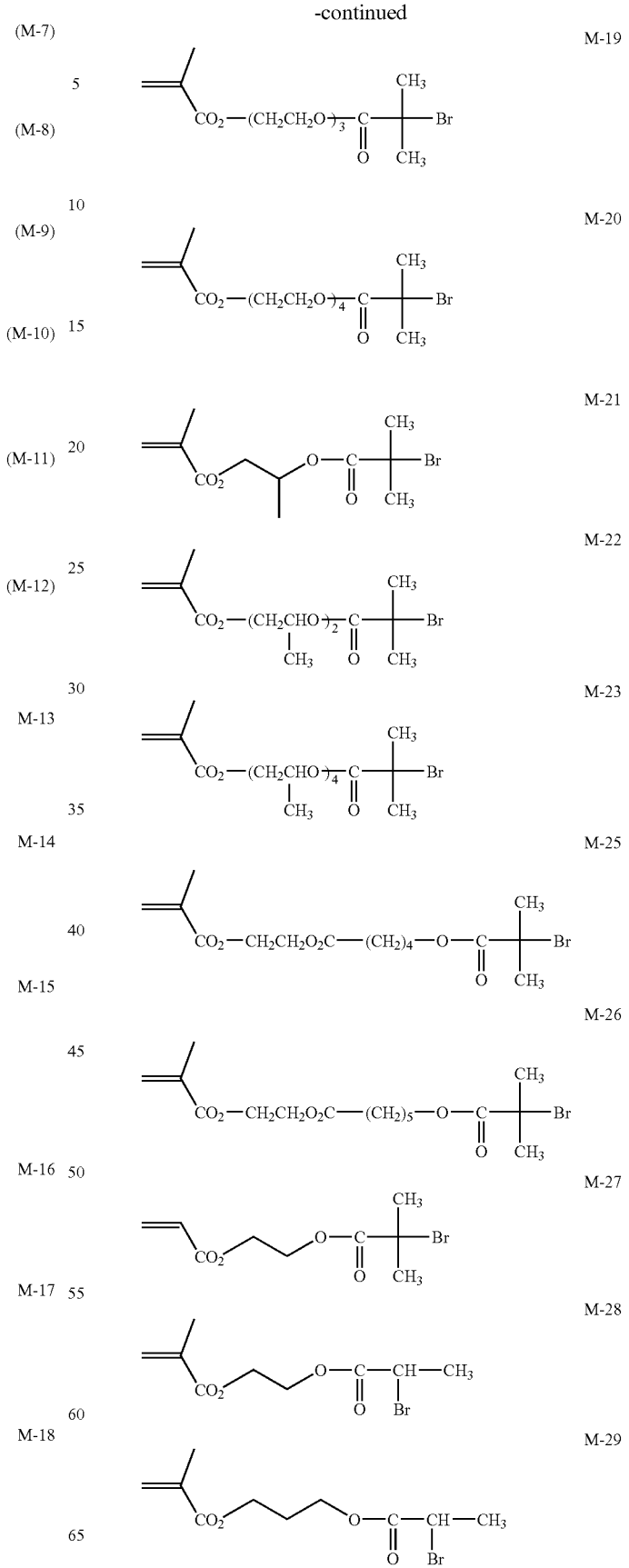

-continued
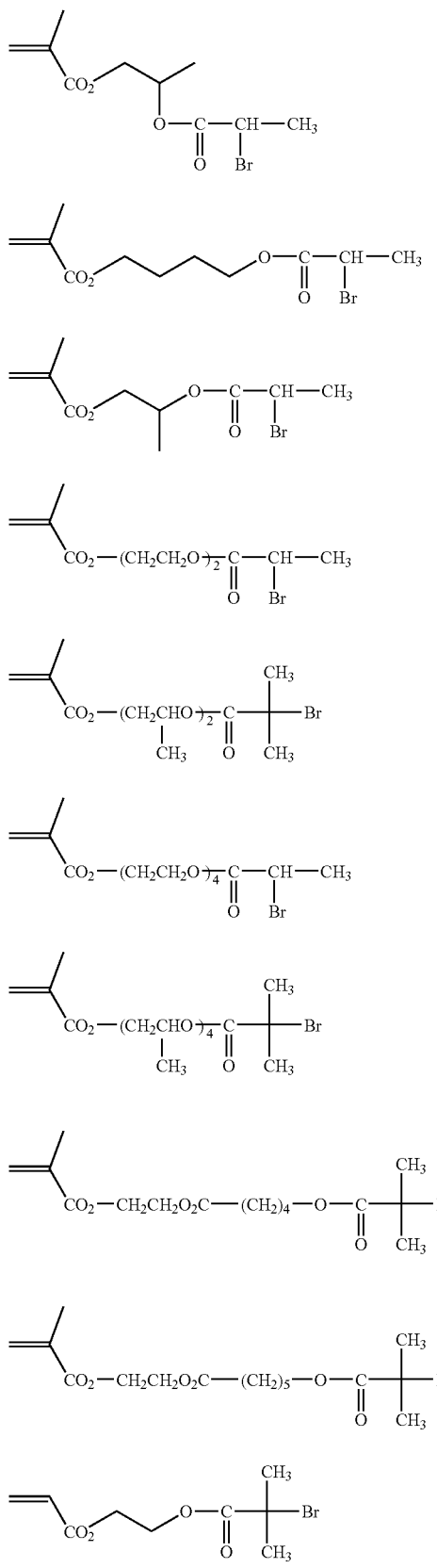
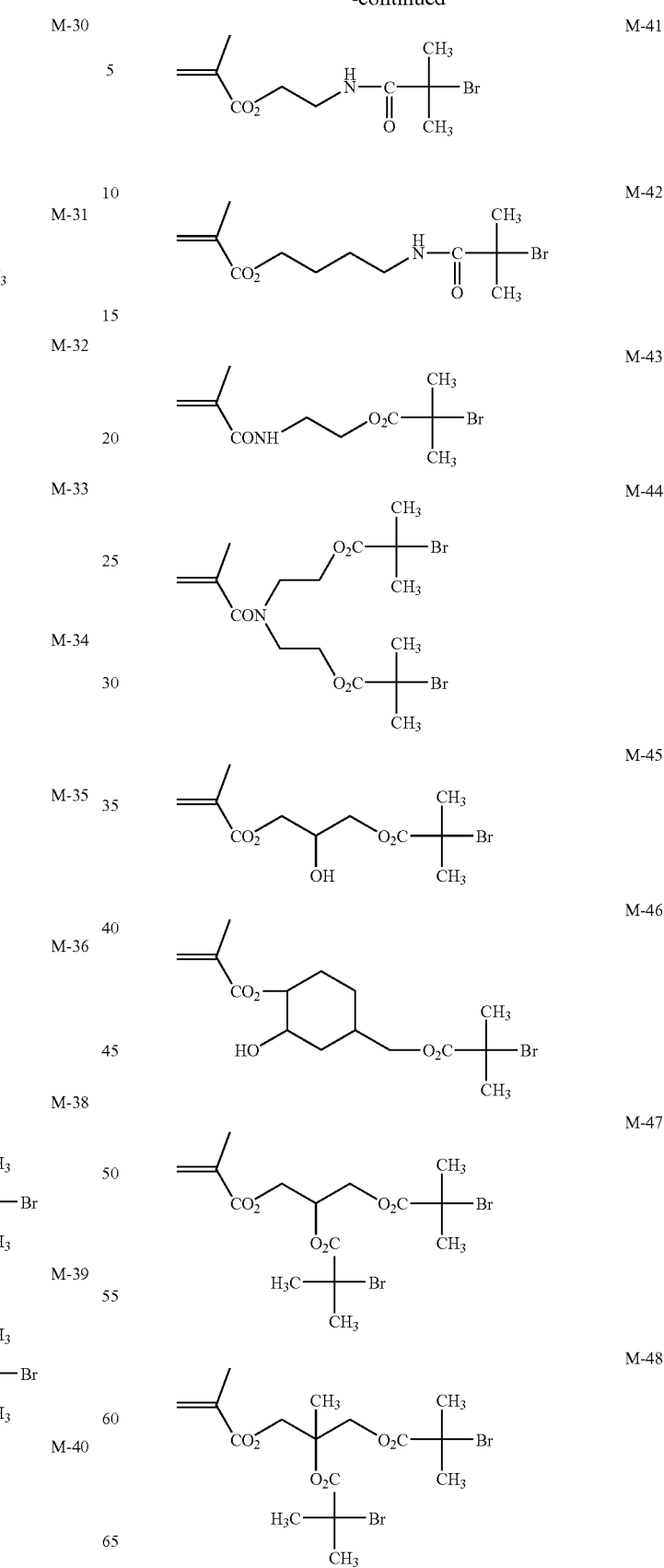

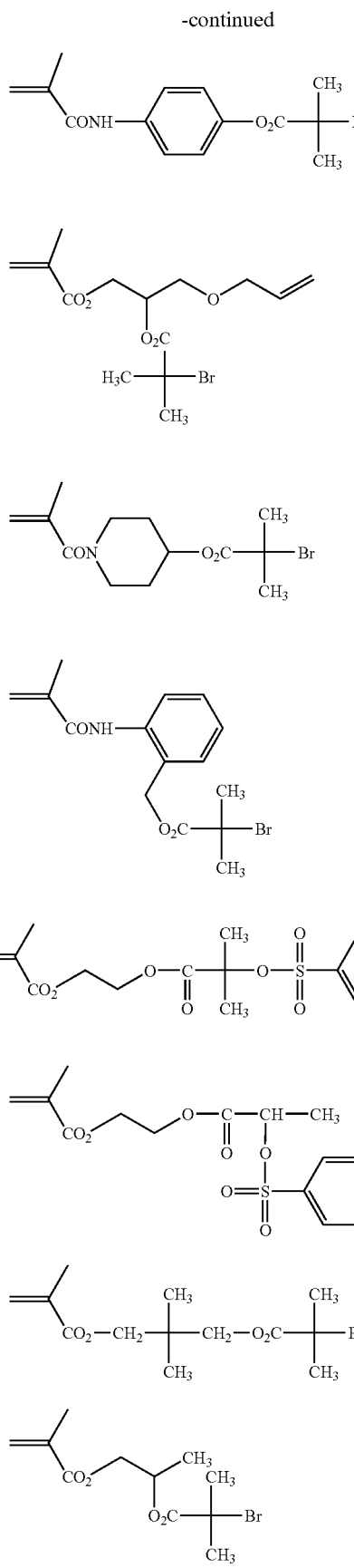

-continued

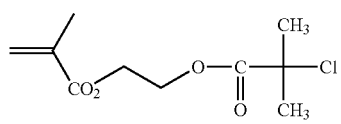
M-67

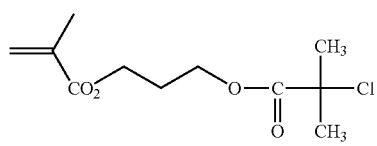
M-68

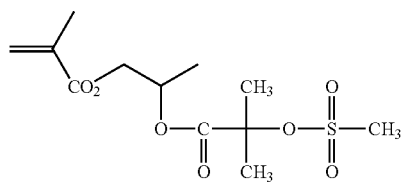
M-69

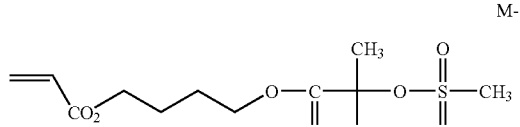
M-70

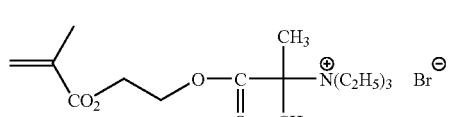
M-71

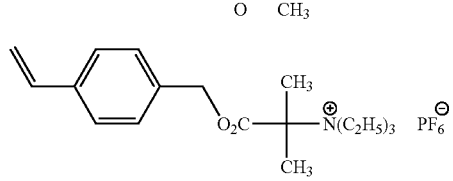
M-72

Synthesis Method (2)

This method comprises: synthesizing a trunk polymer compound (compound constituting the main chain) by polymerization of at least one radical polymerizable compound having a functional group; and allowing a functional group on a side chain of the trunk polymer compound to react with a compound having a structure represented by the following formula (6).

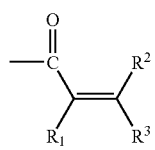
(6)

The functional group on the radical polymerizable compound used for the synthesis of the trunk polymer compound in the synthesis method (2) may be, for example, a hydroxyl group, a carboxyl group, a carboxylic acid halide group, an anhydrous carboxylic acid group, an amino group, a halogenated alkyl group, an isocyanate group, or an epoxy group. The radical polymerizable compound having such a functional group may be, for example, 2-hydroxyethyl acrylate, 2-hydroxyethyl methacrylate, 4-hydroxybutyl acrylate, 4-hydroxybutyl methacrylate, acrylic acid, methacrylic acid, acrylic acid chloride, methacrylic acid chloride, methacrylic acid anhydride, N,N-dimethyl-2-aminoethyl methacrylate, 2-chloroethyl methacrylate, 2-isocyanic acid ethyl methacrylate, glycidyl acrylate, or glycidyl methacrylate. In the method, polymerization of at least one type of radical-polymerizable compound described above is conducted while other radical-polymerizable compounds may be optionally added, so as to form a trunk polymer compound, and then a compound having a group represented by formula (6) is allowed to react with the trunk polymer compound to form the desired polymer compound. Examples of the compound having a group represented by formula (6) include the above-described examples of the radical-polymerizable compound having a functional group.

A specific polymer (B) having a group represented by formula (2) can be synthesized by at least one of the following synthesis methods (3) and (4).

Synthesis Method (3)

This method comprises: polymerizing at least one radical-polymerizable compound having a first unsaturated group represented by formula (2) and a second ethylenic unsaturated group with higher addition-polymerizability than the first unsaturated group while optionally adding other radical-polymerizable compound, so as to form a polymer compound. This method uses a compound having two or more ethylenic unsaturated group with different addition-polymerizability, such as an allyl methacrylate.

Synthesis Method (4)

This method comprises: polymerizing at least one radical-polymerizable compound having a functional group to form a polymer compound; and then allowing the functional group on a side chain to react with a compound having a structure represented by the following formula (7) so as to incorporate a group represented by formula (2) into the polymer compound.

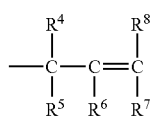
(7)

The radical-polymerizable compound having a first unsaturated group represented by formula (2) and a second ethylenic unsaturated group with a higher addition-polymerizability than the first unsaturated group may be, for example, allyl acrylate, allyl methacrylate, 2-allyloxyethyl acrylate, propargyl acrylate, propargyl methacrylate, N-allyl acrylate, N-allyl methacrylate, N,N-diallyl acrylate, N,N-diallyl methacrylate, allyl acrylamide, or allyl methacrylamide. Examples of the polymer compound obtained by polymerizing at least one radical-polymerizable compound having a functional group include the examples of the radical-polymerizable group having a functional group described in the synthesis example (2).

The compound having a structure represented by formula (7) may be allyl alcohol, allyl amine, diallyl amine, 2-allyloxyethyl alcohol, 2-chloro-1-butene, or allyl isocyanate.

A specific polymer compound (B) having a group represented by formula (3) on a side chain can be synthesized by at least one of the following synthesis methods (5) and (6).

Synthesis Method (5)

This method comprises: polymerizing at least one radical-polymerizable compound having a first unsaturated group represented by formula (3) and a second ethylenic unsaturated group with higher addition-polymerizability than the first unsaturated group while optionally adding other radical-polymerizable compound, so as to form a polymer compound.

Synthesis Method (6)

This method comprises: polymerizing at least one radical-polymerizable compound having a functional group to form a polymer compound; and then allowing the functional group on a side chain to react with a compound having a structure represented by the following formula (8) so as to incorporate a group represented by formula (3) into the polymer compound.

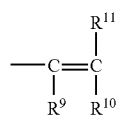

(8)

The radical-polymerizable compound having a first unsaturated group represented by formula (3) and a second ethylenic unsaturated group with a higher addition-polymerizability than the first unsaturated group may be, for example, vinyl acrylate, vinyl methacrylate, 2-phenylvinyl acrylate, 2-phenylvinyl methacrylate, 1-propenyl acrylate, 1-propenyl methacrylate, vinyl acrylamide, or vinyl methacrylamide. Examples of the polymer compound obtained by polymerizing at least one radical-polymerizable compound having a functional group include the examples of the radical-polymerizable group having a functional group described in the synthesis example (2). The compound having a structure represented by formula (8) may be 2-hydroxyethyl monovinyl ether, 4-hydroxybutyl monovinyl ether, diethylene glycol monovinyl ether, or 4-chloromethylstyrene.

(Thermal Polymerization Inhibitor)

In the synthesis methods of specific polymer (B), it is preferable to use a thermal polymerization inhibitor in order to inhibit thermal radical reaction of the generated radical-reactive group. The thermal polymerization inhibitor may be hydroquinone, p-methoxyphenol, di-t-butyl-p-cresol, pyrogallol, t-butyl catecol, benzoquinone, 4,4'-thiobis(3-methyl-6-t-butylphenol), 2,2'-methylene bis(4-methyl-6-t-butylphenol), N-nitroso-N-phenylhydroxylamine aluminum salt, 2,2,6,6,-tetramethylpyperidine-1-oxyl-(TEMPO), 4-hydroxy-TEMPO free radical, 3,3,5,5-tetramethyl-1-pyrroline-N-oxide, 4-oxo-2,2,6,6-tetramethylpiperidine-1-oxyl, 3-(aminomethyl)proxyl free radical, 3-carboxy-proxyl free radical, 4-amino-TEMPO free radical, 4-carboxy-TEMPO free radical, a thiosulfate compound, a ferrocene compound, a thiol compound, a sulfide compound, a disulfide compound, or a borate salt compound. The amount of the thermal polymerization inhibitor is 10 ppm to 10% by weight based on the weight of the reaction system.

Preferably, the specific polymer (B) does not have an alkali-soluble group. A radical-polymerizable compound having a hydrophilic group may be included in the specific polymer (B) as a copolymerization component for the purpose of improving on-press developability or the like. The hydrophilic group may be an amide group, a hydroxyl group, an ether group, or an onium salt group, preferably a sulfonic acid group, an amide group, a hydroxyl group or an ether group. Examples of the radical-polymerizable compound having a hydrophilic group include acrylamide, methacrylamide, N,N-dimethylacrylamide, N-isopropylacrylamide, N-vinyl pyrrolidone, N-vinyl acetoamide, N-acryloyl morpholine, 2-hydroxyethyl acrylate, 2-hydroxyethyl methacrylate, glycerol monomethacrylate, glycerol monoacrylate, methoxypolyethyleneglycol monomethacrylate, methoxypolyethyleneglycol monoacrylate, polyethyleneglycol monomethacrylate, polyethyleneglycol monoacrylate, polypropylene glycol monomethacrylate, polypropyleneglycol monoacrylate, polyethyleneglycol-polypropyleneglycol monomethacrylate, polyethyleneglycol-polypropyleneglycol monoacrylate, poly(ethyleneglycol-tetramethyleneneglycol) monomethacrylate, poly(ethyleneglycol-tetramethyleneglycol) monoacrylate, poly(propyleneglycol-tetramethyleneglycol) monomethacrylate, and poly(propyleneglycol-tetramethyleneglycol) monoacrylate. A single type of radical-polymerizable compound having a hydrophilic group may be added, or two or more types of such compounds may be added. The proportion of the radical-polymerizable compound having a hydrophilic group to the entire copolymer is preferably 0 to 85% by mol, more preferably 5 to 70% by mol.

It is preferable to incorporate other radical-polymerizable compounds than those described above into the specific polymer (B) as copolymerization components for the purpose of improving properties such as image strength as long as the effect of the invention is maintained. The radical-polymerizable compounds which can be included in the specific polymer (B) as copolymer components may be selected from acrylic esters, methacrylic esters, N,N-bis-substituted acrylamides, N,N-bis-substituted methacrylamides, styrenes, acrylonitriles, and methacrylonitrils.

Examples of the radical-polymerizable compounds which can be included in the specific polymer (B) as copolymer components include: acrylic esters such as alkyl acrylates (the number of carbon atoms in the alkyl group is preferably 1 to 20, and the alkyl acrylates include methyl acrylate, ethyl acrylate, propyl acrylate, butyl acrylate, amyl acrylate, ethylhexyl acrylate, octyl acrylate, t-octyl acrylate, chloroethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate, and tetrahydrofurfuryl acrylate); aryl acrylates such as phenyl acrylate; methacrylic esters such as alkyl methacrylates (the number of carbon atoms in the alkyl group is preferably 1 to 20, and the alkyl methacrylates include methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, and tetrahydrofurfuryl methacrylate); aryl methacrylates such as phenyl methacrylate, cresyl methacrylate, and naphtyl methacrylate; styrenes such as styrene and alkyl styrenes (examples thereof include methylsyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, and acetoxymethylstyrene); alkoxy styrenes such as methoxystyrene, 4-methoxy-3-methylstyrene, and dimethoxystyrene; halogen styrenes such as chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, and 4-fluoro-3-trifluoromethylstyrene; acrylonitrile; and methacrylonitrile. Among them, acrylic esters, methacrylic esters and styrenes are preferable. Only one radical-polymerizable compound or two or more radical-polymerizable compounds may be copolymerized with the compound having a group represented by formula (1), (2), or (3). The proportion of such other radical-polymerizable compounds in the specific polymer (B) is 0 to 95% by mol, more preferably 20 to 90% by mol.

The specific polymer (B) may be a homopolymer, or a copolymer of some radical-polymerizable compounds each having a group represented by formula (1), (2), or (3), or a copolymer of at least one radical-polymerizable compound having a group represented by formula (1), (2), or (3) and at least one such other radical-polymerizable compound as described above. When the specific polymer (B) is a copolymer, the copolymer may be a block copolymer, a random copolymer or a graft copolymer.

The solvent to be used for synthesis of the specific polymer (B) may be, for example, ethylene dichloride, cyclohexanone, methyl ethyl ketone, acetone, methanol, ethanol, propanol, butanol, ethyleneglycol monomethyl ether, ethyleneglycol monoethyl ether, 2-methoxyethyl acetate, 1-methoxy-2-propanol, 1-methoxy-2-propyl acetate, N,N-dimethyl formamide, N,N-dimethyl acetoamide, dimethyl sulfoxide, toluene, ethyl acetate, methyl lactate, or ethyl lactate. Only a single solvent may be used, or a mixture of two or more solvents may be used.

The specific polymer (B) has a weight-average molecular weight of preferably 2,000 or larger, more preferably 5,000 to 300,000. The specific polymer (B) may include unreacted monomers. The content of the unreacted monomers in the specific polymer (B) is preferably 15% by weight or lower.

The content of the specific polymer (B) in the planographic printing plate precursor of the second embodiment is preferably 5 to 95% by mass based on the solid content of the photopolymerizable layer, more preferably 10 to 85% by mass based on the solid content of the photopolymerizable layer. When the content of the specific polymer (B) is in the above ranges, the strength of image portions and image-forming property are improved.

The photopolymerizable layer of the second embodiment may further include the specific polymer (A) described above. In this case, preferable examples of the specific polymer (A) are the same as in the first embodiment.

Polymerizable Compound

A polymerizable compound may be used in the polymerizable composition of the first embodiment or in the photopolymerizable layer of the second embodiment. The polymerizable compound is an addition-polymerizable compound having at least one ethylenic unsaturated double bond. The number of ethylenic unsaturated bond in the polymerizable compound is at least one, preferably two or more. Such a compound is well-known in the art, and is not particularly limited. The polymerizable compound may be a monomer, a prepolymer such as a dimer, a trimer, or an oligomer, or a mixture thereof, or a copolymer thereof. The monomer or copolymer of monomers may be, for example, an unsaturated carboxylic acid (such as acrylic acid, methacrylic acid, itaconic acid, crotonic acid, isocrotonic acid or maleic acid), or an ester or amide of such an unsaturated carboxylic acid, and is preferably: an ester of an unsaturated carboxylic acid and an aliphatic polyhydric alcohol; an amide of an unsaturated carboxylic acid and an aliphatic polyamine; a product of an addition-reaction between an unsaturated carboxylic ester or amide having a nucleophilic substituent such as a hydroxyl group, an amino group, and a mercapto group, and a monofunctional or polyfunctional isocyanate or epoxy; a product of dehydration-condensation of such an unsaturated carboxylic ester or amide having a nucleophilic group and a monofunctional or polyfunctional carboxylic acid; a product of an addition-reaction between an unsaturated carboxylic ester or amide having an electrophilic substituent such as isocyanate group or an epoxy group and a monofunctional or polyfunctional alcohol, amine, or thiol; or a product of substitution reaction of an unsaturated carboxylic ester or amide having a dissociative group such as a halogen group or a tosyloxy group with a monofunctional or polyfunctional alcohol, amine or thiol. The unsaturated carboxylic acid used in the above examples may be replaced by an unsaturated phosphonic acid, styrene, or a vinyl ether.

When the monomer is an ester between an aliphatic polyhydric alcohol and an unsaturated carboxylic acid, examples of the monomer include: acrylic esters such as ethyleneglycol diacrylate, triethyleneglycol diacrylate, 1,3-butanediol diacrylate, tetramethyleneglycol diacrylate, propyleneglycol diacrylate, neopentylglycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethyleneglycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, and polyester acrylate oligomer isocyanurate EO-modified triacrylate; methacrylic esters such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, and bis[p-(acryloxyethoxy)phenyl]dimethylmethane; itaconic esters such as ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate; crotonic esters such as ethylene glycol dicrotonate, tetramethylene glycol dicrotonate, pentaerythritol dicrotonate, and sorbitol tetracrotonate; isocrotonic esters such as ethylene glycol diisocrotonate, pentaerythritol diisocrotonate, and sorbitol tetraisocrotonate; maleic esters such as ethylene glycol dimaleate, triethylene glycol dimaleate, pentaerythritol dimaleate, and sorbitol tetramaleate; and mixtures of two or more ester monomers which may be selected from the above ester monomers.

Other examples of esters include esters of aliphatic alcohols described in JP-B No. 51-47334 and JP-A No. 57-196231 (the disclosures of which are incorporated herein by reference), esters having aromatic skeletons described in JP-A Nos. 59-5240, 59-5241, and 2-226149 (the disclosures of which are incorporated herein by reference), and esters having amino groups described in JP-A No. 1-165613 (the disclosure of which is incorporated herein by reference). A mixture of ester monomers can also be used.

When the monomer is an amide between an aliphatic polyamine compound and an unsaturated carboxylic acid, examples thereof include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide. Amide monomers having cyclohexylene structures disclosed in JP-B No. 54-21726 (the disclosure of which is incorporated herein by reference) are also preferable.

Urethane-based addition-polymerizable compounds each prepared by addition-reaction between an isocyanate and a hydroxyl group are also preferable and example thereof include vinylurethane compounds described in JP-B No.

48-41708 (the disclosure of which is incorporated by reference herein) which each have two or more polymerizable vinyl groups and which are each obtained by adding a vinyl monomer having a hydroxyl group represented by the following formula (A) to a polyisocyanate compound having two or more isocyanate groups.

   Formula (A)

In formula (A), $R^{V1}$ and $R^{V2}$ each independently represent H or $CH_3$.

Other examples of the monomer include: urethane acrylates disclosed in JP-A No. 51-37193 and JP-B Nos. 2-32293 and 2-16765 (the disclosures of which are incorporated herein by reference); urethane compounds having ethylene oxide skeletons such as urethane compounds disclosed in JP-B Nos. 58-49860, 56-17654, 62-39417, and 62-39418 (the disclosures of which are incorporated herein by reference); addition-polymerizable compounds having an amino structure or a sulfide structure disclosed in JP-A Nos. 63-277653, 63-260909, and 1-105238 (the disclosures of which are incorporated herein by reference), which enables remarkably quick exposure of the photopolymerizable composition or photopolymerizable layer.

Still other examples of the monomer include: polyester acrylates such as polyester acrylates disclosed in JP-A No. 48-64183 and JP-B Nos. 49-43191 and 52-30490 (the disclosures of which are incorporated herein by reference); polyfunctional acrylates and methacrylates such as epoxy acrylates obtained by a reaction of an epoxy resin and (meth)acrylic acid; unsaturated compounds disclosed in JP-B Nos. 46-43946, 1-40337, and 1-40336 (the disclosures of which are incorporated herein by reference); vinylphosphonic acid compounds disclosed in JP-A No. 2-25493 (the disclosure of which is incorporated herein by reference); monomers having perfluoroalkyl groups disclosed in JP-A No. 61-22048 (the disclosure of which is incorporated herein by reference); and photocurable monomer and oligomer disclosed in *Nihon Secchaku Kyoukaishi* vol. 20 (1984), No. 7, pp. 300 to 308, the disclosure of which is incorporated herein by reference.

The polymerizable compound may be a polyfunctional styrene crosslinking agent represented by the following formula, which is described in JP-A No. 2001-290271, pp. 13 to 14, the disclosure of which is incorporated herein by reference. This polyvalent styrene crosslinking agent has two or more phenyl groups each having a vinyl group. When such a polyvalent styrene crosslinking agent is used, styryl radicals are generated by a polymerization initiator, and then the styryl radicals combine with each other, so that the polymerizable composition or the photopolymerizable layer is crosslinked, thereby achieving higher sensitivity.

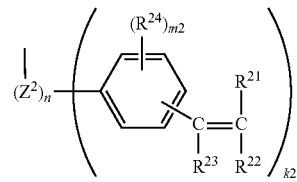

In the formula, $Z^2$ represents a connecting group, $R^{21}$, $R^{22}$, and $R^{23}$ each independently represent a hydrogen atom, a halogen atom, a carboxyl group, a sulfo group, a nitro group, a cyano group, an amide group, an amino group, an alkyl group, an aryl group, an alkoxy group, or an aryloxy group, each of which may be substituted by an alkyl group, an amino group, an aryl group, an alkenyl group, a carboxyl group, a sulfo group, a hydroxyl group, or the like. $R^{24}$ represent a group or atom which can be bonded to the benzene ring. $m^2$ represents an integer of 0 to 4, and $k^2$ represents an integer of 2 or larger.

The connecting group represented by $Z^2$ may be —O—, —S—, an alkylene group, an alkenylene group, an arylene group, —N($R^5$)—, —C=(O)—O—, —C($R^6$)=N—, —C=(O)—, a sulfonyl group, a heterocyclic group, or a connecting group comprised of a combination of two or more connecting groups which may be selected from the above connecting groups. $R^5$ and $R^6$ each independently represent a hydrogen atom, an alkyl group, or an aryl group. The connecting group represented by $Z^2$ may have a substituent such as an alkyl group, an aryl group, or a halogen atom.

When the connecting group represented by $Z^2$ contains a heterocyclic group, the heterocyclic group may be a nitrogen-containing heterocyclic ring such as a pyrrole ring, a pyrazole ring, an imidazole ring, a triazole ring, a tetrazole ring, an isooxazole ring, an oxazole ring, an oxadiazole ring, an isothiazole ring, a thiazole ring, a thiadiazole ring, a thiatriazole ring, an indole ring, an indazole ring, a benzimidazole ring, a benzotriazole ring, a benzoxazole ring, a benzthiazole ring, a benzoselenazole ring, a benzothiadiazole ring, a pyridine ring, a pyridazine ring, a pyrimidine ring, a pyrazine ring, a triazine ring, a quinoline ring or a quinoxaline ring, or a furan ring, or a thiophene ring, each of which may have a substituent such as an alkyl group, an aryl group, or a halogen atom.

The polyfunctional styrene crosslinking agent is preferably a compound in which $R^{21}$ and $R^{22}$ are both hydrogens, $R^{23}$ is a hydrogen atom or a lower-alkyl group having 4 or less carbon atoms (such as a methyl group or an ethyl group), and m is 2 to 10. In the following, examples ((C-1) to (C-11)) of the polyfunctional styrene crosslinking agent are shown below, but the examples should not be construed as limiting the invention.

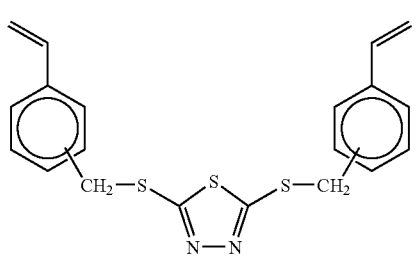

(C-1)

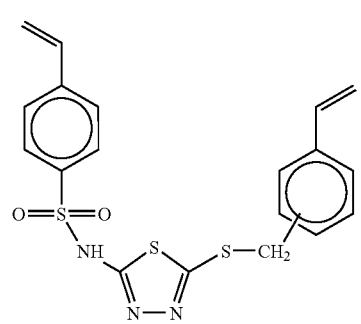

(C-2)

-continued
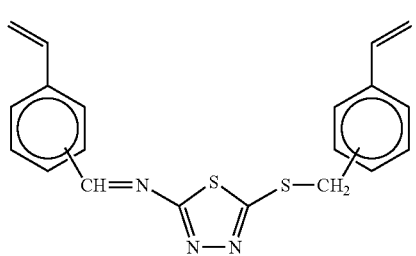
(C-3)
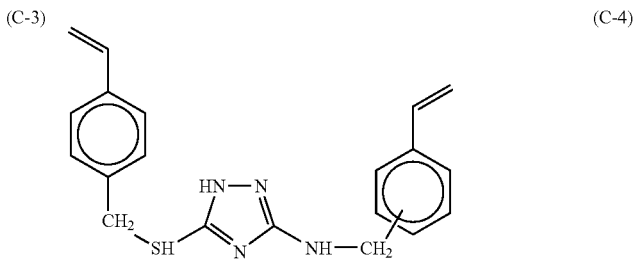
(C-4)
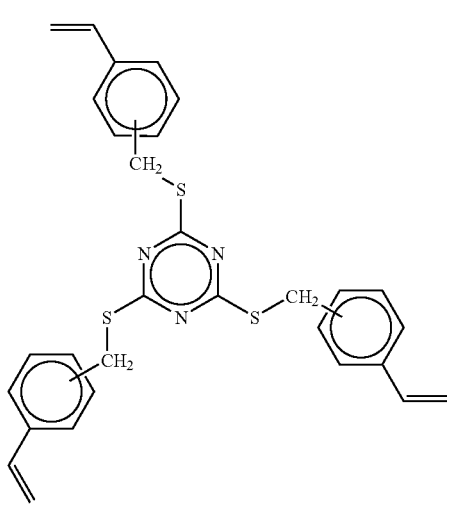
(C-5)
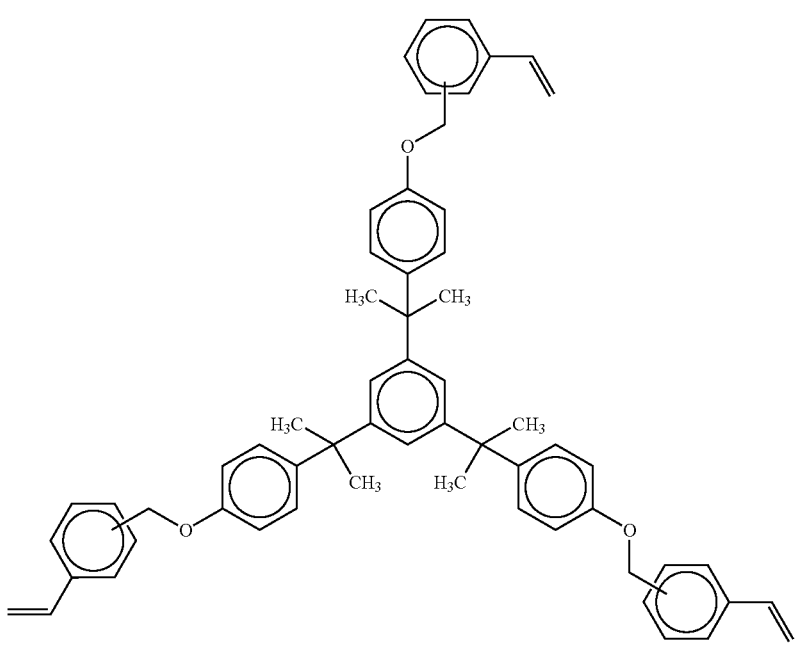
(C-6)

-continued
(C-7)
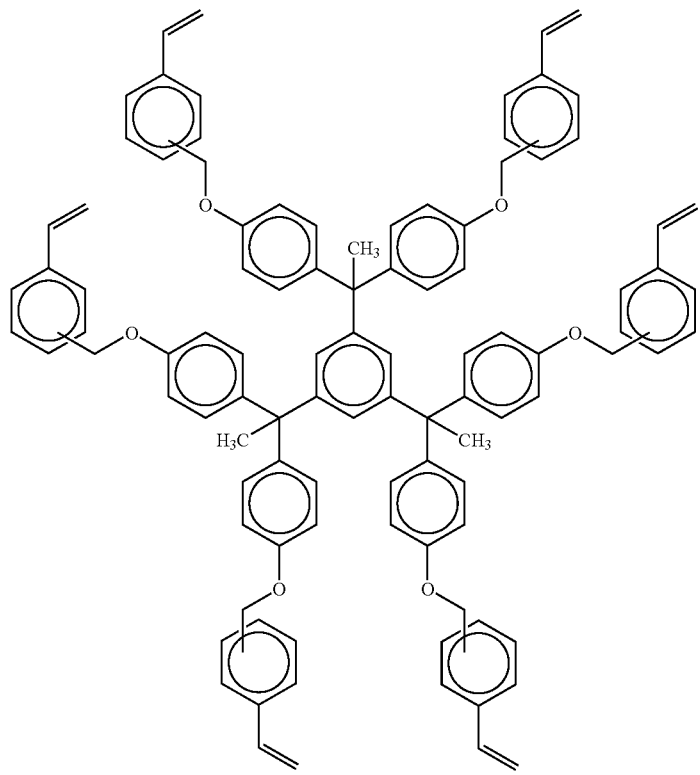
(C-8)
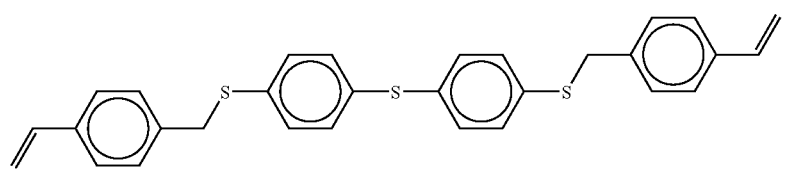
(C-9)
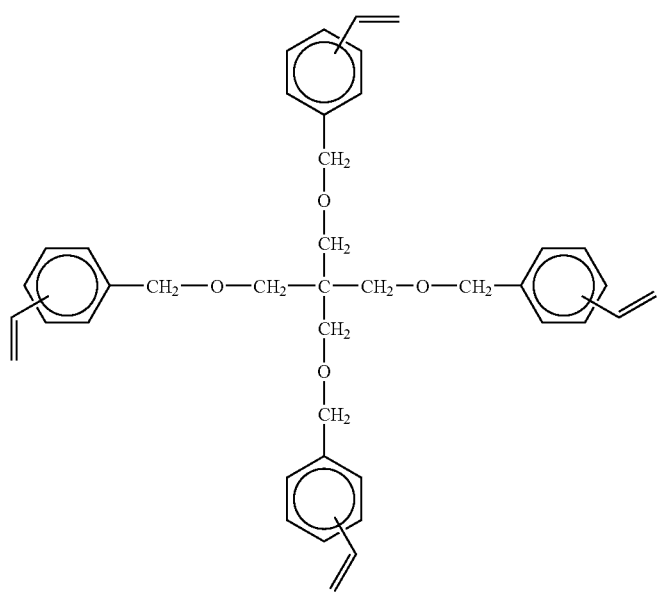

-continued (C-10)

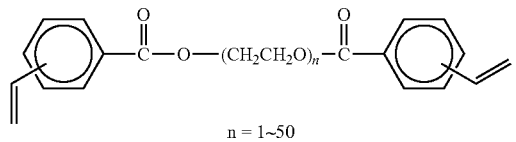

n = 1~50

(C-11)

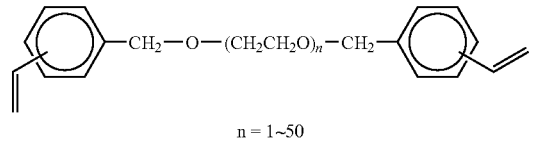

n = 1~50

In the invention, these monomers may be used in the form of a prepolymer such as a dimer, a trimer, or an oligomer, in the form of a mixture thereof, or in the form of a copolymer thereof.

The polymerizable group to be used is preferably an ester between an unsaturated carboxylic acid and an aliphatic polyhydric alcohol compound or an amide between an unsaturated carboxylic acid and an aliphatic polyamine compound, more preferably an ester between an unsaturated carboxylic acid and an aliphatic polyhydric alcohol compound from the viewpoint of developability and printing durability of the recording layer of the resultant planographic printing plate precursor.

In the first embodiment, the amount of the polymerizable compound to be used is preferably 5 to 90% by mass based on the total amount of the solids in the polymerizable composition, more preferably 10 to 80% by mass, still more preferably 20 to 75% by mass, from the viewpoint of film forming property, printing durability, and storage stability.

In the second embodiment, the amount of the polymerizable compound is preferably 5 to 80% by mass based on the involatile components in the photopolymerizable layer, more preferably 25 to 75% by mass. Only a single polymerizable compound may be used or two or more polymerizable compounds may be used. Details of use of the addition-polymerizable compound may be determined in consideration of the degree of polymerization inhibition by oxygen, resolution, fogging, change in refractive index, and surface adhesiveness. An appropriate structure, an adequate amount to be added, and an appropriate composition of the polymerizable compound may be determined in consideration of the above factors. In some cases, a layer constitution and a coating method such as undercoating and overcoating may be adopted.

The details of use of the polymerizable compound may be determined in accordance with the desired properties of the resultant planographic printing plate precursor, the details include the structure of the polymerizable compound, the amount of the polymerizable compound, and whether only a single polymerizable compound is used or two or more polymerizable compounds are used. The details may be determined in consideration of the factors described below.

From the viewpoint of sensitivity, the amount of unsaturated groups per molecule is preferably large, and, in many cases, the polymerizable compound preferably has two or more unsaturated groups. In order to heighten the strength of image portions (cured film), the polymerizable compound preferably has three or more unsaturated groups. It is preferable to adjust both sensitivity and strength by using polymerizable compounds each having a different number of unsaturated groups and/or a different type of polymerizable group (which may be selected from an acrylic ester, a methacrylic ester, a styrene compound, or a vinyl ether compound).

The selection and use of the addition-polymerizable compound largely affect the compatibility of the addition-polymerizable compound with other components (such as a binder polymer, an initiator, and a colorant) in the photopolymerizable layer or in the polymerizable composition and dispersibility of the addition-polymerizable compound in such other components. For example, the compatibility with other components can be sometimes improved by use of an addition-polymerizable compound with a low purity or use of two or more addition-polymerizable compounds. A specific structure may be selected in order to improve the adhesion to the support or an overcoat layer described below.

In the invention, there are several methods for incorporating components of the photopolymerizable layer described above and other components into the photopolymerizable layer or for incorporating components of the polymerizable composition into the polymerizable composition. A method disclosed in JP-A No. 2002-287334 (the disclosure of which is incorporated herein by reference) comprises dissolving the components in an appropriate solvent to form a coating liquid and applying the coating liquid so as to make a molecular-dispersion-type image-forming layer. Another method disclosed in JP-A Nos. 2001-277740 and 2001-277742 comprises encapsulating some of the components or all of the components and incorporating the microcapsules into the image-recording layer so as to make a microcapsule-type image-recording layer. In this method, there may be components which are not contained in the microcapsules. The microcapsule-type image-recording layer preferably has such a constitution that hydrophobic components are contained in microcapsules and hydrophilic components are present outside the microcapsules. The image-recording layer is preferably a microcapsule-type image-recording layer from the viewpoint of obtaining superior on-press developability.

Known methods can be used for encapsulating components of the photopolymerizable layer or components of the photopolymerizable composition. The following methods are examples of methods for forming microcapsules: methods using coacervation disclosed in U.S. Pat. Nos. 2,800,457 and 2,800,485 (the disclosures of which are incorporated herein by reference); methods involving surface polymerization disclosed in U.S. Pat. No. 3,287,154 and JP-B Nos. 38-19574 and 42-446 (the disclosures of which are incorporated herein by reference); methods using precipitation of polymers disclosed in U.S. Pat. Nos. 3,418,250 and 3,660,304; methods using isocyanate polyol wall materials disclosed in U.S. Pat. No. 3,796,669 (the disclosure of which is incorporated herein by reference); methods using isocyanate wall materials disclosed in U.S. Pat. No. 3,914,511 (the disclosure of which is incorporated herein by reference); methods using a urea-formaldehyde wall-forming material or a urea formaldehyde-resorcinol wall forming material disclosed in U.S. Pat. Nos. 4,001,140, 4,087,376, and 4089802 (the disclosures of which are incorporated herein by reference); methods using wall materials such as melamine-formaldehyde resins and hydroxycellulose disclosed in U.S. Pat. No. 4,025,445 (the disclosure of which is incorporated herein by reference); in situ methods involving polymerization of monomers disclosed in JP-B Nos. 36-9163 and 51-9079 (the disclosures of which are incorporated herein by reference); spray-drying methods disclosed in GB No. 930422 and U.S. Pat. No. 3,111,407 (the disclosures of which are incorporated herein by reference); and electrolytic dispersion cooling methods disclosed in GB Patent Nos. 952807 and 967074 (the disclosures of which are incorporated herein by reference). Methods other than the above are also usable.

In the invention, the microcapsule wall is preferably a wall which has three-dimensional crosslinking and which can be swollen by a solvent. From such viewpoints, the wall material of the microcapsule is preferably polyurea, polyurethane, polyester, polycarbonate, polyamide, or a mixture thereof, more preferably polyurea or polyurethane. The microcapsule wall may contain a compound having a crosslinkable functional group such as an ethylenic unsaturated bond which compound can be introduced to the binder polymer described above.

The average particle size of the microcapsule is preferably 0.01 to 3.0 µm, more preferably 0.05 to 2.0 µm, still more preferably 0.10 to 1.0 µm. When the average particle diameter of the microcapsule is within the above ranges, the resolution and storage stability are improved.

Polymerization Initiator

The polymerizable composition of the first embodiment and the photopolymerizable layer of the second embodiment preferably contain a polymerization initiator from the viewpoint of sensitivity. The polymerization initiator may be selected from known photopolymerization initiators disclosed in patent documents and other literatures and combinative systems (photopolymerization initiation systems) each comprising two or more photopolymerization initiators.

The photopolymerization initiator is preferably selected from: (a) aromatic ketones; (b) aromatic onium salt compounds; (c) organic peroxides; (d) thio compounds; (e) hexaaryl biimidazole compounds; (f) ketoxime ester compounds; (g) borate compounds; (h) azinium compounds; (i) metallocene compounds; (j) active ester compounds; and (k) compounds having carbon-halogen bond. Specific examples of (a) to (k) are shown below, but such examples are not intended to limit the scope of the invention.

(a) Aromatic Ketones

In the invention, preferred examples of (a) aromatic ketone as a polymerization initiator include the compounds each having a benzophenone skeleton or a thioxanthone skeleton disclosed in J. P. Fouassier and J. F. Rabek, RADIATION CURING IN POLYMER SCIENCE AND TECHNOLOGY, pp. 77-117, 1993, (the disclosure of which is incorporated herein by reference), such as the following compounds:

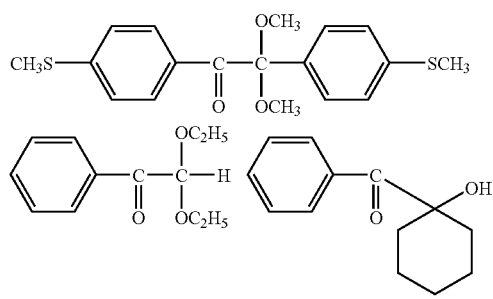

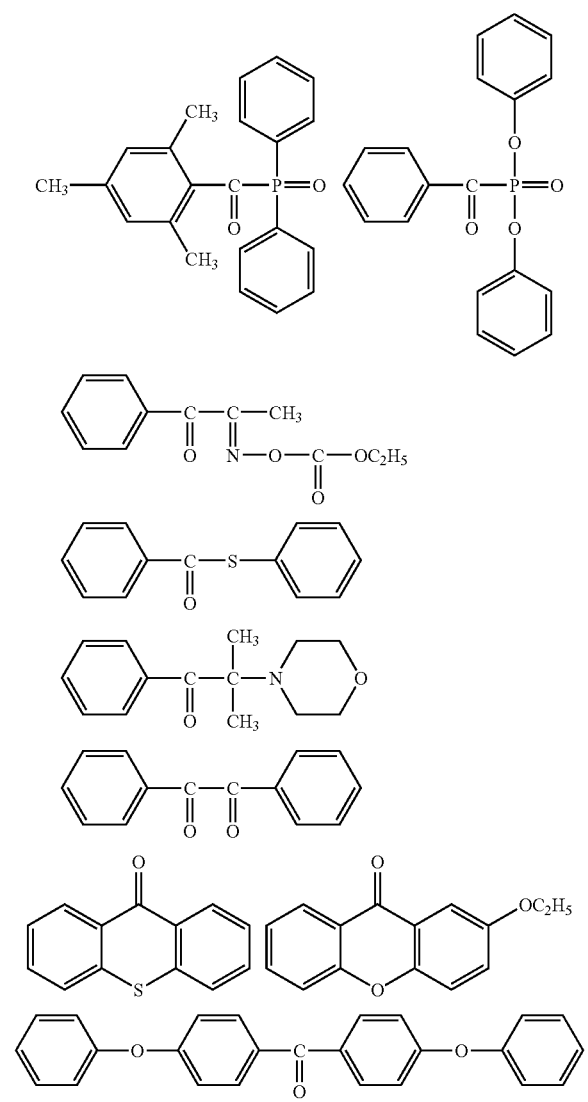

In particular, preferable examples of (a) aromatic ketones include:

α-thiobenzophenone compounds disclosed in JP-B No. 47-6416 (the disclosure of which is incorporated herein by reference) and benzoin ether compounds disclosed in JP-B No. 47-3981 (the disclosure of which is incorporated herein by reference), such as the following compound:

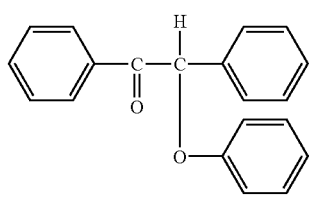

α-substituted benzoin compounds disclosed in JP-B No. 47-22326 (the disclosure of which is incorporated herein by reference), such as the following compound:

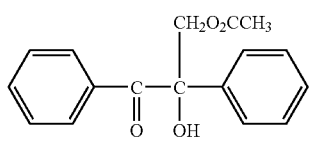

benzoin derivatives disclosed in JP-B No. 47-23664 (the disclosure of which is incorporated herein by reference), aroyl phosphonate esters disclosed in JP-A No. 57-30704 (the disclosure of which is incorporated herein by reference) and dialkoxybenzophenone disclosed in JP-B No. 60-26483 (the disclosure of which is incorporated herein by reference), such as the following compound:

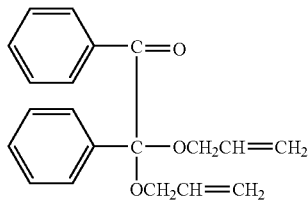

benzoin ethers disclosed in JP-B No. 60-26403 and JP-A No. 62-81345 (the disclosures of which are incorporated herein by reference), such as the following compound:

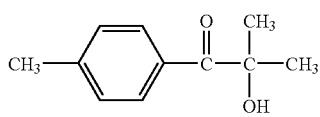

α-aminobenzophenones disclosed in JP-B No. 01-34242, U.S. Pat. No. 4,318,791 and European Patent No. 0284561 A1 (the disclosures of which are incorporated herein by reference), such as the following compounds:

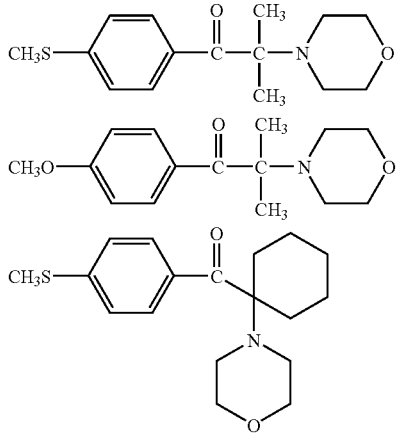

p-di(dimethylaminobenzoyl)benzene disclosed in JP-A No. 2-211452 (the disclosure of which is incorporated herein by reference), such as the following compound:

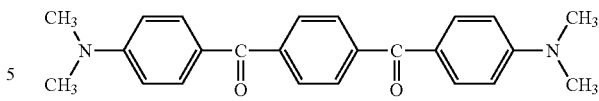

thio-substituted aromatic ketones disclosed in JP-A No. 61-194062 (the disclosure of which is incorporated herein by reference), such as the following compound:

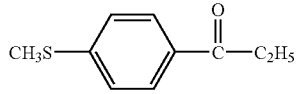

acylphosphine sulfides disclosed in JP-B No. 2-9597 (the disclosure of which is incorporated herein by reference), such as the following compounds:

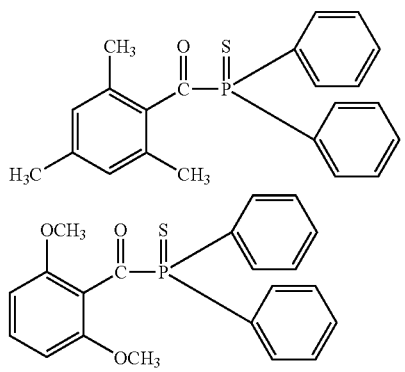

acylphosphines disclosed in JP-B No. 2-9596 (the disclosure of which is incorporated herein by reference), such as the following compounds:

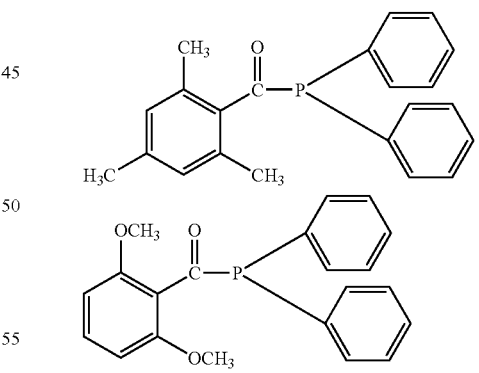

thioxanthones disclosed in JP-B No. 63-61950 (the disclosure of which is incorporated herein by reference), and coumarins disclosed in JP-B No. 59-42864 (the disclosure of which is incorporated herein by reference).

(b) Onium Salt Compounds

In the invention, preferred examples of (b) onium salt compound for use as the structure having the ability to initiate polymerization include the compounds respectively represented by formulae (1) to (3) below.

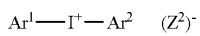 Formula (1)

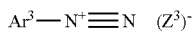 Formula (2)

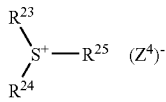 Formula (3)

In formula (1), $Ar^1$ and $Ar^2$ each independently represent an aryl group having 20 or less carbon atoms which may have a substituent. When the aryl group has a substituent, the substituent is preferably a halogen atom, a nitro group, an alkyl group having 12 or less carbon atoms, an alkoxy group having 12 or less carbon atoms, or an aryloxy group having 12 or less carbon atoms. $(Z^2)^-$ represents a counter ion selected from the group consisting of halogen ions, a perchlorate ion, carboxylate ions, a tetrafluoroborate ion, a hexafluorophosphate ion, and sulfonate ions. $(Z^2)^-$ is preferably a perchlorate ion, a hexafluorophosphate ion, or an arylsulfonate ion.

In formula (2), $Ar^3$ represents an aryl group having 20 or less carbon atoms which may have a substituent. The substituent is preferably a halogen atom, a nitro group, an alkyl group having 12 or less carbon atoms, an alkoxy group having 12 or less carbon atoms, an aryloxy group having 12 or less carbon atoms, an alkylamino group having 12 or less carbon atoms, a dialkylamino group having 12 or less carbon atoms, an arylamino group having 12 or less carbon atoms, or a diarylamino group having 12 or less carbon atoms. $(Z^3)^-$ represents a counter ion whose definition is the same as that of $(Z^2)^-$.

In formula (3), $R^{23}$, $R^{24}$ and $R^{25}$ each independently represent a hydrocarbon group having 20 or less carbon atoms which may have a substituent. The substituent is preferably a halogen atom, a nitro group, an alkyl having 12 or less carbon atoms, an alkoxy group having 12 or less carbon atoms, or an aryloxy group having 12 or less carbon atoms. $(Z^4)^-$ represents a counter ion whose definition is the same as that of $(Z^2)^-$.

Examples of (b) onium salt compounds include the onium salt compounds disclosed in JP-A No. 2001-133969, paragraphs [0030]-[0033], JP-A No. 2001-92127, paragraphs [0096]-[0101] and JP-A No. 2001-343742, paragraphs [0015]-[0046], the disclosures of which are incorporated by reference herein.

The onium salt used in the invention preferably has an absorption peak wavelength of 400 nm or shorter, more preferably 360 nm or shorter. When the absorption peak is in the ultraviolet region as described above, the planographic printing plate precursor can be handled under safe light.

(c) Organic Peroxides

Examples of (c) organic peroxide as a polymerization initiator include most organic compounds having at least one oxygen-oxygen bond in the molecule. Specific examples thereof include methyl ethyl ketone peroxide, cyclohexanone peroxide, 3,3,5-trimethylcyclohexanone peroxide, methylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butyl hydroperoxide, cumene hydroperoxide, diisopropylbenzene hydroperoxide, paramethane hydroperoxide, 2,5-dimethylhexane-2,5-dihydroperoxide, 1,1,3,3-tetramethylbutyl hydroperoxide, di-tert-butyl peroxide, tert-butylcumyl peroxide, dicumyl peroxide, bis(tert-butylperoxyisopropyl) benzene, 2,5-dimethyl-2,5-di(tert-butylperoxy)hexane, 2,5-hexanoyl peroxide, succinic peroxide, benzoyl peroxide, 2,4-dichlorobenzoyl peroxide, meta-toluoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl)peroxydicarbonate, tert-butyl peroxyacetate, tert-butyl peroxypivalate, tert-butyl peroxyneodecanoate, tert-butyl peroxyoctanoate, tert-butyl peroxy-3,5,5-trimethylhexanoate, tert-butyl peroxylaurate, tert-carbonate, 3,3',4,4'-tetra(tert-butylperoxycarbonyl)benzophenone, 3,3',4,4'-tetra(tert-amylperoxycarbonyl)benzophenone, 3,3',4,4'-tetra(tert-hexylperoxycarbonyl)benzophenone, 3,3',4,4'-tetra(tert-octylperoxycarbonyl)benzophenone, 3,3',4,4'-tetra(cumylperoxycarbonyl)benzophenone, 3,3',4,4'-tetra(p-isopropylcumylperoxycarbonyl)benzophenone, carbonyl di(tert-butylperoxy dihydrogen diphthalate), and carbonyl di(tert-hexylperoxy dihydrogen diphthalate).

Among them, preferred are peroxide esters such as 3,3',4,4'-tetra(tert-butylperoxycarbonyl)benzophenone, 3,3',4,4'-tetra(tert-amylperoxycarbonyl)benzophenone, 3,3',4,4'-tetra(tert-hexylperoxycarbonyl)benzophenone, 3,3',4,4'-tetra(tert-octylperoxycarbonyl)benzophenone, 3,3',4,4'-tetra(cumylperoxycarbonyl)benzophenone, 3,3',4,4'-tetra(p-isopropylcumylperoxycarbonyl)benzophenone, and di-tert-butyl diperoxyisophthalate.

(d) Thio Compounds

In the invention, preferred examples of (d) thio compounds as polymerization initiators include compounds represented by Formula (4):

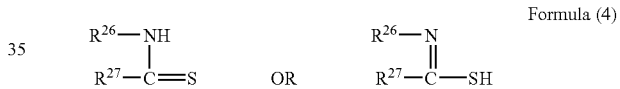 Formula (4)

In formula (4), $R^{26}$ represents an alkyl group, an aryl group or a substituted aryl groups; $R^{27}$ represents a hydrogen atom or an alkyl groups; or $R^{26}$ and $R^{27}$ represent such nonmetallic atomic groups that $R^{26}$ and $R^{27}$ are bonded to each other to form a five- to seven-membered ring optionally containing a hetero atom selected from oxygen atoms, sulfur atoms and nitrogen atoms.

In formula (4), when any of $R^{26}$ and $R^{27}$ represents an alkyl group, the alkyl group preferably has 1 to 4 carbon atoms. When any of $R^{26}$ and $R^{27}$ represents an aryl group, the aryl group is preferably an aryl group having 6 to 10 carbon atoms, such as a phenyl group or a naphthyl group. When any of $R^{26}$ and $R^{27}$ represents a substituted aryl group, the substituted aryl group may be an aryl group substituted by a halogen atom such as a chlorine atom, an aryl substituted by an alkyl group such as a methyl group, or an aryl group substituted by an alkoxy group such as a methoxy group or an ethoxy group. $R^{27}$ is preferably an alkyl group having 1 to 4 carbon atoms. Examples of the thio compound represented by formula (4) include the following compounds:

TABLE 1

| No. | $R^{26}$ | $R^{27}$ |
|---|---|---|
| 1 | —H | —H |
| 2 | —H | —$CH_3$ |
| 3 | —$CH_3$ | —H |
| 4 | —$CH_3$ | —$CH_3$ |
| 5 | —$C_6H_5$ | —$C_2H_5$ |

TABLE 1-continued

| No. | R²⁶ | R²⁷ |
|---|---|---|
| 6 | —C₆H₅ | —C₄H₉ |
| 7 | —C₆H₄Cl | —CH₃ |
| 8 | —C₆H₄Cl | —C₄H₉ |
| 9 | —C₆H₄—CH₃ | —C₄H₉ |
| 10 | —C₆H₄—OCH₃ | —CH₃ |
| 11 | —C₆H₄—OCH₃ | —C₂H₅ |
| 12 | —C₆H₄—OC₂H₅ | —CH₃ |
| 13 | —C₆H₄—OC₂H₅ | —C₂H₅ |
| 14 | —C₆H₄—OCH₃ | —C₄H₉ |
| 15 | —(CH₂)₂— | |
| 16 | —(CH₂)₂—S— | |
| 17 | —CH(CH₃)—CH₂—S— | |
| 18 | —CH₂—CH(CH₃)—S— | |
| 19 | —C(CH₃)₂—CH₂—S— | |
| 20 | —CH₂—C(CH₃)₂—S— | |
| 21 | —(CH₂)₂—O— | |
| 22 | —CH(CH₃)—CH₂—O— | |
| 23 | —C(CH₃)₂—CH₂—O— | |
| 24 | —CH=CH—N(CH₃)— | |
| 25 | —(CH₂)₃—S— | |
| 26 | —(CH₂)₂—CH(CH₃)—S— | |
| 27 | —(CH₂)₃—O— | |
| 28 | —(CH₂)₅— | |
| 29 | —C₆H₄—O— | |
| 30 | —N=C(SCH₃)—S— | |
| 31 | —C₆H₄—NH— | |
| 32 | 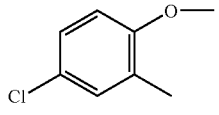 | |

(e) Hexaarylbiimidazole Compounds

In the invention, examples of (e) hexaarylbiimidazole compounds as polymerization initiators include lophine dimers disclosed in JP-B Nos. 45-37377 and 44-86516 (the disclosures of which are incorporated herein by reference), such as 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, and 2,2'-bis(o-trifluorophenyl)-4,4',5,5'-tetraphenylbiimidazole.

(f) Ketoxime Ester Compounds

In the invention, examples of (f) ketoxime ester compounds as polymerization initiators include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-p-toluenesulfonyloxyiminobutan-2-one, and 2-ethoxycarbonyloxyimino-1-phenylpropan-1-one.

(g) Borate Compounds

In the invention, examples of (g) borate compounds as polymerization initiators include compounds represented by formula (5):

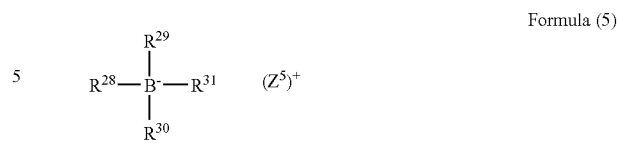

Formula (5)

In formula (5), $R^{28}$, $R^{29}$, $R^{10}$, and $R^{31}$ each independently represent a substituted or unsubstituted alkyl group, a substituted or unsubstituted aryl group, a substituted or unsubstituted alkenyl group, a substituted or unsubstituted alkynyl group, or a substituted or unsubstituted heterocyclic group; two or more of $R^{28}$, $R^{29}$, $R^{30}$, and $R^{31}$ may be combined to form a ring structure; at least one of $R^{28}$, $R^{29}$, $R^{30}$, and $R^{31}$ is a substituted or unsubstituted alkyl group; and $(Z^5)^+$ represents an alkali metal cation or a quaternary ammonium cation.

When any of $R^{28}$ to $R^{31}$ represents an alkyl group, the alkyl may be linear, branched or cyclic and has preferably 1 to 18 carbon atoms. Examples thereof include a methyl group, an ethyl group, a propyl group, an isopropyl group, a butyl group, a pentyl group, a hexyl group, an octyl group, a stearyl group, a cyclobutyl group, a cyclopentyl group, and a cyclohexyl group. When any of $R^{28}$ to $R^{31}$ represents a substituted alkyl group, the substituted alkyl group may be an alkyl group obtained by providing any of the above alkyl groups with a substituent which may be selected from halogen atoms (such as —Cl and —Br), a cyano group, a nitro group, aryl groups (preferably a phenyl groups), a hydroxyl group, —COOR³² groups (wherein $R^{32}$ represents a hydrogen atom, an alkyl having 1 to 14 carbon atoms or an aryl group), —OCOR³³ groups (wherein $R^{33}$ represents an alkyl group having 1 to 14 carbon atoms or an aryl group), —OR³⁴ groups (wherein $R^{34}$ represents an alkyl group having 1 to 14 carbon atoms or an aryl group), and substituents represented by the following formula:

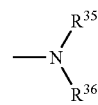

wherein $R^{35}$ and $R^{36}$ each independently represent a hydrogen atom, an alkyl group having 1 to 14 carbon atoms or an aryl group.

When any of $R^{28}$ to $R^{31}$ represents an aryl group, the aryl group may be an aryl group having 1 to 3 rings such as a phenyl group and a naphthyl group. When any of $R^{28}$ to $R^{31}$ represents a substituted aryl group, the substituted aryl group may be an aryl group obtained by providing such an aryl group as described above with a substituent which may be selected from: the substituents cited as examples of the substituent of the substituted alkyl group, and alkyl groups having 1 to 14 carbon atoms. The alkenyl group represented by any of $R^{28}$ to $R^{31}$ may be a linear, branched or cyclic alkenyl group having 2 to 18 carbon atoms. Examples of the substituent in the substituted alkenyl group represented by any of $R^{28}$ to $R^{31}$ include the substituents cited as examples of the substituent in the substituted alkyl group. The alkynyl represented by any of $R^{28}$ to $R^{31}$ may be a linear or branched alkynyl group having 2 to 28 carbon atoms. Examples of the substituent in the substituted alkynyl group represented by any of $R^{28}$ to $R^{31}$ include the substituents cited as examples of the substituent in the substituted alkyl group. The heterocyclic group represented by any of $R^{28}$ to $R^{31}$ may be a heterocyclic group having a heterocycle comprised of five or more atoms including at least one of N, S and O, preferably a five- to seven-membered heterocyclic group containing at least one of N, S and O. Such a heterocyclic group may contain a fused ring and may have any of the above-described substituents for the substituted aryl group. Specific examples of the compound represented by formula (5) include the compounds disclosed in U.S. Pat. Nos. 3,567,453 and 4,343,891 and European Patent Nos. 109,772 and 109,773 (the disclosures of which are incorporated herein by reference) and the following compounds:

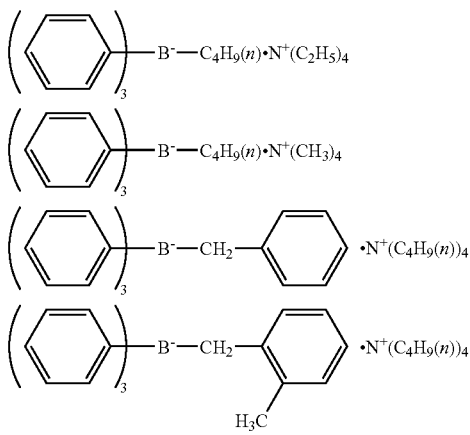

(h) Azinium Compounds

In the invention, examples of (h) azinium compounds as polymerization initiators include compounds having N—O bonds disclosed in JP-A Nos. 63-138345, 63-142345, 63-142346, and 63-143537, and JP-B No. 46-42363, the disclosures of which are incorporated herein by reference.

(i) Metalocene Compounds

Examples of the (i) metalocene compounds as polymerization initiators include titanocene compounds described in JP-A Nos. 59-152396, 61-151197, 63-41484, 2-249 and 2-4705 (the disclosures of which are incorporated herein by reference), and iron-arene complexes described in JP-A Nos. 1-304453 and 1-152109 (the disclosures of which are incorporated herein by reference).

Specific examples of the titanocene compound include di-cyclopentadienyl-Ti-dichloride,
di-cyclopentadienyl-Ti-bisphenyl,
di-cyclopentadienyl-Ti-bis-2,3,4,5,6-pentafluorophen-1-yl,
di-cyclopentadienyl-Ti-bis-2,3,5,6-tetrafluorophen-1-yl,
di-cyclopentadienyl-Ti-bis-2,4,6-trifluorophen-1-yl,
di-cyclopentadienyl-Ti-bis-2,6-difluorophen-1-yl,
di-cyclopentadienyl-Ti-bis-2,4-difluorophen-1-yl,
di-methylcyclopentadienyl-Ti-bis-2,3,4,5,6-pentafluorophen-1-yl,
di-methylcyclopentadienyl-Ti-bis-2,3,5,6-tetrafluorophen-1-yl,
di-methylcyclopentadienyl-Ti-bis-2,4-difluorophen-1-yl,
bis(cyclopentadienyl)-bis(2,6-difluoro-3-(pyr-1-yl)phenyl) titanium
bis(cyclopentadienyl)bis[2,6-difluoro-3-(methylsulfonamide)phenyl]titanium,
bis(cyclopentadienyl)bis[2,6-difluoro-3-(N-butylpivaroylamino)phenyl]titanium,
bis(cyclopentadienyl)bis[2,6-difluoro-3-(N-butyl-(4-chlorobenzoyl)amino)phenyl]titanium,
bis(cyclopentadienyl)bis[2,6-difluoro-3-(N-benzyl-2,2-dimethylpentanoylamino)phenyl]titanium,
bis(cyclopentadienyl)bis[2,6-difluoro-3-(N-(2-ethylhexyl)-4-tolyl-sulfonyl)amino]phenyl]titanium,
bis(cyclopentadienyl)bis[2,6-difluoro-3-(N-(3-oxaheptyl)-benzoylamino)phenyl]titanium,
bis(cyclopentadienyl)bis[2,6-difluoro-3-(N-(3,6-dioxadecyl)-benzoylamino)phenyl]titanium,
bis(cyclopentadienyl)bis[2,6-difluoro-3-(trifluoromethylsulfonylamino)phenyl]titanium,
bis(cyclopentadienyl)bis[2,6-difluoro-3-(trifluoroacetylamino)phenyl]titanium,
bis(cyclopentadienyl)bis[2,6-difluoro-3-(2-chlorobenzoylamino)phenyl]titanium,
bis(cyclopentadienyl)bis[2,6-difluoro-3-(4-chlorobenzoylamino)phenyl]titanium,
bis(cyclopentadienyl)bis[2,6-difluoro-3-(N-(3,6-dioxadecyl)-2,2-dimethylpentanoylamino)phenyl]titanium,
bis(cyclopentadienyl)bis[2,6-difluoro-3-(N-(3,7-dimethyl-7-methoxyoctyl)benzoylamino)phenyl]titanium, and
bis(cyclopentadienyl)bis[2,6-difluoro-3-(N-cyclohexylbenzoylamino)phenyl]titanium.

(j) Active Ester Compounds

In the invention, examples of (j) active ester compounds as polymerization initiators include imidosulfonate compounds disclosed in JP-B No. 62-6223 (the disclosure of which is incorporated herein by reference) and active sulfonate compounds disclosed in JP-B No. 63-14340 and JP-A No. 59-174831 (the disclosures of which are incorporated herein by reference).

(k) Compounds having Carbon-Halogen Bonds

In the invention, examples of (k) compounds having carbon-halogen bonds as polymerization initiators include compounds respectively represented by Formulae (6) to (12) below.

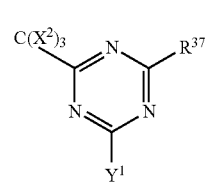

Formula (6)

In formula (6), $X^2$ represents a halogen atom; $Y^1$ represents $-C(X^2)_3$, $-NH_2$, $-NHR^{38}$, $-NR^{38}$, or $-OR^{38}$, wherein $R^{38}$ represents an alkyl group, a substituted alkyl group, an aryl group, or a substituted aryl group; and $R^{37}$ represents $-C(X^2)_3$, an alkyl group, a substituted alkyl group, an aryl group, a substituted aryl group, or a substituted alkenyl group.

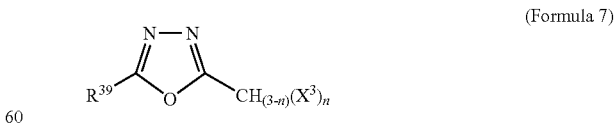

(Formula 7)

In formula (7), $R^{39}$ represents an alkyl group, a substituted alkyl group, an alkenyl group, a substituted alkenyl group, an aryl group, a substituted aryl group, a halogen atom, an alkoxy group, a substituted alkoxyl group, a nitro group, or a cyano group; $X^3$ represents a halogen atom; and n represents an integer of 1 to 3.

Formula (8)

$R^{40}-Z^6-CH_{(2-m)}(X^3)_m R^{41}$

In formula (8), $R^{40}$ represents an aryl group or a substituted aryl group; $R^{41}$ represents any of the groups shown below or a halogen atom; Z represents —C(=O)—, —C(=S)— or —SO$_2$—; $X^3$ represents a halogen atom; and m represents an integer of 1 or 2.

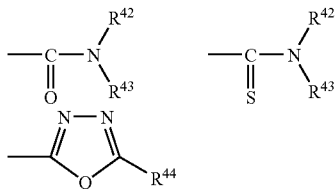

In the formulae, $R^{42}$ and $R^{43}$ each independently represent an alkyl group, a substituted alkyl group, an alkenyl group, a substituted alkenyl group, an aryl group, or a substituted aryl group; and $R^{44}$ has the same definition as that of $R^{38}$ in formula (6).

Formula (9)

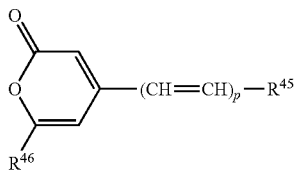

In formula (9), $R^{45}$ represents a substituted or non-substituted aryl or heterocyclic group; $R^{46}$ represents a trihaloalkyl or trihaloalkenyl group having 1 to 3 carbon atoms; and p represents 1, 2 or 3.

Formula (10)

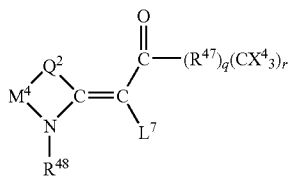

The compound represented by formula (10) is a carbonyl methylene heterocyclic compounds having a trihalogenomethyl group. In formula (10), $L^7$ represents a hydrogen atom or —CO—$(R^{47})_q(C(X^4)_3)_r$; $Q^2$ represents a sulfur atom, a selenium atom, an oxygen atom, a dialkylmethylene group, an alkene-1,2-ylene group, a 1,2-phenylene group, or N—R; $M^4$ represents a substituted or unsubstituted alkylene or alkenylene group, or a 1,2-arylene group; $R^{48}$ represents an alkyl group, an aralkyl group or an alkoxyalkyl group; $R^{47}$ represents a carbocyclic or heterocyclic bivalent aromatic group; $X^4$ represents a chlorine atom, a bromine atom or an iodine atom; q represents 0 or 1; and r represents 1 when q represents 0 and r represents 1 or 2 when q represents 1.

Formula (11)

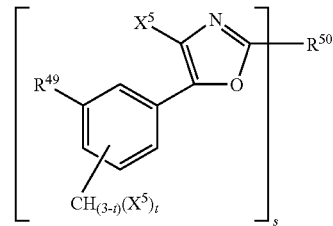

The compound represented by formula (11) represents a 4-halogeno-5-(halogenomethyl-phenyl)-oxazole derivative. In formula (11), $X^5$ represents a halogen atom; t represents an integer of 1 to 3; s represents an integer of 1 to 4; $R^{49}$ represents a hydrogen atom or $CH_{3-t}X^5_t$; and $R^{50}$ represents a substituted or non-substituted unsaturated organic group with a valence of s.

Formula (12)

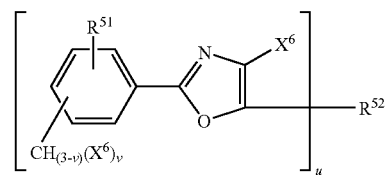

The compound represented by formula (12) is a 2-(halogenomethyl-phenyl)-4-halogeno-oxazole derivative. In formula (12), $X^6$ represents a halogen atom; v represents an integer of 1 to 3; u represents an integer of 1 to 4; $R^{51}$ represents a hydrogen atom or $CH_{3-v}X^6_v$; and $R^{52}$ represents a substituted or non-substituted unsaturated organic group with a valence of u.

Specific examples of such compounds having carbon-halogen bonds include: the compounds disclosed in Wakabayashi et al., Bull. Chem. Soc. Japan, 42, 2924 (1969) (the disclosure of which is incorporated herein by reference) such as 2-phenyl-4,6-bis(trichloromethyl)-S-triazine, 2-(p-chlorophenyl)-4,6-bis(trichloromethyl)-S-triazine, 2-(p-tolyl)-4,6-bis (trichloromethyl)-S-triazine, 2-(p-methoxyphenyl)-4,6-bis (trichloromethyl)-S-triazine, 2-(2',4'-dichlorophenyl)-4,6-bis(trichloromethyl)-S-triazine, 2,4,6-tris(trichloromethyl)-S-triazine, 2-methyl-4,6-bis(trichloromethyl)-S-triazine, 2-n-nonyl-4,6-bis(trichloromethyl)-S-triazine, and 2-(α,α,β-trichloroethyl)-4,6-bis(trichloromethyl)-S-triazine; the compounds disclosed in U.K. Patent No. 1,388,492 (the disclosure of which is incorporated herein by reference) such as 2-styryl-4,6-bis(trichloromethyl)-S-triazine, 2-(p-methylstyryl)-4,6-bis(trichloromethyl)-S-triazine, 2-(p-methoxystyryl)-4,6-bis(trichloromethyl)-S-triazine, and 2-(p-methoxystyryl)-4-amino-6-trichloromethyl-S-triazine; the compounds disclosed in JP-A No. 53-133428 (the disclosure of which is incorporated herein by reference) such as 2-(4-methoxy-naphtho-1-yl)-4,6-bis-trichloromethyl-S-triazine, 2-(4-ethoxy-naphtho-1-yl)-4,6-bis(trichloromethyl)-S-triazine, 2-[4-(2-ethoxyethyl)-naphtho-1-yl]-4,6-bis(trichloromethyl)-S-triazine, 2-(4,7-dimethoxy-naphtho-1-yl)-4,6-bis-trichloromethyl-S-triazine, and 2-(acenaphtho-5-yl)-4,6-bis-trichloromethyl-S-triazine; and the compounds disclosed in German Patent No. 3,337,024 (the disclosure of which is incorporated herein by reference) such as the following compounds:

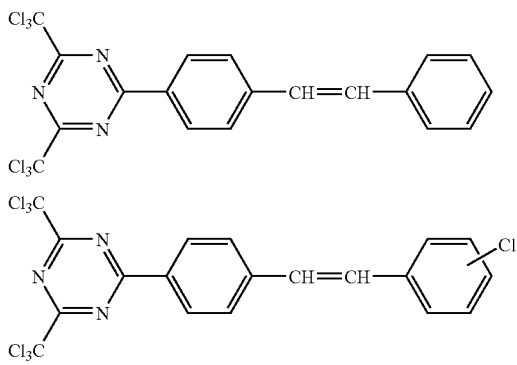

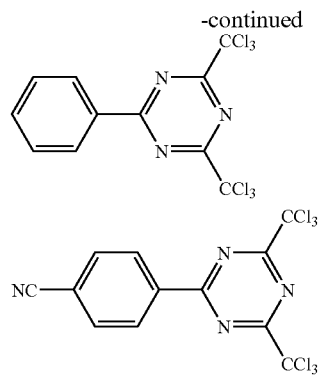

Specific examples of compounds having carbon-halogen bonds also include: the compounds disclosed in F. C. Schaefer et al., J. Org. Chem., 29, 1527 (1964) (the disclosure of which is incorporated herein by reference) such as 2-methyl-4,6-bis(tribromomethyl)-S-triazine, 2,4,6-tris(tribromomethyl)-S-triazine, 2,4,6-tris(dibromomethyl)-S-triazine, 2-amino-4-methyl-6-tribromomethyl-S-triazine, and 2-methoxy-4-methyl-6-trichloromethyl-5-triazine; and the compounds disclosed in JP-A No. 62-58241 (the disclosure of which is incorporated herein by reference) such as the following compounds:

Specific examples of compounds having carbon-halogen bonds also include compounds shown below, which can be easily synthesized by one skilled in the art according to the synthesis method described in M. P. Hutt, E. F. Elslager and L. M. Herbel, Journal of Heterocyclic Chemistry, vol. 7 (No. 3), page 511 et seq. (1970), the disclosure of which is incorporated herein by reference.

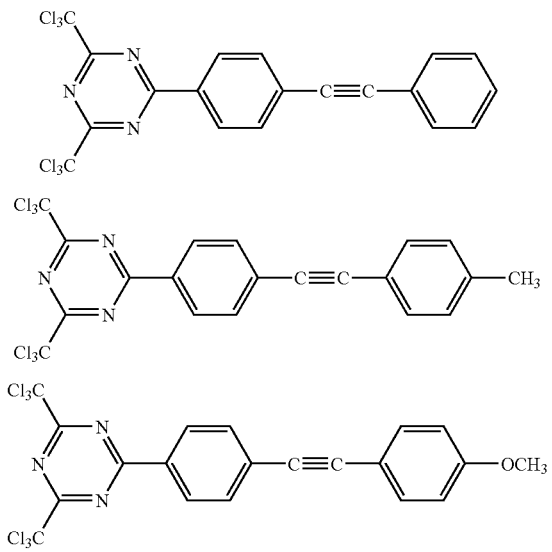

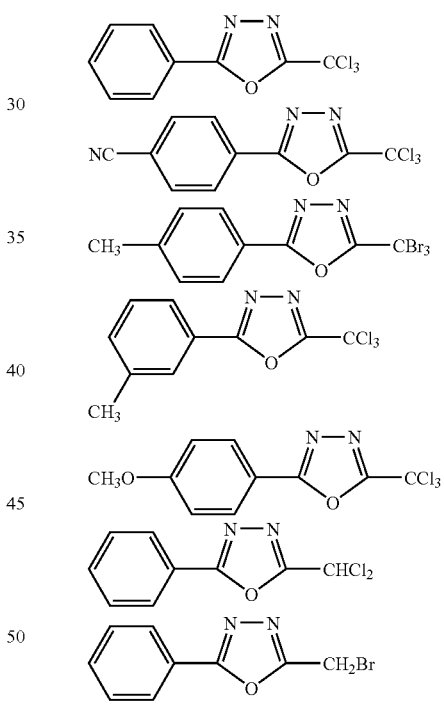

Specific examples of compounds having carbon-halogen bonds also include the compounds disclosed in JP-A No. 05-281728 such as the following compounds:

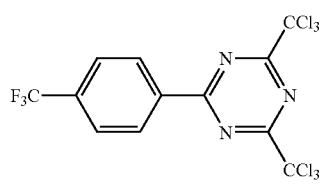

Examples of polymerization initiators further include specific aromatic sulfonium salts disclosed in JP-A Nos. 2001-92127, 2002-148790, and 2002-006482, the disclosures of which are incorporated herein by reference. The polymerization initiator is preferably a titanocene compound, an aromatic sulfonium salt, or a trihalomethyl-S-triazine compound.

Only a single polymerization initiator may be used, or two or more polymerization initiators may be used. The amount of polymerization initiator(s) in the polymerizable composition is preferably 0.01 to 10% by mass based on the total solids, more preferably 0.1 to 2% by mass based on the total solids. When the polymerizable composition is used for a recording layer of a planographic printing plate precursor, a preferable range of the amount of polymerization initiator(s) is the same as the range described above.

Various photopolymerization initiators (systems) have been proposed for light sources including blue-ray semiconductor lasers, Ar lasers, second harmonic wave of IR semiconductor lasers, and SHG-YAG lasers. Examples thereof include: photo-reductive dyes disclosed in U.S. Pat. No. 2,850,445, such as rose bengal, eosine, and erythrosine; and combinations of dyes and initiators such as complex initiator systems of dyes and amines described in JP-B No. 44-20189, combination systems containing hexaaryl biimidazoles, radical generators, and dyes disclosed in JP-B No. 45-37377, systems containing hexaaryl biimidazoles and p-dialkylamino benzylidene ketone disclosed in JP-B No. 47-2528 and JP-A No. 54-155292, systems containing cyclic cis-α-dicarbonyl compounds and dyes disclosed in JP-A No. 48-84183, systems containing cyclic triazines and melocyanines disclosed in JP-A No. 54-151024, systems containing 3-keto cumarine and activators disclosed in JP-A Nos. 52-112681 and 58-15503, systems containing biimidazoles, styrene derivatives and thiols (disclosed in JP-A No. 59-140203), systems containing organic peroxides and dyes disclosed in JP-A Nos. 59-1504, 59-140203, 59-189340, and 62-174203 and JP-B No. 62-1641 and U.S. Pat. No. 4,766, 055, systems containing dyes and active halogen compounds disclosed in JP-A No. 63-1718105, 63-258903, and 3-264771, systems containing dyes and borate compounds disclosed in JP-A Nos. 62-143044, 62-150242, 64-13140, 64-13141, 64-13142, 64-13143, 64-13144, 64-17048, 1-229003, 1-298348, and 1-138204, systems containing colorants having rhodanine cycles and radical generators disclosed in JP-A Nos. 2-179643 and 2-244050, systems containing titanocenes and 3-keto cumarine disclosed in JP-A No. 63-221110, systems containing titanocenes, xantene colorants, and addition-polymerizable ethylenic unsaturated compounds each having an amino group or an urethane group disclosed in JP-A Nos. 4-221958 and 4-219756, systems containing titanocenes and specific melocyanine colorants disclosed in JP-A No. 6-295061, and systems containing titanocenes and colorants having benzopyrane cycles disclosed in JP-A No. 8-334897. The disclosures of the above patent documents are incorporated herein by reference.

The photopolymerization initiator (system) in the polymerizable composition or photopolymerizable layer (photosensitive layer) may contain a titanocene. The titanocene compound used in the photopolymerization initiator (system) may be any compound which can generate an active radical when irradiated with light in the presence of a sensitizing colorant described later. The titanocene compound may be selected from various titanocene compounds described in JP-A Nos. 59-152396, 61-151197, 63-41483, 63-41484, 2-249, 2-291, 3-27393, 3-12403 and 6-41170, the disclosures of which are incorporated herein by reference.

Specific examples thereof include di-cyclopentadienyl-Ti-dichloride, di-cyclopentadienyl-Ti-bis-phenyl, di-cyclopentadienyl-Ti-bis-2,3,4,5,6-pentafluorophen-1-yl (hereinafter referred to as "T-1"), di-cyclopentadienyl-Ti-bis-2,3,5,6-tetrafluorophen-1-yl, di-cyclopentadienyl-Ti-bis-2,4,6-trifluorophen-1-yl, di-cyclopentadienyl-Ti-bis-2,6-difluorophen-1-yl, di-cyclopentadienyl-Ti-bis-2,4-di-fluorophen-1-yl, di-methylcyclopentadienyl-Ti-bis-2,3,4,5,6-pentafluorophen-1-yl, di-methylcyclopentadienyl-Ti-bis-2,3,5,6-tetrafluorophen-1-yl, di-methylcyclopentadienyl-Ti-bis-2,4-difluorophen-1-yl, and bis(cyclopentadienyl)-bis(2,6-difluoro-3-(pyl-1-yl)phenyl titanium (hereinafter referred to as "T-2").

The titanocene compounds may be chemically modified such that the characteristics of the photosensitive layer is improved. For example, the chemical modification may be binding of the titanocene compounds to sensitizing colorants or radical generating moieties such as addition-polymerizable unsaturated compounds, introduction of hydrophilic moieties, introduction of substituents for improving compatibility and/or preventing precipitation of crystal, introduction of substituents for improving adhesion, and polymerization of the titanocene compounds.

Details of the use of the titanocene compounds may be arbitrary selected in accordance with the desired characteristics of the resulting planographic printing plate precursor, similarly to the case of the addition-polymerizable compound described above. The compatibility with the photosensitive layer may be improved by using two or more titanocene compounds. The amount of photopolymerization initiators such as titanocene compounds is preferably large from the viewpoint of sensitivity. The amount of photopolymerization initiators may be 0.5 to 80 parts by mass based on 100 parts by mass of volatile components in the photosensitive layer, preferably 1 to 50 parts by mass based on 100 parts by mass of volatile components in the photosensitive layer. When the light source is a white light source or a yellow light source, the amount of titanocene compounds to be used is preferably small from the viewpoint of fogging caused by a light at around 500 nm. However, when titanocene compound is used in combination with sensitizing colorants, sufficient sensitivity can be obtained even with an amount of titanocene compounds of 6 parts by mass or less (which may be 1.9 parts by mass or less, or 1.4 parts by mass or less).

The radical polymerization initiator used for initiating curing of the addition-polymerizable compound and allowing the curing to proceed may be a thermal polymerization initiator. The thermal polymerization initiator may be a thermally-decomposable radical generator which is decomposed by heat to generate a radical. When such a radical generator is used in combination with an IR absorber described later, the IR absorber emits heat upon irradiation with a IR laser beam and the radical generator generates a radical, thereby enabling recording.

The radical generator may be an onium salt, a triazine compound having a trihalomethyl group, a peroxide, an azo-based polymerization initiator, an azide compound, a quinone diazide, an oxime ester compound, or a triarylmonoalkyl borate compound. An onium salt and an oxime ester compound are preferable because of their high sensitivity. In the following, an onium salt as polymerization initiators are described. The onium salt may be an iodonium salt, a diazonium salt, or a sulfonium salt. In the invention, these onium salts function not as acid generators but as initiators for radical polymerization. In the invention, the onium salt is preferably an onium salt represented by formula (A), (B), or (C).

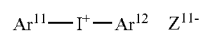
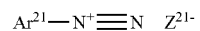
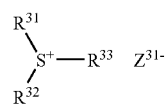

Formula (A)

Formula (B)

Formula (C)

In the formula (A), $Ar^{11}$ and $Ar^{12}$ each independently represent a substituted or non-substituted aryl group having 20 or less carbon atoms. When the aryl group has a substituent, the substituent is preferably selected from halogen atoms, a nitro group, alkyl groups each having 12 or less carbon atoms, alkoxy groups each having 12 or less carbon atoms, and aryloxy groups each having 12 or less carbon atoms. $Z^{11-}$ represents a counter-ion which may be selected from halogen ions, perchlorate ions, a tetrafluoroborate ion, a hexafluorophosphate ion, a carboxylate ion, and sulfonic ions. $Z^{11-}$ preferably represents a perchlorate ion, a hexafluorophosphate ion, a carboxylate ion, or an aryl sulfonic acid ion.

In the formula (B), Ar represents a substituted or non-substituted aryl group having 20 or less carbon atoms. When the aryl group has a substituent, the substituent is preferably selected from halogen atoms, a nitro group, alkyl groups each having 12 or less carbon atoms, alkoxy groups each having 12 or less carbon atoms, aryloxy groups each having 12 or less carbon atoms, alkylamino groups each having 12 or less carbon atoms, dialkylamino groups each having 12 or less carbon atoms, aryl amino groups each having 12 or less carbon atoms, and diaryl amino groups each having 12 or less carbon atoms. $Z^{21-}$ represents a counter-ion having the same definition as that of $Z^{11-}$.

In the formula (C), $R^{31}$, $R^{32}$ and $R^{33}$ each independently represent a substituted or non-substituted hydrocarbon group having 20 or less carbon atoms. When the hydrocarbon group has a substituent, the substituent is preferably selected from halogen atoms, a nitro group, alkyl groups each having 12 or less carbon atoms, alkoxy groups each having 12 or less carbon atoms, and aryloxy groups each having 12 or less carbon atoms. $Z^{31-}$ represents a counter-ion having the same definition as that of $Z^{11-}$.

Onium salts as polymerization initiators (radical generators) may be selected from the onium salts disclosed in JP-A No. 2001-133696, the disclosure of which is incorporated herein by reference. In the following, examples ([OI-1] to [OI-10]) of onium salts represented by formula (A), examples ([ON-1] to [ON-5]) of onium salts represented by formula (B), and examples ([OS-1] to [OS-7]) of onium salts represented by formula (C) are shown below. However, the examples should not be construed as limiting the invention.

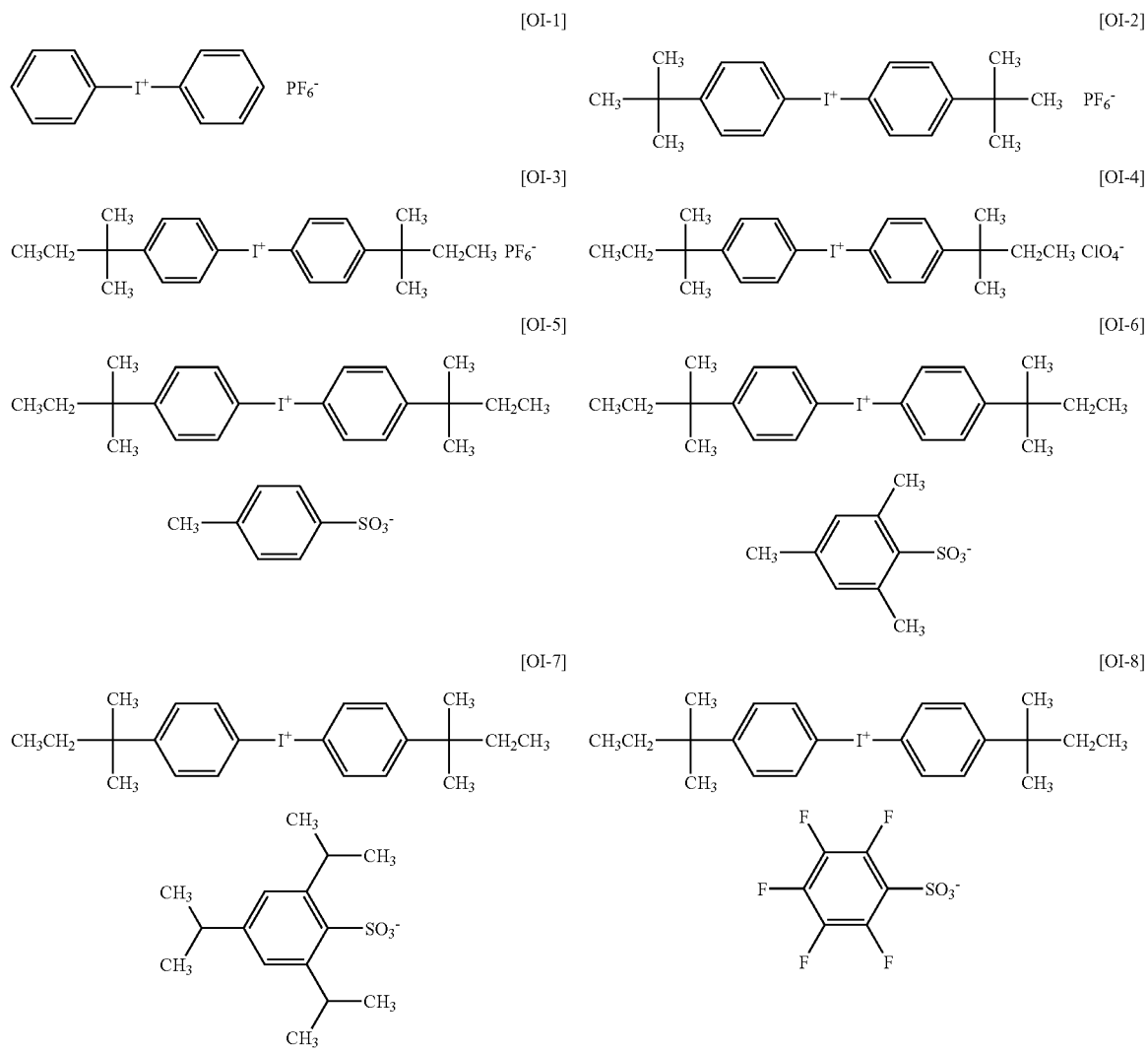

-continued
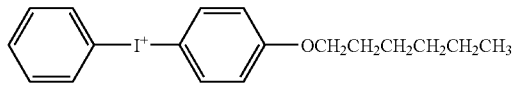
[OI-9]
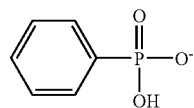
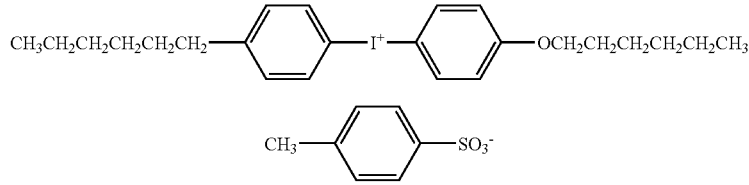
[OI-10]
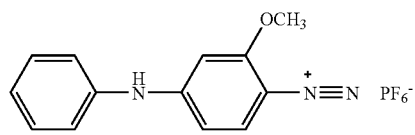
[ON-1]
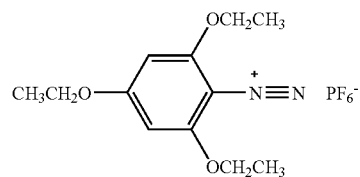
[ON-2]
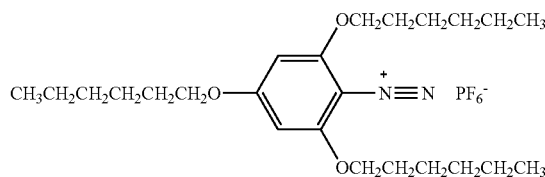
[ON-3]
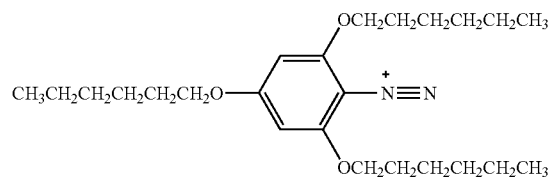
[ON-4]
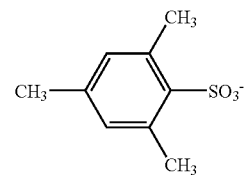
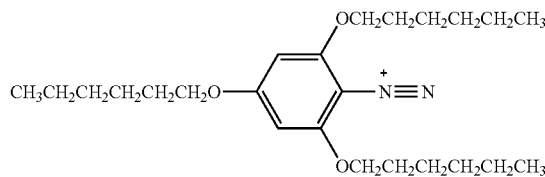
[ON-5]
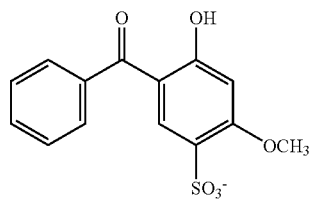

-continued

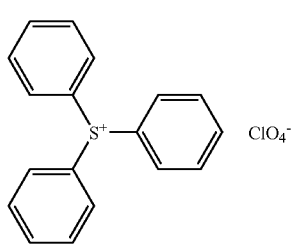 [OS-1]

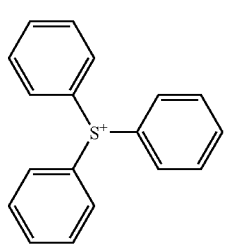 [OS-2]

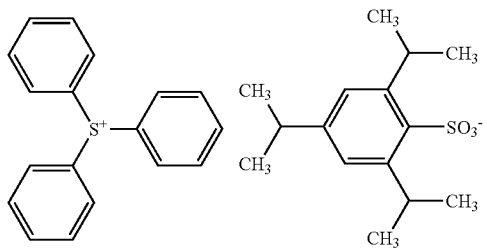 [OS-3]

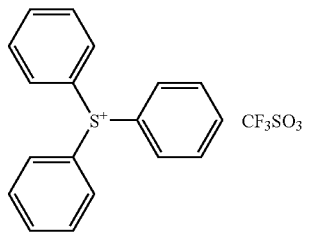 [OS-4]

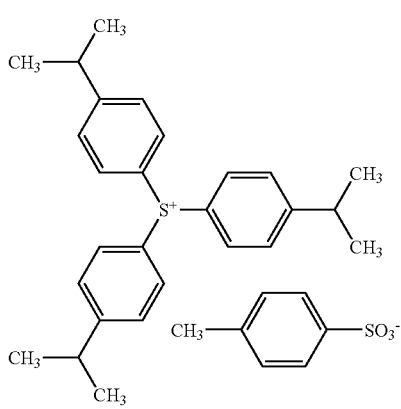 [OS-5]

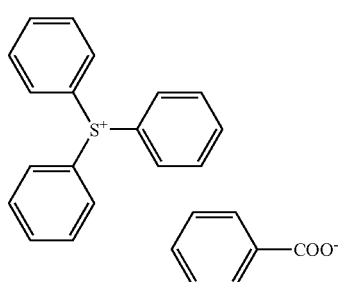 [OS-6]

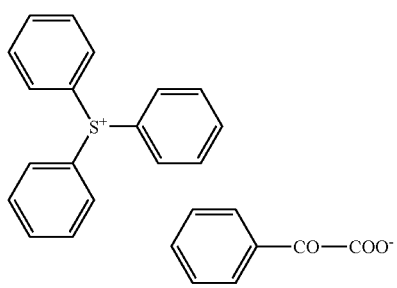

The polymerization initiator used in the invention may have an absorption peak of 400 nm or shorter, preferably 360 nm or shorter. When the absorption wavelength is in the UV range, it is possible to handle the resultant planographic printing plate precursor under white light.

The polymerization initiator may also be an aromatic sulfonium salt selected from the specific aromatic sulfonium salts disclosed in JP-A Nos. 2002-148790, 2002-350207, and 2003-006552, the disclosures of which are incorporated herein by reference. In the following, typical examples thereof are shown.

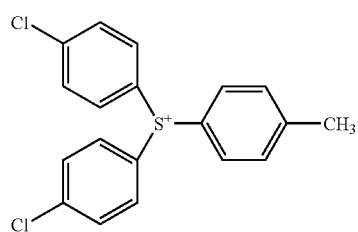 [OS-7]

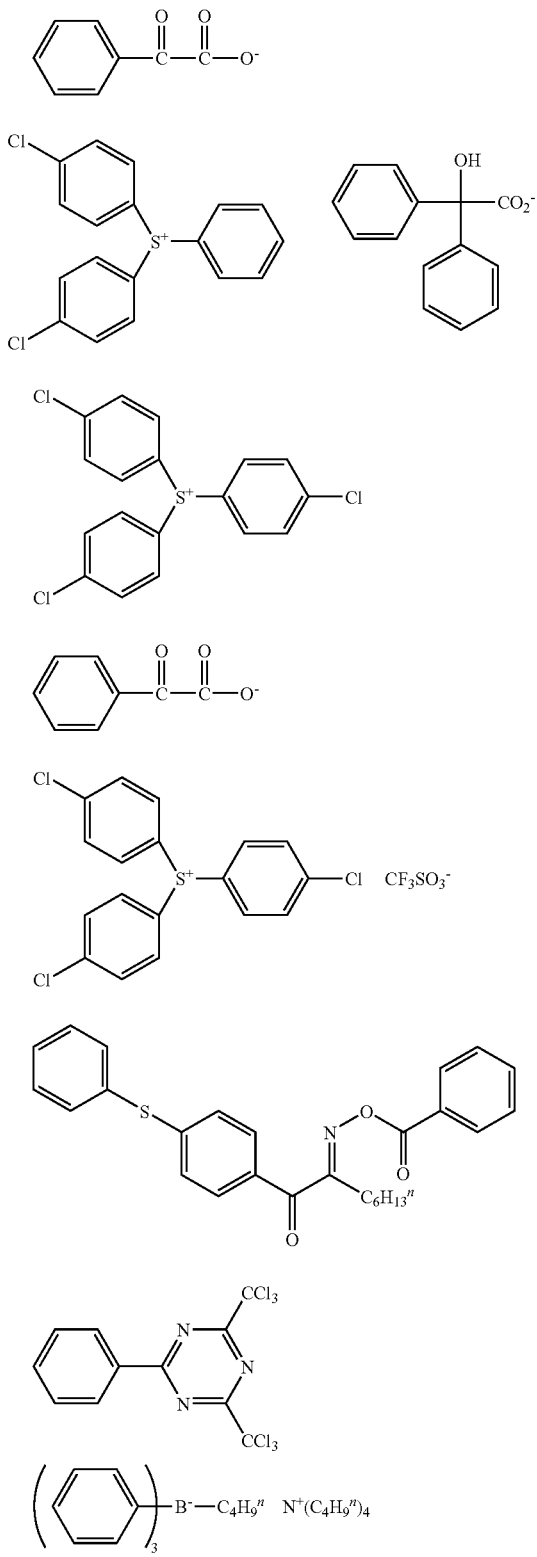

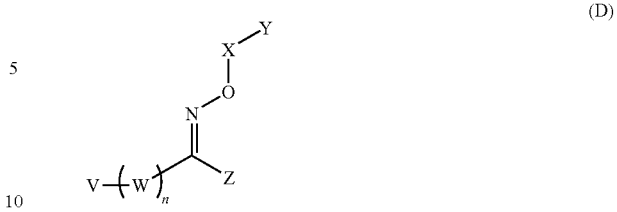

In the following, an oxime ester compound as a polymerization initiator is described. The oxime ester compound is preferably a compound represented by the following formula (D).

In formula (D), X represents a carbonyl group, a sulfone group, or a sulfoxide group; Y represents a cyclic or straight-chain alkyl, alkenyl, or alkynyl group having 1 to 12 carbon atoms, an aryl group having 6 to 18 carbon atoms, or a heterocyclic group. The aryl group refers to an aromatic hydrocarbon compound such as a benzene ring, a naphthalene ring, an anthracene ring, a phenanthrene group, a pyrene group, or a triphenylene group. The heterocyclic ring refers to an aromatic compound whose cycle has at least one atom selected from nitrogen atoms, sulfur atoms, and oxygen atoms, and examples thereof include a pyrrole group, a furan group, a thiophene group, a selenophene group, a pyrazole group, an imidazole group, a triazole group, a tetrazole group, an oxazole group, a thiazole group, an indole group, a benzofuran group, a benzimidazole group, a benzoxazole group, a benzthiazole group, a pyridine group, a pyrimidine group, a pyrazine group, a triazine group, a quinoline group, a carbazole group, an acridine group, and compounds such as phenoxazine and phenothiazine. The substituent represented by Y may be substituted by: a halogen atom; a hydroxyl group; a nitrile group; a nitro group; a carboxyl group; an aldehyde group; an alkyl group; a thiol group; an aryl group; or a compound containing an alkenyl group, an alkynyl group, an ether group, an ester group, an urea group, an amino group, an amide group, a sulfide group, a disulfide group, a sulfoxide group, a sulfo group, a sulfone group, a hydrazine group, a carboyl group, an imino group, a halogen atom, a hydroxyl group, a nitrile group, a nitro group, a carboxyl group, a carbonyl group, an urethane group, an alkyl group, a thiol group, an aryl group, a phosphoroso group, a phospho group, or a carbonyl ether group.

In formula (D), Z represents a nitrile group, a halogen atom, a hydrogen atom, an amino group, or a group within the range of groups that Y in formula (D) can represent. Z in formula (D) may have a substituent such as: a halogen atom; a hydroxyl group; a nitrile group; a nitro group; a carboxyl group; an aldehyde group; an alkyl group; a thiol group; an aryl group; or a compound containing an alkenyl group, an alkynyl group, an ether group, an ester group, an urea group, an amino group, an amide group, a sulfide group, a disulfide group, a sulfoxide group, a sulfo group, a sulfone group, a hydrazine group, a carboyl group, an imino group, a halogen atom, a hydroxyl group, a nitrile group, a nitro group, a carboxyl group, a carbonyl group, an urethane group, an alkyl group, a thiol group, an aryl group, a phosphoroso group, a phospho group, or a carbonyl ether group.

In formula (D), W represents a divalent organic group which may be a methylene group, a carbonyl group, a sulfoxide group, a sulfone group, or an imino group. The methylene group or the imino group may be substituted by a compound containing a group such as: an alkyl group; an ester group; a nitrile group, a carbonyl ether group, a sulfo group, a sulfo ether group, or an ether group. n represents an integer of 0 or 1.

In formula (D), V represents a cyclic or straight-chain alkyl, alkenyl, or alkynyl group having 1 to 12 carbon atoms, or an aryl, alkoxy, or aryloxy group having 6 to 18 carbon atoms. The aryl group may be an aromatic hydrocarbon compound such as a benzene ring, a naphthalene ring, an anthracene ring, a phenanthrene group, a pyrene group, or a triphenylene group, or an aromatic compound containing a hetero-atom such as a pyrrole group, a furan group, a thiophene group, a selenophene group, a pyrazole group, an imidazole group, a triazole group, a tetrazole group, an oxazole group, a thiazole group, an indole group, a benzofuran group, a benzimidazole group, a benzoxazole group, a benzthiazole group, a pyridine group, a pyrimidine group, a pyrazine group, a triazine group, a quinoline group, a carbazole group, an acridine group, or a compounds such as phenoxazine or phenothiazine.

The group represented by V may be substituted by: a halogen atom; a hydroxyl group; a nitrile group; a nitro group; a carboxyl group; an aldehyde group; an alkyl group; a thiol group; an aryl group; or a compound containing an alkenyl group, an alkynyl group, an ether group, an ester group, an urea group, an amino group, an amide group, a sulfide group, a disulfide group, a sulfoxide group, a sulfo group, a sulfone group, a hydrazine group, a carbonyl group, an imino group, a halogen atom, a hydroxyl group, a nitrile group, a nitro group, a carboxyl group, a carbonyl group, an urethane group, an alkyl group, a thiol group, an aryl group, a phosphoroso group, a phospho group, or a carbonyl ether group.

V and Z may be bonded to each other to form a ring.

In the oxime ester compound represented by formula (D), X is preferably a carbonyl group, Y is preferably an aryl group or a benzoyl group, Z is preferably an alkyl group or an aryl group, W is preferably a carbonyl group, V is preferably an aryl group, from the viewpoint of sensitivity. V is more preferably an aryl group having a thioether substituent.

In formula (D), the structure of the N—O bond may be in the E-form or in the Z-form.

The oxime ester compound may be a compound selected from the compounds described in: *Progress in Organic Coatings*, 13 (1985) pp. 123-150; J. C. S Perkin 11 (1979) pp. 1653-1660; *Journal of Photopolymer Science and Technology* (1995) pp. 205-232; J. C. S Perkin 11 (1979) pp. 156-162; JP-A Nos. 2000-66385 and 2000-80068, the disclosures of which are incorporated herein by reference.

Examples of the oxime ester compound are shown below. However, the examples should not be construed as limiting the invention.

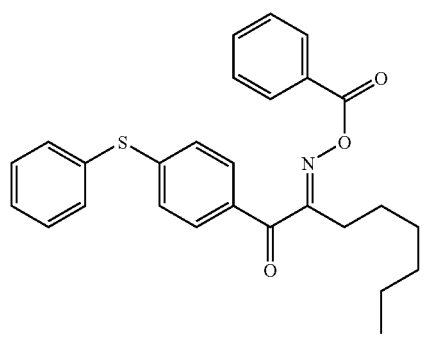

-continued

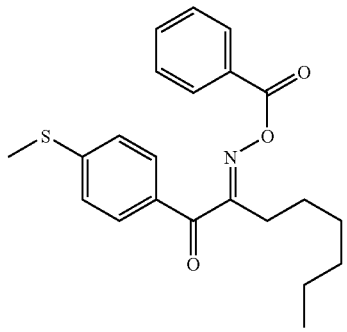

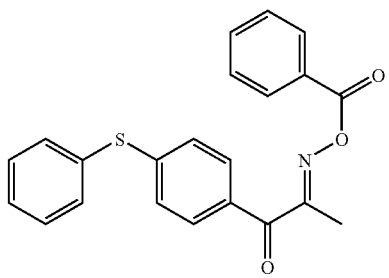

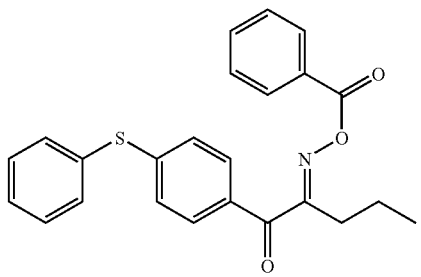

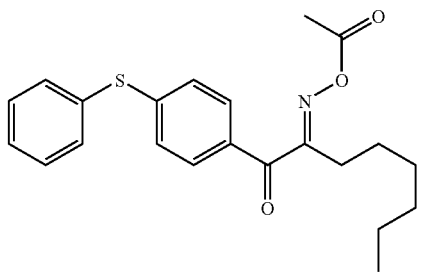

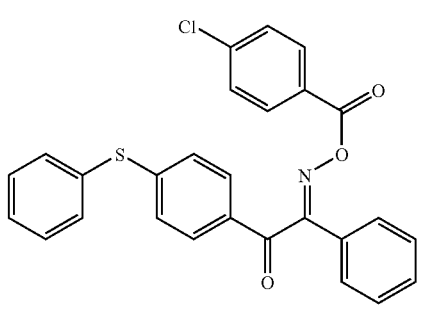

-continued
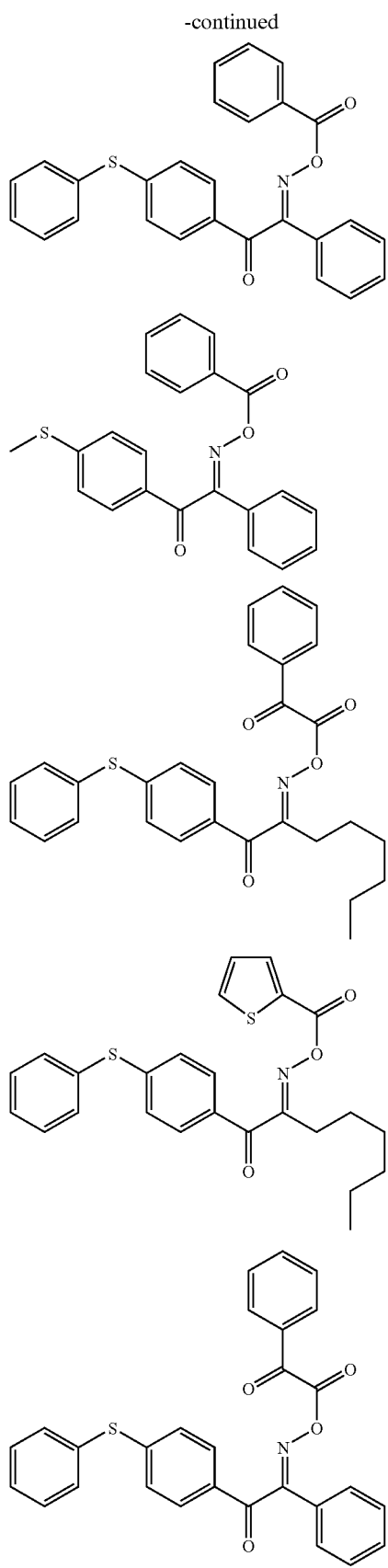
-continued
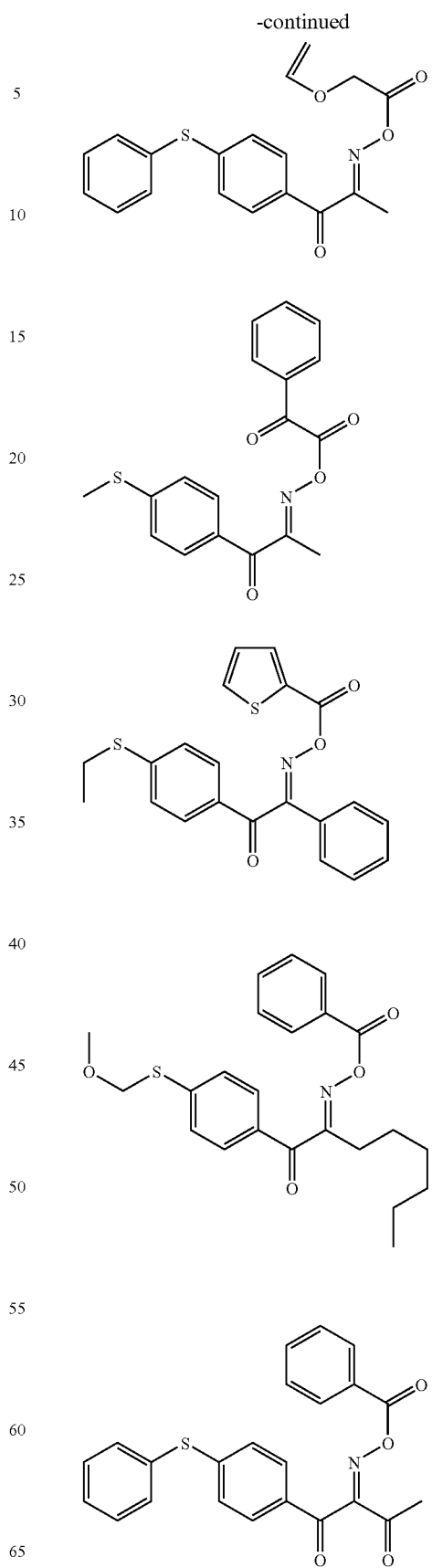

-continued
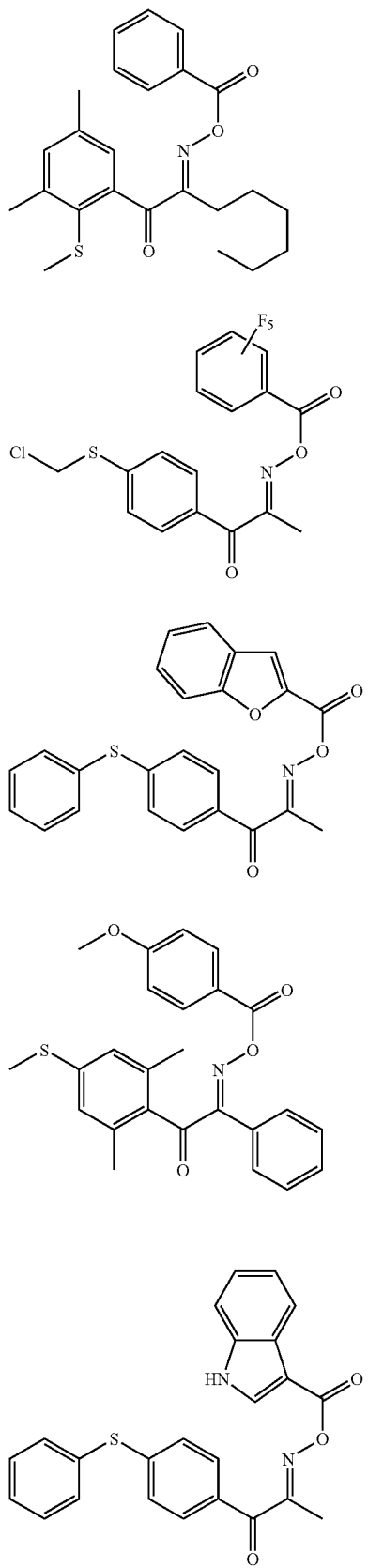
-continued
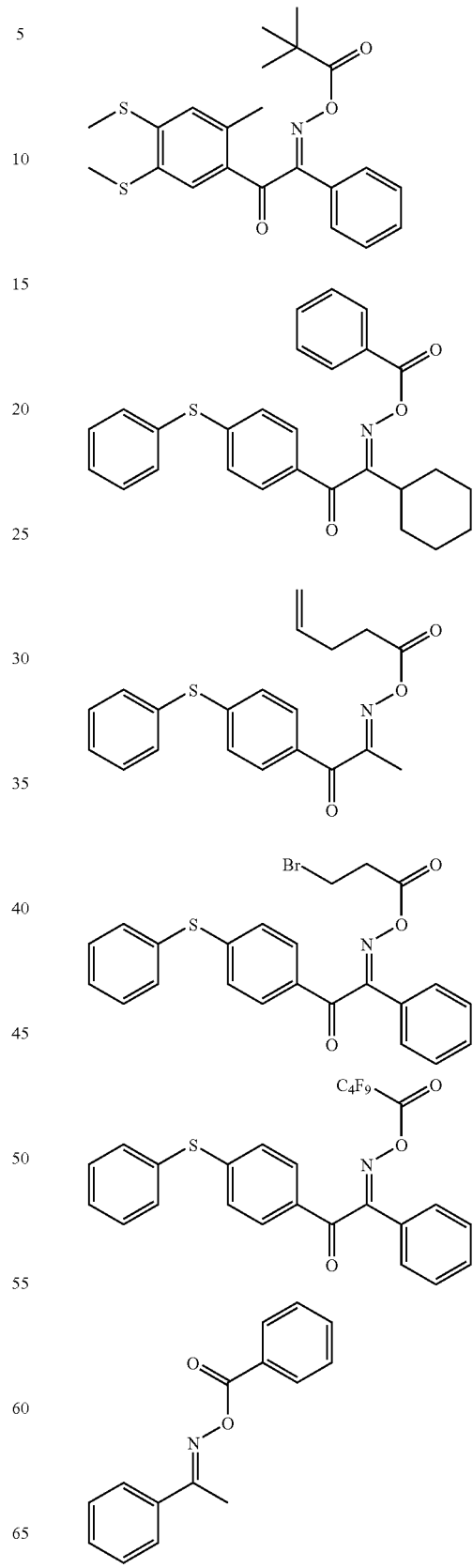

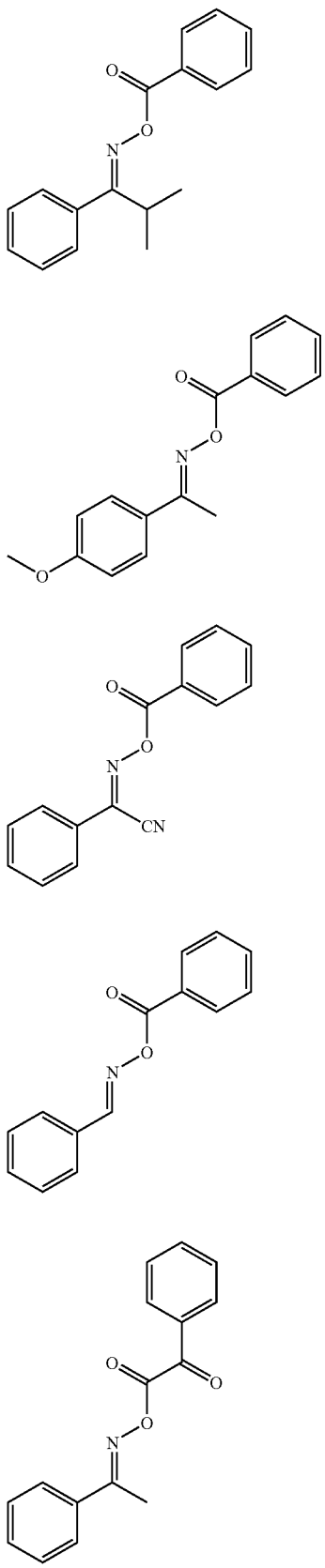
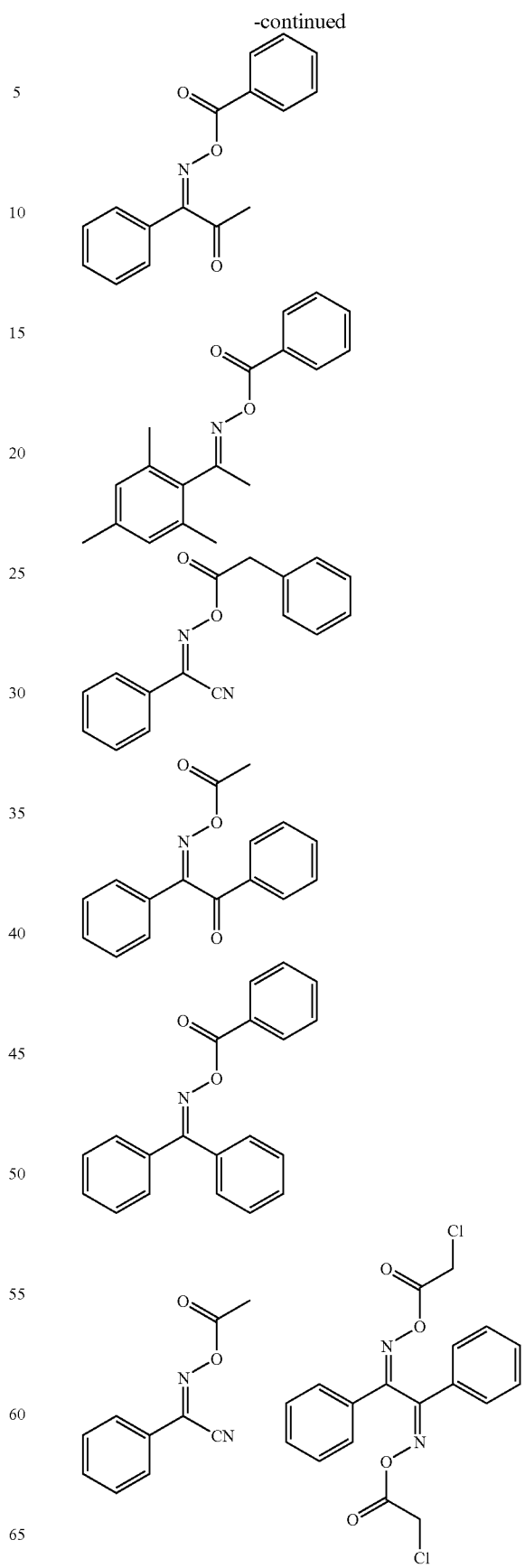

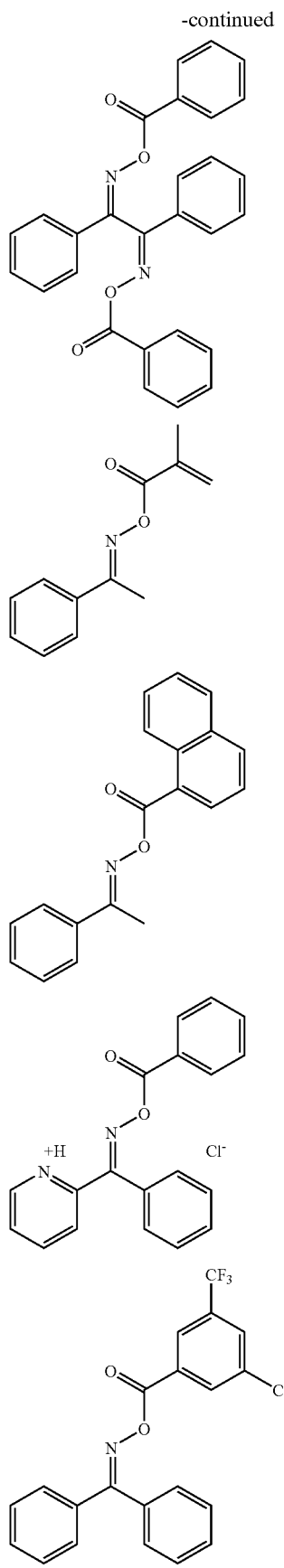
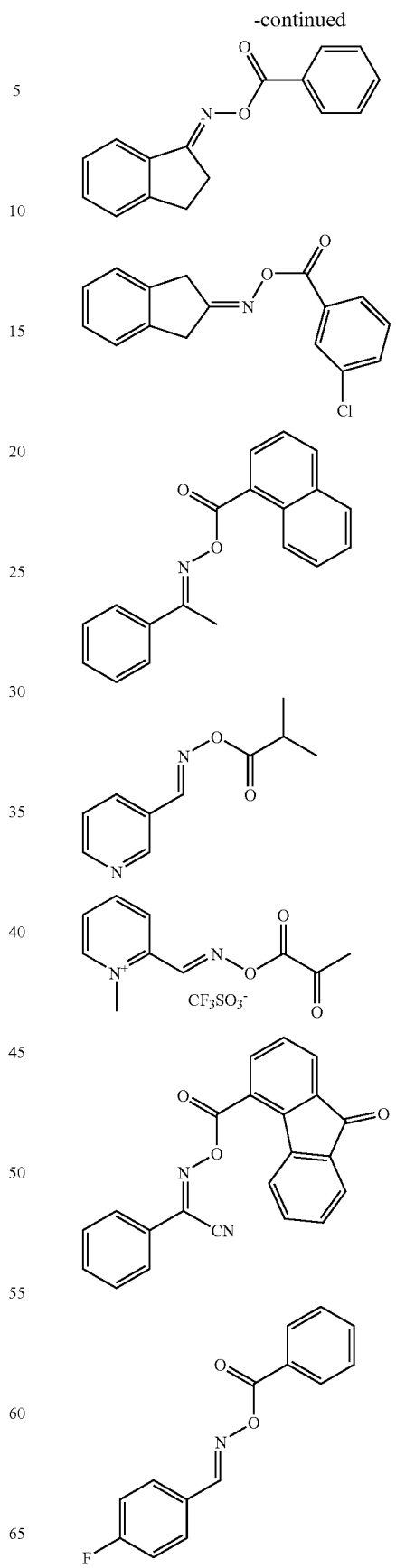

-continued
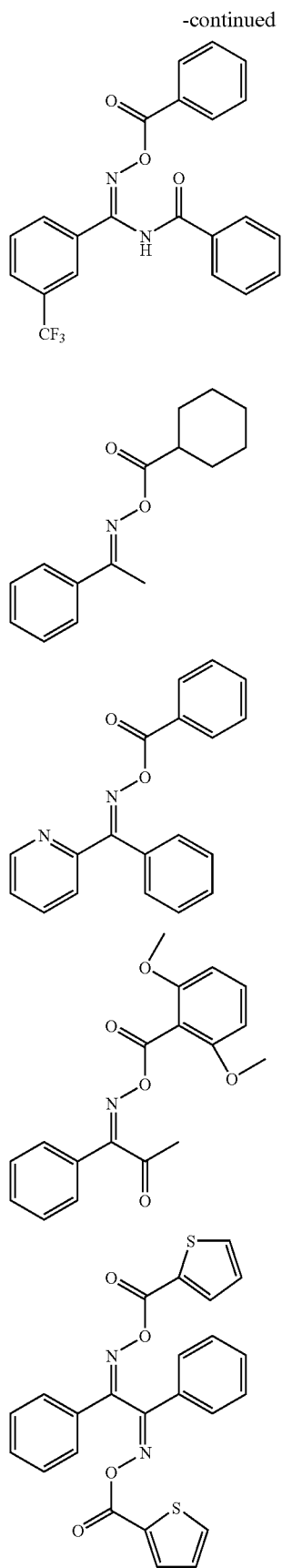
-continued
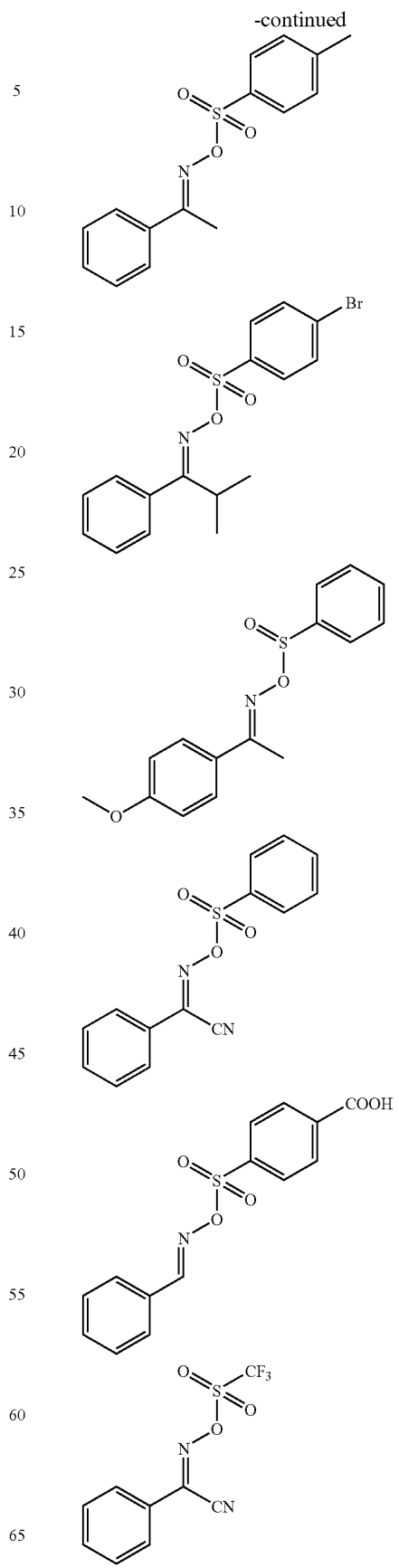

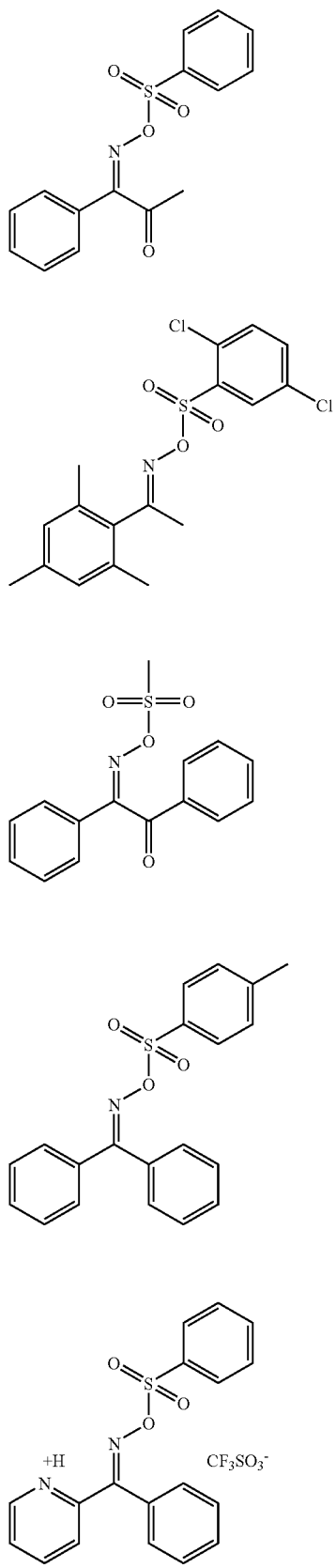
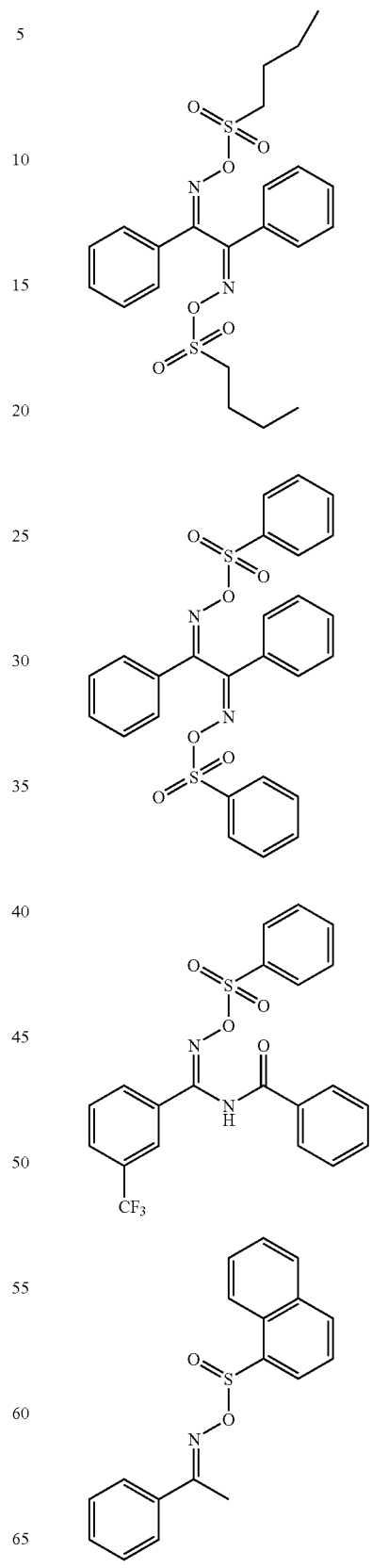

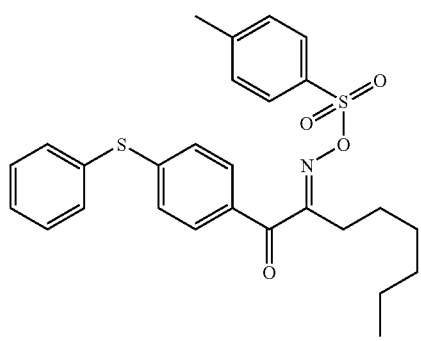
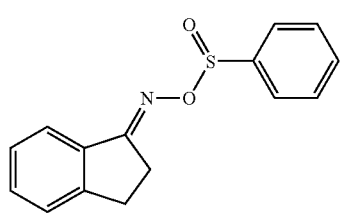
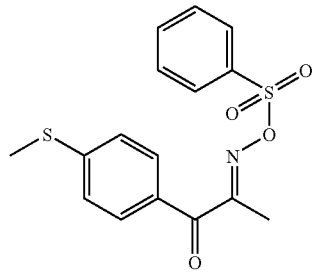
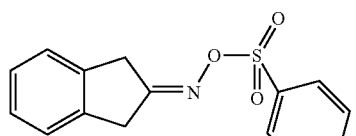
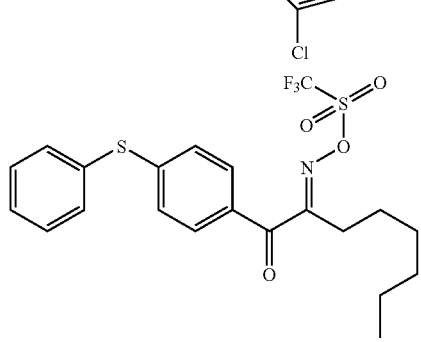
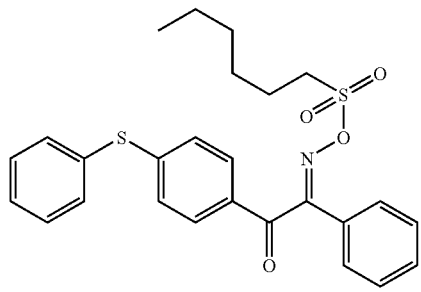
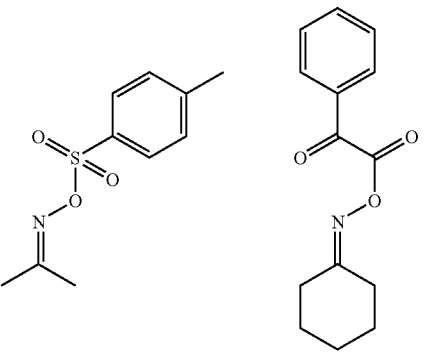
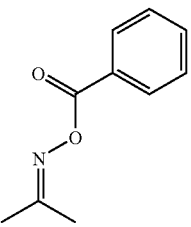
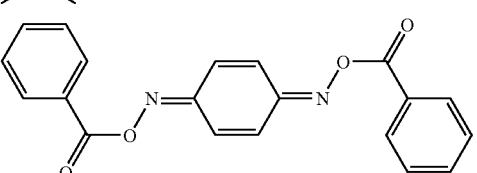
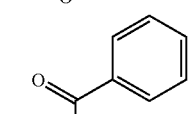
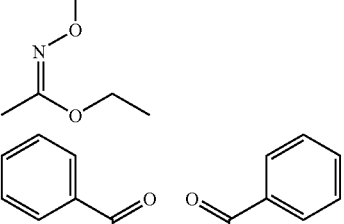
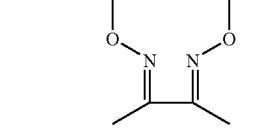
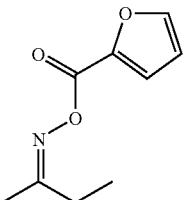
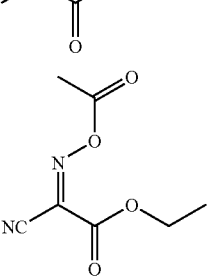

-continued

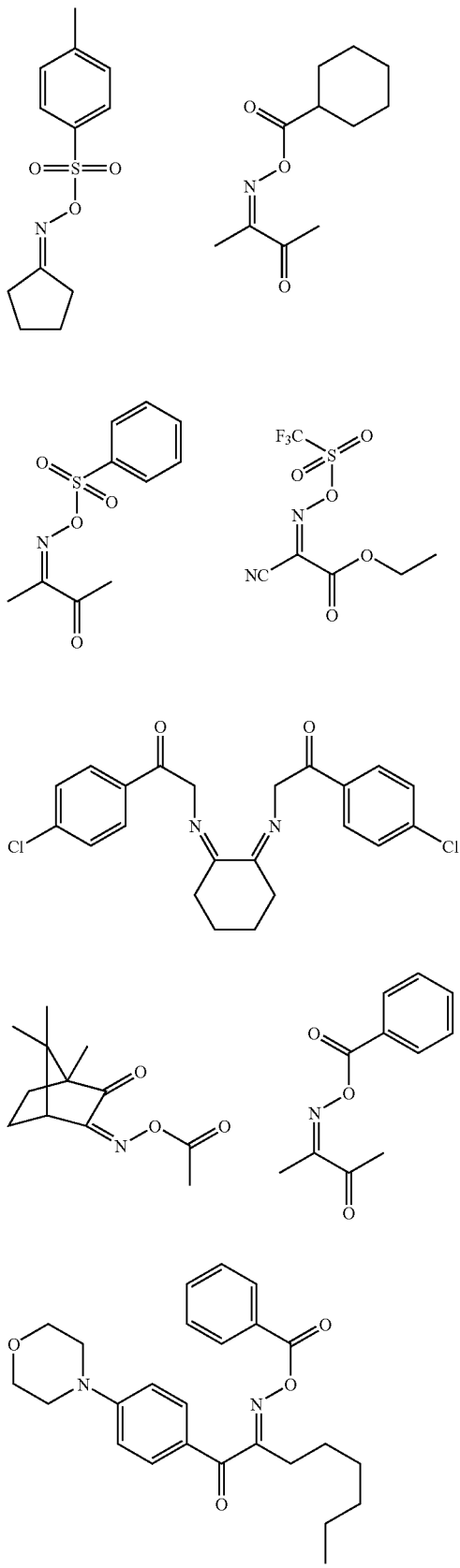

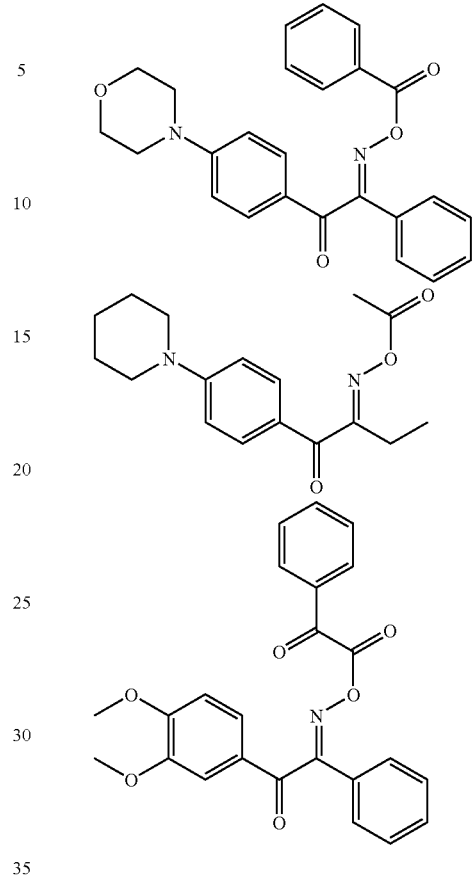

The polymerization initiator may be added such that the amount of the polymerization initiator in the photopolymerizable layer is 0.1 to 50% by mass based on the total amount of the solids in the photopolymerizable layer, preferably 0.5 to 30% by mass based on the total amount of the solids in the photopolymerizable layer, more preferably 1 to 20% by mass based on the total amount of the solids in the photopolymerizable layer, from the viewpoints of sensitivity and stains developing in non-image portions at printing. Only a single polymerization initiator may be used or two or more polymerization initiators may be used. The polymerization initiator may be included in the same layer as the layer containing other components, or may be included in a separate layer.

Sensitizing Colorant

The polymerizable composition of the first embodiment and the photopolymerizable layer of the second embodiment may include a sensitizing colorant from the viewpoint of sensitivity. The sensitizing colorant may have an absorption peak at a wavelength within the wavelength range of 350 nm to 850 nm. The sensitizing colorant may be a spectral sensitizing dye, or a dye or pigment which interacts with a photopolymerization initiator upon absorption of light from a light source. The sensitizing dye or pigment may be a polynuclear aromatic compound (such as pyrene, perylene, or triphenylene), a xanthene (such as fluorescein, eosine, erythrosine, rhodamine B, or rose Bengal), a cyanine (such as thiacarbocyanine or oxacarbocyanine), a merocyanine (such as merocyanine or carbomerocyanine), a thiazine (such as thionine, methylene blue, or toluidine blue), an acridine (such as acridine orange, chloroflavine, or acryflavine), a phthalocyanine (such as phthalocyanine or a metal phthalocyanine), a porphyrin (such as tetraphenylporphirin or a porphyrin whose center is substituted by a metal), a chlorofyll (such as chlorophyll, chlorophylline, and a chlorophyll whose center is substituted by a metal), a metal complex (such as the compound described below), an anthraquinone (such as anthraquinone), or a squarium (such as squarium).

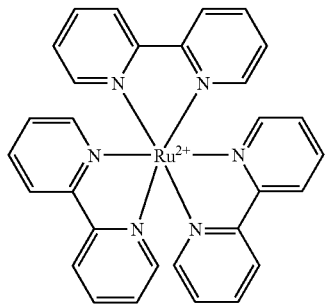

The sensitizing dye or pigment may be selected from styryl colorants described in JP-B No. 37-13034 (the disclosure of which is incorporated herein by reference) and examples thereof include the following compounds:

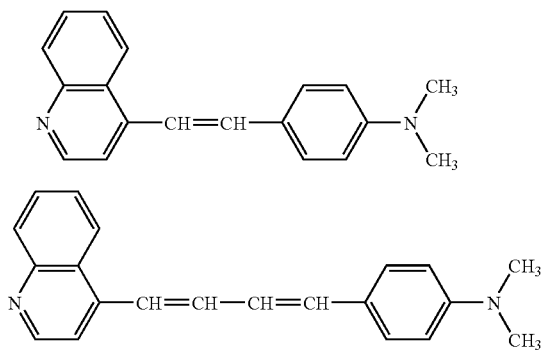

The sensitizing dye or pigment may be selected from cationic dyes disclosed in JP-A No. 62-143044, the disclosure of which is incorporated herein by reference. Examples thereof include the following compounds.

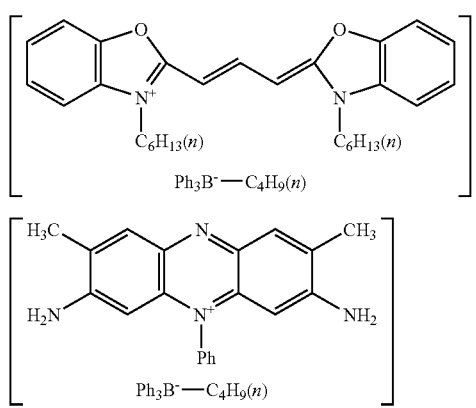

-continued

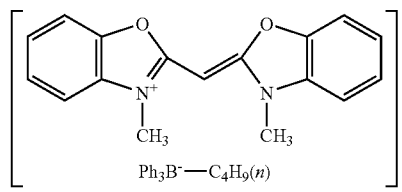

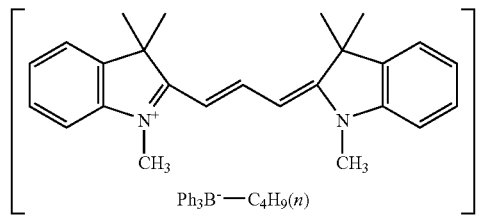

The sensitizing dye or pigment may be selected from quinoxalinium salts disclosed in JP-B No. 59-24147, the disclosure of which is incorporated herein by reference. Examples thereof include the following compounds.

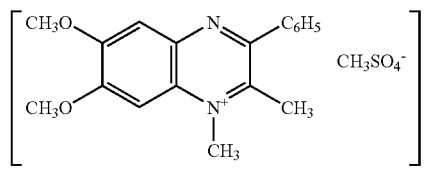

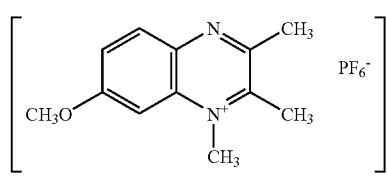

The sensitizing dye or pigment may be selected from novel methylene blue compounds disclosed in JP-A No. 64-33104, the disclosure of which is incorporated herein by reference. Examples thereof include the following compounds.

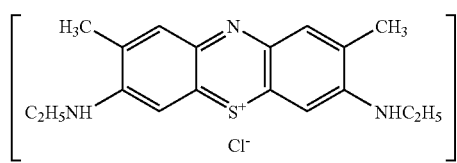

The sensitizing dye or pigment may be selected from anthraquinones disclosed in JP-A No. 64-56767, the disclosure of which is incorporated herein by reference. Examples thereof include the following compounds.

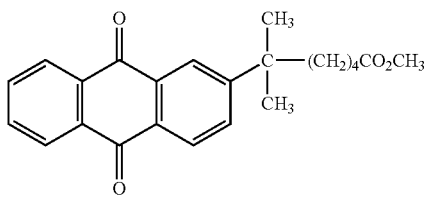

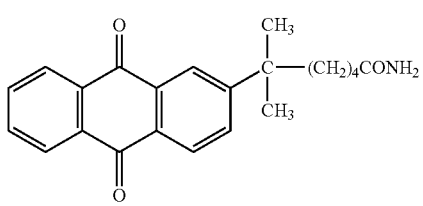

The sensitizing dye or pigment may be selected from benzoxanthene dyes disclosed in JP-A No. 2-1714, and acridines disclosed in JP-A Nos. 2-226148 and 2-226149, the disclosures of which are incorporated herein by reference. Examples thereof include the following compounds.

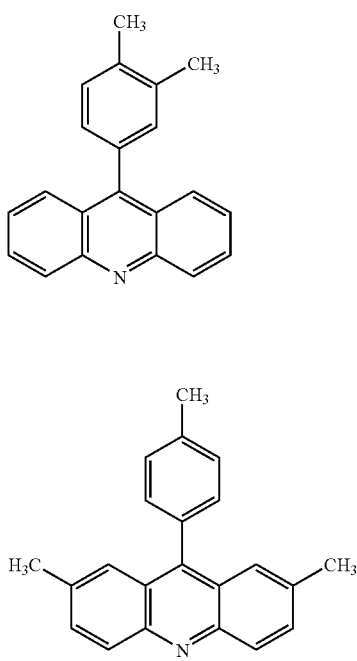

The sensitizing dye or pigment may be selected from pyrylium salts disclosed in JP-B No. 40-28499, the disclosure of which is incorporated herein by reference. Examples thereof include the following compounds.

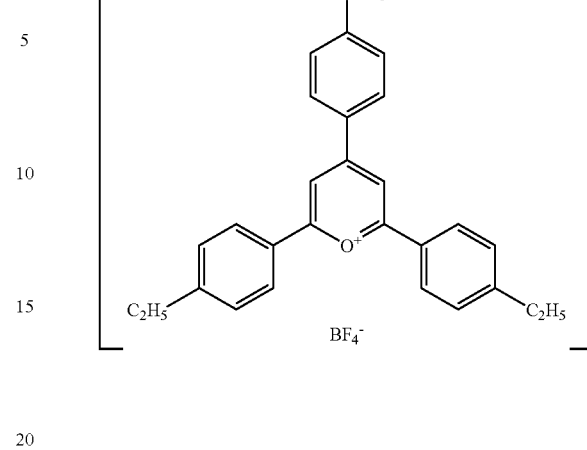

The sensitizing dye or pigment may be selected from cyanines disclosed in JP-B No. 46-42363, the disclosure of which is incorporated herein by reference. Examples thereof include the following compounds.

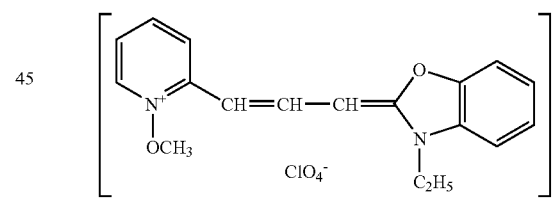

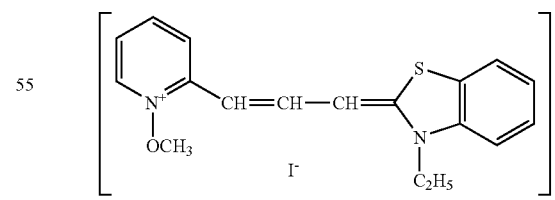

The sensitizing dye or pigment may be selected from benzofuran colorants disclosed in JP-A No. 2-63053, the disclosure of which is incorporated herein by reference. Examples thereof include the following compounds.

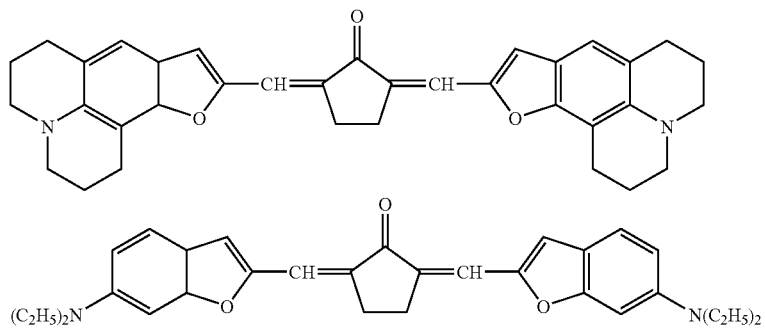

The sensitizing dye or pigment may be selected from conjugate ketone colorants disclosed in JP-A Nos. 2-85858 and 2-216154, the disclosures of which are incorporated herein by reference. Examples thereof include the following compounds.

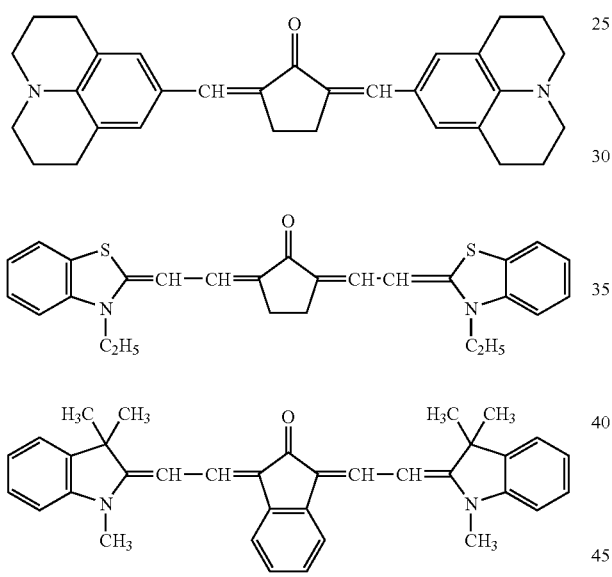

The sensitizing dye or pigment may be selected from colorants disclosed in JP-A No. 57-10605 and azo cinnamylidene derivatives disclosed in JP-B No. 2-30321, the disclosures of which are incorporated herein by reference. Examples thereof include the following compound.

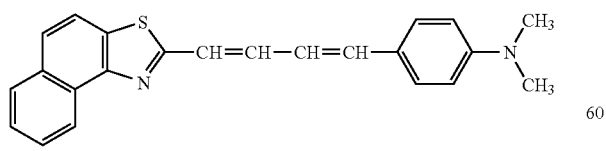

The sensitizing dye or pigment may be selected from cyanine colorants disclosed in JP-A No. 1-287105, the disclosure of which is incorporated herein by reference. Examples thereof include the following compounds.

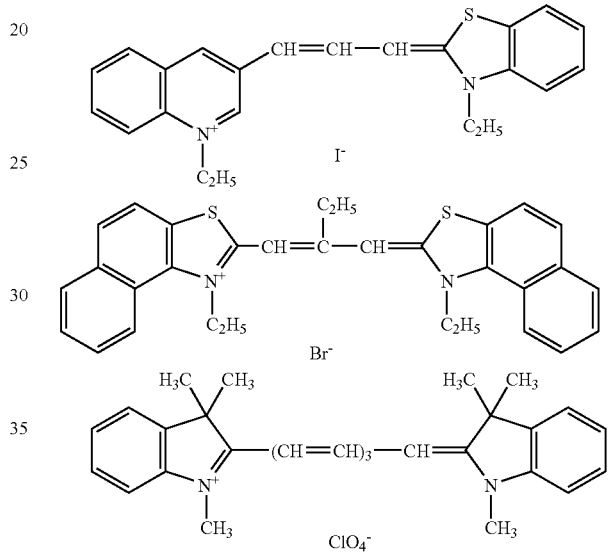

The sensitizing dye or pigment may be selected from xanthene colorants disclosed in JP-A Nos. 62-31844, 62-31848, and 62-143043, the disclosures of which are incorporated herein by reference. Examples thereof include the following compounds.

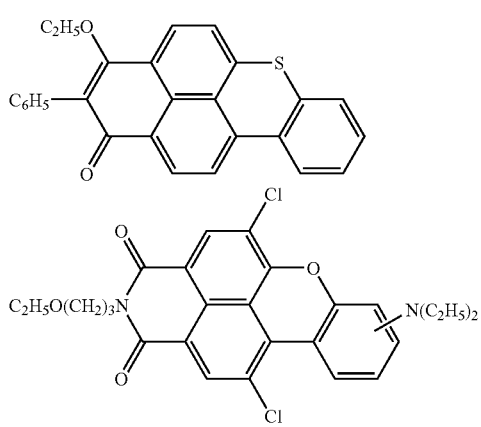

The sensitizing dye or pigment may be selected from aminostyryl ketones disclosed in JP-B No. 59-28325, the disclosure of which is incorporated herein by reference. Examples thereof include the following compounds.

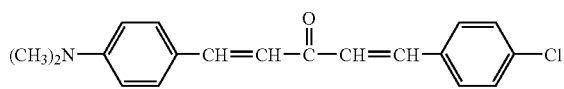

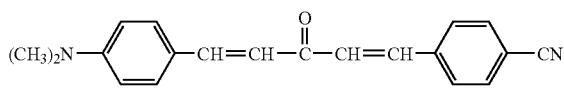

The sensitizing dye or pigment may be selected from colorants represented by the following formulae (13) to (15) disclosed in JP-A No. 2-179643, the disclosure of which is incorporated herein by reference.

Formula (13)

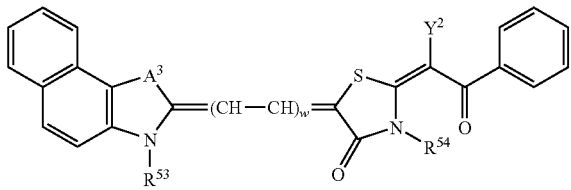

Formula (14)

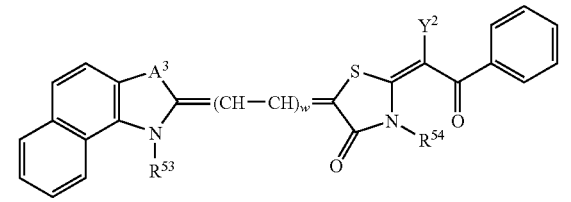

Formula (15)

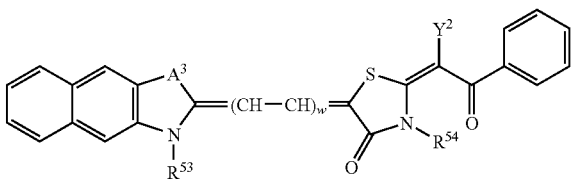

In formulae (13) to (15), $A^3$ represents an oxygen atom, a sulfur atom, a selenium atom, a tellurium atom, a nitrogen atom substituted by an alkyl or aryl group, or a carbon atom substituted by two alkyl groups; $Y^2$ represents a hydrogen atom, an alkyl group, a substituted alkyl group, an aryl group, a substituted aryl group, an aralkyl group, an acyl group or a substituted alkoxycarbonyl group; and $R^{53}$ and $R^{54}$ each independently represent a hydrogen atom, an alkyl group having 1 to 18 carbon atoms, or a substituted alkyl group having 1 to 18 carbon atoms in which the substituent is selected from —$OR^{55}$, —$(CH_2CH_2O)$, —$R^{55}$, halogen atoms (F, Cl, Br, and I), and groups represented by the following formulae (wherein $R^{55}$ represents a hydrogen atom or an alkyl group having 1 to 10 carbon atoms; $B^1$ represents a dialkylamino group, a hydroxyl group, an acyloxy group, a halogen atom, or a nitro group; and w represents an integer of 0 to 4).

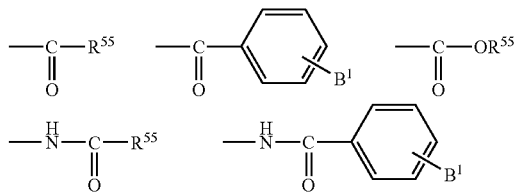

The sensitizing dye or pigment may be selected from merocyanine colorants represented by the following formula (16) disclosed in JP-A No. 2-244050, the disclosure of which is incorporated herein by reference. Examples thereof include the following compounds.

Formula (16)

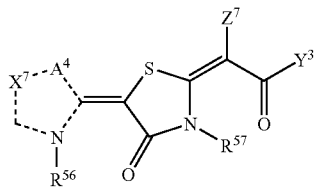

In formula (16), $R^{56}$ and $R^{57}$ each independently represent a hydrogen atom, an alkyl group, a substituted alkyl group, an alkoxycarbonyl group, an aryl group, a substituted aryl group, or an aralkyl group. $A^4$ represents an oxygen atom, a sulfur atom, a selenium atom, a tellurium atom, a nitrogen atom substituted by an alkyl or aryl group, or a carbon atom substituted by two alkyl groups. $X^7$ represents a non-metal atomic group necessary for forming a nitrogen-containing heterocyclic five-membered ring. $Y^3$ represents a substituted phenyl group, a substituted or non-substituted polynuclear aromatic cycle, or a substituted or non-substituted aromatic heterocycle. $Z^7$ represents a hydrogen atom, an alkyl group, a substituted alkyl group, an aryl group, a substituted aryl group, an aralkyl group, an alkoxy group, an alkylthio group, an arylthio group, a substituted amino group, an acyl group, or an alkoxycarbonyl group. $Z^7$ and $Y^3$ may be bonded to each other to form a ring. Examples of compounds represented by formula (16) include the following.

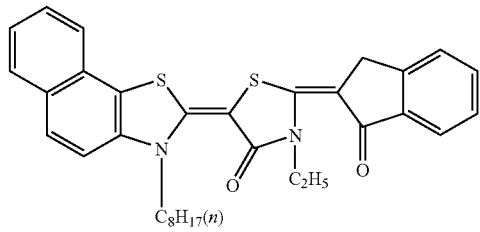

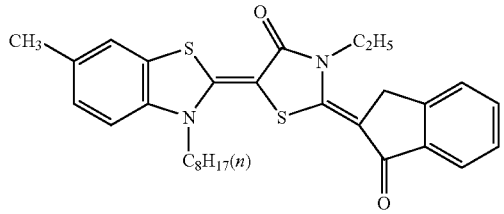

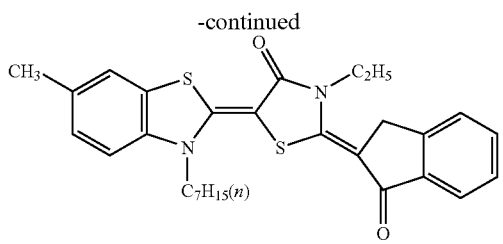

The sensitizing dye or pigment may be selected from merocyanine colorants represented by the following formula (17) disclosed in JP-B No. 59-28326, the disclosure of which is incorporated herein by reference.

Formula (17)

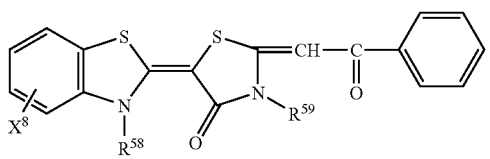

In formula (17), $R^{58}$ and $R^{59}$ each independently represent a hydrogen atom, an alkyl group, a substituted alkyl group, an aryl group, a substituted aryl group, or an aralkyl group. $X^8$ represents a substituent having a Hammett's σ value of −0.9 to +0.5.

The sensitizing dye or pigment may be selected from merocyanine colorants represented by the following formula (18) disclosed in JP-A No. 59-89303, the disclosure of which is incorporated herein by reference.

Formula (18)

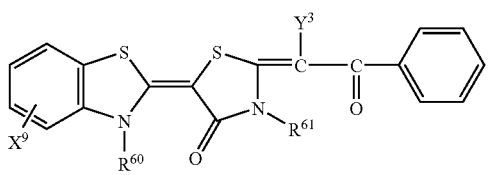

In formula (18), $R^{60}$ and $R^{61}$ each independently represent a hydrogen atom, an alkyl group, a substituted alkyl group, an aryl group, a substituted aryl group, or an aralkyl group. $X^9$ represents a substituent having a Hammett's σ value of −0.9 to +0.5. $Y^4$ represents a hydrogen atom, an alkyl group, a substituted alkyl group, an aryl group, a substituted aryl group, an aralkyl group, an acyl group, or an alkoxycarbonyl group. Examples of compounds represented by formula (18) include the following compounds.

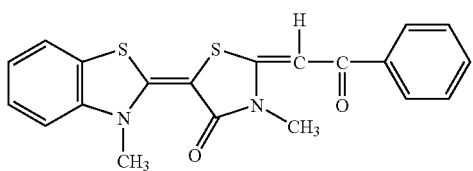

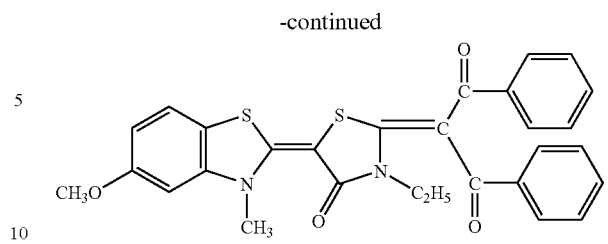

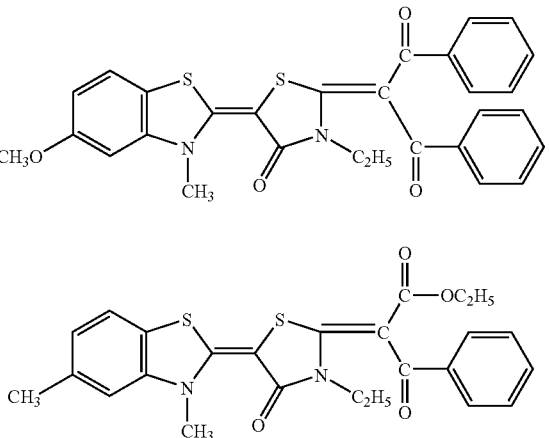

The sensitizing dye or pigment may be selected from merocyanine colorants represented by the following formula (19) disclosed in JP-A No. 6-269047, the disclosure of which is incorporated herein by reference.

Formula (19)

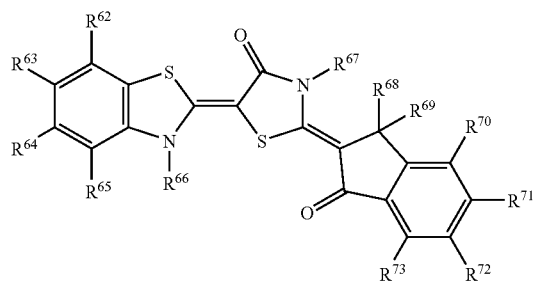

In formula (19), $R^{62}$, $R^{63}$, $R^{64}$, $R^{65}$, $R^{70}$, $R^{71}$, $R^{72}$, and $R^{73}$ each independently represent a hydrogen atom, a halogen atom, an alkyl group a substituted alkyl group an aryl group, a substituted aryl group, a hydroxyl group, a substituted oxy group, a mercapto group, a substituted thio group, an amino group, a substituted amino group, a substituted carbonyl group, a sulfo group, a sulfonato group, a substituted sulfinyl group, a substituted sulfonyl group, a phosphono group, a substituted phosphono group, a phosphonato group, a substituted phosphonato group, a cyano group, or a nitro group, wherein a bond may be formed between $R^{62}$ and $R^{63}$, between $R^{63}$ and $R^{64}$, between $R^{64}$ and $R^{65}$, between $R^{70}$ and $R^{71}$ between $R^{71}$ and $R^{72}$, or between $R^{72}$ and $R^{73}$, to form an aliphatic ring or an aromatic ring. $R^{66}$ represents a hydrogen atom, an alkyl group, a substituted alkyl group, an aryl group, or a substituted aryl group. $R^{67}$ represents a substituted or non-substituted alkenylalkyl group or a substituted or non-substituted alkynylalkyl group. $R^{68}$ and $R^{69}$ each independently represent a hydrogen atom, a halogen atom, an alkyl group, a substituted alkyl group, an aryl group, a substituted aryl group, or a substituted carbonyl group. Examples of compounds represented by formula (19) include the following compounds.

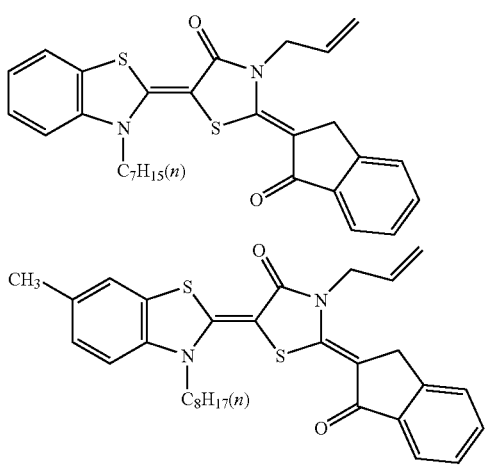

The sensitizing dye or pigment may be selected from benzpyran colorants represented by the following formula (20) disclosed in JP-A No. 7-164583, the disclosure of which is incorporated herein by reference.

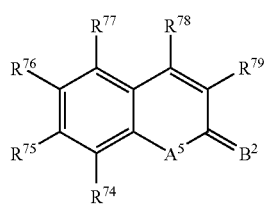

Formula (20)

In formula (20), $R^{74}$ to $R^{77}$ each independently represent a hydrogen atom, a halogen atom, an alkyl group, an aryl group, a hydroxyl group, an alkoxy group, or an amino group. $R^{74}$ to $R^{77}$ may be bonded to each other to form a ring comprised of non-metallic atoms including at least one carbon atom. $R^{78}$ represents a hydrogen atom, an alkyl group, an aryl group, an aromatic heterocyclyl group, a cyano group, an alkoxy group, a carboxyl group, or an alkenyl group. $R^{79}$ represents a hydrogen atom, an alkyl group, an aryl group, an aromatic heterocyclyl group, a cyano group, an alkoxy group, a carboxyl group, an alkenyl group, or $-Z^7-R^{78}$, in which $Z^7$ represents a carbonyl group, a sulfonyl group, a sulfinyl group, or an arylene dicarbonyl group. $R^{78}$ and $R^{79}$ may be bonded to each other to form a ring comprised of non-metallic atoms. $A^5$ represents an O atom, an S atom, an NH group, or an N atom which may have a substituent. $B^2$ represents an O atom or $=C(G^7)(G^8)$. $G^7$ and $G^8$ may be the same as each other, or different from each other. $G^7$ and $G^8$ each represent a hydrogen atom, a cyano group, an alkoxycarbonyl group, an aryloxycarbonyl group, an acyl group, an arylcarbonyl group, an alkylthio group, an arylthio group, an alkylsulfonyl group, an aryl sulfonyl group, or a fuluorosulfonyl group. At least one of $G^7$ and $G^8$ is different from a hydrogen atom. $G^7$ and $G^8$ may be bonded to each other to form a ring comprised of non-metallic atoms including at least one carbon atom.

The sensitizing dye may be selected from merocyanine colorants described in JP-B No. 61-9621, and indolenine cyanine colorants described in JP-A No. 2002-278057, the disclosures of which are incorporated herein by reference. The amount of the sensitizing colorant may be 0.1 to 50% by mass, preferably 0.5 to 30% by mass, more preferably 1 to 20% by mass, based on the total amount of the solids in the polymerizable composition or the photopolymerizable layer.

Furthermore, the following infrared absorbers (dyes or pigments) can be preferably used as sensitizing colorants. Examples of the dyes include cyanine dyes described in JP-A Nos. 58-125246, 59-84356, 59-202829 and 60-78787 (the disclosures of which are incorporated herein by reference), cyanine dyes described in GB Patent No. 434,875 (the disclosure of which is incorporated herein by reference), and the specific indolenine cyanine colorants described above.

Near-infrared absorbing sensitizing agents described in U.S. Pat. No. 5,156,938 (the disclosure of which is incorporated herein by reference) are also preferable, and examples of IR absorbers further include substituted arylbenz(thio)pyrylium salts described in U.S. Pat. No. 3,881,924 (the disclosure of which is incorporated herein by reference), trimethinethiapyrylium salts described in JP-A No. 57-142645 (U.S. Pat. No. 4,327,169, the disclosures of which are incorporated herein by reference), pyrylium compounds described in JP-A Nos. 58-181051, 58-220143, 59-41363, 59-84248, 59-84249, 59-146063 and 59-146061 (the disclosures of which are incorporated herein by reference), cyanine colorants described in JP-A No. 59-216146 (the disclosure of which is incorporated herein by reference), pentamethinethiopyrylium salts described in U.S. Pat. No. 4,283,475 (the disclosure of which is incorporated herein by reference), and pyrylium compounds described in JP-B Nos. 5-13514 and 5-19702 (the disclosures of which are incorporated herein by reference) can also be used.

Examples of IR absorbing colorants further include near-infrared absorbing dyes shown by the formulae (1) and (II) in U.S. Pat. No. 4,756,993 (the disclosure of which is incorporated herein by reference), and phthalocyanine dyes described in EP-A No. 916,513A2 (the disclosure of which is incorporated herein by reference).

Examples of IR absorbing colorants further include anionic infrared absorbers described in JP-A No. 11-338131 (the disclosure of which is incorporated herein by reference). The anionic infrared absorbers as used herein refer to colorants whose nuclei contain anionic structures but do not contain cationic structures, and which substantially absorb infrared rays. Examples thereof include (c1) anionic metal complexes, (c2) anionic carbon blacks, (c3) anionic phthalocyanines and (c4) compounds represented by the following formula (21). The counter-cation of the anionic infrared absorber is a monovalent cation such as a proton, or a polyvalent cation.

Formula (21)

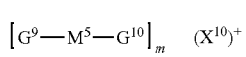

The anionic metal complex (c1) as used herein refers to a complex substantially absorbing light whose net charge (including charges of the ligands and the central metal) is anionic.

Examples of the anionic carbon black (c2) include carbon black to which an anionic group is bound such as a sulfonic acid group, a carboxylic acid group or a phosphonic acid group. In order to introduce such a group into carbon black, carbon black may be oxidized with a predetermined acid as described in *Carbon Black Binran*, Third Edition (Carbon Black Handbook, Third Edition), p. 12, edited by Society of Carbon Black, Apr. 5, 1995, published by Society of Carbon Black, the disclosure of which is incorporated herein by reference.

The anionic phthalocyanine (c3) as used herein refers to a compound in which an anionic group selected from the anionic groups mentioned as substituents in the description of (c2) is bonded to the phthalocyanine skeleton to form an anion.

The compound (c4) represented by formula (21) will be described in detail. In formula (21), $G^9$ represents an anionic substituent; $G^{10}$ represents a neutral substituent; $(X^{10})^+$ represents a monovalent to m-valent cation such as a proton, wherein m represents an integer of 1 to 6; and $M^5$ represents a conjugated chain, which may have a substituent and may have a cyclic structure. The conjugated chain $M^5$ can be represented by the following formula:

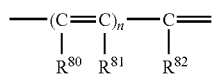

In the formula, $R^{10}$, $R^{81}$ and $R^{82}$ each independently represents a hydrogen atom, a halogen atom, a cyano group, an alkyl group, an aryl group, an alkenyl group, an alkynyl group, a carbonyl group, a thio group, a sulfonyl group, a sulfinyl group, an oxy group or an amino group. $R^{80}$, $R^{81}$ and $R^{82}$ may be bonded to each other to form a cyclic structure, and n represents an integer of 1 to 8.

Among the anionic infrared absorbers represented by formula (21), the following compounds IRA-1 to IRA-5 are preferable.

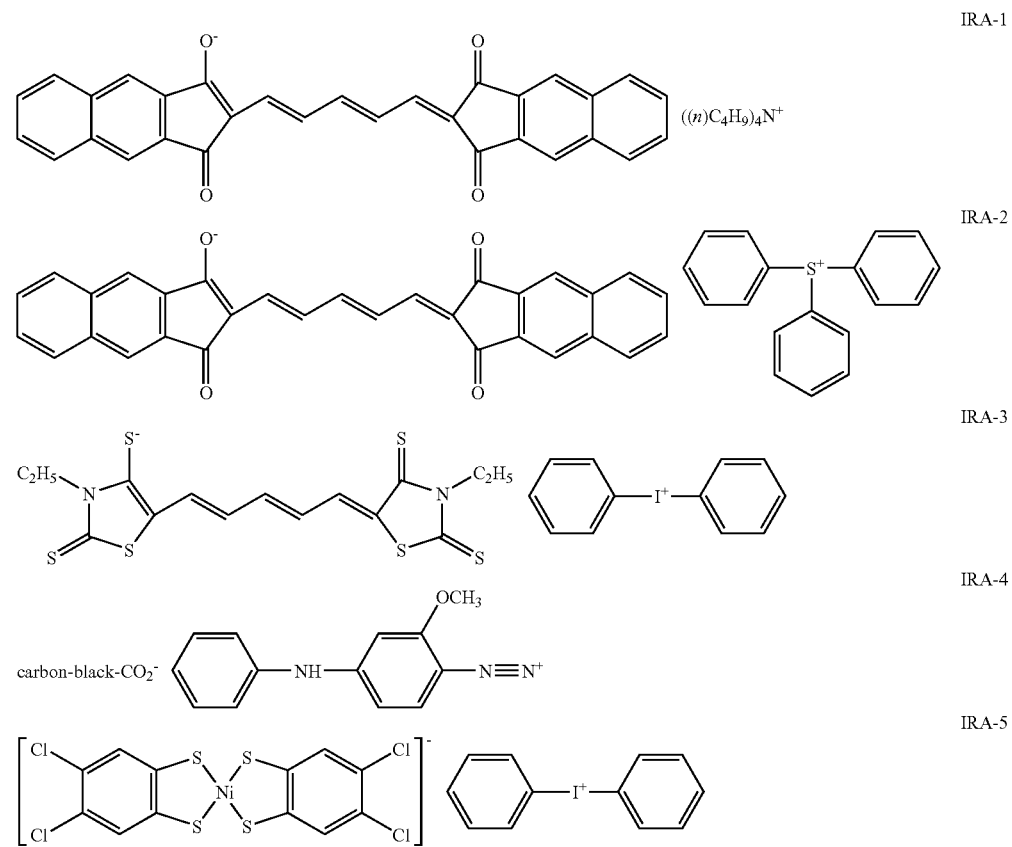

The cationic infrared absorbers IRC-1 to IRC-44 shown below are also preferable.

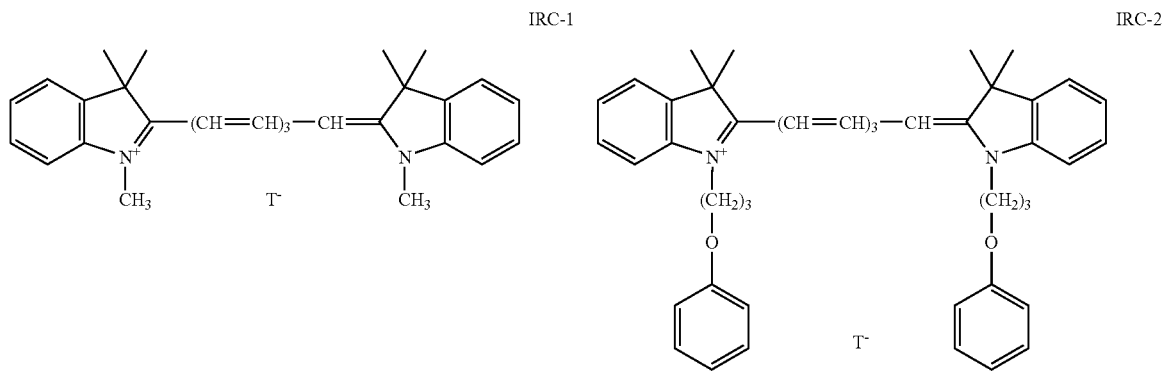

-continued
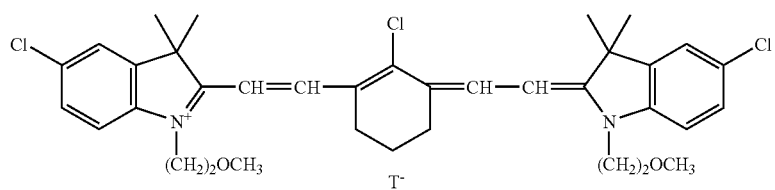
IRC-3
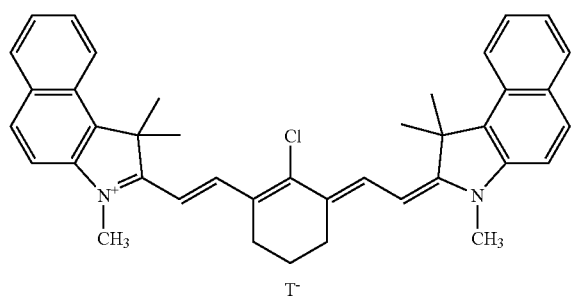
IRC-4
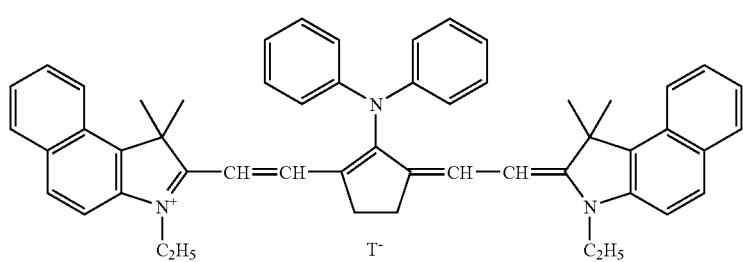
IRC-5
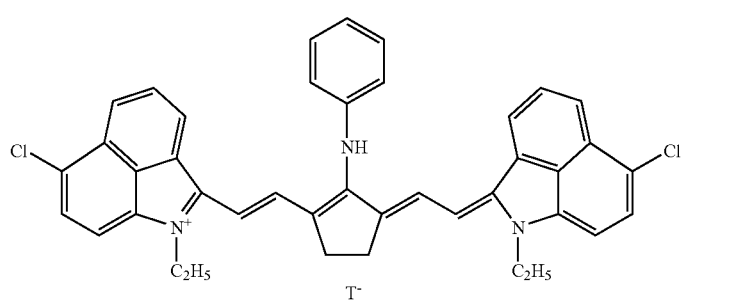
IRC-6
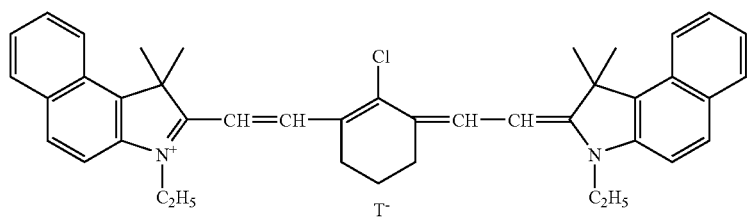
IRC-7
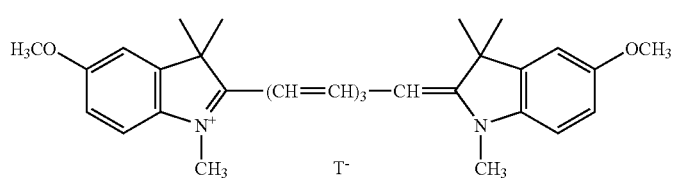
IRC-8

-continued
IRC-9
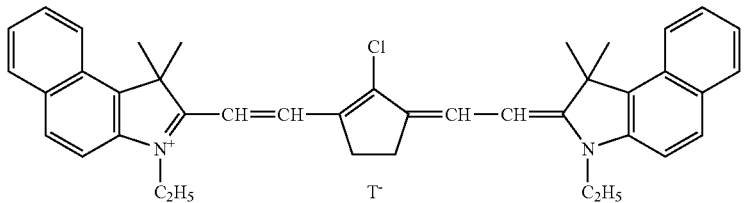
IRC-10
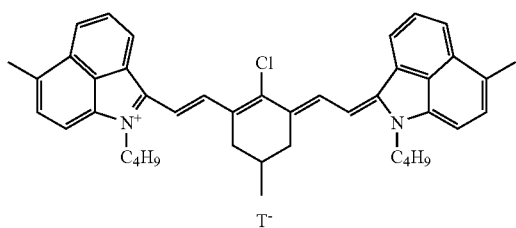
IRC-11
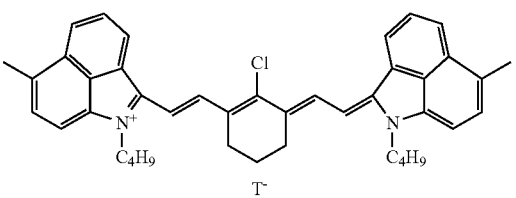
IRC-12
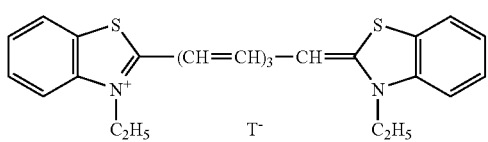
IRC-13
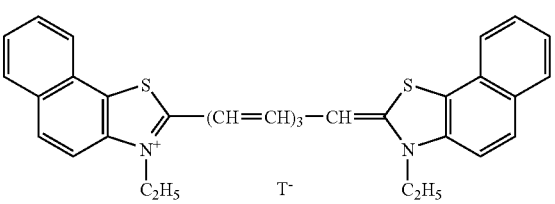
IRC-14
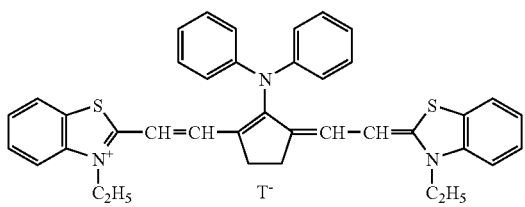
IRC-15
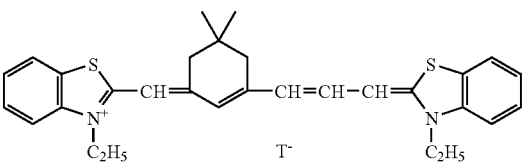
IRC-16
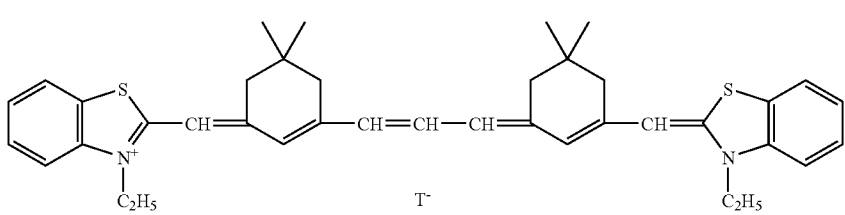
IRC-17
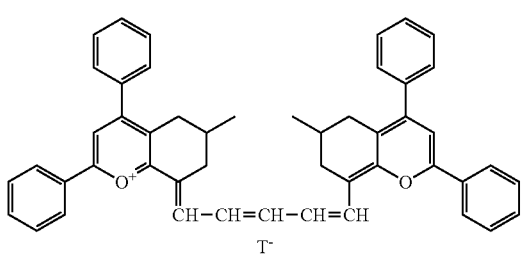
IRC-18
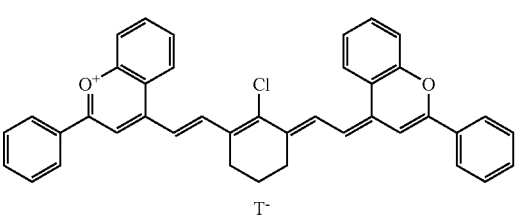

-continued
IRC-19
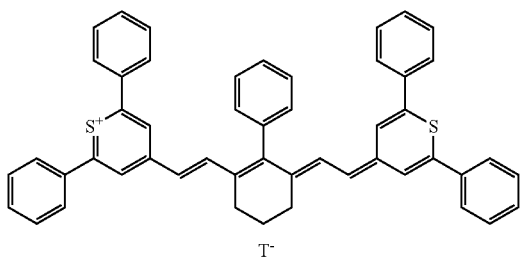
IRC-20
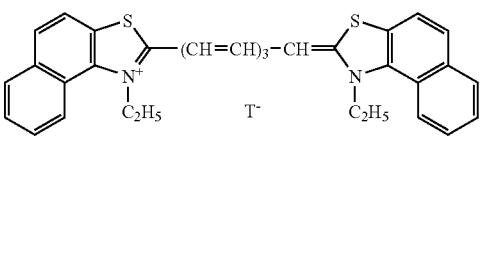
IRC-21
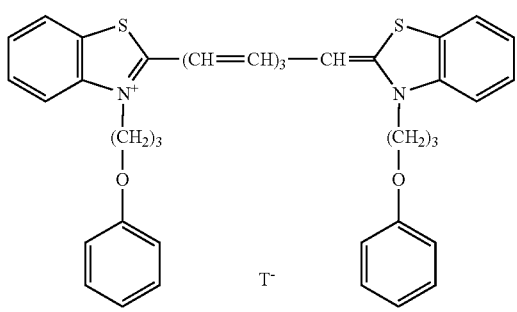
IRC-22
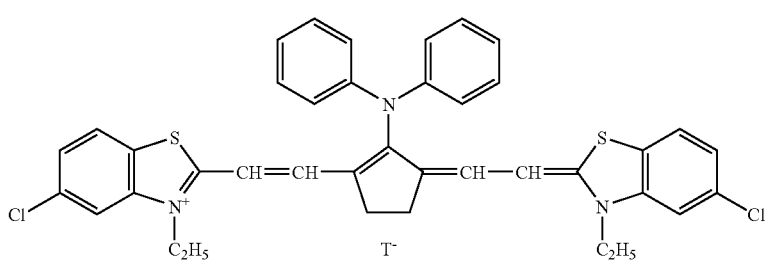
IRC-23
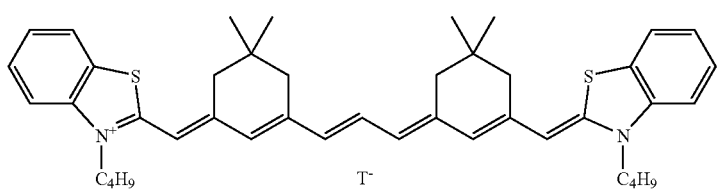
IRC-24
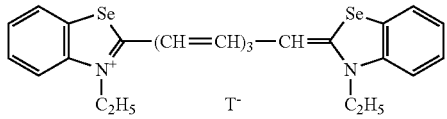
IRC-25
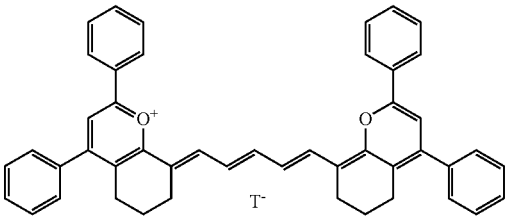
IRC-26
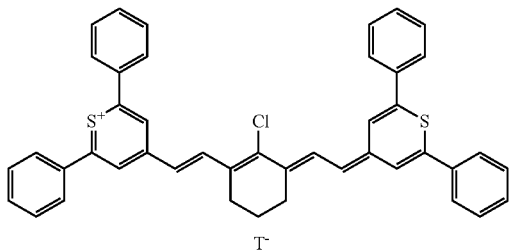
IRC-27
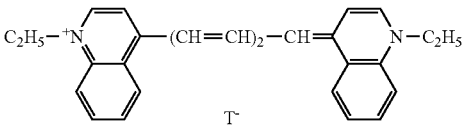

-continued
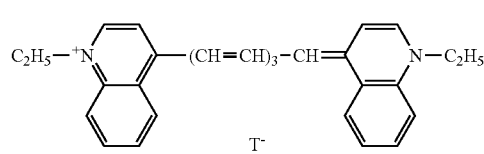
IRC-28
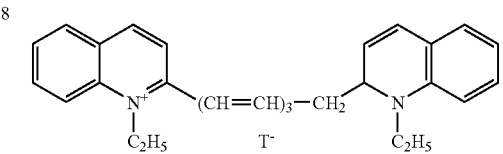
IRC-29
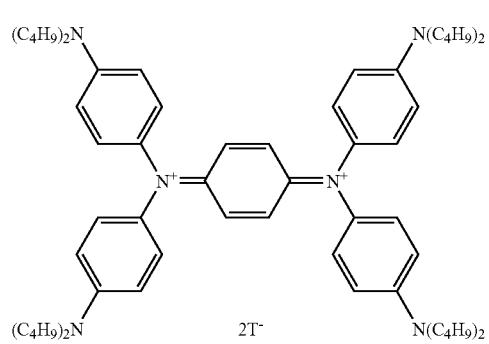
IRC-30
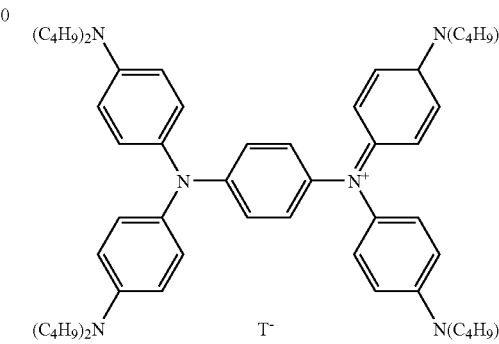
IRC-31
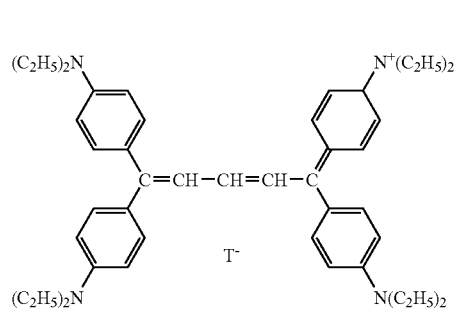
IRC-32
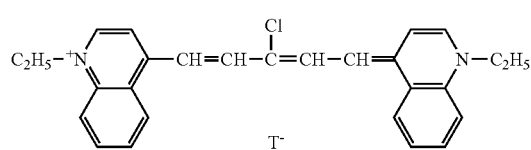
IRC-33
IRC-34
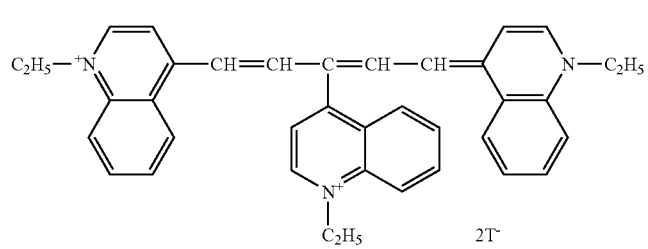
IRC-35
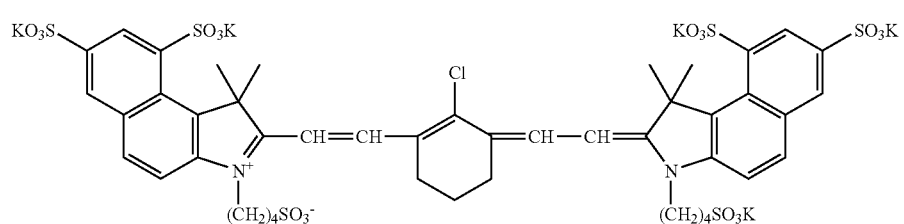
IRC-36
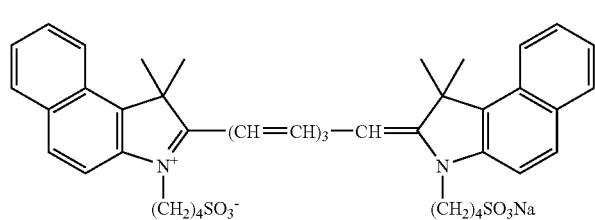

-continued
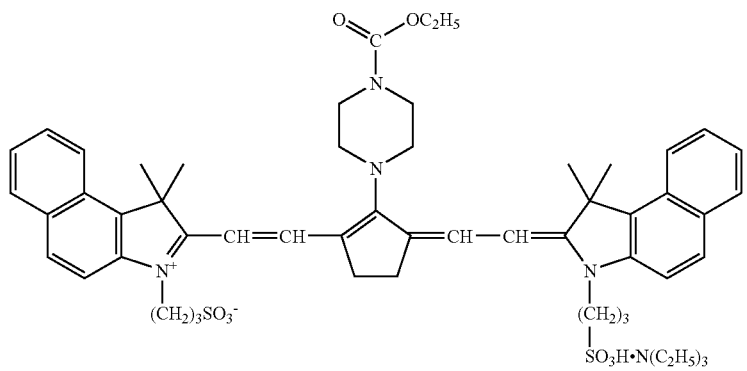
IRC-37
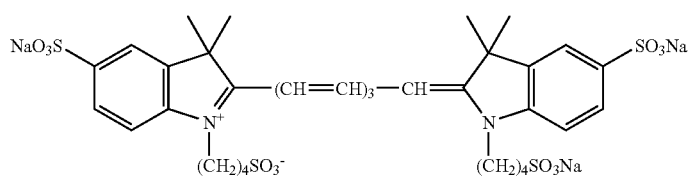
IRC-38
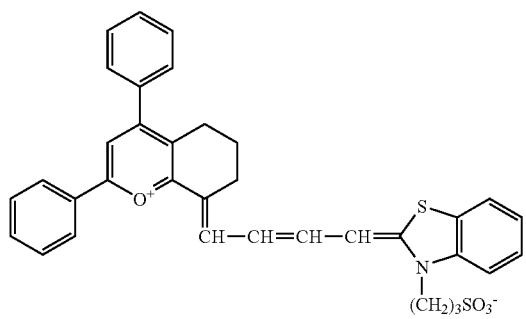
IRC-39
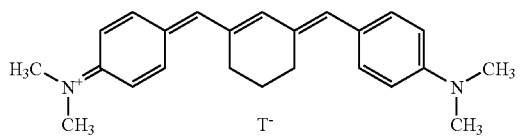
IRC-40
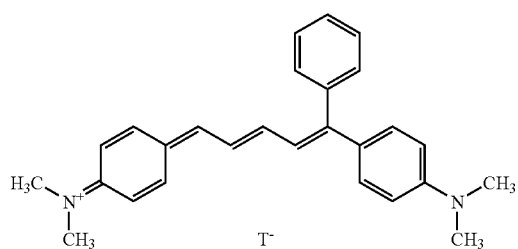
IRC-41
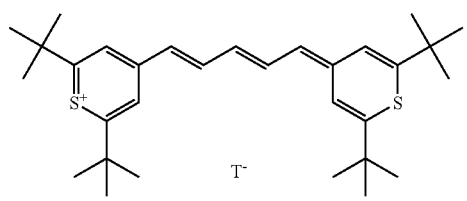
IRC-42
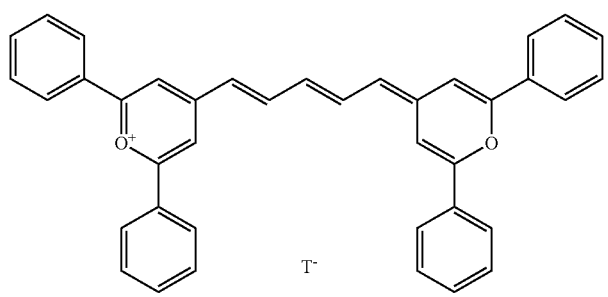
IRC-43

IRC-44

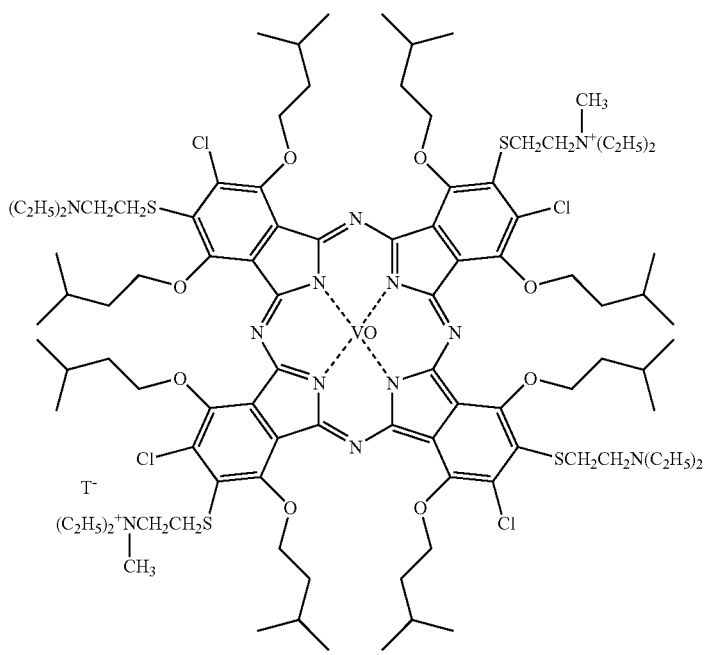

In the foregoing structural formulae, $T^-$ represents a monovalent counter anion, preferably a halogen anion (such as $F^-$, $Cl^-$, $Br^-$ or $I^-$), a Lewis acid anion (such as $BF_4^-$, $PF_6^-$, $SbCl_6^-$ or $Cl_4^-$), an alkylsulfonate anion or an arylsulfonate anion.

The alkyl group in the alkylsulfonate is a linear, branched or cyclic alkyl group having 1 to 20 carbon atoms, and specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group. Among these, preferable are a linear alkyl group having 1 to 12 carbon atoms, a branched alkyl group having 3 to 12 carbon atoms, and a cyclic alkyl group having 5 to 10 carbon atoms.

The aryl group in the arylsulfonate is a group containing one benzene ring, a group containing a condensed ring comprised of two or three benzene rings, or a group containing a condensed ring comprised of a benzene ring and a 5-membered unsaturated ring. Specific examples thereof include a phenyl group, a naphthyl group, an anthryl group, a phenanthryl group, an indenyl group, an acenabutenyl group and a fluorenyl group. Among these, a phenyl group and a naphthyl group are preferable.

The following non-ionic infrared absorbents IRN-1 to IRN-9 are also preferable.

IRN-1

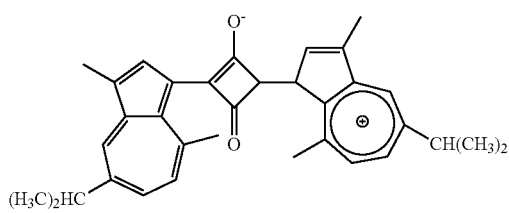

IRN-2

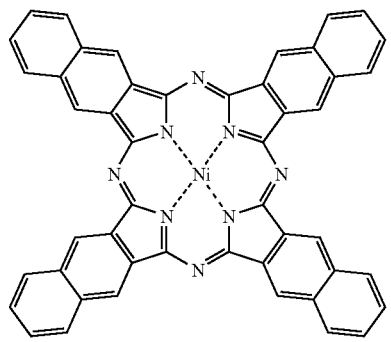

-continued
IRN-3
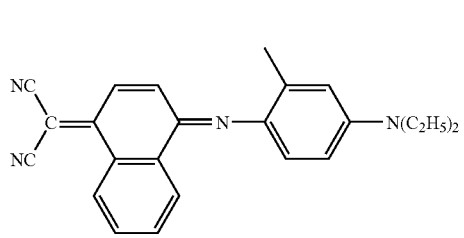
IRN-4
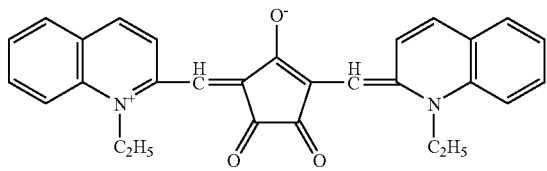
IRN-5
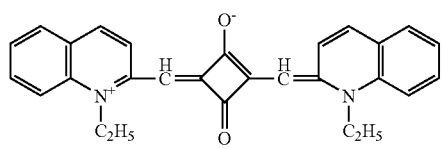
IRN-6
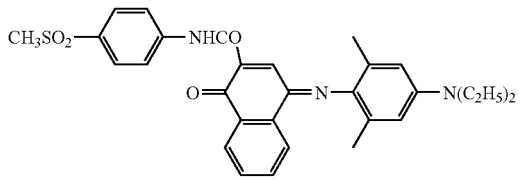
IRN-7
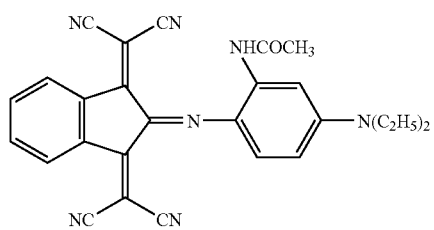
IRN-8
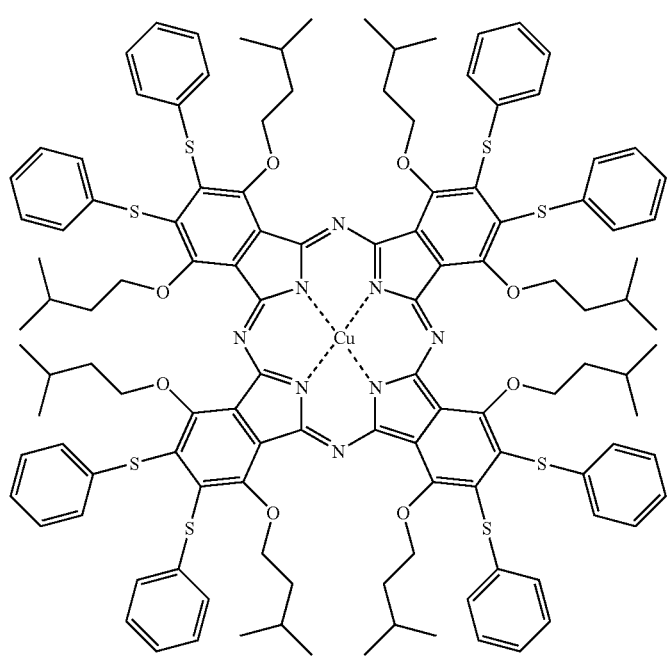

IRN-9

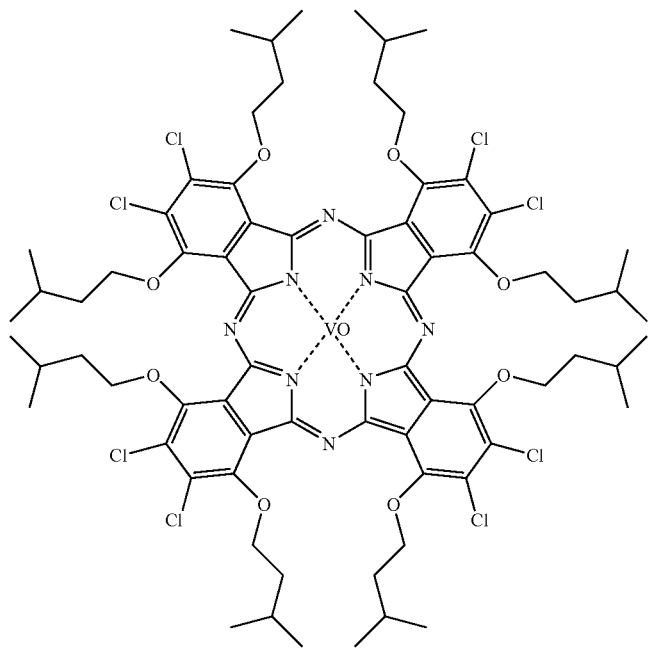

The anionic infrared absorber is preferably IRA-1, the cationic infrared absorber is preferably IRC-7, IRC-30, IRC-40 or IRC-42, the nonionic infrared absorber is preferably IRN-9.

When the planographic printing plate precursor is subjected to image formation with a laser light source emitting infrared light of 760 nm to 1200 nm, it is preferable to incorporate an IR absorber into the polymerizable composition or the photopolymerizable layer. The IR absorber has a function of converting absorbed infrared light to heat. The heat thus generated decomposes a polymerization initiator (radical generator) to generate a radical. The IR absorber may be a dye or pigment having an absorption peak within the wavelength range of 760 nm to 1200 nm.

The IR absorber may be a dye selected from known dyes disclosed, for example, in "Senryou Binran" edited by organic synthesis chemistry association (1970), the disclosure of which is incorporated herein by reference. The IR absorber may be an azo dye, a metal complex azo dye, a pyrazolone azo dye, a naphthoquinone dye, an anthraquinone dye, a phthalocyanine dye, a carbonium dye, a quinoneimine dye, a methin dye, a cyanine dye, a squalirium dye, a pyrylium salt, or a metal thiolate complex. The IR absorbing dye may be selected from: cyanine dyes such as cyanine dyes disclosed in JP-A Nos. 58-125246, 59-84356, and 60-78787; methine dyes such as methine dyes disclosed in JP-A Nos. 58-173696, 58-181690, and 58-194595 (the disclosures of which are incorporated herein by reference); naphthoquinone dyes such as naphthoquinone dyes disclosed in JP-A Nos. 58-112793, 58-224793, 59-48187, 59-73996, 60-52940, and 60-63744 (the disclosures of which are incorporated herein by reference); and squalirium dyes such as squalirium dyes disclosed in JP-A No. 58-112792 (the disclosure of which is incorporated herein by reference).

Examples of IR absorbing colorants further include specific indolenine cyanine colorants shown below which are disclosed in JP-A No. 2002-278057.

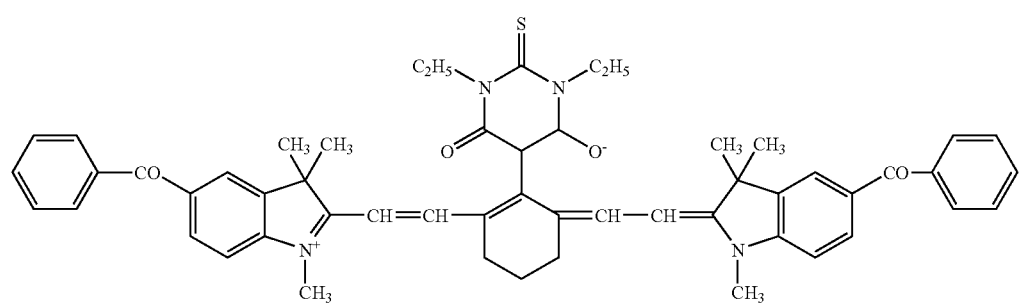

-continued

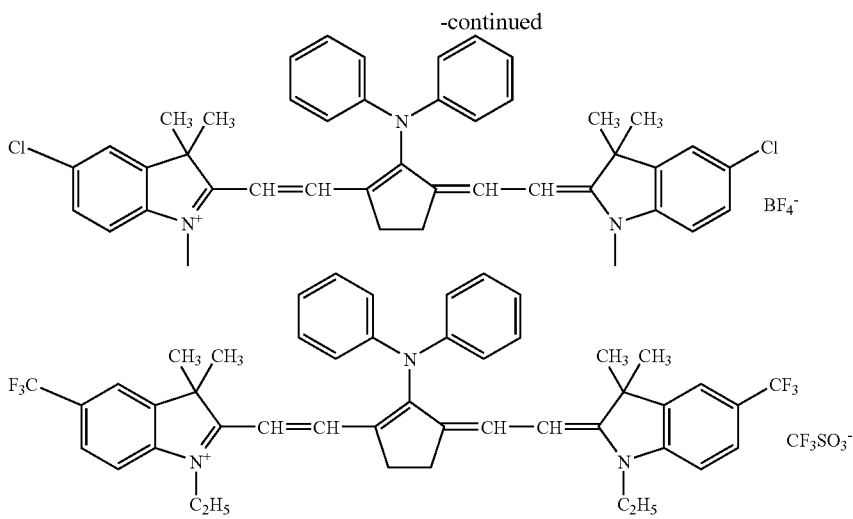

IR absorbing dye may be a cyanine dye, a squalirium dye, a pyrylium salt, a nickel thiolate complex, or an indolenine cyanine dye. The IR absorbing dye is preferably a cyanine dye or an indolenine cyanine dye. Cyanine dyes represented by the following formula (i) are more preferable.

Formula (i)

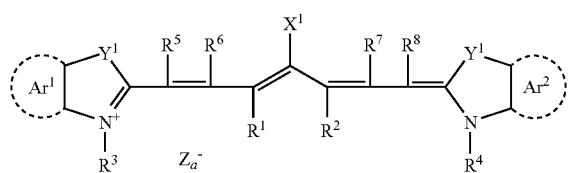

$X^1$ represents a hydrogen atom, a halogen atom, —NPh$_2$, $X^2$—L$^1$, or a group shown below.

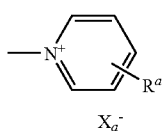

$X^1$ represents an oxygen atom, a nitrogen atom, or a sulfur atom. L$^1$ represents a hydrocarbon group having 1 to 12 carbon atoms, an aromatic ring having a hetero-atom, or a hydrocarbon group having 1 to 12 carbon atoms and at least one hetero-atom. The term "hetero-atom" used here refers to N, S, O, a halogen atom, or Se.

$Xa^-$ represents a counter anion. $R^a$ represents a substituent selected from a hydrogen atom, alkyl groups, aryl groups, substituted amino groups, non-substituted amino groups, and halogen atoms.

In formula (i), $R^1$ and $R^2$ each independently represent a hydrocarbon group having 1 to 12 carbon atoms. $R^1$ and $R^2$ are each preferably a hydrocarbon group having 2 or more carbon atoms, from the viewpoint of storage stability of a coating solution for recording layer. In a preferable structure, $R^1$ and $R^2$ are bound to each other to form a five-membered or six-membered ring.

$Ar^1$ and $Ar^2$ may be the same as each other or different from each other. $Ar^1$ and $Ar^2$ each represent an aromatic hydrocarbon group which may have a substituent. The aromatic hydrocarbon group may be a benzene ring or a naphthalene ring. The substituent may be a hydrocarbon group having 12 or less carbon atoms, a halogen atom, or an alkoxy group having 12 or less carbon atoms. $Y^1$ and $Y^2$ may be the same as each other or different from each other. Y and Y each represent a sulfur atom or a dialkylmethylene group having 12 or less carbon atoms. $R^3$ and $R^4$ may be the same as each other or different from each other. $R^3$ and $R^4$ each represent a hydrocarbon group having 20 or less carbon atoms which may have a substituent. The substituent may be an alkoxy group having 12 or less carbon atoms, a carboxyl group, or a sulfo group. $R^5$ to $R^8$ each independently represent a hydrogen atom or a hydrocarbon group having 12 or less carbon atoms, preferably a hydrogen atom from the viewpoint of availability of raw materials. $Z_a^-$ represents a counter-anion. $Z_a^-$ is unnecessary when the cyanine colorant represented by formula (i) is electrically neutralized by an anionic substituent within the cyanine colorant molecule. $Z_a^-$ may be a halogen ion, a perchloric acid ion, a tetrafluoroborate ion, a hexafluorophosphate ion, or a sulfonic acid ion, preferably a perchloric acid ion, a hexafluorophosphate ion, or an arylsulfonic acid ion, from the viewpoint of storage stability of a coating liquid for the recording layer.

Examples of cyanine dyes represented by formula (i) include cyanine dyes disclosed in paragraphs [0017] to [0019] of JP-A No. 2001-133969, the disclosure of which is incorporated herein by reference. The specific indolenine cyanine colorants described above which are disclosed in JP-A No. 2002-278057 are also preferable.

The IR absorber may be added to the same layer as the layer containing other components, or may be added to a separate layer. The IR absorber may be added such that the polymerizable composition layer or the photopolymerizable layer of the resultant negative planographic printing plate precursor has an absorbance of 0.3 to 1.2 (preferably 0.4 to 1.1) at the absorption peak in the wavelength range of 760 nm to 1200 nm when measured by a reflection measuring method. When the absorbance is in the range, the polymerization of the polymerizable composition or the photopolymerizable layer proceeds uniformly with respect to the direction of the depth of the layer, and the cured film in image areas has high strength and adhesion to the support.

The absorbance of the polymerizable composition layer or the photopolymerizable layer may be adjusted by the amount of IR absorber to be added to the layer and by the thickness of the layer. The absorbance may be measured by a usual method. For example, the absorbance may be measured by: forming a polymerizable composition layer or a photopolymerizable layer on a reflective support such as aluminum such that the layer has a predetermined thickness which corresponds to an adequate dry coating weight as a planographic printing plate; and then measuring the reflection density by an optical densitometer. As an alternative, the absorbance may be measured by a spectrophotometer according to a reflection method using an integrating sphere.

Pigment

Examples of the pigment used in the invention include commercially available pigments and pigments described in Color Index (C.I.) Handbook, *Saishin Ganryo Binran* (Newest Pigment Handbook) (edited by Society of Pigment Technique, Japan (1977)), *Saishin Ganryo Oyo Gijutu* (Newest Pigment Application Techniques) (CMC Press (1986)) and *Insatsu Ink Gijutu* (Printing Ink Techniques) (CMC Press (1984)), the disclosures of which are incorporated herein by reference.

Examples of the pigment include black pigments, yellow pigments, orange pigments, brown pigments, red pigments, violet pigments, blue pigments, green pigments, fluorescent pigments, metal powder pigments and pigments bound to polymers. Specific examples thereof include insoluble azo pigments, azo lake pigments, condensed azo pigments, chelate azo pigments, phthalocyanine pigments, anthraquinone pigments, perylene pigments, perynone pigments, thioindigo pigments, quinacridone pigments, dioxazine pigments, isoindolinone pigments, quinophthalone pigments, dyed lake pigments, azine pigments, nitroso pigments, nitro pigments, natural pigments, fluorescent pigments, inorganic pigments and carbon black. Among these pigments, carbon black is preferable.

The pigment may be used without a surface treatment or may be used after being subjected to a surface treatment. Examples of surface treatments include a method of coating a resin or wax on the surface, a method of attaching a surfactant, and a method of binding a reactive substance (such as a silane coupling agent, an epoxy compound or a polyisocyanate) onto the surface of the pigment. These surface treatments are described in *Kinzoku Sekken no Seishitu to Oyo* (Natures and Applications of Metallic Soap) (Saiwai Shobo Co., Ltd.), *Insatsu Ink Gijutsu* (Printing Ink Techniques) (CMC Press (1984)), and *Saishin Ganryo Oyo Gijutsu* (Newest Pigment Application Techniques) (CMC Press (1986)), the disclosures of which are incorporated herein by reference.

The particle diameter of the pigment is preferably 0.01 μm to 10 μm, more preferably 0.05 μm to 1 μm, and still more preferably 0.1 μm to 1 μm, from the viewpoints of dispersion stability and evenness of the film. When the particle diameter is in the range, stability of the pigment dispersion in the polymerizable composition or the photopolymerizable layer coating liquid and uniformity of the obtained layer are improved.

As a method for dispersing the pigment, conventionally known dispersing techniques utilized in production of inks and toners can be used. Examples of dispersing machines include an ultrasonic wave dispersing instrument, a sand mill, an attritor, a pearl mill, a super mill, a ball mill, an impeller, a disperser, a KD mill, a colloid mill, a dynatron, a three-roll mill and a pressure kneader. Details thereof are described in *Saishin Ganryo Oyo Gijutsu* (Newest Pigment Application Techniques) (CMC Press (1986)).

The sensitizing colorant added for accelerating the curing reaction of the polymerizable composition or the photopolymerizable layer may be directly added to the composition or the layer together with other components, or may be added to a separate layer adjacent to the layer containing other components. The latter method can provide similar effects as the effects the former method provides.

When a planographic printing plate precursor has a negative image-recording layer which is the polymerizable composition layer or the photopolymerizable layer, the sensitizing colorant may be added to the same layer as the image forming layer or to a separate layer. The optical density of the recording layer may be 0.1 to 3.0 at the absorption peak in the wavelength range of 300 to 1,200 nm. When the optical density is in the range, high-sensitivity recording is possible. The optical density is determined by the amount of the sensitizing colorant and the thickness of the recording layer, and can be controlled by those factors.

The optical density of the recording layer can be measured by an ordinary method. Examples of measuring methods include a method comprising forming a recording layer on a transparent or white support such that the thickness of the recording layer is a predetermined thickness corresponding to an adequate dry coating weight as a planographic printing plate, and measuring the optical density by a transmission-type optical densitometer, and a method comprising forming a recording layer on a reflective support such as aluminum, and measuring the reflection density.

The amount of the pigment or dye may be 0.01 to 50% by mass, preferably 0.1 to 10% by mass, based on the total amount of the solids in the recording layer. In the case of the dye, the amount thereof may be 0.5 to 10% by mass based on the total amount of the solids in the recording layer. In the case of the pigment, the amount thereof may be 0.1 to 10% by mass based on the total amount of the solids in the recording layer. When the amount of the dye or pigment is in the range, the recording layer has high sensitivity and is uniform and highly durable.

When the sensitizing colorant is used, the ratio by mol of the polymerization initiator to the sensitizing dye in the polymerizable composition or the photopolymerizable layer may be in the range of 100:0 to 1:99, preferably in the range of 90:10 to 10:90, still more preferably in the range of 80:20 to 20:80.

The polymerizable composition or the photopolymerizable layer may include a co-sensitizer which may be selected from known compounds each having a function of improving sensitivity or suppressing polymerization inhibition by oxygen.

The co-sensitizer may be an amine and may be selected, for example from amine compounds disclosed in M. R. Sanders "Journal of Polymer Society" vol. 10 (1972), p. 3173, JP-B No. 44-20189, JP-A Nos. 51-82102, 52-134692, 59-138205, 60-84305, 62-18537, and 64-33104, and *Research Disclosure* no. 33825, the disclosures of which are incorporated herein by reference. The amine may be triethanol amine, ethyl p-dimethylamino benzoate, p-formyldimethyl aniline, or p-methylthiodimethyl aniline.

Other examples of the co-sensitizer include thiols and sulfides, such as thiol compounds disclosed in JP-B No. 55-500806 and JP-A Nos. 53-702 and 5-142772 (the disclosures of which are incorporated herein by reference) and disulfide compounds disclosed in JP-A No. 56-75643 (the disclosure of which is incorporated herein by reference). Specific examples thereof include 2-mercaptobenzothiazol, 2-mercaptobenzoxazol, 2-mercaptobenzimidazole, 2-mercapto-4(3H)-quinazoline, and β-mercaptonaphthalene.

Other examples of the co-sensitizer include: amino acid compounds (such as N-phenylglycine, N-phenylimino diacetate, and derivatives thereof); organic metal compounds such as tributyl tin acetate disclosed in JP-B No. 48-42965 (the disclosure of which is incorporated herein by reference); hydrogen donors disclosed in JP-B No. 55-34414 (the disclosure of which is incorporated herein by reference); sulfur compounds such as trithiane disclosed in JP-A No. 6-308727 (the disclosure of which is incorporated herein by reference); phosphorus compounds such as diethyl phosphite disclosed in JP-A No. 6-250389 (the disclosure of which is incorporated herein by reference); and Si—H compounds and Ge—H compounds disclosed in JP-A No. 8-65779 (the disclosure of which is incorporated herein by reference).

When the co-sensitizer is used, the amount thereof may be 0.01 to 50 parts by mass, preferably 0.02 to 20 parts by mass, more preferably 0.05 to 10 parts by mass, based on 1 part by mass of polymerization initiator.

Other Components

In addition to the above components, various additives may be optionally added to the polymerizable composition of the first embodiment or to the photopolymerizable layer of the second embodiment. Examples of the additives include laser-light absorbers, surfactants, coloring agents, print-out agents, polymerization inhibitors such as thermal polymerization inhibitors, plasticizers, inorganic particles, and low-molecular-weight hydrophilic compounds. Such additives may be added to the polymerizable composition or to the photopolymerizable layer in the form of molecular dispersion. As an alternative, additives may be contained in microcapsules together with the polymerizable compound.

Surfactant

It is preferable to use a surfactant in the polymerizable composition or in the photopolymerizable layer for the purpose of improving on-press developability at initiation of printing and improving properties of the coating surface. The surfactant may be a nonionic surfactant, an anionic surfactant, a cationic surfactant, an amphoteric surfactant, or a fluorine-based surfactant. Only a single surfactant may be used, or two or more surfactants may be used.

The nonionic surfactant is not particularly limited and may be a known nonionic surfactant. Examples thereof include polyoxyethylene alkyl ethers, polyoxyethylene alkylphenyl ethers, polyoxyethylene polystyrylphenyl ethers, polyoxyethylene polyoxypropylene alkyl ethers, glycerine fatty acid partial esters, sorbitan fatty acid partial esters, pentaerythritol fatty acid partial esters, propylene glycol mono-fatty-acid esters, sucrose fatty acid partial esters, polyoxyethylene sorbitan fatty acid partial esters, polyoxyethylene sorbitol fatty acid partial esters, polyethylene glycol fatty acid esters, polyglycerin fatty acid partial esters, polyoxyethylenized castor oils, polyoxyethylene glycerine fatty acid partial esters, fatty acid diethanol amides, N,N-bis-2-hydroxyalkylamines, polyoxyethylene alkyl amines, triethanolamine fatty acid esters, trialkylamine oxides, polyethylene glycol, and copolymers of polyethylene glycol and polypropylene glycol.

The anionic surfactant used in the invention is not particularly limited, and may be a conventionally known anionic surfactant. Examples thereof include fatty acid salts, abietates, hydroxyalkane sulfonic acid salts, alkane sulfonic acid salts, dialkylsulfosuccinic ester salts, linear alkyl benzene sulfonates, branched alkyl benzene sulfonates, alkyl naphthalene sulfonates, alkyl phenoxy polyoxyethylene propyl sulfonic acid salts, polyoxyethylene alkyl sulfophenyl ether salts, N-methyl-N-oleyl taurine sodium salt, N-alkyl sulfosuccinic monoamide disodium salts, petroleum sulfonic acid salts, sulfated tallow oil, sulfuric ester salts of alkyl esters of fatty acids, alkyl sulfuric ester salts, polyoxyethylene alkyl ether sulfuric ester salts, fatty acid monoglyceride sulfuric ester salts, polyoxyethylene alkyl phenyl ether sulfuric ester salts, polyoxyethylene styryl phenyl ether sulfuric ester salts, alkyl phosphoric ester salts, polyoxyethylene alkyl ether phosphoric ester salts, polyoxyethylene alkyl phenyl ether phosphoric ester salts, partially saponified styrene-maleic anhydride copolymers, partially saponified olefin-maleic anhydride copolymers and formalin condensates of naphthalene sulfonic acid salts.

The cationic surfactant used in the invention is not particularly limited, and may be a conventionally known cationic surfactant. Examples thereof include alkyl amine salts, quaternary ammonium salts, polyoxyethylene alkyl amine salts and polyethylene polyamine derivatives.

The amphoteric surfactant used in the invention is not particularly limited, and may be a conventionally known amphoteric surfactant. Examples thereof include carboxy betaines, aminocarboxylic acids, sulfobetaines, aminosulfates and imidazolines.

Examples of the surfactant further includes the surfactants obtained by replacing the polyoxyethylene in the above surfactants by another polyoxyalkylene such as a polyoxymethylene, a polyoxypropylene, or a polyoxybutylene.

Fluorine-based surfactants containing perfluoroalkyl groups are further preferable. Examples of the fluorine-based surfactants include: anionic surfactants such as perfluoroalkyl carboxylic acid salts, perfluoroalkyl sulfonic acid salts and perfluoroalkyl phosphoric acid salts; amphoteric surfactants such as perfluoroalkyl betaine; cationic surfactants such as perfluoroalkyl trimethyl ammonium salts; and nonionic surfactants such as perfluoroalkyl amine oxides, perfluoroalkyl ethylene oxide adducts, oligomers each having a perfluoroalkyl group and a hydrophilic group, oligomers each having a perfluoroalkyl group and a lipophilic group, oligomers each having a perfluoroalkyl group, a hydrophilic group, and a lipophilic group, and urethanes each having a perfluoroalkyl group and a lipophilic group. The fluorine-based surfactants described in JP-A Nos. 62-170950, 62-226143, and 60-168144 (the disclosures of which are incorporated herein by reference) are also preferable.

Only a single surfactant may be used or two or more surfactants may be used. The content of the surfactant in the total solid of the polymerizable composition or photopolymerizable layer may be 0.001 to 10% by mass, preferably 0.01 to 5% by mass.

Polymerization Inhibitor

It is preferable to add a small amount of a thermal polymerization inhibitor to the polymerizable composition or the photopolymerizable layer in order to inhibit undesired thermal polymerization of the polymerizable compound in the composition or layer during the production or storage thereof.

Preferable examples of the thermal polymerization inhibitor include hydroquinone, p-methoxyphenol, di-t-butyl-p-cresol, pyrogallol, t-butyl catechol, benzoquinone, 4,4'-thiobis(3-methyl-6-t-butyl phenol), 2,2'-methylene bis(4-methyl-6-t-butyl phenol), N-nitroso-N-phenyl hydroxylamine aluminum salt, and N-nitrosophenylhydroxylamine cerium (III) salt.

The amount of the thermal polymerization inhibitor to be added is preferably about 0.01 to about 5% by weight relative to the total amount of the composition or layer.

In order to prevent the polymerization inhibition by oxygen, a higher fatty acid derivative such as behenic acid or behenic amide may be added such that the higher fatty acid derivative is present on the surface of the photosensitive layer in a drying process after coating. The amount of the higher fatty acid derivative to be added may be about 0.1% by mass to about 10% by mass, preferably about 0.5% by mass to about 10% by mass, relative to the amount of the polymerizable composition or the photopolymerizable layer.

Further, a dye or a pigment may be added in order to color the recording layer. By addition of a dye or pigment, the resulting planographic printing plate precursor becomes easier to check by visual inspection or by an image density measuring instrument. The colorant is preferably a pigment since many dyes tend to decrease the exposure sensitivity of the polymerizable composition or the photopolymerizable layer. Accordingly, when a dye is used as the colorant, it is necessary to consider such characteristics. The colorant may be a pigment such as a phthalocyanine pigment, an azo pigment, carbon black, or titanium oxide, or a dye such as ethyl violet, crystal violet, an azo dye, an anthraquinone dye, or a cyanine dye. The amount of the dye and pigment to be added may be about 0.5% by mass to about 5% by mass based on the amount of the polymerizable composition or the photopolymerizable layer.

For example, dyes having large absorption in the visible light range can be used as colorants for an image. Specific examples of the colorants include Oil Yellow #101, Oil Yellow #103, Oil Pink #312, Oil Green BG, Oil Blue BOS, Oil Blue #603, Oil Black BY, Oil Black BS, Oil Black T-505 (which are manufactured by Orient Chemical Industries, Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015), and the dyes disclosed in JP-A 62-293247 (the disclosure of which is incorporated herein by reference). The colorants may be selected from pigments such as phthalocyanine pigments, azo pigments, carbon black and titanium oxide.

The addition of the colorants is preferable since the addition enables easy differentiation between the image region and the non-image region after image formation. The amount of the colorant to be added may be 0.01 to 10% by mass based on the total solid of the polymerizable composition or the photopolymerizable layer.

<Print-Out Agent>

A compound whose color can be changed by an acid or by a radical may be added to the photopolymerizable composition or the photopolymerizable layer in order to form a print-out image. Such a compound may be, for example, a colorant such as a diphenyl methane colorant, a triphenyl methane colorant, a thiazine colorant, an oxazine colorant, a xanthene colorant, an anthraquinone colorant, an iminoquinone colorant, an azo colorant, or an azomethine colorant.

Specific examples thereof include dyes such as Brilliant Green, Ethyl Violet, Methyl Green, Crystal Violet, Basic Fuchsin, Methyl Violet 2B, Quinaldine Red, Rose Bengal, Metanil Yellow, Thymol Sulfophthalein, Xylenol Blue, Methyl Orange, Paramethyl Red, Congo Red, Benzopurprin 4B, α-Naphthyl Red, Nile Blue 2B, Nile Blue A, Methyl Violet, Malachite Green, Parafuchsin, Victoria Pure Blue BOH [manufactured by Hodogaya Kagaku Co., Ltd.], Oil Blue #603 [manufactured by Orient Chemical Industries, Ltd.], Oil Pink #312 [manufactured by Orient Chemical Industries, Ltd.], Oil Red 5B [manufactured by Orient Chemical Industries, Ltd.], Oil Scarlet #308 [manufactured by Orient Chemical Industries, Ltd.], Oil Red OG [manufactured by Orient Chemical Industries, Ltd.], Oil Red RR [manufactured by Orient Chemical Industries, Ltd.], Oil Green #502 [manufactured by Orient Chemical Industries, Ltd.], Spirone Red BEH Special [manufactured by Hodogaya Kagaku Co., Ltd.], m-Cresol Purple, Cresol Red, Rhodamine B, Rhodamine 6G, Sulforhodamine B, Auramine, 4-p-diethylaminophenyl iminonaphthoquinone, 2-carboxyanilino-4-p-diethylaminophenyl iminonaphthoquinone, 2-carboxystearylamino-4-p-N,N-bis(hydroxyethyl)amino-phenyliminonaphthoquinone, 1-phenyl-3-methyl-4-p-diethylaminophenylimino-5-pyrazolone and 1-β-naphthyl-4-p-diethylaminophenylimino-5-pyrazolone, and leuco dyes such as p,p',p"-hexamethyl triaminophenyl methane (Leuco Crystal Violet) and Pergascript Blue SRB (manufactured by Ciba-Geigy).

In addition to the printout agents described above, preferable examples of the printout agent further include leuco dyes known as materials for thermal sensitive paper and pressure sensitive paper. Specific examples thereof include crystal violet lactone, malachite green lactone, benzoyl leucomethylene blue, 2-(N-phenyl-N-methylamino)-6-(N-p-tolyl-N-ethyl) amino-fluoran, 2-anilino-3-methyl-6-(N-ethyl-p-toluidino) fluoran, 3,6-dimethoxy fluoran, 3-(N,N-diethylamino)-5-methyl-7-(N,N-dibenzylamino)-fluoran, 3-(N-cyclohexyl-N-methylamino)-6-methyl-7-anilinofluoran, 3-(N,N-diethylamino)-6-methyl-7-anilinofluoran, 3-(N,N-diethylamino)-6-methyl-7-xylidinofluoran, 3-(N,N-diethylamino)-6-methyl-7-chlorofluoran, 3-(N,N-diethylamino)-6-methoxy-7-aminofluoran, 3-(N,N-diethylamino)-7-(4-chloroanilino) fluoran, 3-(N,N-diethylamino)-7-chlorofluoran, 3-(N,N-diethylamino)-7-benzyl aminofluoran, 3-(N,N-diethylamino)-7,8-benzofluoran, 3-(N,N-dibutylamino)-6-methyl-7-anilinofluoran, 3-(N,N-dibutylamino)-6-methyl-7-xylidinofluoran, 3-piperidino-6-methyl-7-anilinofluoran, 3-pyrrolidino-6-methyl-7-anilinofluoran, 3,3-bis(1-ethyl-2-methylindol-3-yl) phthalide, 3,3-bis(1-n-butyl-2-methylindol-3-yl) phthalide, 3,3-bis(p-dimethylaminophenyl)-6-dimethyl amino phthalide, 3-(4-diethylamino-2-ethoxyphenyl)-3-(1-ethyl-2-methylindol-3-yl)-4-phthalide, and 3-(4-diethylaminophenyl)-3-(1-ethyl-2-methylindol-3-yl) phthalide.

The amount of the dye whose color is changed by an acid or by a radical is 0.01% by mass to 10% by mass based on the total amount of the solids in the polymerizable composition or photopolymerizable layer.

In addition to the above additives, known additives may be added such as inorganic fillers and plasticizers for improving the characteristics of the cured film and sensitizing agents for improving ink adhesion to the surface of the photosensitive layer.

<Plasticizer>

In the invention, a plasticizer may be included in the polymerizable composition or in the photopolymerizable layer in order to improve on-press developability.

Preferable examples of the plasticizer include: phthalic esters such as dimethyl phthalate, diethyl phthalate, dibutyl phthalate, diisobutyl phthalate, dioctyl phthalate, octyl capryl phthalate, dicyclohexyl phthalate, didodecyl phthalate, ditridecyl phthalate, butyl benzyl phthalate, diisodecyl phthalate and diallyl phthalate; glycol esters such as dimethyl glycol phthalate, ethyl phthalyl ethyl glycolate, methyl phthalyl ethyl glycolate, butyl phthalyl butyl glycolate and triethylene glycol dicaprylate ester; phosphoric esters such as tricresyl phosphate and triphenyl phosphate; aliphatic dibasic acid esters such as diisobutyl adipate, dioctyl adipate, dimethyl sebacate, dibutyl sebacate, dioctyl azelate and dibutyl maleate; and polyglycidyl methacrylate, triethyl citrate, glycerin triacetyl ester and butyl laurate.

The content of the plasticizer may be about 30% by mass or less based on the total amount of the solids of the polymerizable composition or the photopolymerizable layer. When a binder is used, the amount of the plasticizer may be 10% by mass or smaller based on the total amount of the binder and compounds having ethylenic unsaturate double bonds.

<Inorganic Particles>

In the invention, the polymerizable composition or the photopolymerizable layer may further include inorganic particles in order to improve the strength of the cured film in image areas and to improve the on-press developability of non-image areas.

Examples of the inorganic particles include, for example, silica, alumina, magnesium oxide, titanium oxide, magnesium carbonate, calcium alginate and mixtures thereof. Even if inorganic particles cannot convert light to heat, the inorganic particles may be used for reinforcing the coating film and improving the interfacial adhesiveness by surface roughening.

The average particle diameter of the inorganic particles is preferably 5 nm to 10 μm, more preferably 0.5 μm to 3 μm. When the average particle diameter is in the range, the inorganic particles can be dispersed stably in the polymerizable composition or in the photopolymerizable layer, whereby excellent film strength of the polymerizable composition layer or the photopolymerizable layer is obtained and a highly hydrophilic non-image areas which are hardly blemished during printing are obtained.

The inorganic particles such as described above are easily available as commercially available products such as colloidal silica dispersions.

The content of the inorganic particles is preferably 40% by mass or lower, more preferably 30% by mass or lower, based on the total amount of the solids of the polymerizable composition or the photopolymerizable layer.

<Low-Molecular-Weight Hydrophilic Compound>

In the invention, the polymerizable composition or the photopolymerizable layer may further include a hydrophilic low-molecular-weight compound in order to improve on-press developability. The hydrophilic low-molecular-weight compound may be a water-soluble organic compound. Examples thereof include: glycols such as ethylene glycol, diethylene glycol, triethylene glycol, propylene glycol, dipropylene glycol and tripropylene glycol, and ether derivatives thereof and ester derivatives thereof; polyhydroxy compounds such as glycerin and pentaerythritol; organic amines such as triethanol amine, diethanol amine, and monoethanol amine, and salts thereof; organic sulfonic acids such as toluene sulfonic acid and benzene sulfonic acid, and salts thereof; organic phosphonic acids such as phenyl phosphonic acid, and salts thereof; and organic carboxylic acids such as tartaric acid, oxalic acid, citric acid, malic acid, lactic acid, gluconic acid and amino acids, and salts thereof.

Further, other additives such as UV initiators and thermal crosslinking agents may also be used for the purpose of enhancing the effects of post-development heating/exposure treatment described later which aims at improving the film strength (printing durability) of the planographic printing plate precursor.

The polymerizable composition of the invention may be used in a planographic printing plate precursor described below. In addition, the polymerizable composition may be used for highly sensitive photomoldable materials, for hologram materials utilizing change in refractive index upon polymerization, and for production of electronic materials such as photoresists.

<Formation of Polymerizable Composition Layer and Photopolymerizable Layer>

In the invention, the polymerizable composition layer and the photopolymerizable layer can be each formed by dispersing or dissolving the necessary components described above in a solvent to prepare a coating liquid and then applying the coating liquid. Examples of the solvent include, but are not limited to: ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethyl urea, N-methylpyrrolidone, dimethyl sulfoxide, sulfolane, γ-butyrolactone, toluene and water. Only a single solvent may be used or a mixture of two or more solvents may be used. The total solid content of the coating liquid is preferably 1 to 50% by weight. It is possible to form the polymerizable composition layer or the photopolymerizable layer by: preparing coating liquids each including different or overlapping components dissolved or dispersed in a same type of solvent or in different solvents, then repeating coating and drying to form the layer.

The amount (in terms of the solid amount) of the polymerizable composition layer or photopolymerizable layer, which was formed on the support by coating and drying, may be changed in accordance with the intended use, and is preferably 0.3 to 3.0 g/m² in general. When the amount is in this range, an image recording layer with high sensitivity and excellent film properties can be obtained.

The coating may be conducted by any of various methods whose examples include bar coating, spin coating, spray coating, curtain coating, dip coating, air knife coating, blade coating and roll coating.

The planographic printing plate precursor of the invention may include a copolymer (hereinafter occasionally referred to as "specific copolymer") comprising a repeating unit (a1) having an ethylenic unsaturated bond and a repeating unit (a2) having a functional group which can interact with the support surface, in the polymerizable composition layer or the photopolymerizable layer. The specific copolymer preferably has a hydrophilic moiety.

The specific copolymer is preferably a copolymer comprising a repeating unit represented by the following formula (I).

  (I)

In formula (I), $A_1$ represents a repeating unit having an ethylenic unsaturated bond and $A_2$ represents a repeating unit having a functional group capable of interacting with the support surface. x and y represent copolymerization ratios.

In formula (I), the repeating unit represented by $A_1$ is preferably a repeating unit represented by the following formula (A1).

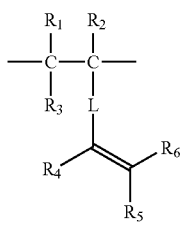

(A1)

In formula (A1), $R_1$ to $R_3$ each independently represent a hydrogen atom, an alkyl group having 1 to 6 carbon atoms, or a halogen atom. $R_4$ to $R_6$ each independently represent a hydrogen atom, an alkyl group having 1 to 6 carbon atoms, a halogen atom, an acyl group, or an acyloxy group. $R_4$ and $R_5$ may be bonded to each other to form a ring, and $R_5$ and $R_6$ may be bonded to each other to form a ring. L represents a divalent connecting group selected from the group consisting of —CO—, —O—, —NH—, a divalent aliphatic group, a divalent aromatic group, or a combination thereof.

When L represents a combination of divalent connecting groups, examples thereof include the following examples. In the examples, the left end is bound to the main chain and the right end is bound to an ethylenic unsaturated bond.

L1: —CO—NH-divalent aliphatic group-O—CO—
L2: —CO-divalent aliphatic group-O—CO—
L3: —CO—O-divalent aliphatic group-O—CO—
L4: -divalent aliphatic group-O—CO—
L5: —CO—NH-divalent aromatic group-O—CO—
L6: —CO-divalent aromatic group-O—CO—
L7: -divalent aromatic group-O—CO—
L8: —CO-divalent aliphatic group-CO—O-divalent aliphatic group-O—CO—
L9: —CO— divalent aliphatic group-O—CO— divalent aliphatic group-O—CO—
L10: —CO-divalent aromatic group-CO—O— divalent aliphatic group-O—CO—
L11: —CO-divalent aromatic group-O—CO— divalent aliphatic group-O—CO—
L12: —CO— divalent aliphatic group-CO—O-divalent aromatic group-O—CO—
L13: —CO— divalent aliphatic group-O—CO-divalent aromatic group-O—CO—
L14: —CO-divalent aromatic group-CO—O-divalent aromatic group-O—CO—
L15: —CO-divalent aromatic group-O—CO-divalent aromatic group-O—CO—

The term "divalent aliphatic group" used in the above examples refers to an alkylene group, a substituted alkylene group, an alkenylene group, a substituted alkenylene group, an alkynylene group, a substituted alkynylene group, or a polyalkyleneoxy group. The divalent aliphatic group is preferably an alkylene group, a substituted alkylene group, an alkenylene group, or a substituted alkenylene group, more preferably an alkylene group or a substituted alkylene group.

The divalent aliphatic group preferably has a chain structure rather than a cyclic structure, and is preferably linear rather than branched. The divalent aliphatic group preferably has 1 to 20 carbon atoms, more preferably 1 to 15 carbon atoms, still more preferably 1 to 12 carbon atoms, further more preferably 1 to 10 carbon atoms, most preferably 1 to 8 carbon atoms.

Examples of substituents on the divalent aliphatic group include halogen atoms (F, Cl, Br, and I), hydroxyl groups, carboxyl groups, amino groups, cyano groups, aryl groups, alkoxy groups, aryloxy groups, acyl groups, alkoxycarbonyl groups, aryloxycarbonyl groups, acyloxy groups, monoalkylamino groups, dialkylamino groups, arylamino groups, and diarylamino groups.

The term "divalent aromatic group" used in the above examples refers to an aryl group or a substituted aryl group. The divalent aromatic group is preferably a phenylene group, a substituted phenylene group, a naphthylene group, or a substituted naphthylene group. Examples of substituents on the divalent aromatic group include the substituents cited as examples of the substituents on the divalent aliphatic group, and alkyl groups.

In formula (I), the repeating unit represented by $A_2$ may be a repeating unit represented by the following formula (A2).

(A2)

In formula (A2), the definitions of $R_1$ to $R_3$ and L are the same as in formula (A1). Q represents a functional group (hereinafter occasionally referred to as "specific functional group" capable of interacting with the support surface. The specific functional group may be a group which can interact with Si—OH, Si—O—, $Al^{3+}$, aluminum oxide, zirconium oxide, or the like present on the support surface. The interaction may be an ionic bond, a hydrogen bond, a polar interaction, or a van der Waals interaction. Examples of the specific functional group are shown below.

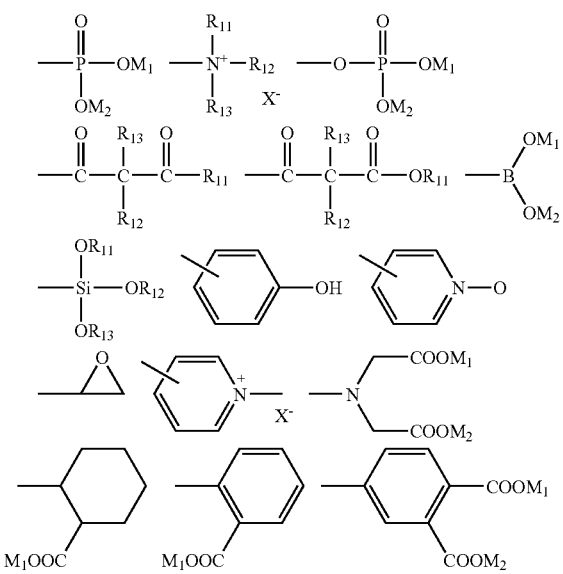

In the formulae, $R_{11}$ to $R_{13}$ each independently represent a hydrogen atom, an alkyl group, an aryl group, an alkynyl group, or an alkenyl group; $M_1$ and $M_2$ each independently represent a hydrogen atom, a metal atom, or an ammonium group; and $X^-$ represents a counter-anion.

Among these examples, the specific functional group is preferably an onium salt group such as an ammonium group or a pyridinium group, a phosphoric ester group, a phosphonic acid group, a boric acid group, or a β-diketone group such as an acetylacetone group.

In formula (A2), L represents a divalent connecting group selected from the group consisting of —CO—, —O—, —NH—, a divalent aliphatic group, a divalent aromatic group, and a combination thereof.

When L represents a combination of divalent connecting groups, examples thereof include the above-described examples of L in formula (A1) and the following combinations. In the following exemplary combinations, the left end is bound to the main chain and the right end is bound to an ethylenic unsaturated bond.

L16: —CO—NH—

L17: —CO—O—

L18: -divalent aromatic group—

In the repeating unit represented by formula (A2), there may be a hydrophilic portion. When the repeating unit represented by (A2) does not contain a hydrophilic portion, the specific copolymer preferably further includes a repeating unit represented by the following formula (A3).

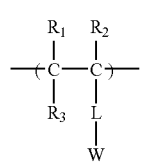

(A3)

In formula (A3), the definitions of $R_1$ to $R_3$ and L are the same as in formula (A1). W represents any of the following groups.

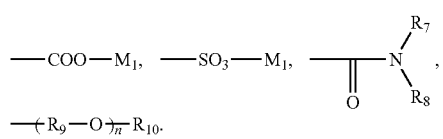

In the formulae, the definition of $M_1$ is the same as in formula (A2). $R_7$ and $R_8$ each independently represent a hydrogen atom or a linear or branched alkyl group having 1 to 6 carbon atoms. $R_9$ represents a linear or branched alkylene group having 1 to 6 carbon atoms. $R_{10}$ represents a hydrogen atom or an alkyl group having 1 to 12 carbon atoms. n represents an integer of 1 to 100.

The molecular weight of the specific copolymer is preferably 500 to 100,000, more preferably 700 to 50,000 in terms of weight-average molecular weight. The proportion of the repeating unit (a1) to all the monomers in the specific copolymer is preferably 5 to 80% by mol, more preferably 10 to 50% by mol. The proportion of the repeating unit (a2) to all the monomers in the specific copolymer is preferably 5 to 80% by mol, more preferably 10 to 50% by mol. The proportion of the repeating unit (a3) to all the monomers in the specific copolymer is preferably 5 to 80% by mol, more preferably 10 to 50% by mol.

Preferable structures of the specific copolymer in the invention are shown below, but the structures should not be construed as limiting the invention.

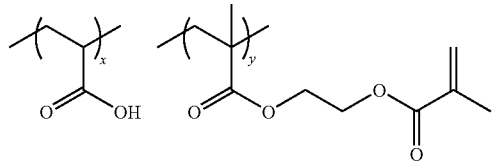

1

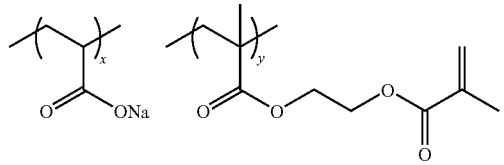

2

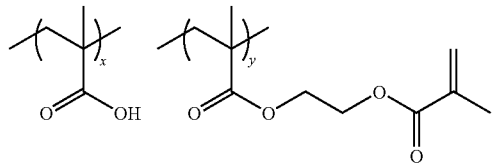

3

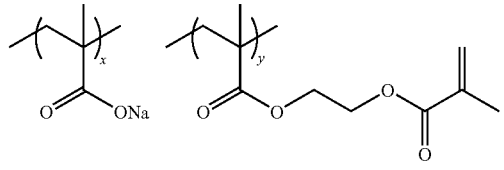

4

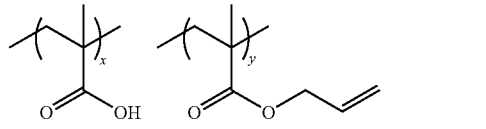

5

6

7

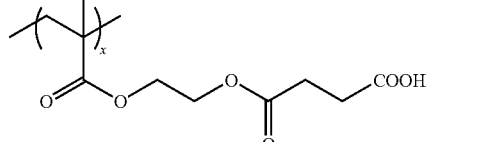

8

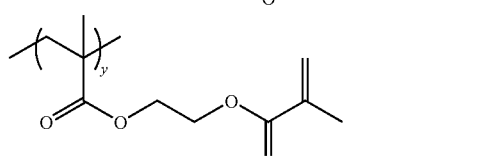

-continued
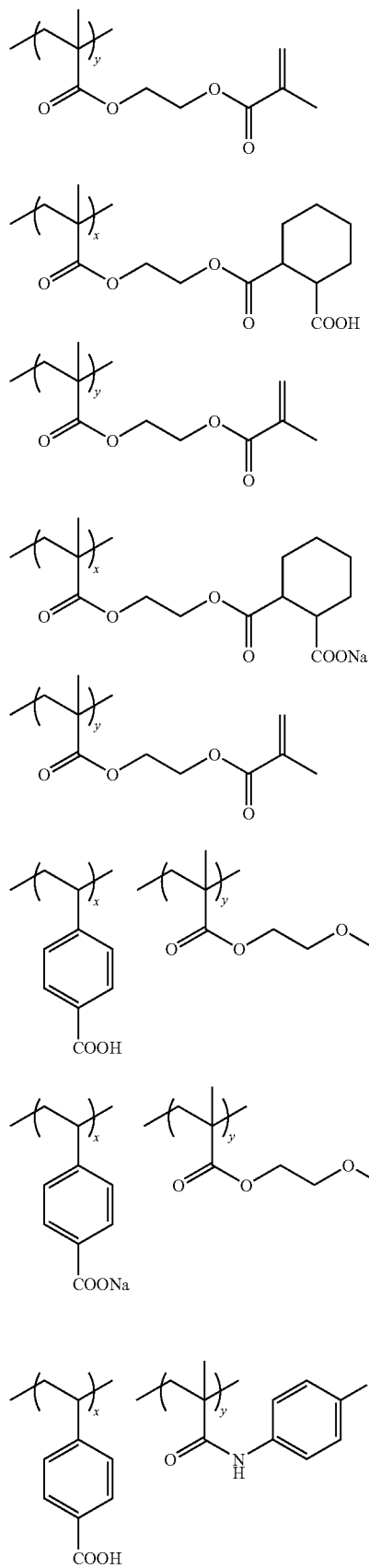
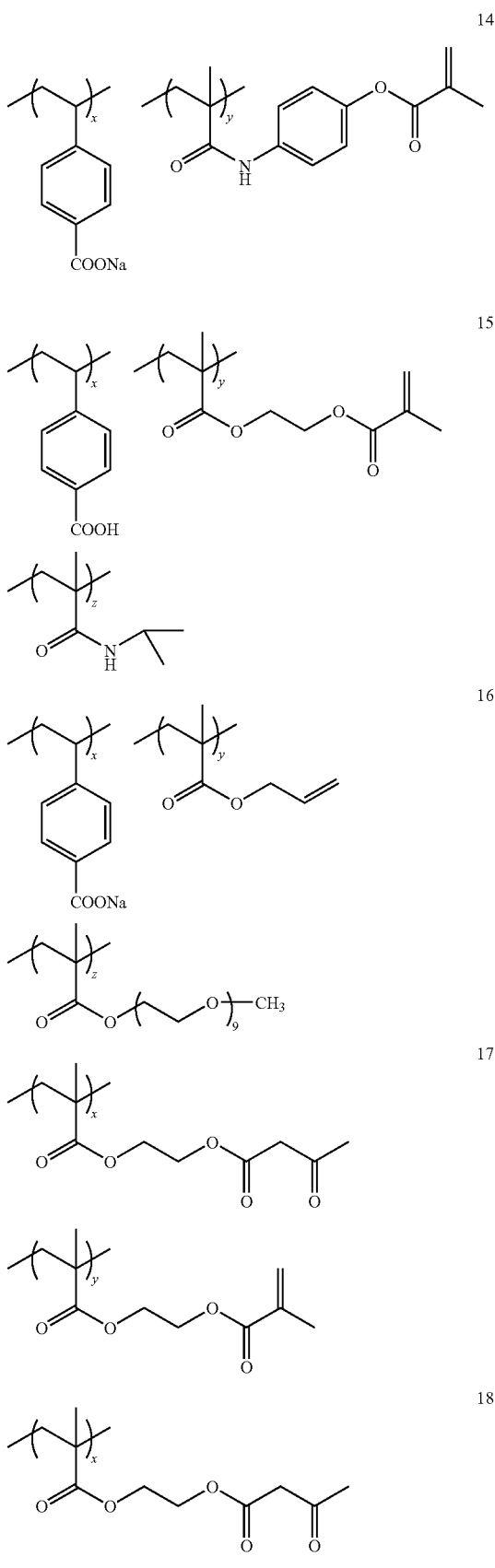

133
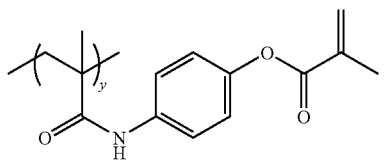
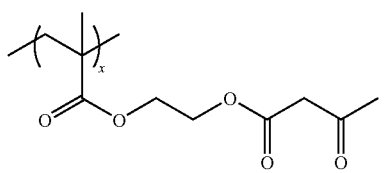
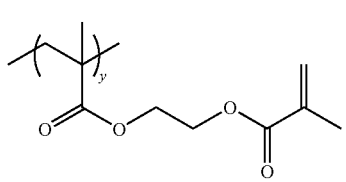
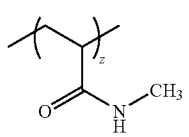
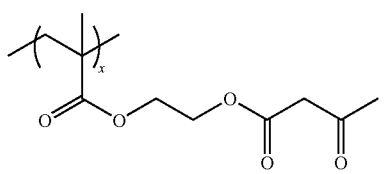
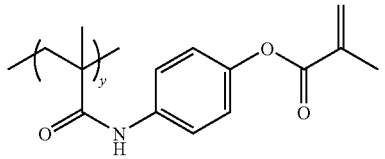
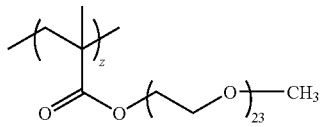
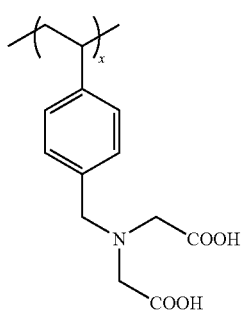
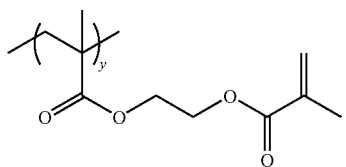
134
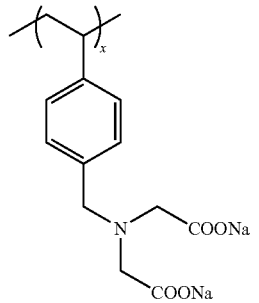
22
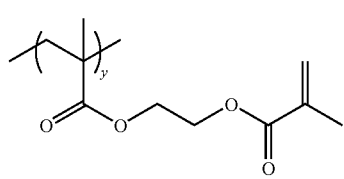
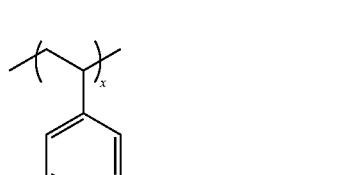
23
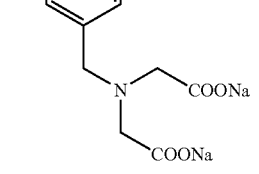
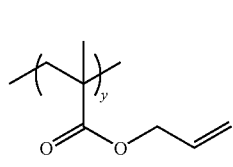
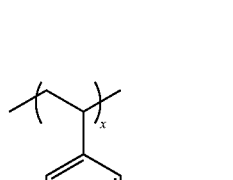
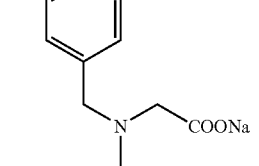
24
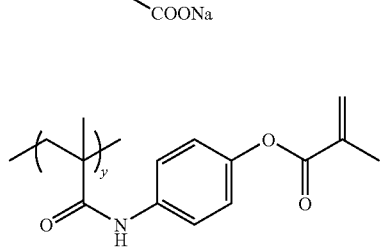

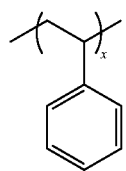
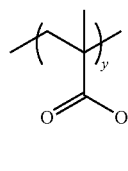
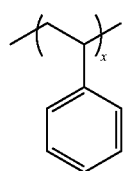
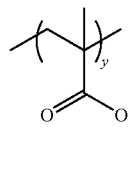
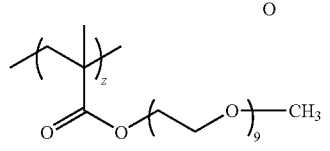
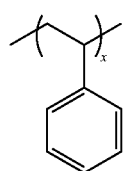
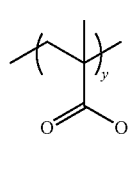
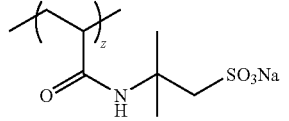
25
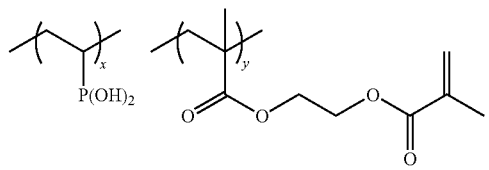
28
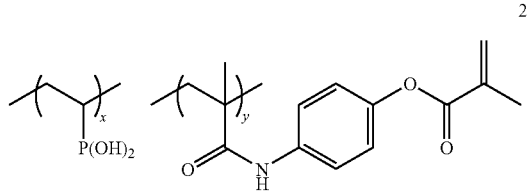
29
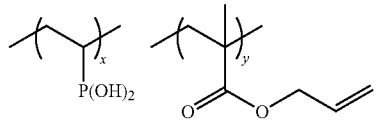
30
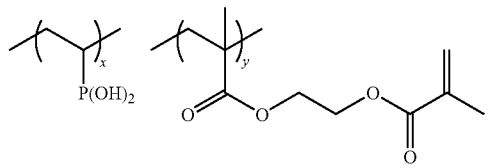
31
26
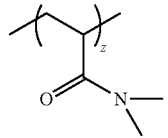
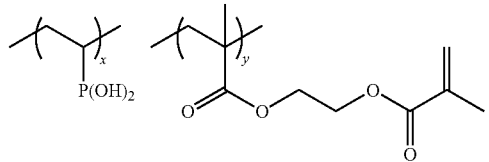
32
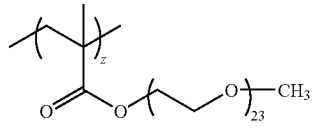
27
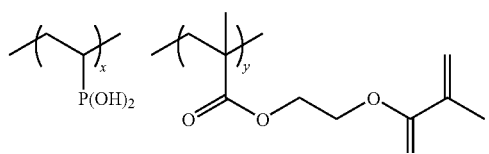
33
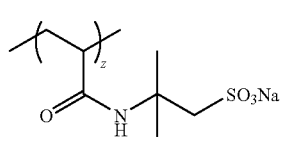

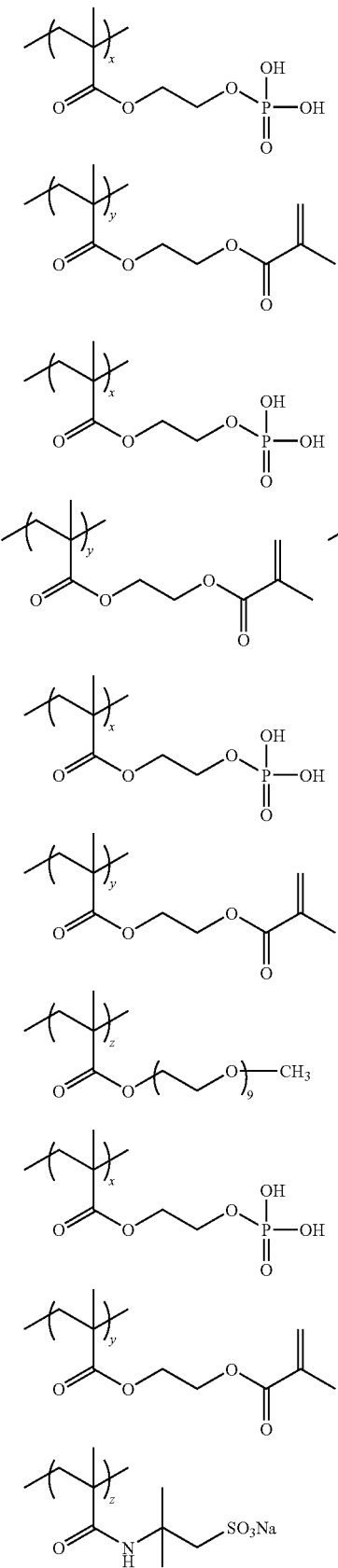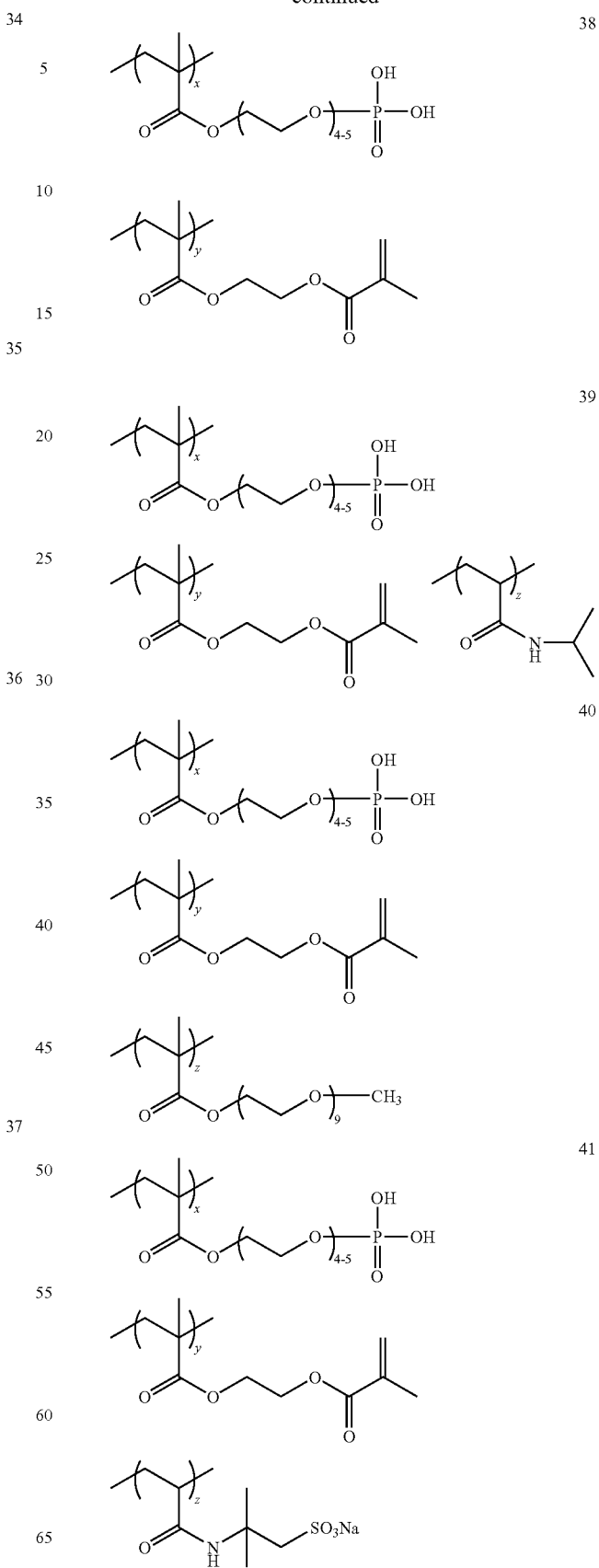

-continued
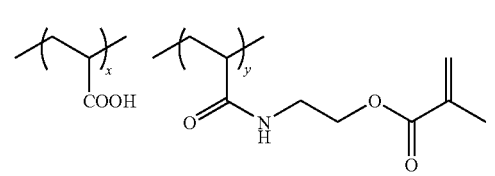
42
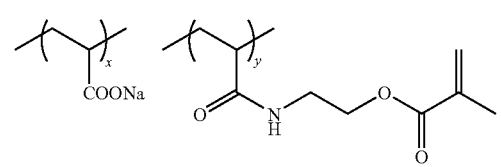
43
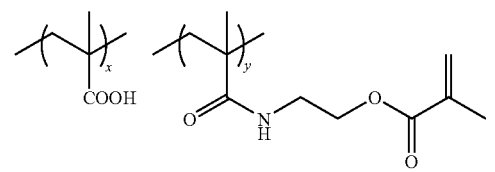
44
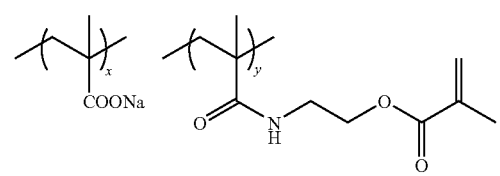
45
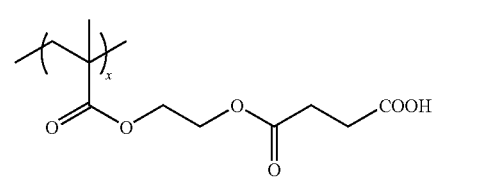
46
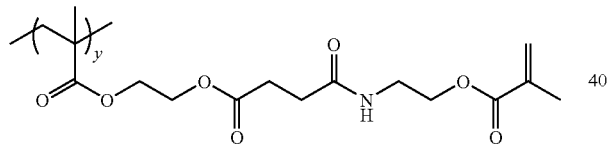
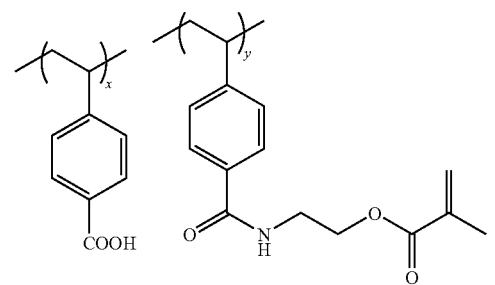
47
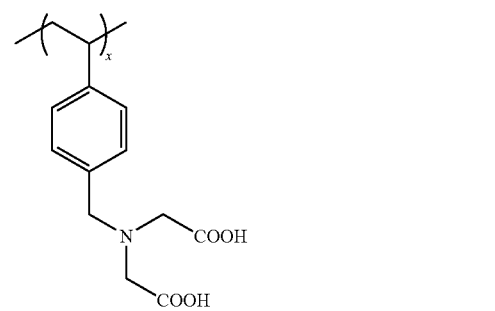
48
-continued
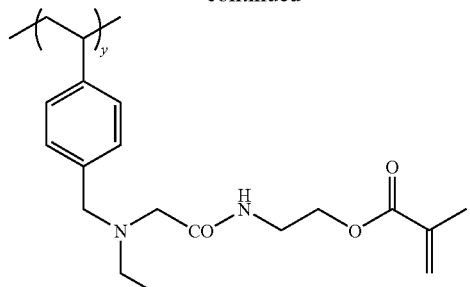
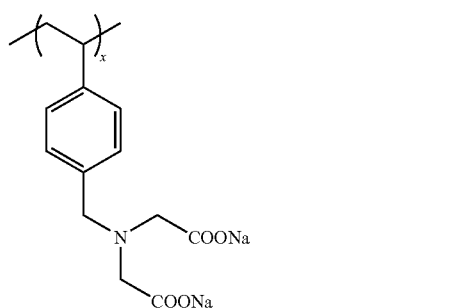
49
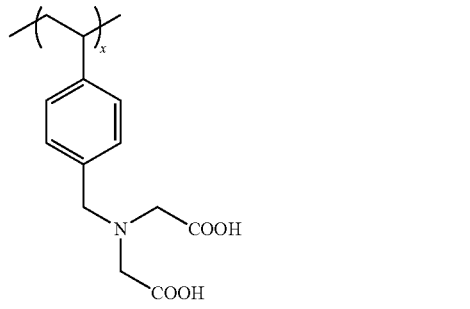
50
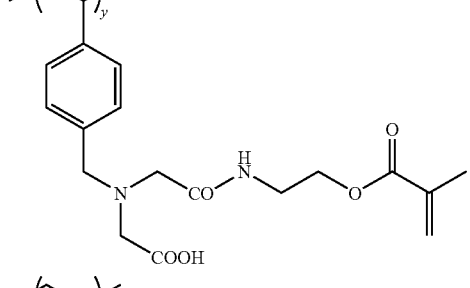

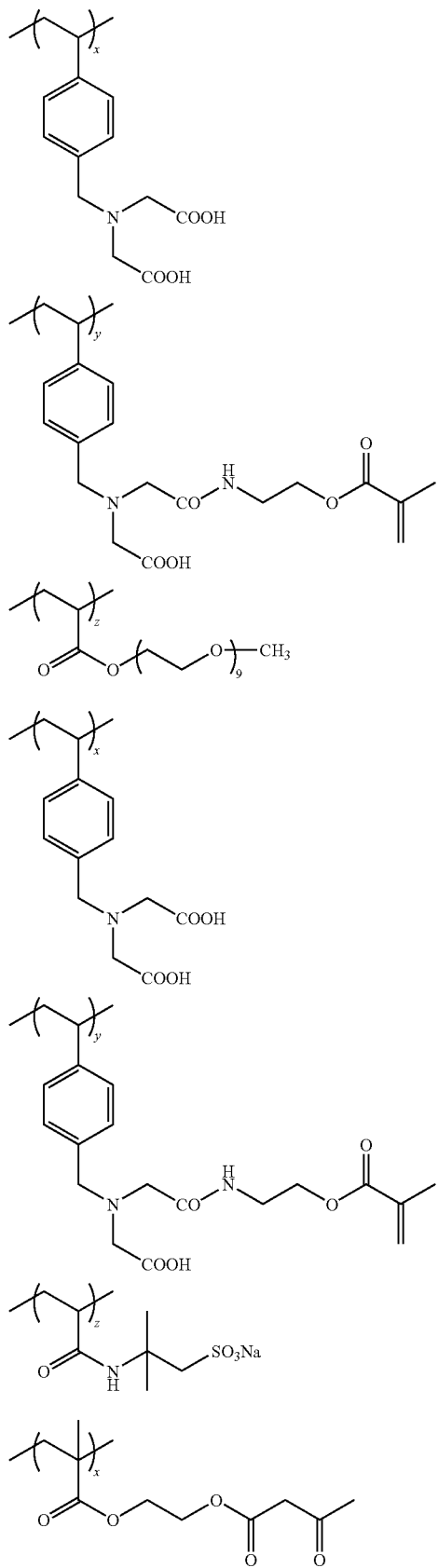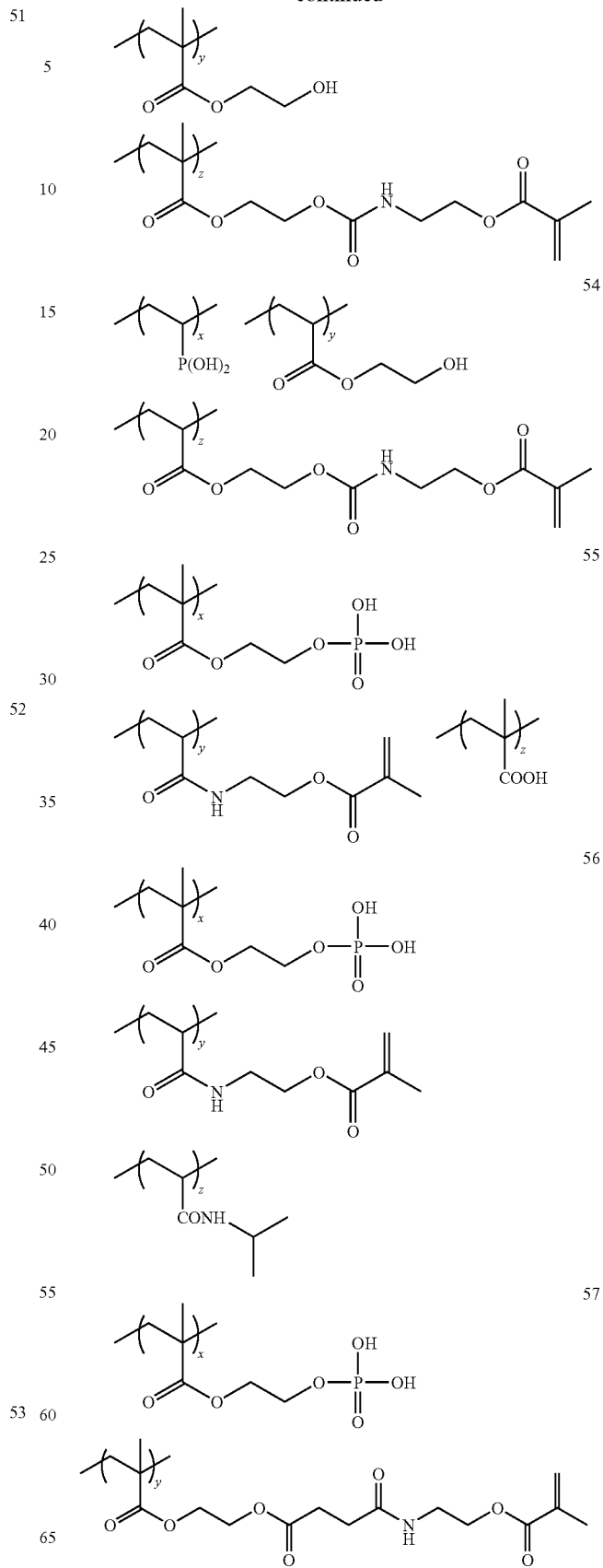

-continued

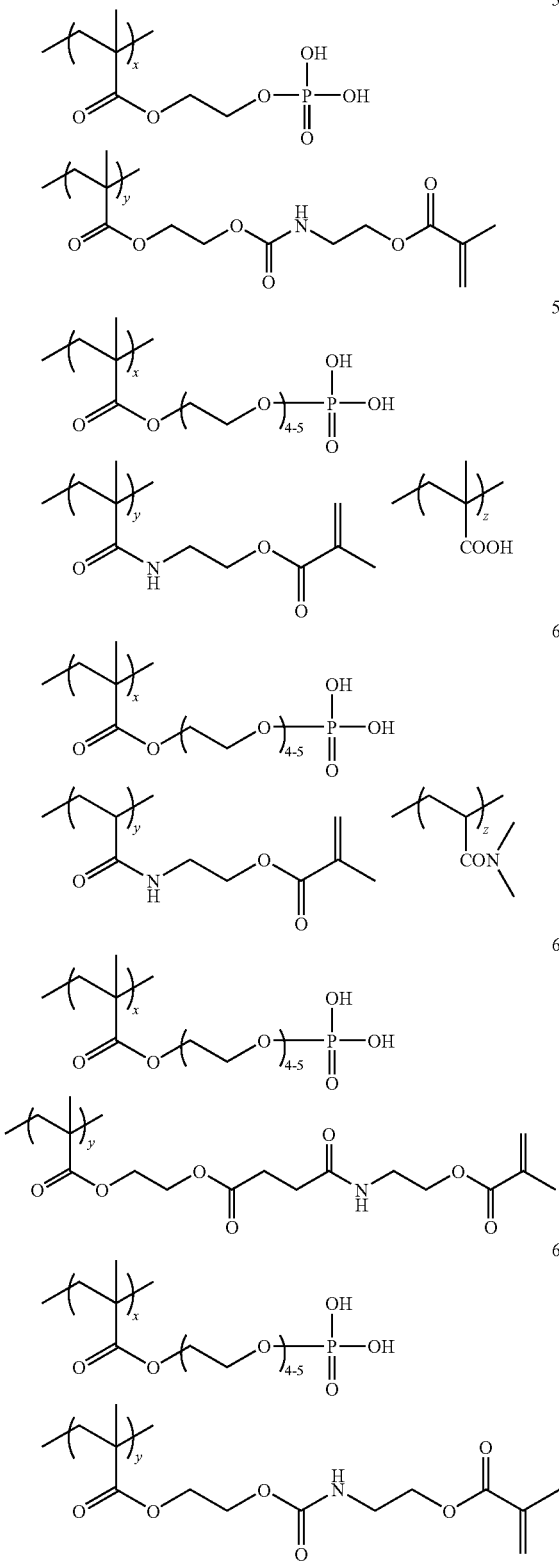

In the invention, the specific copolymer may be contained in the recording layer, or may be contained in a layer adjacent to the recording layer such as aun undercoat layer (intermediate layer) provided between the support and the recording layer. It is preferable to use the specific copolymer in the undercoat layer from the viewpoint of obtaining the effects of the invention. Since the undercoat layer works as a thermal insulating layer, heat generated upon exposure to infrared laser light does not transmitted to the support but is efficiently used for image recording, thus improving sensitivity. Further, the undercoat layer makes it easier to peel the recording layer from the support in unexposed areas, thus improving on-press developability.

When the specific copolymer is used in the undercoat layer, the specific copolymer may be added after being dissolved in a solvent. The solvent may be water or an organic solvent such as methanol, ethanol, propanol, isopropanol, ethylene glycol, hexylene glycol, THF, DMF, 1-methoxy-2-propanol, dimethyl acetamide, or dimethyl sulfoxide. The solvent is preferably an alcohol. The solvent may be a mixture of solvents.

The concentration of a coating liquid for undercoat layer is preferably 0.001 to 10% by mass, more preferably 0.01 to 5% by mass, still more preferably 0.05 to 1% by mass. The undercoat layer may optionally include a surfactant in accordance with the necessity.

The coating weight of the undercoat layer (in terms of solid amount) is preferably 0.1 to 100 mg/m$^2$, more preferably 3 to 30 mg/m$^2$.

Planographic Printing Plate Precursor

The polymerizable composition and the photopolymerizable layer of the invention can be used as a negative recording layer of a planographic printing plate precursor. In the following, the planographic printing plate precursor is described. The planographic printing plate precursor has a constitution in which the photopolymerizable layer or a recording layer containing the polymerizable composition is provided on a support. The planographic printing plate precursor may further comprise other optional layers.

Recording Layer

In the first embodiment, the recording layer (photosensitive layer) of the planographic printing plate precursor is a polymerizable photosensitive layer which comprises the polymerizable composition including the specific polymer (A), a polymerizable compound (an addition-polymerizable compound), and a polymerization initiator as essential components. The photopolymerizable layer of the second embodiment is as described above.

When exposed to a laser light, the polymerization initiator in the polymerizable photosensitive layer decomposes to generate a radical, and the radical causes polymerization of the polymerizable compound. The planographic printing plate precursor is suitable for direct printing-plate-making by irradiation with a laser light having a wavelength of 300 to 1,200 nm. The printing plate precursor is particularly suitable for recording by semiconductor lasers such as ultraviolet LD and infrared LD as exposure light sources, as described above. The planographic printing plate precursor has high printing durability, image-forming property, and on-press developability when compared to conventional printing plate precursors.

In the planographic printing plate precursor, it is possible to provide an intermediate layer between the recording layer and the support so as to improve the adhesion of the recording layer to the support and so as to improve removability of the recording layer in unexposed areas at development.

The recording layer may include a compound capable of interacting with the support. Such a compound may be a compound having a diazonium structure, or a phosphon compound. The compound may be added to the recording layer or to the coating composition for an undercoat layer. The addition of the compound improves adhesion and printing durability.

The removability of non-image areas can be improved by addition of a hydrophilic polymer such as polyacrylic acid or polysulfonic acid or by formation of an undercoat layer containing such a hydrophilic polymer. As a result, the developability of non-image areas is improved and blemish in the non-image areas can be prevented effectively.

When a recording layer is formed by coating a support with the polymerizable composition of the invention, or when the photopolymerizable layer of the invention is formed on a support, components of the polymerizable composition or components of the photopolymerizable layer may be dissolved in an organic solvent.

The organic solvent may be selected from: acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, diacetone alcohol, ethyleneglycol monomethyl ether acetate, ethyleneglycol ethyl ether acetate, ethyleneglycol monoisopropyl ether, ethyleneglycol monobutyl ether acetate, 3-methoxypropanol, methoxymethoxyethanol, diethyleneglycol monomethyl ether, diethyleneglycol monoethyl ether, diethyleneglycol dimethyl ether, diethyleneglycol diethyl ether, propyleneglycol monomethyl ether acetate, propyleneglycol monoethyl ether acetate, 3-methoxypropyl acetate, N,N-dimethylformamide, dimethylsulfoxide, γ-butyrolactone, methyl lactate, and ethyl lactate. Only a single solvent may be used or a mixture of two or more solvents may be used. The solid content of the coating liquid may be 2 to 50% by mass.

The coating weight of the recording layer affects sensitivity and developability of the recording layer and strength and printing durability of the exposed film; therefore, the coating weight may be selected in accordance with the intended use. When the coating weight is too small, the printing durability tends to be low. When the coating weight is too large, the sensitivity tends to be low, exposure takes longer time, and development also takes longer time.

When the planographic printing plate precursor is used for scan-exposure, the dry coating weight of the recording layer may be about $0.19/m^2$ to about $10 g/m^2$, preferably 0.5 g/m to 5 g/m2.

<Support>

The support used in the planographic printing plate precursor is not particularly limited and may be selected from known supports for planograpic printing plates. The support may be hydrophilic.

The support is preferably a dimensionally stable plate. Examples thereof include paper, a plastic laminated paper (such as a polyethylene laminated paper, a polypropylene laminated paper, or a polystyrene laminated paper), a metal plate (such as an aluminum plate, a zinc plate, or a copper plate), a plastic film (such as a cellulose diacetate film, a cellulose triacetate film, a cellulose propionate film, a cellulose butyrate film, a cellulose acetate butyrate film, a cellulose nitrate film, a polyethylene terephthalate film, a polyethylene film, a polystyrene film, a polypropylene film, a polycarbonate film, or a polyvinyl acetal film), a paper on which a metal such as described above is laminated or vapor-deposited, and a plastic film on which a metal such as described above is laminated or vapor-deposited. The surface of the support may be subjected to an appropriate known physical or chemical treatment for the purpose of imparting hydrophilicity to the surface or for improving the strength of the support, in accordance with the necessity.

The support is preferably paper, a polyester film or an aluminum plate. An aluminum plate is particularly preferable because it is excellent in dimensional stability and relatively inexpensive and because higher hydrophilicity or strength can be imparted to the surface by a surface treatment in accordance with the necessity. A complex sheet in which an aluminum sheet is laminated on a polyethylene terephthalate film is also preferable and examples thereof are disclosed in JP-B No. 48-18327, the disclosure of which is incorporated herein by reference.

The aluminum plate is preferably a pure aluminum plate or an alloy plate containing aluminum as the main component and trace amounts of heteroelements, or a plastic film on which aluminum is laminated or vapor-deposited, or an aluminum thin film laminated with plastic, or an aluminum alloy thin film laminated with plastic. Examples of the heteroelements contained in the aluminum alloy include silicon, iron, manganese, copper, magnesium, chrome, zinc, bismuth, nickel, and titanium. The content of the heteroelements in the alloy is preferably 10% by mass or lower. Although a pure aluminum plate is preferable, production of absolutely pure aluminum is difficult from the viewpoint of refining techniques. The aluminum plate used in the invention may be an aluminum plate containing trace amounts of heteroelements.

The composition of the aluminum plate is not limited, and any conventionally known aluminum plates can be used in accordance with the necessity. The thickness of the aluminum plate is preferably 0.1 to 0.6 mm, more preferably 0.15 to 0.4 mm, still more preferably 0.2 mm to 0.3 mm.

When the support has a surface formed by aluminum, it is preferable to subject the surface to a surface treatment such as a roughening (graining) treatment, an immersion treatment in an aqueous solution of sodium silicate, potassium fluorozirconate, or a phosphate, or an anodizing treatment prior to use.

Various methods can be employed for the roughening of the surface of the aluminum plate. For example, the roughening may be conducted by: a mechanical surface roughening, an electrochemical surface roughening (method of electrochemically dissolving the surface) or a chemical surface roughening (method of chemically and selectively dissolving the surface). The mechanical surface roughening method may be a known method such as ball grinding, brush grinding, blast grinding, buff grinding, or the transfer method of transferring an embossed shape on an embossed roll to the aluminum plate during the rolling of aluminum. The electrochemical roughening method may be a method of roughening the surface in an electrolysis solution containing hydrochloric acid or nitric acid with alternating current or direct current, or a method of using a mixed acid as described in JP-A 54-63902, the disclosure of which is incorporated by reference herein.

Before the surface of the aluminum plate is roughened, the aluminum plate may be subjected to a degreasing treatment with e.g. a surfactant, an organic solvent or an aqueous alkali solution so as to remove the rolling oil from the surface, in accordance with the necessity.

In an embodiment, the aluminum plate whose surface has been roughened is subjected to an alkali etching treatment with an aqueous solution of potassium hydroxide, sodium hydroxide, or the like, then to a neutralization treatment, then optionally to an anodizing treatment which improves the abrasion resistance.

The electrolyte used in the anodizing treatment of the aluminum plate may be selected from various electrolytes capable of forming a porous oxide film. Generally, the electrolyte is selected from sulfuric acid, hydrochloric acid, oxalic acid, chromic acid, and mixed acids thereof. The concentration of the electrolyte is determined suitably in accordance with the type of the electrolyte.

The conditions for the anodizing treatment may be changed depending on the electrolyte and cannot be generalized. Usually, the concentration of the electrolyte is preferably 1 to 80% by mass, the liquid temperature is preferably 5 to 70° C., the current density is preferably 5 to 60 A/dm$^2$, the voltage is preferably 1 to 100 V, and the electrolysis time is preferably 10 seconds to 5 minutes. The amount of the anodized film is preferably 1.0 to 5.0 g/m$^2$, more preferably 1.5 to 4.0 g/m$^2$. When the amount of the anodized film is in this range, high printing durability and excellent flaw resistance of non-image regions of the planographic printing plate can be obtained.

After the surface-roughening, the aluminum plate may be immersed in a sodium silicate solution so as to impart hydrophilicity to the surface. For example, the aluminum plate may be immersed in an aqueous solution of an alkali metal silicate after anodization, as described in JP-B No. 47-5125, the disclosure of which is incorporated herein by reference.

The anodization may be conducted by applying an electric current to the aluminum plate (as the anode) placed in an electrolytic liquid which is an aqueous or non-aqueous solution of an inorganic acid (such as phosphoric acid, chromic acid, sulfuric acid or boric acid) or an organic acid (such as oxalic acid or sulfamic acid) or a salt thereof, or a combination of such solutions.

A hydrophilicity-imparting treatment of the support surface with a silicate compound may be silicate electrodeposition such as electrodeposition disclosed in U.S. Pat. No. 3,658,662, the disclosure of which is incorporated herein by reference. Other examples thereof include a surface treatment which is a combination of an electrically-grained support, the anodization described above, and a sodium silicate treatment. Such a surface treatment is disclosed in JP-B No. 46-27481 and JP-A Nos. 52-58602 and 52-30503. Still other examples include a treatment in which mechanical surface-roughening, chemical etching, electrolytic graining, anodization, and a treatment with sodium silicate are conducted sequentially, as described in JP-A No. 56-28893, the disclosure of which is incorporated herein by reference.

After such treatments, the support may be undercoated with a water-soluble resin (such as polyvinyl phosphonic acid, a polymer or copolymer having a sulfonic acid group on a side chain, or polyacrylic acid), a water-soluble metal salt (such as zinc borate), an yellow dye, or an amine salt.

Another example of the hydrophilicity imparting treatment of the support surface may be a sol-gel treated support to which functional groups capable of undergoing addition reaction by radicals are covalently bound, as described in JP-A No. 7-159983, the disclosure of which is incorporated herein by reference.

The surface treatment may be a treatment of providing a waterproof hydrophilic layer as a surface layer to an arbitrary support. Such a surface layer may be a layer comprised of an inorganic pigment and a binder disclosed in U.S. Pat. No. 3,055,295 and JP-A No. 56-13168 (the disclosures of which are incorporated herein by reference), a hydrophilic swelling layer disclosed in JP-A No. 9-80744 (the disclosure of which is incorporated herein by reference), or a sol-gel membrane comprised of titanium oxide, polyvinyl alcohol, and a silicate disclosed in WO 94/18005 (the disclosure of which is incorporated herein by reference).

Other examples of methods for imparting hydrophilicity include: alkali metal silicate methods disclosed in U.S. Pat. Nos. 2,714,066, 3,181,461, 3,280,734, and 3902734 (the disclosures of which are incorporated herein by reference), the methods comprising immersing or electrolyzing the support in an aqueous solution of sodium silicate or the like; a method disclosed in JP-B No. 36-22063 (the disclosure of which is incorporated herein by reference), the method comprising treating the support with potassium fluorozirconate; and methods disclosed in U.S. Pat. Nos. 3,276,868, 4,153,461, and 4689272 (the disclosures of which are incorporated herein by reference), the methods comprising treating the support with polyvinyl phosphonic acid.

When the support is a support whose surface has insufficient hydrophilicity such as polyester film, it is preferable to coat the surface with a hydrophilic layer so as to impart hydrophilicity to the surface. The hydrophilic layer may be selected from: a hydrophilic layer formed by application of a coating liquid containing colloid of an oxide or hydroxide of at least one element selected from beryllium, magnesium, aluminium, silicon, titanium, boron, germanium, tin, zirconium, iron, vanadium, antimony, and transition metals disclosed in JP-A No. 2001-199175, the disclosure of which is incorporated herein; a hydrophilic layer having organic hydrophilic matrix obtained by crosslinking or pseudocrosslinking of an organic hydrophilic polymer disclosed in JP-A No. 2002-79772, the disclosure of which is incorporated herein; a hydrophilic layer having inorganic hydrophilic matrix obtained by sol-gel conversion caused by hydrolysis or condensation of polyalkoxysilane, a titanate, a zirconate, or an aluminate; or a hydrophilic layer comprised of an inorganic thin film having a surface containing a metal oxide. Among them, the hydrophilic layer is preferably a hydrophilic layer formed by application of a coating liquid containing colloid of an oxide or hydroxide of silicon.

When the support is a polyester film or the like, it is preferable to provide an antistatic layer on one side of the support or both sides of the support. When the antistatic layer is provided on one side, the side may be the hydrophilic layer side or the side opposite to the hydrophilic layer side. When an antistatic layer is provided between the support and the hydrophilic layer, the antistatic layer improves adhesion of the hydrophilic layer. The antistatic layer may be a polymer layer in which metal oxide particles or matte agents are dispersed and which is disclosed in JP-A No. 2002-79772, the disclosure of which is incorporated herein.

The center-line average roughness of the support is preferably 0.10 to 1.2 µm. When the center-line average roughness is in the range, contact characteristics between the support and the polymerizable composition layer or the photopolymerizable layer are improved and high printing durability and stain resistance can be achieved.

The hydrophilicity-imparting treatment may be conducted in order to make the support surface hydrophilic, in order to prevent undesirable reactions in the photopolymerizable composition layer or in the photopolymerizable layer, or in order to improve adhesion of the photosensitive layer.

Sealing Treatment

The support having an anodized film which has been subjected to the above surface treatments may be used as the support as it is. However, for the purpose of further improving adhesion to the upper layer, hydrophilicity, stain resistance, thermal insulating properties etc., the support may be further subjected to optional treatments such as: the treatment for enlarging micropores in the anodized film described in JP-A Nos. 2001-253181 and 2001-322365 (the disclosures of which are incorporated hereinby reference), a sealing treatment, and a surface hydrophilicity-imparting treatment in which the support is immersed in an aqueous solution containing a hydrophilic compound. The enlargement treatment and sealing treatment are not limited to the examples described above, and any known treatments can be conducted.

For example, the sealing treatment may be vapor sealing, a treatment only with fluorozirconic acid, a treatment with sodium fluoride, or vapor sealing involving addition of lithium chloride.

The sealing treatment which can be conducted in the invention is not particularly limited, and may be conducted by a conventionally known method. The sealing treatment is preferably a sealing treatment with an aqueous solution containing an inorganic fluorine compound, a sealing treatment with water vapor, or a sealing treatment with hot water. Hereinafter, these methods are described respectively.

<Sealing Treatment with an Aqueous Solution Containing an Inorganic Fluorine Compound>

In a sealing treatment with an aqueous solution containing an inorganic fluorine compound, the inorganic fluorine compound to be used is preferably a metal fluoride.

Specific examples thereof include sodium fluoride, potassium fluoride, calcium fluoride, magnesium fluoride, sodium fluorozirconate, potassium fluorozirconate, sodium fluorotitanate, potassium fluorotitanate, ammonium fluorozirconate, ammonium fluorotitanate, potassium fluorotitanate, fluorozirconic acid, fluorotitanic acid, hexafluorosilicic acid, nickel fluoride, iron fluoride, fluorophosphoric acid and ammonium fluorophosphate. Preferable among these compounds are sodium fluorozirconate, sodium fluorotitanate, fluorozirconic acid and fluorotitanic acid.

The concentration of the inorganic fluorine compound in the aqueous solution is preferably 0.01% by mass or higher, more preferably 0.05% by mass or higher, in respect of sufficient sealing of micropores in the anodized film. The concentration of the inorganic fluorine compound in the aqueous solution is preferably 1% by mass or lower, more preferably 0.5% by mass or lower, in respect of stain resistance.

The aqueous solution containing an inorganic fluorine compound preferably further contains a phosphate compound. When the phosphate compound is contained in the aqueous solution, the hydrophilicity of the surface of the anodized film is improved thus improving on-press developability and stain resistance.

The phosphate compound is preferably selected from metal phosphates such as phosphates of alkali metals and phosphates of alkaline earth metals.

Specific examples thereof include zinc phosphate, aluminum phosphate, ammonium phosphate, diammonium hydrogen phosphate, ammonium dihydrogen phosphate, monoammonium phosphate, monopotassium phosphate, monosodium phosphate, potassium dihydrogen phosphate, dipotassium hydrogen phosphate, calcium phosphate, sodium ammonium hydrogen phosphate, magnesium hydrogen phosphate, magnesium phosphate, ferrous phosphate, ferric phosphate, sodium dihydrogen phosphate, sodium phosphate, disodium hydrogen phosphate, lead phosphate, diammonium phosphate, calcium dihydrogen phosphate, lithium phosphate, phosphotungstic acid, ammonium phosphotungstate, sodium phosphotungstate, ammonium phosphomolybdate, sodium phosphomolybdate, sodium phosphite, sodium tripolyphosphate and sodium pyrophosphate. Among these, sodium dihydrogen phosphate, disodium hydrogen phosphate, potassium dihydrogen phosphate and dipotassium hydrogen phosphate are preferable.

The combination of the inorganic fluorine compound and the phosphate compound is not particularly limited. In a preferable embodiment, the aqueous solution includes sodium fluorozirconate as the inorganic fluorine compound and sodium dihydrogen phosphate as the phosphate compound.

The concentration of the phosphate compound in the aqueous solution is preferably 0.01% by mass or higher, more preferably 0.1% by mass or higher, from the viewpoint of improving on-press developability and stain resistance. The concentration of the phosphate compound in the aqueous solution is preferably 20% by mass or lower, more preferably 5% by mass or lower, in respect of the solubility.

The ratios of the respective compounds in the aqueous solution are not particularly limited. The ratio by mass of the inorganic fluorine compound to the phosphate compound is preferably in the range of 1/200 to 10/1, more preferably in the range of 1/30 to 2/1.

The temperature of the aqueous solution is preferably 20° C. or higher, more preferably 40° C. or higher, but preferably 100° C. or lower, more preferably 80° C. or lower.

The pH of the aqueous solution is preferably 1 or higher, more preferably 2 or higher, but preferably 11 or lower, more preferably 5 or lower.

The method of sealing with the aqueous solution containing an inorganic fluorine compound is not particularly limited, and examples thereof include a dipping method and a spraying method. Only a single kind of sealing treatment may be conducted or two or more kinds of sealing treatments may be conducted in combination. Each sealing treatment may be conducted only once, or may be conducted for twice or more.

The dipping method is preferable for conducting the sealing treatment. When the dipping method is used in the treatment, the treatment time is preferably at least 1 second, more preferably at least 3 seconds, but preferably 100 seconds or shorter, more preferably 20 seconds or shorter.

<Sealing Treatment with Water Vapor>

The sealing treatment with water vapor may be conducted by, for example, allowing the anodized film to continuously or intermittently contact with pressurized water vapor or water vapor of atmospheric pressure.

The temperature of the water vapor is preferably 80° C. or higher, more preferably 95° C. or higher, but preferably 105° C. or lower.

The pressure of the water vapor is preferably in the range of from (atmospheric pressure—50 mmAq) to (atmospheric pressure+300 mmAq). In an embodiment, the pressure of the water vapor is preferably in the range of $1.008 \times 10^5$ to $1.043 \times 10^5$ Pa.

The duration of the contact with water-vapor is preferably 1 second or longer, more preferably 3 seconds or longer, but preferably 100 seconds or shorter, more preferably 20 seconds or shorter.

<Sealing Treatment with Hot Water>

The sealing treatment with hot water may be conducted, for example by dipping an aluminum plate having an anodized film formed thereon in hot water. The hot water may include an inorganic salt (for example, a phosphate) or an organic salt.

The temperature of the hot water is preferably 80° C. or higher, more preferably 95° C. or higher, but preferably 100° C. or lower. The dipping time is preferably 1 second or longer, more preferably 3 seconds or longer, but preferably 100 seconds or shorter, more preferably 20 seconds or shorter.

Backcoat Layer

A backcoat layer may be provided to the back side of the support after the support is subjected to a surface treatment or after the surface is provided with an undercoat layer.

The backcoat may be a layer comprised of an organic polymer compound described in JP-A 5-45885 (the disclosure of which is incorporated herein by reference) or a layer comprised of a metal oxide obtained by hydrolysis and polycondensation of an organic or inorganic metal compound described in JP-A No. 6-35174 (the disclosure of which is incorporated herein by reference). It is preferable to use silicon alkoxy compounds such as $Si(OCH_3)_4$, $Si(OC_2H_5)_4$, $Si(OC_3H_7)_4$ and $Si(OC_4H_9)_4$ because these starting materials are easily available and inexpensive.

Undercoat Layer

In the planographic printing plate precursor of the invention, an undercoat layer may be optionally provided between the support and the polymerizable composition layer or photopolymerizable layer. Because the undercoat layer functions as a thermal insulator layer, heat generated upon exposure to light from an infrared laser can be efficiently utilized without diffusing into the support, thus achieving higher sensitivity. In unexposed areas, the undercoat layer improves on-press developability by facilitating release of the polymerizable composition layer or photopolymerizable layer from the support.

The undercoat layer material may be a silane coupling agent having an addition-polymerizable ethylenic double bond reactive group described in JP-A No. 10-282679 (the disclosure of which is incorporated herein by reference) or a phosphorus compound having an ethylenic double bond reactive group.

The coating weight (in terms of the solid content) of the undercoat layer is preferably 0.1 to 100 $mg/m^2$, more preferably 3 to 30 $mg/m^2$.

Protective Layer

In the planographic printing plate precursor of the invention, a protective layer may be optionally provided on the polymerizable composition layer or on the photopolymerizable layer for the purpose of prevention of the flaw on the image recording layer, oxygen blocking, and prevention of ablation upon exposure with a high-intensity laser. A protective layer may be provided particularly when the planographic printing plate precursor is to be exposed by scanning exposure. Exposure of a planographic printing plate precursor is conducted usually in the air, and the protective layer prevents the incorporation of low-molecular-weight compounds in the air (such as oxygen and basic substances) into the image recording layer, which low-molecular-weight compounds inhibit the image formation reaction in the photosensitive layer caused by the exposure. In this manner, the protective layer prevents inhibition of the image formation reaction in the air upon exposure to light. Accordingly, the protective layer preferably has a low permeability to low-molecular-weight compounds such as oxygen. The protective layer preferably has a high transmittance to the light used in the exposure. The protective layer is preferably capable of adhering tightly to the image recording layer. The protective layer is preferably easily removable with an on-press development after exposure.

The protective layer having such properties has been extensively examined and described in detail in U.S. Pat. No. 3,458,311 and JP-B No. 55-49729, the disclosures of which are incorporated by reference herein.

The material used in the protective layer is preferably a water-soluble polymer compound having relatively high crystallinity. Specific examples thereof include water-soluble polymers such as polyvinyl alcohol, polyvinyl pyrrolidone, acidic celluloses, gelatin, gum arabic and polyacrylic acid. When polyvinyl alcohol is used as a main component, the protective layer has superior basic characteristics such as oxygen impermeability and removability upon development. The polyvinyl alcohol may be partially substituted by groups such as esters, ethers and acetals and may partially include other copolymerizable components insofar as it contains unsubstituted vinyl alcohol units which impart the oxygen blocking property and water solubility required for the protective layer. The water-soluble polymer is preferably a mixture including polyvinyl alcohol and 15% by mass to 50% by mass of polyvinyl pyrrolidone, from the viewpoint of storage stability.

The polyvinyl alcohol may be a polyvinyl alcohol having a hydrolysis degree of 71 to 100% and a molecular weight of 300 to 2400. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8, all of which are manufactured by Kuraray Co., Ltd.

The components (the type of PVA and additives to be used) of the protective layer, the coating weight, etc. are selected in consideration of oxygen blocking property, removability upon development, fogging property, adhesiveness, flaw resistance, and the like. In general, as the degree of hydrolysis of PVA is increased (as the content of unsubstituted vinyl alcohol units in the protective layer is increased) or as the thickness of the layer is increased, the oxygen blocking property is enhanced to improve the sensitivity. However, excessive oxygen blocking property is not preferred, which may result in undesired polymerization reaction during production or raw storage, and unnecessary fogging and line thickening upon imagewise exposure. Accordingly, the oxygen permeability A at 25° C., 1 atm is preferably $0.2 \leq A \leq 20$ ($cc/m^2$-day).

As other components in the protective layer, glycerin, dipropylene glycol etc. can be added in an amount of a few % by mass based on the amount of the (co)polymer, in order to impart flexibility to the protective layer. Further, anionic surfactants such as sodium alkylsulfate and sodium alkylsulfonate, amphoteric surfactants such as alkylaminocarboxylates and alkylaminodicarboxylates and nonionic surfactants such as polyoxyethylene alkyl phenyl ether may be added in an amount of a few % by mass based on the amount of the (co)polymer.

The thickness of the protective layer may be 0.05 to 4 μm, preferably 0.1 to 2.5 μm.

In addition, adhesion to the image region and flaw resistance are also very important in handling of the planographic printing plate precursor. That is, when the hydrophilic protective layer including a water-soluble polymer is laminated on the lipophilic polymerizable layer, the protective layer easily peels because of insufficient adhesion between the layers, so that defects such as insufficient film curing in the peeling portion occur because of inhibition of the polymerization by oxygen.

Towards this problem, various proposals have been made for the purpose of improving the adhesion between the layers. For example, U.S. patent application Nos. 292,501 and 44,563, JP-A49-70702 and GB Patent Application (Laid-Open) No. 1303578 (the disclosures of which are incorporated herein by reference) disclose a method comprising incorporating an acrylic emulsion, a water-insoluble vinyl pyrrolidone-vinyl acetate copolymer, or the like in an amount of 20 to 60% by mass into a hydrophilic polymer primarily comprising polyvinyl alcohol and then laminating the mixture on the polymerizable layer thereby achieving satisfactory adhesion. Any known techniques can be applied to the protective layer in the invention. The method for applying the protective layer is described in detail, for example in U.S. Pat. No. 3,458,311 and JP-A 55-49729, the disclosures of which are incorporated by reference herein.

Further, the protective layer may have other functions. For example, when a colorant (for example, a water-soluble dye) which has high transmittance to the light used for exposure (for example, 760 nm to 1200 nm in the case of an infrared laser) but efficiently absorbs lights of other wavelengths is added to the protective layer, adaptability to safelight is improved without deteriorating the sensitivity.

For instance, when a laser light is used as the light source, there may be a requirement that the photosensitive composition should have high sensitivity in the wavelength of the light source but should not have high sensitivity outside the wavelength range. For example, when the light source is a light source emitting a light in an infrared region of 750 nm or longer, the planographic printing plate precursor is substantially able to be handled in a lighted room. However, actually, the planographic printing plate precursor may be sensitive to a light of a shorter wavelength such as light from a fluorescent lamp. In such a case, it is preferable to add a coloring agent (such as a water-soluble dye) which has high transmittance to the light from the light source but efficiently absorbs lights of wavelengths of shorter than 700 nm. In another example, when the light source emits a light in a ultra-violet region of 450 nm or shorter, the planographic printing plate precursor is substantially able to be handled under safelight. However, in actual, the planographic printing may be sensitive to visible lights of 500 nm or longer. In such a case, adaptability to safelight can be improved without reduction in sensitivity by adding a coloring agent (such as water-soluble dye) which has high transmittance to the light from the light source but efficiently absorbs lights of 500 nm or longer.

Known methods can be used without limitation for exposing the planographic printing plate precursor comprising the polymerizable composition or the photopolymerizable layer. The light source used for exposure of the planographic printing plate precursor may be selected from known light sources without particular limitation. The light emission wavelength of the light source may be 300 nm to 1200 nm, and the light source may be a laser selected from various lasers. The light source may be a semiconductor laser emitting an infrared light of 760 nm to 1200 nm.

The light source is preferably a laser. The following lasers are examples of available lasers emitting lights of 350 to 450 nm.

Examples of gas lasers include an Ar ion laser (364 nm, 351 nm, from 10 mW to 1 W), Kr ion laser (356 nm, 351 nm, from 10 mW to 1 W), and He—Cd laser (441 nm, 325 nm, from 1 mW to 100 mW); examples of solid lasers include a combination of Nd:YAG (YVO$_4$) and a SHG crystal (twice) (355 nm, from 5 mW to 1 W) and a combination of Cr: LiSAF and an SHG crystal (430 nm, 10 mW); examples of semiconductor lasers include KNbO$_3$, a ring resonator (430 nm, 30 mW), a combination of a waveguide-type wavelength converter with AlGaAs and InGaAs semiconductors (from 380 to 450 nm, from 5 mW to 100 mW), a combination of a waveguide-type wavelength converter with AlGaInP and AlGaAs semiconductors (from 300 to 350 nm, from 5 mW to 100 mW), and AlGaInN (from 350 to 450 rm, 5 mW to 30 mW); and examples of pulse lasers include a N$_2$ laser (337 nm, from 0.1 to 10 mJ pulse) and XeF (351 nm, from 10 to 250 mJ pulse).

In particular, AlGaInN semiconductor laser (commercially available semiconductor laser of InGaN type, from 400 to 410 nm, from 5 to 30 mW) is advantageous from the viewpoints of wavelength characteristics and cost.

Examples of available light sources in the range of 450 to 700 nm include an Ar$^+$ laser (488 nm), a YAG-SHG laser (532 nm), a He—Ne laser (633 nm), a He—Cd laser, and a red semiconductor laser (from 650 to 690 nm). Examples of available light sources in the range of 700 to 1200 nm include a semiconductor laser (from 800 to 850 nm) and a Nd—YAG laser (1064 nm).

Examples of usable light sources further include a ultra-high pressure mercury lamp, a high-pressure mercury lamp, a medium-pressure mercury lamp, a low-pressure mercury lamp, a chemical lamp, a carbon arc lamp, a Xenon lamp, a metal halide lamp, an ultra-violet laser lamp (such as an ArF excimer laser or a KrF excimer lamp), a visible-light laser lamp, a fluorescent lamp, a tungsten lamp, sun light, and radiation such as an electron beam, X-ray, an ion beam or an infrared ray.

Among these, the light source for imagewise exposure of the image recording material of the invention is preferably a light source having an emission wavelength in the wavelength region from near infrared to infrared region, more preferably a solid laser or a semiconductor laser.

The exposure system may be the internal drum method, the external drum method, or the flat bed method. When the recording layer components are highly water-soluble, the recording layer is soluble in neutral water or weakly alkaline water, whereby the planographic printing plate can be exposed and developed on a printing machine after mounted on the printing machine, thus removing the necessity for a developing treatment of immersing the printing plate in a liquid. This method is an example of on-press developments.

Printing

The planographic printing method using the planographic printing plate precursor of the invention is not particularly limited. In the following, preferable examples of planographic printing methods using the planographic printing plate precursor of the invention are described. The planographic printing method of the invention comprises: imagewise exposing a planographic printing plate precursor having the image-recording layer described above on a support; and conducting printing by supplying oil-based ink and an aqueous component such as moistening water to the exposed planographic printing plate precursor. In this method, the exposed planographic printing plate precursor is not subjected to a developing treatment such as a wet developing treatment with an alkaline developer. In the method, regions of the image-recording layer of the planographic printing plate precursor are removed by at least one of non-alkaline water such as moistening water and oil-based ink at the beginning of printing if the regions have not been exposed to the laser light.

In the planographic printing method of the invention, as described above, the planographic printing plate precursor of the invention is imagewise exposed to an infrared laser light and then used for printing by supplying oil-based ink and an aqueous component, and the method does not comprise a developing treatment step.

In a specific example of the method, the planographic printing plate precursor is exposed to an infrared laser light, and then mounted on a printing machine and used for printing without a developing treatment step. In another example of the method, the planographic printing plate precursor is mounted on a printing machine, and then exposed to an infrared laser light and used for printing without a developing treatment step. However, the light source is not limited to the infrared laser.

When printing is conducted by supplying an aqueous component and oil-based ink to the planographic printing plate precursor which was imagewise exposed to a laser light but has not been subjected to a developing treatment such as a wet developing treatment, cured recording layer in exposed regions forms oil-based ink receiving regions having lipophylic surface and uncured recording layer in non-exposed regions is dissolved or dispersed in the supplied aqueous component and/or oil-based ink whereby hydrophilic support surface is exposed.

As the result, aqueous components adhere to the hydrophilic surface which is now exposed, and oil-based ink adheres to the image-recording layer in the regions which were exposed to the laser light, whereby the printing can be conducted. The first substance to be supplied to the surface of the planographic printing plate precursor may be an aqueous component or oil-based ink, preferably oil-based ink from the viewpoint of preventing contamination of the aqueous component with the recording layer in the regions which were not exposed to the laser light. The aqueous component may be moistening water for usual planographic printing. The oil-based ink may be an ink for usual planographic printing.

In this way, the planographic printing plate precursor is developed on-press on an off-set press, and then used for printing to produce a lot of printed sheets.

Since the recording layer of the planographic printing plate precursor of the invention is the polymerizable composition layer or the photopolymerizable layer of the invention, the curability of exposed regions is superior, whereby the exposed regions can be cured quickly by being subjected to a laser exposure to form ink-receiving regions having hydrophobic surface with strength. In unexposed regions, the recording layer can be removed in a short time by contact with moistening water and/or ink because the uncured recording layer inherently has high solubility and dispersibility in the moistening water and/or ink. Accordingly, the planographic printing plate precursor is particularly suitable for planographic printing method with on-press development which removes the necessity for a particular developing treatment.

Although the planographic printing plate precursor of the invention has high on-press developability, the planographic printing plate precursor can be developed by a usual process; after imagewise exposure, the planographic printing plate precursor may be subjected to a wet developing treatment with a developer such that unexposed regions of the recording layer are removed to form an image. In the following, the printing plate making with an alkali developing treatment is described.

The developer is preferably a developer described in JP-B No. 57-7427 (the disclosure of which is incorporated herein by reference), and the developer may include an inorganic alkali agent (such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate, and ammonia water) or an organic alkali agent (such as monoethanol amine or diethanol amine). The concentration of such an alkaline solution is preferably 0.1 to 10% by mass, more preferably 0.5 to 5% by mass.

The alkaline solution may further include a small amount of a surfactant or a small amount of an organic solvent such as benzyl alcohol, 2-phenoxyethanol, or 2-butoxyethanol, in accordance with the necessity. Examples of the developer include the developers described in U.S. Pat. Nos. 3,375,171 and 3,615,480 and JP-A Nos. 50-26601 and 58-54341 and JP-B Nos. 56-39464 and 56-42860, the disclosures of which are incorporated by reference. The developer disclosed in JP-A No. 2002-202616 which contains a specific aromatic nonionic surfactant is preferable from the viewpoint of developability.

As an alternative, the planographic printing plate precursor of the invention which was imagewise exposed to a laser light may be developed by a developer which is a non-alkaline aqueous solution with pH of 10 or lower. The non-alkaline aqueous solution may be water or an aqueous solution whose main component is water (containing 60% by mass or more of water), preferably an aqueous solution with the same composition as a general known moistening water, or an aqueous solution containing a surfactant which may be anionic, nonionic, or cationic. pH of the developer may be 2 to 10, preferably 3 to 9, more preferably 5 to 9.

The non-alkaline aqueous solution as the developer may contain an organic acid, an inorganic acid, or an inorganic salt.

The organic acid may be citric acid, acetic acid, oxalic acid, malonic acid, salicylic acid, caprylic acid, tartaric acid, malic acid, lactic acid, levulinic acid, p-toluenesulfonic acid, xylenesulfonic acid, phytic acid, or an organic phosphonic acid. The organic acid may be in the form of an alkali metal salt thereof or an ammonium salt thereof. The content of the organic acid in the developer is preferably 0.01 to 5% by mass.

The inorganic acid or inorganic salt may be phosphoric acid, metaphosphoric acid, ammonium primary phosphate, ammonium secondary phosphate, sodium primary phosphate, sodium secondary phosphate, potassium primary phosphate, potassium secondary phosphate, sodium tripolyphosphate, potassium pyrophosphate, sodium hexamethaphosphate, magnesium nitrate, sodium nitrate, potassium nitrate, ammonium nitrate, sodium sulfate, potassium sulfate, ammonium sulfate, sodium sulfite, ammonium sulfite, sodium hydrogen sulfate, or nickel sulfate. The content of the inorganic acid and inorganic salt in the developer is preferably 0.01 to 5% by mass.

Examples of anionic surfactants usable in the developer include salts of fatty acids, salts of abietic acid, salts of hydroxyalkane sulfonic acids, salts of alkane sulfonic acids, salts of dialkylsulosuccinic acids, salts of linear alkylbenzene sulfonic acids, salts of branched alkylbenzene sulfonic acids, salts of alkylnaphthalene sulfonic acids, salts of alkylphenoxypolyoxyethylenepropyl sulfonic acids, salts of polyoxyethylenealkyl sulfophenyl ethers, sodium salt of N-methyl-N-oleyltaurine, disodium salts of N-alkyl sulfosuccinic acid monoamide, salts of petroleum sulfonic acids, sulfated castor oil, sulfated beef tallow oil, salts of sulfuric esters of fatty acid alkyl esters, salts of alkyl sulfates, salts of sulfuric esters of polyoxyethylene alkyl ethers, salts of sulfuric esters of fatty acid monoglycerides, salts of sulfuric esters of polyoxyethylenealkylphenyl ethers, salts of sulfuric esters of polyoxyethylenestyrylphenyl ethers, salts of alkylphosphoric esters, salts of phosphoric esters of polyoxyethylenealkyl ethers, salts of phosphoric esters of polyoxyethylenealkylphenyl ethers, partially saponified products of styrene-maleic anhydride copolymers, partially saponified products of olefine-maleic anhydride copolymers, and formaline condensates of salts of naphthalene sulfonic acids. Preferable among the examples are salts of dialkyl sulfosuccinic acids, salts of alkyl sulfates, and salts of alkylnaphthalene sulfonic acids.

The cationic surfactant used in the developer is not particularly limited, and may be selected from known cationic surfactants. Examples thereof include alkyl amines, quaternary ammonium salts, salts of polyoxyethylene alkyl amines, and polyethylene polyamine derivatives.

Examples of nonionic surfactants usable in the developer include polyethyleneglycol-type higher alcohol ethylene oxide adducts, alkylphenol ethylene oxide adducts, fatty acid ethylene oxide adducts, polyhydric alcohol fatty acid ester ethylene oxide adducts, higher alkylamine ethylene oxide adducts, fatty acid amide ethylene oxide adducts, oil ethylene oxide adducts, polypropyleneglycol ethyleneoxide adducts, dimethylsiloxane-ethylene oxide block copolymers, dimethylsiloxane-(propylene oxide-ethylene oxide) block copolymers, polyhydric-alcohol-type fatty acid esters of glycerol, fatty acid esters of pentaerythritol, fatty acid esters of sorbitol, fatty acid esters of sorbitan, fatty acid esters of sucrose, alkyl ethers of polyhydric alcohols, and fatty acid amides of alkanol amines.

Only a single nonionic surfactant may be used, or a mixture of two or more nonionic surfactants may be used. In the invention, preferable are sorbitol fatty acid ester ethylene oxide adducts, sorbitan fatty acid ester ethylene oxide adducts, polypropyleneglycol ethylene oxide adducts, dimethylsiloxane-ethylene oxide block copolymers, dimethylsiloxane-(propylene oxide-ethylene oxide) block copolymers and fatty acid esters of polyhydric alcohols.

The nonionic surfactant usable in the invention is preferably a nonionic surfactant with HLB (Hydrophile-Lipophile Balance) value of 6 or higher, more preferably 8 or higher, from the viewpoint of stable solubility in water and miscibility with water. The concentration of nonionic surfactants in the developer is preferably 0.01 to 10% by mass, more preferably 0.01 to 5% by mass.

Also usable are acetylene glycol oxyethylene adducts, acetylene alcohol oxyethylene adducts, fluorine-based surfactants and silicon-based surfactants.

The developer is preferably a developer containing a nonionic surfactant from the viewpoint of suppression of foaming.

The developer may contain an organic solvent. The organic solvent may be an aliphatic hydrocarbon (such as hexane, heptane, ISOPAR E, H, and G" (manufactured by Exon Mobil Corporation), gasoline, or kerosene), an aromatic hydrocarbon (such as toluene or xylene), a halogenated hydrocarbon (methylene dichloride, ethylene dichloride, trichloroehylene, or monochlorobenzene), or any of the polar solvents described below.

Examples of polar solvents include alcohols (such as methanol, ethanol, propanol, isopropanol, benzyl alcohol, ethyleneglycol monomethyl ether, 2-ethoxyethanol, diethyleneglycol monoethyl ether, diethyleneglycol monohexyl ether, triethyleneglycol monomethyl ether, propyleneglycol monoethyl ether, dipropyleneglycol monomethyl ether, polyethyleneglycol monomethyl ether, polypropyleneglycol, tetraethylene glycol, ethyleneglycol monobutyl ether, ethylene glycol monobenzyl ether, ethyleneglycol, monophenyl ether, methylphenyl carbinol, n-amyl alcohol, and methylamyl alcohol), ketones (such as acetone, methyl ethyl ketone, ethyl butyl ketone, methyl isobutyl ketone, and cyclohexanone), esters (such as ethyl acetate, propyl acetate, butyl acetate, amyl acetate, benzyl acetate, methyl lactate, butyl lactate, ethyleneglycol monobutyl acetate, propyleneglycol monomethyl ether acetate, diethyleneglycol acetate, diethyl phthalate, and butyl levulinate), and other polar solvents (such as triethyl phosphate, tricresyl phosphate, N-phenyl ethanolamine, and N-phenyl diethanol amine).

When the organic solvent is not water-soluble, the organic solvent may be mixed into the developer by using a surfactant or the like. When the developer contains an organic solvent, the content of the organic solvent is preferably lower than 40% by mass from the viewpoints of safety and inflammability.

The developer may further contain water-soluble polymer compounds such as: soybean polysaccharides, modified starches, gum arabic, dextrin, cellulose derivatives (such as carboxymethyl cellulose, carboxyethyl cellulose, and methyl cellulose) and derivatives thereof, pullulan, polyvinyl alcohol and derivatives thereof, polyvinyl pyrrolidone, polyacrylamide, acrylamide copolymers, vinyl methyl ether-maleic anhydride copolymers, vinyl acetate-maleic anhydride copolymers, and styrene-maleic anhydride copolymers.

The soybean polysaccharides may be known soybean polysaccharides, such as commercially available SOYAFIBE manufactured by Fuji Oil Co., Ltd. of various grades. The soybean polysaccharides are preferably such polysaccharides that 10% by mass aqueous solutions of the respective polysaccharides have viscosities in the range of 10 mPa/sec to 100 mPa/sec.

The modified starches may be known modified starches, such as modified polysaccharides each obtained by: partially decomposing, with an acid or an enzyme, a starch such as a starch of corn, Irish potato, tapioca, rice or wheat such that the number of glucose residues per molecule becomes 5 to 30; and then adding oxypropylene to the partially decomposed starch in an alkali.

Only a single water-soluble polymer compound may be used, or two or more water-soluble polymer compounds may be used. The content of water-soluble polymer compounds in the developer is preferably 0.1 to 20% by mass, more preferably 0.5 to 10% by mass.

The developer may further include an antiseptic agent, a chelete compound, an antifoaming agent, or the like.

The antiseptic agent may be selected from: phenol and derivatives thereof, formaline; imidazole derivatives; sodium dehydroacetate; 4-isothiazoline-3-on derivatives; benzisothiazoline-3-on; benztriazol derivatives; amidine guanidine derivatives; quaternary ammonium salts; derivatives of pyridine, quinoline, guanidine, and the like; diazine; derivatives of triazol; oxazol; derivatives of oxazine; and nitrobromo alcohols such as 2-bromo-2-nitropropane-1,3-diol, 1,1-dibromo-1-nitro-2-ethanol, and 1,1-dibromo-1-nitro-2-propanol.

The chelate compound may be selected from organic phosphonic acids and phosphonoalkanetricarboxylic acids, such as: ethylenediaminetetraacetic acid, potassium salts thereof, and sodium salts thereof; diethylenetriaminepentaacetic acid, potassium salts thereof, and sodium salts thereof, triethylenetetraminehexaacetic acid, potassium salts thereof, and sodium salts thereof; hydroxyethylethylenediaminetriacetic acid, potassium salts thereof, and sodium salts thereof; nitrilotriacetic acid and sodium salts thereof; 1-hydroxyethane-1,1-diphosphonic acid, potassium salts thereof, and sodium salts thereof; and aminotri(methylenephosphonic acid), potassium salts thereof, and sodium salts thereof. The counter-cations of such salts may be replaced by organic amines.

The antifoaming agent may be a general self-emulsifiable silicone-type antifoaming agent, a general emulsifiable silicone-type antifoaming agent, or a nonionic surfactant with a HLB value of 5 or lower. The antifoaming agent is preferably a silicone antifoaming agent. The silicone antifoaming agent may be emulsifiable or solubilizable.

The development treatment with a non-alkaline aqueous solution can be conducted by an automatic processor equipped with a developer supplying unit and a rubbing member. The automatic processor may be selected from: automatic processors which rub the surface of an imagewise exposed planographic printing plate precursor while transporting the planographic printing plate precursor disclosed in JP-A Nos. 2-220061 and 60-59351 (the disclosures of which are incorporated herein by reference); and automatic processors which rub the surface of an imagewise exposed planographic printing plate precursor placed on a cylinder while rotating the cylinder disclosed in U.S. Pat. Nos. 5,148,746 and 5,568,768 and GB Patent No. 2297719 (the disclosures of which are incorporated herein by reference). The automatic processor is preferably an automatic processor which uses a rotatable brush roll as the rubbing member. In the invention, after subjected to the rubbing treatment, the planographic printing plate may be subjected to further treatments such as water-washing, drying, and desensitizing treatment.

The temperature of the developer may be an arbitrary temperature, preferably 10° C. to 50° C.

In an embodiment, the planographic printing plate which was developed by using a developer and replenisher is washed with water, and then washed with a rinsing liquid containing a surfactant or the like so as to remove the developer, and then treated with a desensitizing liquid containing gum arabic and/or a starch derivative. The post-treatment for the image-recording material as a printing plate may be a combination of such treatments.

In the process of making a planographic printing plate, the entire surface of the planographic printing plate precursor may be heated before exposure, during exposure, or between exposure and development. When the planographic printing plate precursor is to be developed on-press, it is preferable to expose the entire surface to light or to heat the entire surface within a period from before exposure to printing. Such heating or exposure fascilitates image-forming reaction in the recording layer, thus improving sensitivity, printing durability, and stability of sensitivity. Generally, such heating or exposure conducted before development or before printing is preferably carried out under a mild condition which does not affect non-image regions, so as to prevent fogging in the non-image portions. From the viewpoint, the heating temperature is preferably 150° C. or lower.

In a process for making a printing plate having a developing treatment step, the entire surface of the planographic printing plate precursor after development may be subjected to heating or exposure so as to improve image strength and printing durability.

Since post-development heating does not have the limitation imposed in the case of pre-development heating, the heating condition may be harsh, and may be 200 to 500° C. In the temperature range, image strength is sufficiently improved without causing deterioration of the support or thermal decomposition of image regions. When the planographic printing plate precursor is subjected to scanning exposure, the method of the exposure is not particularly limited and may be a known method.

EXAMPLES

In the following, the present invention is further described with reference to Examples. However, Examples should not be construed as limiting the invention. In Examples, the evaluation of the polymerizable composition of the invention is conducted by evaluation of a planographic printing plate precursor having a recording layer containing the polymerizable composition.

Examples 1 to 10 and Comparative Examples 1 to 10

Preparation of Support

An aluminum plate with a thickness of 0.3 mm was immersed in a 10% by mass aqueous sodium hydroxide solution having a temperature of 60° C. for 25 seconds so as to etch the surface of the aluminum plate. Then the aluminum plate was washed with water, and then washed with 20% by mass nitric acid to conduct neutralization, and then washed with water. Then, the aluminum plate was subjected to electrolytic surface roughening in a 1% by mass aqueous nitric acid solution with a quantity of anode electricity of 300 $C/dm^2$, using a sine wave alternating current. Subsequently, the aluminum plate was immersed in a 1% by mass aqueous sodium hydroxide solution having a temperature of 40° C. for 5 seconds, then immersed in a 30% by mass aqueous sulfuric acid solution having a temperature of 60° C. to conduct desmutting for 40 seconds. Then, the aluminum support is subjected to anodization for 2 minutes in a 20% by mass aqueous sulfuric acid solution at an electric current density of 2 $A/dm^2$ such that the thickness of the anodic oxide film was 2.7 $g/m^2$. After the anodization, the surface roughness of the aluminum plate was 0.3 µm (in terms of Ra value according to JIS (Japanese Industrial Standards) B0601, the disclosure of which is incorporated herein by reference).

The backside of the obtained aluminum support was coated with the following backcoat coating liquid by a bar coater, and then dried at 100° C. for 1 minute, so that a backcoat layer with a coating weight after drying of 70 $mg/m^2$ was formed on the support.

| <Sol-Gel Reaction Requid> | |
|---|---|
| Tetraethyl silicate | 50 parts by mass |
| Water | 20 parts by mass |
| Methanol | 15 parts by mass |
| Phosphoric acid | 0.05 part by mass |

The above substances were mixed and stirred. 5 minutes after initiation of the mixing, heat generation started. The mixture was allowed to react for 60 minutes, and then a liquid having the following composition was added to the mixture to form the backcoat coating liquid.

| | |
|---|---|
| Pyrogallol-formaldehyde condensation resin (melecular weight 2,000) | 4 parts by mass |
| Dimethyl phthalate | 5 parts by mass |
| Fluorine-based surfactant (N-butylperfluorooctanesulfonamide etylacrylate-polyoxyethylene acrylate copolymer with a molecular weight of 20,000) | 0.7 part by mass |
| Methanol silica sol (manufactured by Nissan Kagaku Industries Ltd., with a methanol content of 30% by mass) | 50 parts by mass |
| Methanol | 800 parts by mass |

Formation of Recording Layer

The aluminum support having the backcoat layer was coated with a photopolymerizable composition (recording layer coating liquid) with the following composition such that the coating weight after drying was 1.5 $g/m^2$, then dried at 100° C. for 1 minute to form a recording layer.

| <Recording layer coating liquid> | |
| --- | --- |
| Binder polymer (specific polymer (A) or comparative polymer shown in Table 2 or | 0.5 g |
| Polymerization initiator (compound shown in Table 2 or 3) | 0.3 g |
| Sensitizing colorant (compound shown in Table 2 or 3) | 0.3 g |
| Polymerizable compound (compound shown in Table 2 or 3) | 1.5 g |
| Methyl ethyl ketone | 9.0 g |
| Propyleneglycol monomethyl ether | 8.0 g |
| Methanol | 10.0 g |

Formation of Protective Layer 3 mass % aqueous solution of polyvinyl alcohol (saponification degree: 98% by mol, polymerization degree: 550) was coated on the recording layer such that the coating weight after drying was 2 g/m$^2$, and then dried at 100° C. for 2 minutes to form a protective layer. Tables 2 and 3 also show whether or not the protective layer was provided.

The planographic printing plate precursors of Examples 1 to 10 and Comparative examples 1 to 10 were produced as described above.

Exposure of Planographic Printing Plate Precursor to Light

Each of the produced planographic printing plate precursors was subjected to scanning exposure by using a laser suitable for the planographic printing plate precursor. Details of the exposure conditions are as follows.

(1) Planographic printing plate precursors of Examples 1 to 5 and Comparative examples of 1 to 5

Each planographic printing plate precursor was subjected to scanning exposure with an InGaN-type semiconductor laser having an oscillation wavelength of 400 nm. In the exposure, the beam diameter on the surface of the printing plate precursor was 25 μm and exposure energy density was 0.15 mJ/cm$^2$.

(2) Planographic Printing Plate Precursors of Examples 6 to 10 and Comparative examples of 6 to 10

Each planographic printing plate precursor was subjected to exposure with a TRENDSETTER 3244 VFS manufactured by Creo Inc. equipped with a 40 W water-cooling infrared semiconductor laser (830 nm). In the exposure, the output was 9 W, the rotating speed of the external drum was 210 rpm, the energy on the surface of the printing plate precursor was 100 mJ/cm$^2$, and the resolution was 2400 dpi.

Printing Plate Making

After exposure, each planographic printing plate was attached to a Heidel KOR-D and used for printing without being subjected to a wet developing treatment with an alkaline developer.

Evaluation of Sensitivity

Sensitivity of each planographic printing plate precursor was evaluated using the above-described exposure light source.

In the evaluation of the sensitivity, each planographic printing plate precursor is developed on-press and image formation was observed. The exposure was gradually decreased while checking the image formation after the on-press development, so that the minimum exposure required for image formation was determined. The planographic printing plate precursors of Examples 1 and 6 were assumed to be standard planographic printing plate precursors in the respective exposure manners (with respective exposure wavelengths). Assuming the sensitivities of the planographic printing plate precursors of Examples 1 and 6 are 1.0 in the respective exposure manners, the sensitivities of the other planographic printing plate precursors are expressed in terms of relative sensitivities to the sensitivity of the standard planographic printing plate precursor. The relative sensitivity can be expressed by the following formula:

relative sensitivity=(the minimum exposure required for the standard planographic printing plate precursor/the minimum exposure required for the planographic printing plate precursor of interest)

Accordingly, a planographic printing plate precursor has higher sensitivity and better characteristic if the relative sensitivity of the planographic printing plate precursor is higher.

Evaluation of Image Quality and Printing Durability

Each planographic printing plate precursors was subjected to scanning exposure with the laser described above to form a 0.5% halftone dot image (highlight). After the exposure, as described above, each planographic printing plate precursor was directly attached to Heidel KOR-D printing machine and developed on-press by being supplied with ink and moistening water in a printing process, and the printing process was continued to determine the number of sheets (hereinafter referred to as "number S") on which the image was printed with satisfactory quality. The number of sheets was considered as the index representing printing durability. The printing durability of the standard planographic printing plates (planographic printing plates of Examples 1 and 6 in respective exposure manners) was assumed to be 200, and the printing durabilities of other planographic printing plates were expressed in terms of relative value to the printing durability of the standard planographic printing plate. In other words, the printing durability of a planographic printing plate was expressed by the formula:

Relative printing durability=(the number S of the planographic printing plate of interest/the number S of the standard planographic printing plate)×200.

Accordingly, a planographic printing plate with a higher relative printing durability has a better characteristic (higher printing durability). The relative printing durability practically reflects printing durability in the case where the printed image is a high definition image of 0.5% halftone dot image.

Evaluation of On-Press Developability

In the above-described evaluations of the sensitivity and the printing durability, the number of waste sheets discharged until on-press development was completed, that is the number of waste sheets which had been discharged until the desired image was formed on the printing plate was considered as an index representing the on-press developability. When the number of waste sheets is smaller, the planographic printing plate has better on-press developability. The number of waste sheets are preferably 50 or smaller from the practical viewpoint.

Evaluation of Storage Stability

Each sample was stored in a condition of 45° C. 75% RH (relative humidity) for 2 days, and then the sensitivity was evaluated in the same manner as "Evaluation of Sensitivity." The sensitivity ratio of sensitivity before storage to sensitivity after storage was calculated according to the following formula, and the sensitivity ratio was considered as an index representing storage stability. When there is no change in sensitivity, the sensitivity ratio was 1.0. Therefore, the storage stability is higher if the sensitivity ratio is nearer to 1.0.

Sensitivity ratio=[(sensitivity before storage)/(sensitivity after storage at 45° C. 75% RH for 2 days)]

The evaluation results for Examples 1 to 5 and Comparative examples 1 to 5 are shown in Table 2, and the evaluation results for Examples 6 to 10 and Comparative examples 6 to 10 are shown in Table 3.

TABLE 2

| | Polymer | Polymerization Initiator | Sensitizing Colorant | Polymerizable Compound | Protective Layer | Relative Sensitivity | Printing Durability | On-press developability | Storage Stability |
|---|---|---|---|---|---|---|---|---|---|
| Example 1 | Q-1 | X-1 | Y-1 | R-1 | Formed | 1.0 | 200 | 29 | 1.0 |
| Example 2 | Q-3 | X-1 | Y-1 | R-1 | Formed | 1.1 | 200 | 30 | 1.05 |
| Example 3 | Q-8 | X-1 | Y-1 | R-1 | Formed | 1.0 | 180 | 35 | 1.05 |
| Example 4 | Q-10 | X-2 | Y-2 | R-2 | Formed | 1.1 | 210 | 31 | 1.0 |
| Example 5 | Q-11 | X-2 | Y-2 | R-1 | Formed | 1.0 | 190 | 32 | 1.05 |
| Comp. Ex. 1 | T-1 | X-1 | Y-1 | R-1 | Formed | 0.9 | 150 | 103 | 1.2 |
| Comp. Ex. 2 | T-3 | X-1 | Y-1 | R-1 | Formed | 0.8 | 150 | 110 | 1.1 |
| Comp. Ex. 3 | T-8 | X-1 | Y-1 | R-1 | Formed | 0.9 | 160 | 106 | 1.2 |
| Comp. Ex. 4 | T-10 | X-2 | Y-2 | R-2 | Formed | 0.9 | 160 | 131 | 1.2 |
| Comp. Ex. 5 | T-11 | X-2 | Y-2 | R-1 | Formed | 0.8 | 160 | 122 | 1.3 |

TABLE 3

| | Polymer | Polymerization Initiator | Sensitizing Colorant | Polymerizable Compound | Protective Layer | Relative Sensitivity | Printing Durability | On-press developability | Storage Stability |
|---|---|---|---|---|---|---|---|---|---|
| Example 6 | Q-2 | X-3 | Y-5 | R-3 | Not Formed | 1.0 | 200 | 25 | 1.05 |
| Example 7 | Q-10 | X-3 | Y-5 | R-4 | Not Formed | 1.0 | 190 | 29 | 1.0 |
| Example 8 | Q-7 | X-3 | Y-6 | R-3 | Not Formed | 1.1 | 200 | 31 | 1.0 |
| Example 9 | Q-5 | X-4 | Y-5 | R-4 | Not Formed | 1.1 | 200 | 27 | 1.05 |
| Example 10 | Q-1 | X-4 | Y-6 | R-4 | Not Formed | 1.1 | 190 | 36 | 1.0 |
| Comp. Ex. 6 | T-2 | X-3 | Y-5 | R-3 | Not Formed | 0.9 | 160 | 104 | 1.3 |
| Comp. Ex. 7 | T-10 | X-3 | Y-5 | R-4 | Not Formed | 0.8 | 160 | 121 | 1.1 |
| Comp. Ex. 8 | T-7 | X-3 | Y-6 | R-3 | Not Formed | 0.9 | 170 | 103 | 1.2 |
| Comp. Ex. 9 | T-5 | X-4 | Y-5 | R-4 | Not Formed | 0.8 | 160 | 112 | 1.2 |
| Comp. Ex. 10 | T-1 | X-4 | Y-6 | R-4 | Not Formed | 0.8 | 170 | 126 | 1.1 |

Polymerization initiators (X-1 to X-4), sensitizing colorants (Y-1 to Y-6), and polymerizable compounds (R-1 to R-4) described in Tables 2 and 3 are shown below.

X-1:

CGI-784 (manufactured by Ciba-Geigy)

X-2:

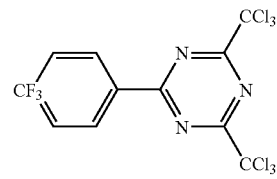

X-3:

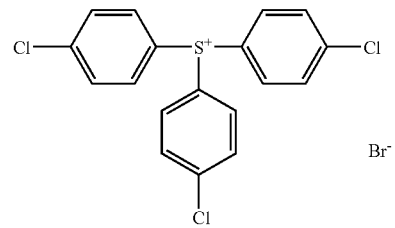

X-4:

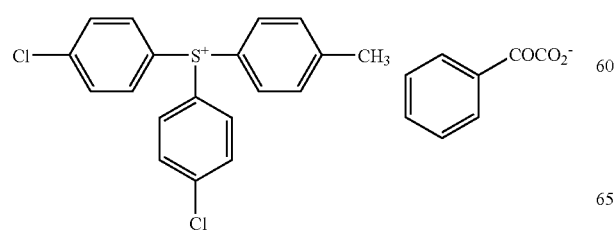

Y-1:

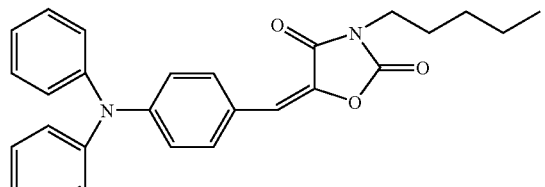

Y-2:

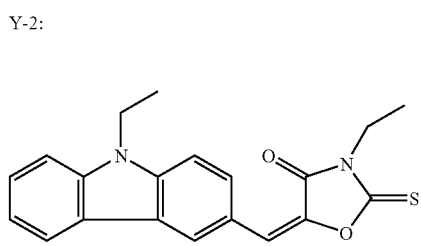

Y-3:

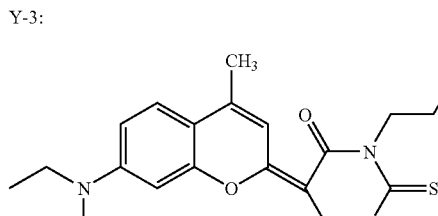

Y-4:
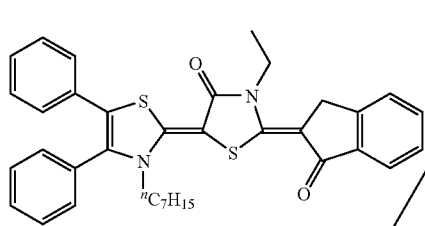
(10:1 wt %)

Y-5:
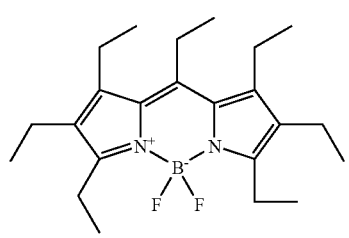

Y-6:
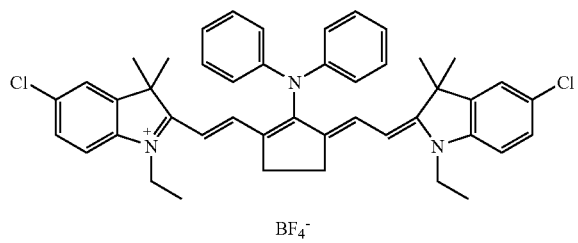

R-1:
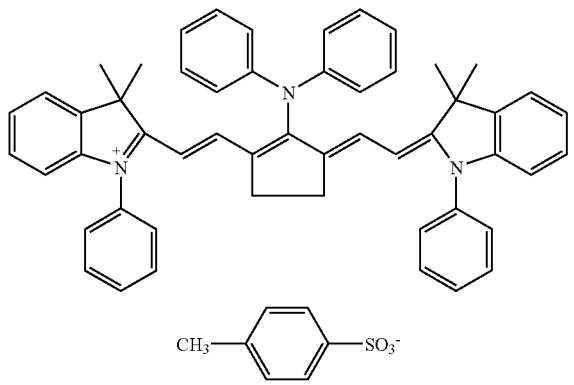

R-2:
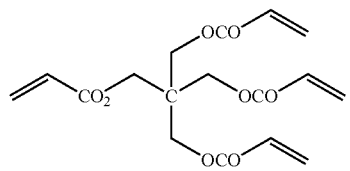
(1:1 wt %)

R-3:
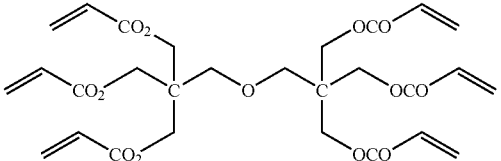

R-4:
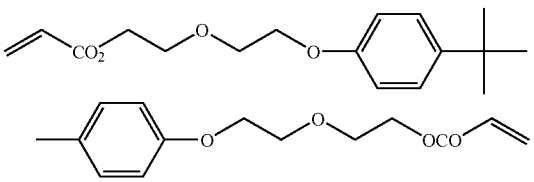

Polymers (T-1) to (T-3), (T-5), (T-7) to (T-8), and (T-10) to (T-11) used in Comparative examples are shown below together with their weight-average molecular weights (Mw) and Tg. Polymers (T-1) to (T-3), (T-5), (T-7) to (T-8), and (T-10) to (T-11) have structures respectively similar to the structures of polymers (Q-1) to (Q-3), (Q-5), (Q-7) to (Q-8), and (Q-10) to (Q-11) used in Examples. For example, comparative polymer (T-1) has a similar structure to the structure of the representative compound (Q-1) of the invention except that polymer (T-1) does not have an alkyleneoxy group on its side chain which alkyleneoxy group is essential for the first embodiment of the invention.

(T-1)
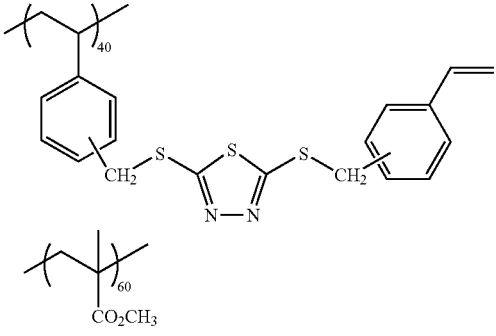
Mw 20000, Tg 100° C.

(T-2)
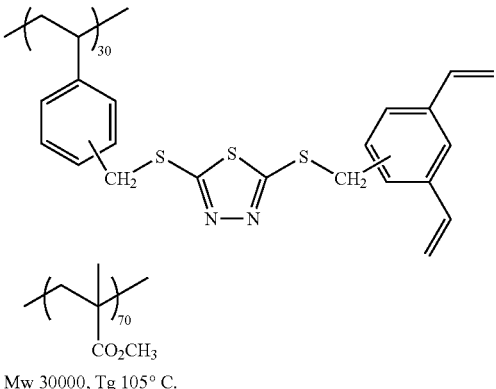
Mw 30000, Tg 105° C.

-continued (T-3)

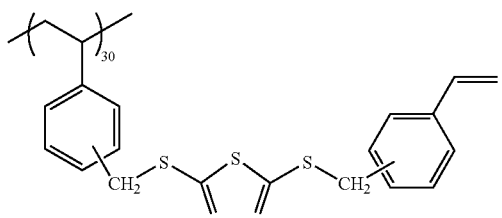
Mw 30000, Tg 80° C.

(T-5)

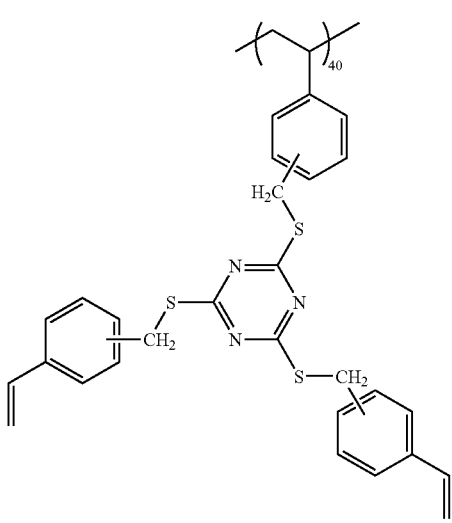
Mw 30000, Tg 95° C.

(T-7)

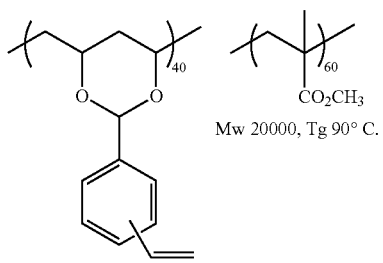
Mw 20000, Tg 90° C.

(T-8)

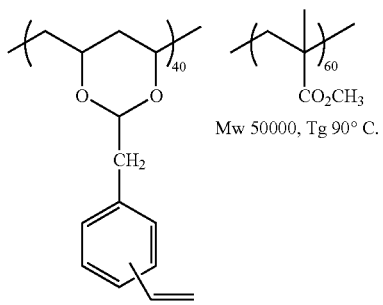
Mw 50000, Tg 90° C.

-continued (T-10)

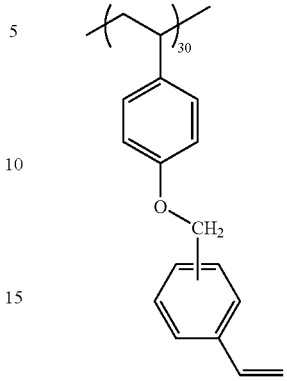 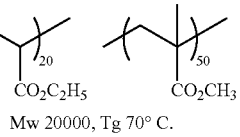
Mw 20000, Tg 70° C.

(T-11)

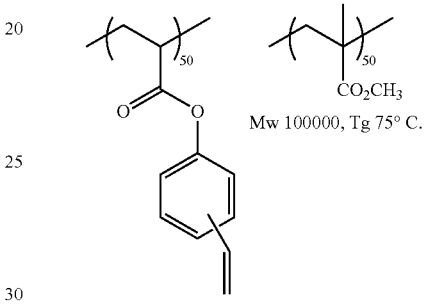
Mw 100000, Tg 75° C.

As is clear from Tables 2 and 3, the planographic printing plate precursors having recording layers comprised of the polymerizable compositions of the invention containing the specific polymer (A) could record image with high sensitivity, and exhibited high on-press developability, printing durability, and storage stability. Further, the planographic printing plate precursors could form high-quality image. This characteristic was clarified by the reproducibility of the high-definition 0.5% halftone dot image. The combinations of the polymerizable composition of the invention and suitable initiators, sensitizing colorants, and the like provided superior results in both exposure wavelengths of 400 nm (ultraviolet region) and 840 nm (infrared region).

In contrast, the planographic printing plate precursors of Comparative examples in which polymers which are out of the scope of the invention and which do not have alkyleneoxy groups were used exhibited worse characteristics in all of the sensitivity, the printing durability, and the storage stability than the planographic printing plate precursors of Examples. Particularly, the on-press developability of the planographic printing plate precursors of Comparative examples are lower than the practical level.

Synthesis of Compound (M-1)

In 1000 ml three-neck flask, 133 g of 2-hydroxyethyl methacrylate was dissolved in 520 ml of THF, and the solution was cooled to 0° C. Then, 130 g of 3-chloropropionic acid chloride was dropped over 1 hour into the solution, using a dropping funnel. Then, the temperature of the mixture was allowed to gradually rise to room temperature. The mixture was stirred at room temperature for 12 hours, and then the mixture was added to 1 L of ice-cold water. The obtained mixture was stirred for 1 hour, and then subjected to extraction with 2 L of ethyl acetate for three times. The obtained organic phase was washed with water, then with a saturated aqueous solution of sodium hydrogen carbonate, and then with a saturated saline solution, and then dried with magnesium sulfate, and then subjected to filtration. Subsequently, the solvent was removed in a reduced pressure by using a rotary evaporator. The residue was purified by a silica gel column chromatography (solvent: hexane/ethyl acetate) so that 180 g of compound (M-1) was obtained. The structure of compound (M-1) was confirmed by NMR, mass spectroscopy, and IR.

Synthesis of Compound (M-5)

Compound (M-5) was obtained in the same manner as the synthesis of compound (M-1), except that 4-hydroxybutyl methacrylate was used in place of 2-hydroxyethyl methacrylate.

Synthesis of Compound (M-13)

In 500 ml three-neck flask, 250 ml of acetone was added to 58.6 g of 2-hydroxyethyl methacrylate, and the mixture was stirred. 39.2 g of pyridine and 0.1 g of p-methoxyphenol were added to the mixture, and the obtained mixture was cooled in an ice-bath containing ice-cold water. After the temperature of the mixture liquid became 5° C. or lower, 114.9 g of 2-bromoisobutanoic acid bromide was dropped to the mixture over 3 hours using a dropping funnel. After completion of the dropping, the ice bath was removed and the mixture was stirred for another 3 hours. The mixture was then added to 750 ml of water and the obtained mixture was stirred for 1 hour. The mixture was subjected to extraction with 500 ml of ethyl acetate for 3 times using a separating funnel. The organic phase was washed with 500 ml of 1M hydrochloric acid, then with 500 ml of a saturated aqueous solution of sodium hydrogen carbonate, and then with 500 ml of a saturated saline solution. Subsequently, 100 g of magnesium sulfate was added to the organic phase so that the organic phase was dehydrated and dried. The dried organic phase was subjected to filtration, then the solvent was removed in a reduced pressure, so that 120.3 g of residue was obtained. The residue was found to be compound (M-13) by $^1$H-NMR, IR, and mass spectroscopy. Its purity was found to be 95% when measured by a HPLC (High Performance Liquid Chromatography).

Synthesis of Compound (M-17)

In 500 ml three-neck flask, 54.8 g of methacrylic acid and 0.1 g of p-methoxyphenol were dissolved in 250 ml of N,N-dimethylacetamide, and the solution was cooled in an ice bath containing ice-cold water. After the solution was cooled to 5° C. or lower, 96.8 g of DBU was dropped therein over 1 hour, and then 96.0 g of 6-bromo-1-hexanol was dropped therein over 1.5 hours. After completion of the dropping, the ice bath was removed, and the mixture was stirred for 8 hours. The mixture was added to 750 ml of water, and the obtained mixture was stirred for 1 hour. The mixture was subjected to extraction with 300 ml of ethyl acetate for three times using a separating funnel. The organic phase was washed with 300 ml of 1M hydrochloric acid, then washed with 300 ml of a saturated aqueous solution of sodium hydrogen carbonate, and then washed with 300 ml of a saturated saline solution. Then, 100 g of magnesium sulfate was added to the organic phase so that the organic phase was dehydrated and dried. Then, the dried organic phase was subjected to filtration. Subsequently, the solvent was removed in a reduced pressure to obtain residue in an amount of 100.3 g. 50.0 g of the residue, 23.5 g of pyridine, and 0.1 g of p-methoxyphenol were put in a 500 ml three-neck flask, and dissolved in 200 ml of acetone. The solution was cooled in an ice bath containing ice-cold water. After the solution was cooled to 5° C. or lower, 68.3 g of 2-bromoisobutanoic acid bromide was dropped therein over 1.5 hours, using a dropping funnel. After completion of the dropping, the ice bath was removed, and the mixture was stirred for 3 hours. The mixture was added to 500 ml of water and stirred for 1 hour. The obtained mixture was subjected to extraction with 500 ml of ethyl acetate for three times, using a separating funnel. The organic phase was washed with 500 ml of 1M hydrochloric acid, and then washed with 500 ml of a saturated aqueous solution of sodium hydrogen carbonate, and then washed with 500 ml of a saturated saline solution. Subsequently, 100 g of magnesium sulfate was added to the organic phase so that the organic phase was dehydrated and dried. The dried organic phase was then subjected to filtration. Then, the solvent was removed in a reduced pressure to obtain 80.3 g of residue. The residue was found to be compound (M-17) by $^1$H-NMR, IR, and mass spectroscopy. Its purity was found to be 95% when measured by a HPLC.

Synthesis of Compound (M-32)

In 1000 ml three-neck flask, 152.6 g of 4-chloromethyl-styrne, 183.7 g of 2-bromoisobutanoic acid, and 0.2 g of p-methoxyphenol were dissolved in 500 ml of N,N-dimethylacetamide. The obtained mixture was cooled in an ice-bath containing ice-cold water. After the temperature of the mixture liquid became 5° C. or lower, 167.5 g of DBU was dropped into the mixture over 3 hours using a dropping funnel. After completion of the dropping, the ice bath was removed and the mixture was stirred for another 8 hours. The mixture was then added to 1000 ml of water and the obtained mixture was stirred for 1 hour. The mixture was subjected to extraction with 500 ml of ethyl acetate for 3 times using a separating funnel. The organic phase was washed with 500 ml of 1M hydrochloric acid, then with 500 ml of a saturated aqueous solution of sodium hydrogen carbonate, and then with 500 ml of a saturated saline solution. Subsequently, 100 g of magnesium sulfate was added to the organic phase so that the organic phase was dehydrated and dried. The dried organic phase was subjected to filtration, then the solvent was removed in a reduced pressure, so that 254.8 g of residue was obtained. The residue was found to be compound (M-32) by $^1$H-NMR, IR, and mass spectroscopy. Its purity was found to be 94% when measured by a HPLC.

Synthesis of Compound (M-18)

174.2 g of diethyleneglycol methacrylate, 138.0 g of potassium carbonate, 0.1 g of p-methoxyphenol, and 400 ml of acetone were put in a 1000 ml three-neck flask. The obtained mixture was cooled in an ice-bath containing ice-cold water. After the temperature of the mixture liquid became 5° C. or lower, 229.9 g of 2-bromoisobutanoic acid bromide was dropped into the mixture over 1.5 hours using a dropping funnel. After completion of the dropping, the ice bath was removed and the mixture was stirred for another 3 hours. The mixture was then added to 800 ml of water and the obtained mixture was stirred for 1 hour. The mixture was subjected to extraction with 500 ml of ethyl acetate for 3 times using a separating funnel. The organic phase was washed with 500 ml of 1M hydrochloric acid, then with 500 ml of a saturated aqueous solution of sodium hydrogen carbonate, and then with 500 ml of a saturated saline solution. Subsequently, 100 g of magnesium sulfate was added to the organic phase so that the organic phase was dehydrated and dried. The dried organic phase was subjected to filtration, then the solvent was removed in a reduced pressure, so that 300.1 g of residue was obtained. The residue was found to be compound (M-18) by $^1$H-NMR, IR, and mass spectroscopy.

Synthesis Example 1

Synthesis of Polymer (P-1) (Specific Example of the Above-Described Synthesis Method 1)

60 g of N,N-dimethylacetamide was placed in a 500 ml three-neck flask provided with a condenser and a stirrer, and heated in a nitrogen air flow to 75° C. A solution obtained by dissolving 18.4 g of compound (M-13), 7.6 g of N,N-dimethylacrylamide, 20 g of methyl methacrylate, and 0.38 g of V-601 (manufactured by Wako Pure Chemical Industries, Ltd.) in 60 g of N,N-dimethylacetamide was dropped therein over 2 hours. After completion of the dropping, the obtained mixture was heated to 90° C., and stirred for 2 hours. Subsequently, the mixture was cooled to room temperature, then added to 3 L of water to precipitate a polymer. The precipitated polymer was collected by filtration, then washed with water, then dried to obtain 44 g of polymer. The weight-average molecular weight of the polymer was measured by a gel permeation chromatography (GPC) method using polystyrene as the standard substance, and was found to be 110,000. Therefore, it was confirmed that a proper polymerization had occurred.

In a 200 ml three-neck flask, 26.0 g of the obtained polymer and 0.1 g of p-methoxy phenol was dissolved in a mixture of 60 g of N,N-dimethylacetamide and 60 g of acetone. The obtained solution was cooled in an ice bath containing ice-cold water. After the solution was cooled to 5° C. or lower, 20.3 g of 1,8-diazabicyclo[5.4.0]-7-undecene (DBU) was dropped into the solution over 1 hour using a dropping funnel. After completion of the dropping, the ice bath was removed, and the obtained mixture was stirred for 8 hours. The mixture was added to 2 L of water to precipitate polymer (P-1). The precipitated polymer was collected by filtration, then washed with water, than dried to give 18.2 g of polymer. The obtained polymer was measured by $^1$H-NMR, and it was confirmed that 100% of the side chains derived from polymer (M-13) had been converted to ethylene methacrylate groups. The weight-average molecular weight of the polymer was measured by a gel permeation chromatography (GPC) method using polystyrene as the standard substance, and was found to be 100,000.

Synthesis Example 2

Synthesis of Polymer (P-2) (Specific Example of the Above-Described Synthesis Method 2)

35 g of methyl ethyl ketone was placed in a 300 ml three-neck flask provided with a condenser and a stirrer, and heated to 75° C. Under nitrogen air flow, a solution obtained by dissolving 15.6 g of 2-hydroxyethyl methacrylate, 6.9 g of N,N-dimethylacrylamide, 12.0 g of methyl methacrylate, and 0.775 g of V-601 (manufactured by Wako Pure Chemical Industries, Ltd.) in 35 g of methyl ethyl ketone was dropped therein over 2.5 hours. Then, the obtained mixture was allowed to react at 75° C. for 2 hours. Then, the mixture was cooled to 0° C. Subsequently, 10.9 g of acrylic acid chloride was dropped into the mixture while the mixture was stirred. The obtained mixture was allowed to react for 12 hours while the temperature of the mixture rose gradually to room temperature. The mixture was then added to 3 L of water to precipitate a polymer. The precipitated polymer was collected by filtration, then washed, then dried to obtain polymer (P-2). Its NMR spectrum confirmed the introduction of acryl groups to side chains in polymerization. The weight-average molecular weight of the polymer was measured by a gel permeation chromatography (GPC) method using polystyrene as the standard substance, and was found to be 85,000.

Synthesis Example 3

Synthesis of Polymer (P-3) (Specific Example of the Above-Described Synthesis Method 3)

68.6 g of 1-methoxy-2-propanol was placed in a 500 ml three-neck flask provided with a condenser and a stirrer, and heated to 75° C. Under nitrogen air flow, a solution obtained by dissolving 33.8 g of 2-allyloxyethyl methacrylate, 20 g of methyl methacrylate, 14.8 g of N-vinyl pyrrolidone, and 0.97 g of V-601 (manufactured by Wako Pure Chemical Industries, Ltd.) in 68.6 g of 1-methoxy-2-propanol was dropped therein over 2.5 hours. Then, the obtained mixture was allowed to react at 75° C. for 2 hours. Then, the mixture was subjected to filtration, then washed, then dried to obtain polymer (P-3). The weight-average molecular weight of the polymer was measured by a gel permeation chromatography (GPC) method using polystyrene as the standard substance, and was found to be 120,000.

Synthesis Example 4

Synthesis of Polymer (P-4) (Specific Example of the Above-Described Synthesis Method 4)

33.5 g of methyl ethyl ketone was placed in a 500 ml three-neck flask provided with a condenser and a stirrer, and heated to 75° C. Under nitrogen air flow, a solution obtained by dissolving 7.2 g of methacrylic acid chloride, 20 g of t-butyl methacrylate, 6.3 g of methoxytetraethyleneglycol monomethacrylate, and 0.37 g of V-601 (manufactured by Wako Pure Chemical Industries, Ltd.) in 33.5 g of methyl ethyl ketone was dropped therein over 2.5 hours. Then, the obtained mixture was allowed to react at 75° C. for 2 hours. Then, the mixture was cooled to 0° C. Subsequently, 7.0 g of 2-allyloxyethyl alcohol was dropped into the mixture while the mixture was stirred. The obtained mixture was allowed to react for 12 hours while the temperature of the mixture rose gradually to room temperature. The mixture was then added to 3 L of water to precipitate a polymer. The precipitated polymer was collected by filtration, then washed, then dried to obtain polymer (P-4). Its NMR spectrum confirmed the introduction of allyl groups to side chains in polymerization. The weight-average molecular weight of the polymer was measured by a gel permeation chromatography (GPC) method using polystyrene as the standard substance, and was found to be 105,000.

Synthesis Example 5

Synthesis of Polymer (P-5) (Specific Example of the Above-Described Synthesis Method 5)

36 g of N,N-dimethylacetamide was placed in a 500 ml three-neck flask provided with a condenser and a stirrer, and heated to 75° C. Under nitrogen air flow, a solution obtained by dissolving 30 g of allyl methacrylate, 5.6 g of 2-acrylamide-2-methyl-1-propanesulfonic acid, and 0.48 g of V-601 (manufactured by Wako Pure Chemical Industries, Ltd.) in 36 g of N,N-dimethylacetamide was dropped therein over 2.5 hours. Then, the obtained mixture was allowed to react at 75° C. for 2 hours. Then, the mixture was subjected to filtration, then washed, then dried to obtain polymer (P-5). The weight-average molecular weight of the polymer was measured by a gel permeation chromatography (GPC) method using polystyrene as the standard substance, and was found to be 120,000.

Synthesis Example 6

Synthesis of Polymer (P-6) (Specific Example of the Above-Described Synthesis Method 6)

40 g of N,N-dimethylacetamide was placed in a 500 ml three-neck flask provided with a condenser and a stirrer, and heated to 75° C. Under nitrogen air flow, a solution obtained by dissolving 16.6 g of methacrylic acid chloride, 3.4 g of methacrylic amide, 20 g of methyl methacrylate, and 0.65 g of V-601 (manufactured by Wako Pure Chemical Industries, Ltd.) in 40 g of N,N-dimethylacetamide was dropped therein over 2.5 hours. Then, the obtained mixture was allowed to react at 75° C. for 2 hours. Then, the mixture was cooled to 0° C. Subsequently, 16.9 g of 2-hydroxyethylmonobinyl ether was dropped into the mixture while the mixture was stirred. The obtained mixture was allowed to react for 12 hours while the temperature of the mixture rose gradually to room temperature. The mixture was then added to 3 L of water to precipitate a polymer. The precipitated polymer was collected by filtration, then washed, then dried to obtain polymer (P-6). Its NMR spectrum confirmed the introduction of vinyl groups to side chains in polymerization. The weight-average molecular weight of the polymer was measured by a gel permeation chromatography (GPC) method using polystyrene as the standard substance, and was found to be 85,000.

Synthesis Examples 7 to 20

Polymers 7 to 20 were synthesized in similar manners to Synthesis Examples 1 to 6 while changing types of monomers and proportions of components. The weight-average molecular weight of each polymer was measured in the same manner as in Synthesis Examples 1 to 6. The specific polymers obtained above are shown below with structures of structure units, mol ratios thereof, and the measured weight-average molecular weight of the specific polymer.

TABLE 4

| Polymer | Composition of Synthesized Polymer (mol %) | | | Weight-Average Molecular Weight |
|---|---|---|---|---|
| P-1 | [structure, 20] | [structure, 60] | [structure, 20] | 100,000 |
| P-2 | [structure, 40] | [structure, 20] | [structure, 40] | 85,000 |
| P-3 | [structure, 33] | [structure, 45] | [structure, 22] | 120,000 |
| P-4 | [structure, 30] | [structure, 60] | [structure, 10] | 105,000 |
| P-5 | [structure, 90] | [structure, 10] | | 120,000 |

TABLE 5
| Polymer | Composition of Synthesized Polymer (mol %) | Weight-Average Molecular Weight |
|---|---|---|
| P-6 | 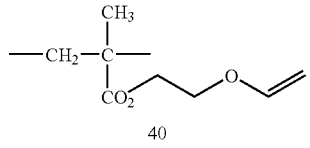 40    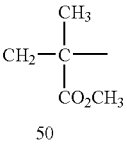 50    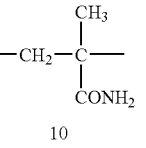 10 | 110,000 |
| P-7 | 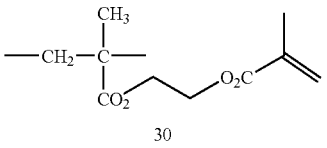 30    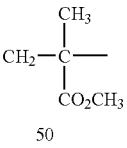 50    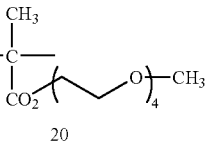 20 | 95,000 |
| P-8 | 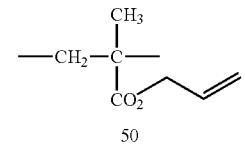 50    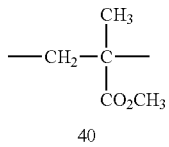 40    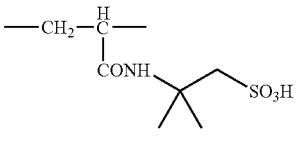 10 | 110,000 |
| P-9 | 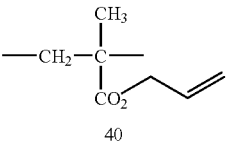 40    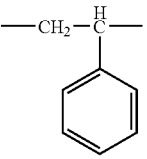 40    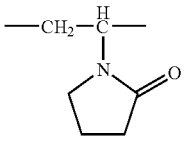 20 | 120,000 |
| P-10 | 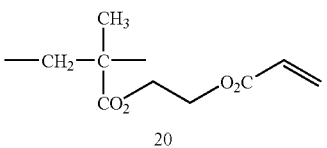 20    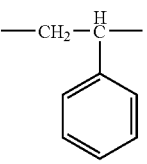 60    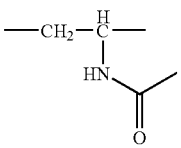 10 | 140,000 |
TABLE 6
| Polymer | Composition of Synthesized Polymer (mol %) | Weight-Average Molecular Weight |
|---|---|---|
| P-11 | 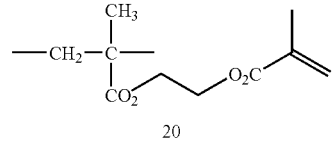 20    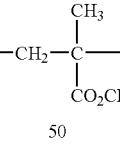 50    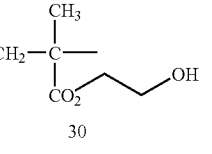 30 | 90,000 |
| P-12 | 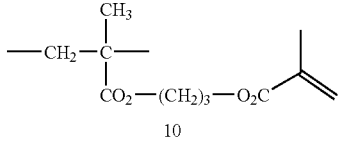 10    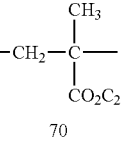 70    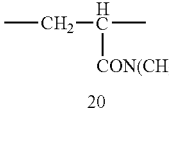 20 | 95,000 |

TABLE 6-continued
| Polymer | Composition of Synthesized Polymer (mol %) | Weight-Average Molecular Weight |
|---|---|---|
| P-13 | 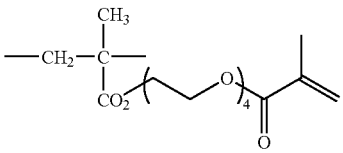 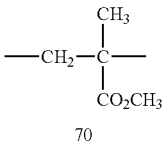 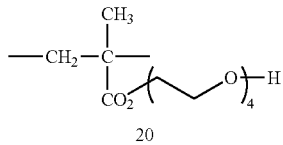<br>10   70   20 | 130,000 |
| P-14 | 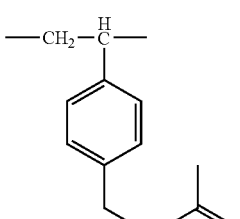 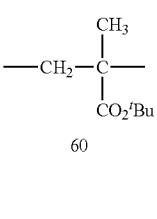 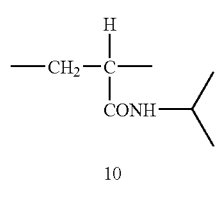<br>20   60   10 | 115,000 |
| P-15 | 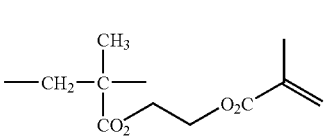 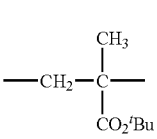 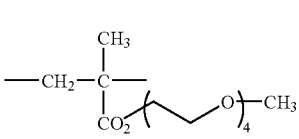<br>30   50   20 | 140,000 |
TABLE 7
| Polymer | Composition of Synthesized Polymer (mol %) | Weight-Average Molecular Weight |
|---|---|---|
| P-16 | 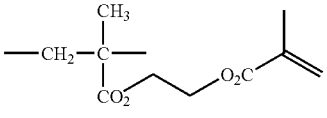 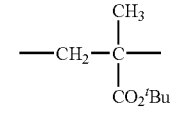 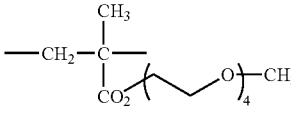<br>40   50   10 | 100,000 |
| P-17 | 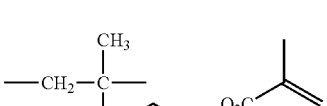 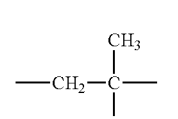 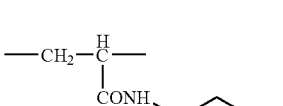<br>30   50   20 | 75,000 |
| P-18 | 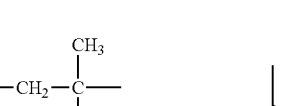 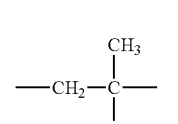 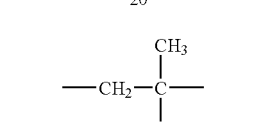<br>20   50   30 | 60,000 |
| P-19 | 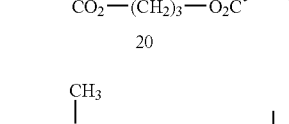 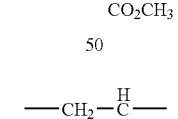 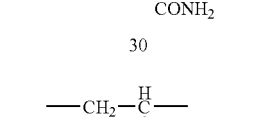<br>30   60   10 | 85,000 |

TABLE 7-continued

| Polymer | Composition of Synthesized Polymer (mol %) | Weight-Average Molecular Weight |
|---|---|---|
| P-20 |  30 / 60 / 10 | 110,000 |

Preparation of Planographic Printing Plate Precursor (1) Preparation of Support

<Support A>

An aluminum plate (material 1050) with a thickness of 0.3 mm was subjected to a degreasing treatment with a 10% by mass aqueous sodium aluminate solution at 50° C. for 30 seconds so as to remove rolling oil from surface of the aluminum plate. Then, surface of the aluminum plate was grained by using three nylon brushes with bundles of fibers having a fiber diameter of 0.3 mm and an aqueous suspension (with specific gravity of 1.1 g/cm$^3$) of pumice having a median diameter of 25 µm. Then, surface of the aluminum plate was washed well with water. The aluminum plate was immersed in a 25% aqueous sodium hydroxide solution having a temperature of 45° C. for 9 seconds so as to be etched, then washed with water, then immersed in a 20% nitric acid having a temperature of 60° C. for 20 seconds, and then washed with water. The etched amount of the grained surface was about 3 g/m$^2$.

Then, the aluminum surface was subjected to a continuous electrochemical surface-roughening treatment with 60 Hz alternating voltage. The electrolytic solution used in the surface roughening was a 1% by mass aqueous nitric acid solution (containing 0.5% by mass of aluminum ion) and its temperature was 50° C. The waveform of the alternating voltage was a trapezoidal waveform in which the time Tp the current took to increase from 0 to the peak current was 0.8 msec and the duty ratio was 1:1. In the surface roughening, the counter electrode was a carbon electrode, the auxiliary anode was ferrite. The current density was 30 A/dm at the peak and the proportion of the current through the auxiliary electrode was 5% of the current generated by the power source. In the electrolysis with nitric acid, the anode electricity quantity of the aluminum plate was 175 C/dm$^2$. Subsequently, the aluminum plate was subjected to spray washing.

Then, the aluminum plate was subjected to another electrochemical surface roughening in a similar manner to the above-described electrolysis with nitric acid, using 0.5% by mass aqueous hydrochloric acid solution (containing 0.5% by mass of aluminum ion) at a liquid temperature of 50° C. with an anode electricity quantity of the aluminum plate of 50 C/dm$^2$. Subsequently, the aluminum plate was washed with sprayed water. The aluminum plate was subjected to a direct-current anodization in 15% sulfuric acid (containing 0.5% by mass of aluminum ion) at an electric current density of 15 A/dm$^2$ to form anodic oxide film of 2.5 g/m$^2$. Then, the aluminum plate was washed with water, then dried to give a support A. The center-line average roughness (Ra) of the support was measured by using a needle with a diameter of 2 µm, and was found to be 0.51 µm.

<Support B>: FZP Treated Support

An aluminum plate having an anodic oxide film was prepared in the same manner as the preparation of support A described above. The aluminum plate was then immersed in a heated solution of 75° C. at pH 3.7 containing 0.1% of sodium fluorozirconate and 1% of sodium dihydrogen phosphate for 10 seconds to conduct sealing, and used as support B.

<Support C>: FZP Pore-Widening Treatment

An aluminum plate having an anodic oxide film was prepared in the same manner as the preparation of support A described above. The aluminum plate was then treated with 1% by mass aqueous sodium hydroxide solution having a temperature of 60° C. for 10 seconds to enlarge the pores in the anodic oxide film. By this treatment, the pore size of the anodic oxide film became 20 nm. After the pore-widening treatment, the aluminum plate was immersed in a heated solution of 75° C. at pH 3.7 containing 0.1% of sodium fluorozirconate and 1% of sodium dihydrogen phosphate for 10 seconds to conduct sealing, and used as support C.

<Support D>: Support Sealed by Steam

An aluminum plate having an anodic oxide film was prepared in the same manner as the preparation of support A described above. The aluminum plate was then exposed to saturated steam atmosphere for 10 seconds to conduct sealing, and used as support D.

The supports A, B, C, and D were treated with a 2.5% by mass aqueous sodium silicate solution of 30° C. for 10 seconds. The center-line average roughness (Ra) of each support was measured by using a needle with a diameter of 2 µm. As a result, it was found that the supports A to D all had a center-line average roughness of 0.51 µm.

(2) Formation of Undercoat Layer

Each of the supports was coated with the following undercoating liquid (1) such that the coating weight after drying was 10 mg/m$^2$. The coated support was used for experiments described below.

| Undercoating liquid (1) | |
| --- | --- |
| Undercoating compound (1) (Molecular weight 30,000) | 0.017 g |
| Methanol | 9.00 g |
| Water | 1.00 g |

Undercoating Compound (1)

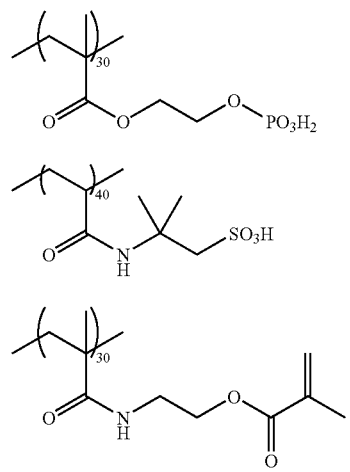

(3) Formation of Image-Recording Layer

Example 11

An image-recording layer coating liquid (1) with the following composition was coated on the support B by a bar-coating method, and the coated support was dried in an oven at 100° C. for 60 seconds to form an image-recording layer with a dry coating weight of 1.0 g/m². The support having the image-recording layer was used as a planographic printing plate precursor.

The image-recording layer coating liquid (1) was obtained by mixing the following photosensitive liquid (1) and microcapsule liquid (1) immediately before coating.

| <Photosensitive liquid (1)> | |
| --- | --- |
| Specific polymer (P-7) | 0.162 g |
| Polymerization initiator (1) shown below | 0.100 g |
| Infrared absorber (1) shown below | 0.020 g |
| Polymerizable monomer, ARONIX M-215 (manufactured by Toa Gosei Co., Ltd.) | 0.385 g |
| Fluorine-based surfactant (1) shown below | 0.044 g |
| Methyl ethyl ketone | 1.091 g |
| 1-methoxy-2-propanol | 8.609 g |
| <Microcapsule liquid (1)> | |
| Microcapsule (1) synthesized as described below | 2.640 g |
| Water | 2.425 g |

Polymerization Initiator (1)

Infrared absorber (1)

Fluorine-based surfactant (1)

Synthesis of Microcapsule (1)

As the oil phase, 10 g of an adduct (TAKENATE D-110 N manufactured by Mitsui Takeda Chemicals Inc.) of trimethylol propane and xylenediisocyanate, 3.15 g of pentaerythritol triacrylate (SR444 manufactured by Nippon Kayaku Co., Ltd.), 0.35 g of an infrared absorber (2) shown below, 1 g of 3-(N,N-diethylamino)-6-methyl-7-anilinofluoran (ODB manufactured by Yamamoto Chemicals Inc.), and 0.1 g of PIONIN A-41 C (manufactured by Takemoto Oil & Fat Co., Ltd.) were dissolved in 17 g of ethyl acetate. As the aqueous phase, 40 g of a 4% by mass aqueous solution of PVA-205 was prepared. The oil phase and the aqueous phase were mixed and subjected to emulsification with a homogenizer at 12000 rpm for 10 minutes. The obtained emulsion was added to 25 g of distilled water, and then the obtained mixture was stirred at room temperature for 30 minutes, and then stirred at 40° C. for 3 hours to form microcapsules. The obtained microcapsule liquid was diluted with distilled water such that its solid content became 15% by mass. The average diameter of the microcapsules was 0.2 μm.

Examples 12 to 20

Planographic printing plate precursors of Examples 12 to 20 having recording layers were each prepared in the same manner as the preparation of the planographic printing plate precursor of Example 11 except that the support and the specific polymer shown in the Table below were used.

TABLE 8

| | Support | Specific Polymer |
| --- | --- | --- |
| Example 12 | A | P-2 |
| Example 13 | A | P-3 |

TABLE 8-continued

| | Support | Specific Polymer |
|---|---|---|
| Example 14 | A | P-4 |
| Example 15 | B | P-5 |
| Example 16 | B | P-11 |
| Example 17 | B | P-12 |
| Example 18 | C | P-13 |
| Example 19 | C | P-14 |
| Example 20 | D | P-15 |

Comparative Example 11

The planographic printing plate precursor of Comparative example 11 having a recording layer was prepared in the same manner as the preparation of the planographic printing plate precursor of Example 11, except that the support was the support B and that the polymer used was a comparative polymer (1) (Weight average molecular weight 50,000) shown below.

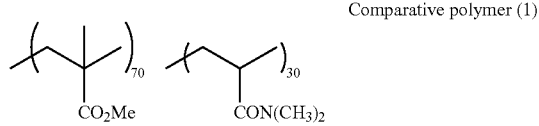

Comparative polymer (1)

Example 21

The support A was coated with an image-recording layer coating liquid with the following composition by a bar-coating method, and then dried in an oven at 100° C. for 60 seconds to form an image-recording layer with a dry coating weight of 1.0 g/m², thereby obtaining a planographic printing plate precursor.

| <Image-recording layer coating liquid (2)> | |
|---|---|
| Infrared absorber (2) shown below | 0.05 g |
| Polymerization initiator (1) shown above | 0.20 g |
| Specific polymer (P-1) | 0.50 g |
| Polymerizable monomer, ARONIX M-215 (manufactured by Toa Gosei Co., Ltd.) | 1.00 g |
| Naphthalenesulfonic acid salt of Victoria Pure Blue | 0.02 g |
| Fluorine-based surfactant (1) shown above | 0.10 g |
| Methyl ethyl ketone | 18.0 g |

Infrared absorber (2)

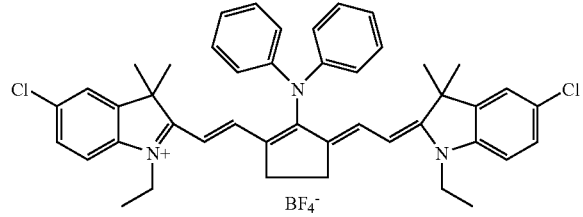

Examples 22 to 30

Planographic printing plate precursors of Examples 22 to 30 having recording layers were each prepared in the same manner as the preparation of the planographic printing plate precursor of Example 21 except that the support and the specific polymer shown in the Table below were used.

TABLE 9

| | Support | Specific Polymer |
|---|---|---|
| Example 22 | A | P-6 |
| Example 23 | A | P-8 |
| Example 24 | B | P-9 |
| Example 25 | B | P-10 |
| Example 26 | B | P-16 |
| Example 27 | C | P-17 |
| Example 28 | C | P-18 |
| Example 29 | D | P-19 |
| Example 30 | D | P-20 |

Comparative Example 12

The planographic printing plate precursor of Comparative example 12 having a recording layer was prepared in the same manner as the preparation of the planographic printing plate precursor of Example 21, except that the support was the support A and that the polymer used was a comparative polymer (2) (Weight average molecular weight 50,000) shown below.

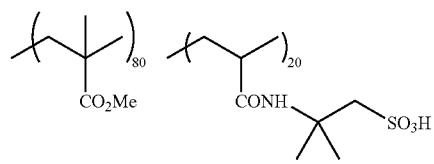

Comparative polymer (2)

2. Exposure and Printing

Each of the planographic printing plate precursors of Examples and Comparative examples was subjected to exposure with a TRENDSETTER 3244 VX manufactured by Creo Inc. equipped with a 40 W water-cooling infrared semiconductor laser. In the exposure, the output was 9 W, the rotating speed of the external drum was 210 rpm, and the resolution was 2400 dpi. The image used for exposure had thin-line chart. After exposure, each planographic printing plate precursor was attached to the cylinder of a printing machine SOR-M manufactured by Heidelberg without being subjected to a developing treatment. Moistening water and ink were supplied to the printing plate precursor. The moistening water was a mixture of an etching solution EU-3 (manufactured by Fuji Photo Film Co., Ltd.), water, and isopropyl alcohol (EU-3/water/isopropyl alcohol=1/89/10 by volume). The ink was TRANS-G (N) black ink manufactured by Dainippon Ink and Chemicals Incorporated. Then, printing was conducted at a printing speed of 6000 sheets per hour to print 100 sheets.

The number of printed sheets discharged until on-press development of the unexposed regions of the image-recording layer was completed and transfer of ink to the printed sheet in unexposed regions stopped, was counted. The number was considered as an index reflecting on-press developability. In each planographic printing plate precursor, the number was 100 or smaller; that is printed sheets without blemish in non-image regions could be obtained before 100 sheets were printed.

3. Evaluation

In general, higher exposure results in higher curing degree of the image-recording layer (photosensitive layer) while lower exposure results in lower curing degree of the image-recording layer, in the case of a negative planographic printing plate precursor. When the curing degree of the image-recording layer is too low, the printing durability of the planographic printing plate is low, resulting in insufficient reproducibility of small dots and thin lines. In contrast, when the curing degree of the image-recording layer is high, the printing durability is high and the reproducibility of small dots and thin lines is satisfactory. In this example, reproducibility of thin lines and printing durability of each negative planographic printing plate was evaluated with respect to the same exposure condition described above. The printing durability and reproducibility of thin lines were considered as indexes representing sensitivity. In other words, sensitivity of a planographic printing plate precursor is higher if printing durability (in terms of the number of sheet the printing plate can print) is higher. Similarly, sensitivity of a planographic printing plate precursor is higher if reproducibility of thin lines (in terms of the width of thin lines) is better.

(1) Reproducibility of Thin Lines

As described above, it was confirmed that a printed sheet without ink stains in non-image regions was obtained before 100 sheets were printed. Then, another 500 sheets were printed. The thin line chart printed on the 600 th (in total) sheet was observed with a 25-power loupe, the original chart having thin lines with width of 10, 12, 14, 16, 18, 20, 25, 30, 35, 40, 60, 80, 100, and 200 μm, respectively. The minimum width of the ink lines without a break was used for evaluation of reproducibility of thin lines.

(2) Printing Durability

Printing was continued even after the print for evaluation of thin line reproducibility was obtained. As the number of printed sheets increased, the image-recording layer was gradually worn and its ink receiving property lowered, resulting in decrease in ink density on printed sheets. The number of sheets printed before the ink density (reflection density) became (initial ink density −0.1) was used for evaluation of printing durability. The initial ink density refers to the ink density at starting of the printing.

The results are shown in Table 10 together with the results of on-press developability.

TABLE 10

| | On-press Developability (Number of Sheets) | Reproducibility of Thin Lines (μ) | Printing Durability (Number of Sheets) |
|---|---|---|---|
| Example 11 | 25 | 16 | 20000 |
| Example 12 | 30 | 16 | 20000 |
| Example 13 | 35 | 25 | 14000 |
| Example 14 | 25 | 25 | 14000 |
| Example 15 | 25 | 30 | 14000 |
| Example 16 | 40 | 20 | 18000 |
| Example 17 | 40 | 16 | 20000 |
| Example 18 | 25 | 20 | 18000 |
| Example 19 | 35 | 16 | 20000 |
| Example 20 | 25 | 18 | 18000 |
| Example 21 | 35 | 16 | 20000 |
| Example 22 | 30 | 25 | 15000 |
| Example 23 | 25 | 30 | 14000 |
| Example 24 | 35 | 25 | 15000 |
| Example 25 | 35 | 16 | 20000 |
| Example 26 | 25 | 18 | 20000 |
| Example 27 | 25 | 20 | 18000 |
| Example 28 | 35 | 16 | 20000 |
| Example 29 | 35 | 20 | 20000 |
| Example 30 | 25 | 16 | 20000 |
| Comp. Ex. 11 | 30 | 40 | 5000 |
| Comp. Ex. 12 | 30 | 60 | 2000 |

As is clear from the results shown in Table 10, the planographic printing plate precursors having photopolymerizable layers containing the specific polymers of the invention exhibited superior results with respect to all of the on-press, developability, the reproducibility of thin lines, and the printing durability. In contrast, Comparative examples 11 and 12 in which polymers without ethylenic unsaturated bond on side chains were used showed inferior results with respect to the reproducibility of thin lines and the printing durability.

Examples 31 to 35

The support shown in Table 11 below was coated with an image-recording layer coating liquid (3) with the following composition by a bar-coating method, then dried in an oven at 100° C. for 60 seconds to form an image-recording layer with a dry coating weight of 1.0 g/m². A protective layer coating liquid (1) with the following composition was coated thereon to give a dry coating amount of 0.5 g/m², and dried at 120° C. for 1 minute, to give a planographic printing plate precursor.

| <Image-recording layer coating liquid (3)> | |
|---|---|
| Polymerization initiator (2) shown below | 0.2 g |
| Sensitizing colorant (1) shown below | 0.5 g |
| Specific polymer compound (shown in Table 11) | 6.0 g |
| Polymerizable monomer, isocyanuric acid EO-modified triacrylate (M315 manufactured by Toa Gosei Co., Ltd.) | 12.4 g |
| Leuco crystalviolet | 3.0 g |
| Aluminum salt of N-nitrosophenylhydroxylamine as a thermal polymerization initiator | 0.1 g |
| Tetraethylammonium chloride | 0.1 g |
| Fluorine-based surfactant (1) | 0.1 g |
| Methyl ethyl ketone | 70.0 g |
| <Protective layer coating liquid (1)> | |
| Polyvinyl alcohol (saponification degree of 95% by mol, polymerization degree of 800) | 40 g |
| Polyvinyl pyrrolidone (molecular weight of 50,000) | 5 g |
| Poly(vinylpyrrolidone/vinyl acetate (1/1)) with molecular weight of 70,000 | 5 g |
| Water | 950 g |

Polymerization Initiator (2)

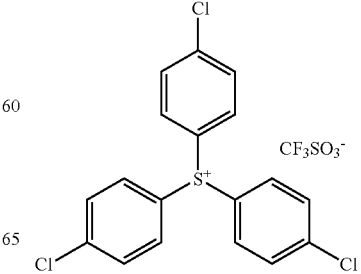

Sensitizing Dye (1)

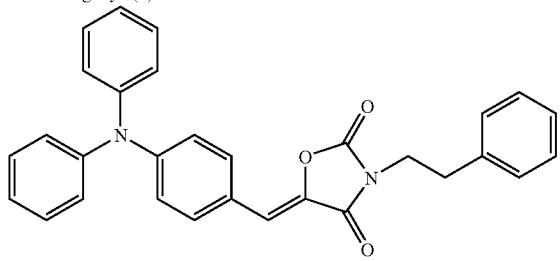

Comparative Example 13

A planographic printing plate precursor having an image-recording layer was prepared in the same manner as in Example 31 except that the comparative polymer (1) was used in place of the specific polymer.

Examples 36 to 40

Planographic printing plate precursors were prepared in the same manner as the preparation of the planographic printing plate precursors of Examples 31 to 35, except that an image-recording layer coating liquid (4) was used in place of the image-recording layer coating liquid (3) described above.

| <Image-recording layer coating liquid (4)> | |
|---|---|
| Polymerization initiator (3) shown below | 0.2 g |
| Specific polymer (shown in Table 11) | 3.0 g |
| Polymerizable monomer, isocyanuric acid EO-modified triacrylate (M315 manufactured by Toa Gosei Co., Ltd.) | 6.2 g |
| Leuco crystalviolet | 3.0 g |
| Aluminum salt of N-nitrosophenylhydroxylamine as a thermal polymerization initiator | 0.1 g |
| Fluorine-based surfactant (1) | 0.1 g |
| Microcapsule (1) | 10.0 g (in terms of solid amount) |
| Methyl ethyl ketone | 35.0 g |
| 1-methoxy-2-propanol | 35.0 g |
| Water | 10.0 g |

Polymerization Initiator (3)

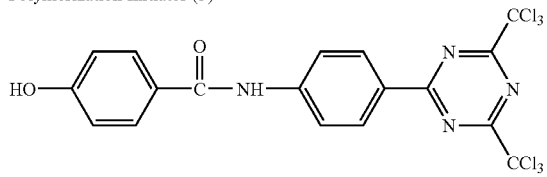

Comparative Example 14

A planographic printing plate precursor was prepared in the same manner as in Example 36, except that a comparative polymer (2) was used in place of the specific polymer in the formation of an image-recording layer.

Exposure Method

Each planographic printing plate precursor was subjected to exposure with a 375 nm or 405 nm semiconductor laser with an output of 2 mW. In the exposure, the circumference of the external drum was 900 mm, the drum rotating velocity was 800 rpm, and the resolution was 2400 dpi. The time the laser took to write one pixel is shown in Table 12.

Printing Method

After exposure, each planographic printing plate precursor was attached to the cylinder of SOR-M manufactured by Heidelberg without being subjected to a developing treatment. Moistening water and ink were supplied to the printing plate precursor. The moistening water was a mixture of an etching solution EU-3 (manufactured by Fuji Photo Film Co., Ltd.), water, and isopropyl alcohol (EU-3/water/isopropyl alcohol=1/89/10 by volume). The ink was TRANS-G (N) black ink manufactured by Dainippon Ink and Chemicals Incorporated. Then, printing was conducted at a printing speed of 6000 sheets per hour to print 100 sheets. The image-recording layer in unexposed regions was removed on-press, and prints without ink stains in non-image regions were obtained.

Evaluation of Planograhic Printing Plate Precursor

Reproducibility of thin lines, on-press developability and printing durability were evaluated in the same manner as in Examples 11 to 30.

<Sensitivity>

After the printing of 100 sheets for confirmation of prints with no ink stains in non-image regions, the printing was continued to print further 500 sheets. The minimum exposure required for achieving uniform ink density in image regions of the 600th (in total) sheet was determined to evaluate sensitivity.

<Safety under White Light>

Unexposed planographic printing plate precursors were left under a white fluorescent lump such that the light intensity on the surface of the planographic printing plate precursors was 400 lux. After the exposure to white light, planograhic printing plate precursors which needed a developing treatment were subjected to a development treatment. Then, similarly to the above, all the planographic printing plate precursors were each attached to the cylinder of SOR-M manufactured by Heidelberg, and used for printing 100 sheets. For each planographic printing plate precursor, the longest time of the exposure to white light which did not cause ink stains on the 100th sheet was measured. If the longest time is longer, the planographic printing plate precursor can be handled more safely under white light.

The results of the evaluations are shown in Table 12.

TABLE 11

| | Support | Specific Polymer |
|---|---|---|
| Example 31 | A | P-7 |
| Example 32 | A | P-2 |
| Example 33 | B | P-3 |
| Example 34 | C | P-4 |
| Example 35 | D | P-5 |
| Example 36 | A | P-11 |
| Example 37 | A | P-12 |
| Example 38 | B | P-13 |
| Example 39 | C | P-14 |
| Example 40 | D | P-15 |

TABLE 12

| | Light Source | Writing time per pixel | Sensitivity (mJ/cm²) | Reproducibility of Thin Lines (μm) | On-press Developability (Number of Sheets) | Printing Durability (Number of Sheets) | White Light Safety (Minutes) |
|---|---|---|---|---|---|---|---|
| Example 31 | 405 nm | 0.9 μS | 0.18 | 12 | 25 | 20000 | 240 |
| Example 32 | Semiconductor | 0.9 μS | 0.2 | 12 | 30 | 18000 | 240 |
| Example 33 | Laser | 0.9 μS | 0.2 | 12 | 35 | 15000 | 240 |
| Example 34 | | 0.9 μS | 0.23 | 14 | 25 | 14000 | 240 |
| Example 35 | | 0.9 μS | 0.22 | 14 | 25 | 19000 | 240 |
| Example 36 | 375 nm | 0.9 μS | 0.05 | 10 | 40 | 18000 | 240 |
| Example 37 | Semiconductor | 0.9 μS | 0.07 | 10 | 40 | 20000 | 180 |
| Example 38 | Laser | 100 μS | 0.07 | 10 | 25 | 18000 | 180 |
| Example 39 | | 100 μS | 0.15 | 12 | 35 | 20000 | 180 |
| Example 40 | | 1 mS | 0.15 | 14 | 25 | 18000 | 180 |
| Comp. Ex. 3 | 405 nm Semiconductor Laser | 0.9 μS | 0.2 | 12 | 30 | 5000 | 240 |
| Comp. Ex. 4 | 375 nm Semiconductor Laser | 0.9 μS | 0.25 | 14 | 30 | 2000 | 180 |

The photopolymerizable composition of the invention is particularly suitable for a recording layer of a planographic printing plate precursor for scanning exposure, but may be used in other applications such as highly sensitive photo-molding material, a hologram material utilizing change in refractive index upon polymerization, or production of electronic materials such as photoresists.

According to the invention, a photopolymerizable composition is provided which can be polymerized and cured by exposure to laser light or the like with high sensitivity such that unexposed areas can be removed without being subjected to a wet developing treatment with an excessive amount of aqueous alkaline solution. According to the invention, a planographic printing plate precursor is provided which can form image by laser exposure with high sensitivity. Image regions thereof are excellent in adhesion to the support, and non-image regions thereof can be removed easily in a printing process without being subjected to a wet developing treatment. The planographic printing plate precursor can form high-quality image.

The invention further provides a planographic printing method in which image can be recorded on the planographic printing plate precursor directly from digital data stored in a computer or the like. In the method, the planographic printing plate precursor is developed on-press without having been subjected to a wet developing treatment. This method makes it possible to obtain a lot of good prints with a practical energy amount.

The polymerizable composition of the invention can be polymerized and cured with high sensitivity by exposure with an infrared LD laser or an ultraviolet LD laser to form a cured film excellent in hydrophobicity and crosslinking density. Unreacted regions (unexposed regions) thereof have high water dispersibility, whereby the unreacted regions can be removed without being subjected to a wet developing treatment. A planographic printing plate precursor of the invention having a recording layer containing the polymerizable composition can form image with high sensitivity, and the planographic printing plate precursor can be used for printing after exposure without need for a wet developing treatment with an alkaline developer. The planographic printing plate precursor can form high quality image.

What is claimed is:

1. A planographic printing plate precursor comprising
a support and
a laser-sensitive recording layer, and
a layer other than the recording layer, which includes a copolymer comprising a first repeating unit having an ethylenic unsaturated bond and a second repeating unit having a functional group capable of interacting with a surface of the support
wherein the planographic printing plate can be used for printing after exposure without being developed with an alkaline developer, the recording layer includes a polymer having a polymerizable group on a side chain thereof,
wherein the planographic printing plate precursor is developable by
i) attaching the planographic printing plate precursor to a printing machine;
ii) imagewise exposing the planographic printing plate precursor to laser light;
and
iii) supplying printing ink and moistening water to the planographic printing plate precursor so as to remove the recording layer in unexposed regions and so as to generate a printing plate and conduct printing,
and wherein the polymer comprises
a copolymer component which has a structure represented by the following formula (S) on a side chain thereof:

Formula (S)

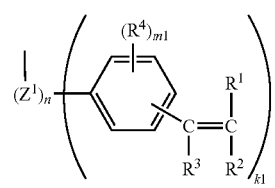

wherein in formula (S), $Z^1$ represents a connecting group; $R^1$, $R^2$ and $R^3$ each independently represent a hydrogen atom, a halogen atom, a carboxyl group, a sulfo group, a nitro group, a cyano group, an amide group, an amino group, an alkyl group, an aryl group, an alkoxy group, or an aryloxy group, each of which may have a substituent; $R^4$ represents a group or atom which can combine with the benzene ring and may have a substituent; n represents 0 or 1; m1 represents an integer of 0 to 4; and k1 represents an integer of 1 to 4 and a copolymer component which has a structure represented by the following formula (AO) on a side chain thereof:

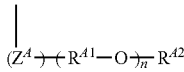

Formula (AO)

wherein in formula (AO), $Z^A$ represents a connecting group; $R^{A1}$ represents an alkylene group; $R^{A2}$ represents a hydrogen atom, an alkyl group, or an aryl group; and n represents an integer of 1 to 20.

2. The planographic printing plate precursor according to claim 1, wherein the recording layer includes a microcapsule.

3. The planographic printing plate precursor according to claim 1, wherein the recording layer includes a copolymer comprising a first repeating unit having an ethylenic unsaturated bond and a second repeating unit having a functional group capable of interacting with a surface of the support.

4. A planographic printing method comprising:
attaching the planographic printing plate precursor of claim 1 to a printing machine;
imagewise exposing the planographic printing plate precursor to laser light; and
supplying printing ink and moistening water to the planographic printing plate precursor so as to remove the recording layer in unexposed regions and so as to conduct printing.

5. The planographic printing method according to claim 4, wherein the imagewise exposure to laser light is conducted before the attachment of the planographic printing plate precursor to the printing machine.

* * * * *